US009806126B2

(12) United States Patent
Kamino et al.

(10) Patent No.: US 9,806,126 B2
(45) Date of Patent: Oct. 31, 2017

(54) METHOD FOR MANUFACTURING IMAGE CAPTURING DEVICE AND IMAGE CAPTURING DEVICE

(71) Applicant: Renesas Electronics Corporation, Koutou-ku, Tokyo (JP)

(72) Inventors: Takeshi Kamino, Kawasaki (JP); Takahiro Tomimatsu, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/404,320

(22) Filed: Jan. 12, 2017

(65) Prior Publication Data

US 2017/0125478 A1 May 4, 2017

Related U.S. Application Data

(63) Continuation of application No. 14/437,910, filed as application No. PCT/JP2012/077855 on Oct. 29, 2012, now Pat. No. 9,576,993.

(51) Int. Cl.
*H01L 27/146* (2006.01)
*H01L 21/28* (2006.01)
(Continued)

(52) U.S. Cl.
CPC ...... *H01L 27/14689* (2013.01); *H01L 21/266* (2013.01); *H01L 21/28123* (2013.01);
(Continued)

(58) Field of Classification Search
CPC ......... H01L 27/14643; H01L 27/14609; H01L 27/14683; H01L 31/02019; H01L 31/1876; H01L 31/18
(Continued)

(56) References Cited

U.S. PATENT DOCUMENTS 7,345,308 B2 * 3/2008 Sakano ............. H01L 27/14687 257/351
8,525,909 B2 * 9/2013 Matsumoto ....... H01L 27/14609 250/208.1
(Continued)

FOREIGN PATENT DOCUMENTS

CN 101640210 A 2/2010
JP 2004-335588 A 11/2004
(Continued)

OTHER PUBLICATIONS

Office Action dated Jul. 26, 2016, in Japanese Patent Application No. 2014-544066.
(Continued)

*Primary Examiner* — Earl Taylor
(74) *Attorney, Agent, or Firm* — Shapiro, Gabor and Rosenberger, PLLC

(57) ABSTRACT

An offset spacer film (OSS) is formed on a side wall surface of a gate electrode (NLGE, PLGE) to cover a region in which a photo diode (PD) is disposed. Next, an extension region (LNLD, LPLD) is formed using the offset spacer film and the like as an implantation mask. Next, process is provided to remove the offset spacer film covering the region in which the photo diode is disposed. Next, a sidewall insulating film (SWI) is formed on the side wall surface of the gate electrode. Next, a source-drain region (HPDF, LPDF, HNDF, LNDF) is formed using the sidewall insulating film and the like as an implantation mask.

10 Claims, 223 Drawing Sheets

(51) Int. Cl.

| | |
|---|---|
| ***H04N 5/374*** | (2011.01) |
| ***H01L 21/266*** | (2006.01) |
| ***H01L 21/285*** | (2006.01) |
| ***H01L 29/66*** | (2006.01) |

(52) U.S. Cl.

CPC .... *H01L 21/28518* (2013.01); *H01L 27/1461* (2013.01); *H01L 27/1462* (2013.01); *H01L 27/14612* (2013.01); *H01L 27/14685* (2013.01); *H01L 29/665* (2013.01); *H04N 5/374* (2013.01)

(58) Field of Classification Search

USPC .......................................... 257/297; 438/73

See application file for complete search history.

(56) References Cited

U.S. PATENT DOCUMENTS

| | | | | |
|---|---|---|---|---|
| 8,786,044 | B2 * | 7/2014 | Mishima | H01L 27/1462 257/462 |
| 8,809,914 | B2 * | 8/2014 | Suzuki | H01L 31/02325 257/232 |
| 8,953,077 | B2 * | 2/2015 | Matsumoto | H01L 27/14609 250/208.1 |
| 9,130,071 | B2 * | 9/2015 | Suzuki | H01L 31/02325 |
| 2004/0217436 | A1 | 11/2004 | Kimura | |
| 2006/0290659 | A1 * | 12/2006 | Sakano | H01L 27/14689 345/156 |
| 2010/0026866 | A1 * | 2/2010 | Matsumoto | H01L 27/14609 348/308 |
| 2010/0233861 | A1 * | 9/2010 | Kimizuka | H01L 27/14609 438/231 |
| 2013/0285131 | A1 * | 10/2013 | Matsumoto | H01L 27/14609 257/291 |
| 2013/0334641 | A1 * | 12/2013 | Suzuki | H01L 31/02325 257/432 |
| 2014/0313384 | A1 * | 10/2014 | Suzuki | H01L 31/02325 348/302 |
| 2015/0303230 | A1 * | 10/2015 | Kamino | H01L 27/1461 257/443 |

FOREIGN PATENT DOCUMENTS

| | | | |
|---|---|---|---|
| JP | 2006-319158 | A | 11/2006 |
| JP | 2008-041958 | A | 2/2008 |
| JP | 2009-026848 | A | 2/2009 |
| JP | 2010-056515 | A | 3/2010 |
| JP | 2010-212536 | A | 9/2010 |
| WO | WO 2007/055141 | A1 | 5/2007 |

OTHER PUBLICATIONS

Office Action dated Mar. 14, 2017, in Chinese Patent Application No. 201280076690.8.

Office Action dated Apr. 26, 2017, in Taiwanese Patent Application No. 102134073.

* cited by examiner

METHOD FOR MANUFACTURING IMAGE CAPTURING DEVICE AND IMAGE CAPTURING DEVICE

TECHNICAL FIELD

The present invention relates to a method for manufacturing an image capturing device and the image capturing device, in particular, the present invention can be suitably used for a method for manufacturing an image capturing device including a photo diode for image sensor.

BACKGROUND ART

An image capturing device including a CMOS (Complementary Metal Oxide Semiconductor) image sensor is applied to a digital camera or the like, for example. Such an image capturing device has a pixel region and a peripheral circuit region, the pixel region being provided with a photo diode for converting incoming light into a charge, the peripheral circuit region being provided with a peripheral circuit for processing, as an electric signal, the charge converted by the photo diode. In the pixel region, the charge generated in the photo diode is transferred to a floating diffusion region by a transfer transistor. The transferred charge is converted into an electrical signal by an amplification transistor in the peripheral circuit region, and is output as an image signal. As documents disclosing such an image capturing device, there are Japanese Patent Laying-Open No. 2010-56515 (Patent Document 1) and Japanese Patent Laying-Open No. 2006-319158 (Patent Document 2).

For high sensitivity and low power consumption, size reduction of image capturing devices is being attempted. When the gate length of a gate electrode of a field effect transistor processing an electrical signal becomes not more than 100 nm as a result of the size reduction, an approach has been taken to improve transistor characteristics while securing an effective gate length. Specifically, before forming a sidewall insulating film, extension implantation (LDD (Lightly Doped Drain) implantation) is performed with an offset spacer film being formed on the side wall surface of the gate electrode. Accordingly, the effective gate length of the field effect transistor is secured.

CITATION LIST

Patent Document

PTD 1: Japanese Patent Laying-Open No. 2010-56515
PTD 2: Japanese Patent Laying-Open No. 2006-319158

SUMMARY OF INVENTION

Technical Problem

However, the conventional image capturing device has the following problems. The offset spacer film is formed by providing anisotropic etching process (etch-back process) onto the entire surface of an insulating film formed on the surface of the semiconductor substrate to cover the gate electrode or the like and to serve as a side wall spacer film. Accordingly, due to dry etching process when removing the insulating film covering the photo diode, damage (plasma damage) is caused in the photo diode. The damage in the photo diode leads to increased dark current, with the result that current flows even when light does not come into the photo diode.

Other objects and novel features will be apparent from the description of the present specification and attached figures.

Solution to Problem

In a method for manufacturing an image capturing device according to one embodiment, a first insulating film to serve as an offset spacer film is formed to cover an element formation region and a gate electrode. The offset spacer film is formed on a side wall surface of the gate electrode by providing anisotropic etching process to the first insulating film while a portion of the first insulating film covering a photoelectric conversion unit remains. The portion of the first insulating film covering the photoelectric conversion unit is removed by providing wet etching process.

In a method for manufacturing an image capturing device according to another embodiment, a first insulating film to serve as an offset spacer film is formed to cover an element formation region and a gate electrode. The offset spacer film is formed on a side wall surface of the gate electrode portion by providing anisotropic etching process to the first insulating film while a portion of the first insulating film covering the photoelectric conversion unit remains.

In an image capturing device according to still another embodiment, a photoelectric conversion unit is formed at a portion of a pixel region at one side relative to a transfer gate electrode. An offset spacer film is formed on a side wall surface of a gate electrode to exclude a region in which the photoelectric conversion unit is disposed.

Advantageous Effects of Invention

In accordance with the method for manufacturing the image capturing device according to one embodiment, there can be manufactured an image capturing device suppressing a dark current.

In accordance with the method for manufacturing the image capturing device according to another embodiment, there can be manufactured an image capturing device suppressing a dark current.

In accordance with the image capturing device according to still another embodiment, a dark current can be suppressed.

BRIEF DESCRIPTION OF DRAWINGS

FIG. 59C is a cross sectional view of the peripheral region to show a step performed in the embodiment after the steps shown in FIG. 58A and FIG. 58B.

FIG. 60A is a cross sectional view of the pixel region and the like to show a step performed in the embodiment after the steps shown in FIG. 59A to FIG. 59C.

FIG. 60B is a cross sectional view of each pixel region to show a step performed in the embodiment after the steps shown in FIG. 59A to FIG. 59C.

FIG. 60C is a cross sectional view of the peripheral region to show a step performed in the embodiment after the steps shown in FIG. 59A to FIG. 59C.

FIG. 61A is a cross sectional view of the pixel region and the like to show a step performed in the embodiment after the steps shown in FIG. 60A to FIG. 60C.

FIG. 61B is a cross sectional view of each pixel region to show a step performed in the embodiment after the steps shown in FIG. 60A to FIG. 60C.

FIG. 61C is a cross sectional view of the peripheral region to show a step performed in the embodiment after the steps shown in FIG. 60A to FIG. 60C.

FIG. 62A is a cross sectional view of the pixel region and the like to show one step of the method for manufacturing the image capturing device according to the fourth embodiment.

FIG. 62B is a cross sectional view of the peripheral region to show one step of the method for manufacturing the image capturing device according to the fourth embodiment.

FIG. 63A is a cross sectional view of the pixel region and the like to show a step performed in the embodiment after the steps shown in FIG. 62A and FIG. 62B.

FIG. 63B is a cross sectional view of the peripheral region to show a step performed in the embodiment after the steps shown in FIG. 62A and FIG. 62B.

FIG. 64 is a cross sectional view of each pixel region to show a step performed in the embodiment after the steps shown in FIG. 63A and FIG. 63B.

Figure 64:
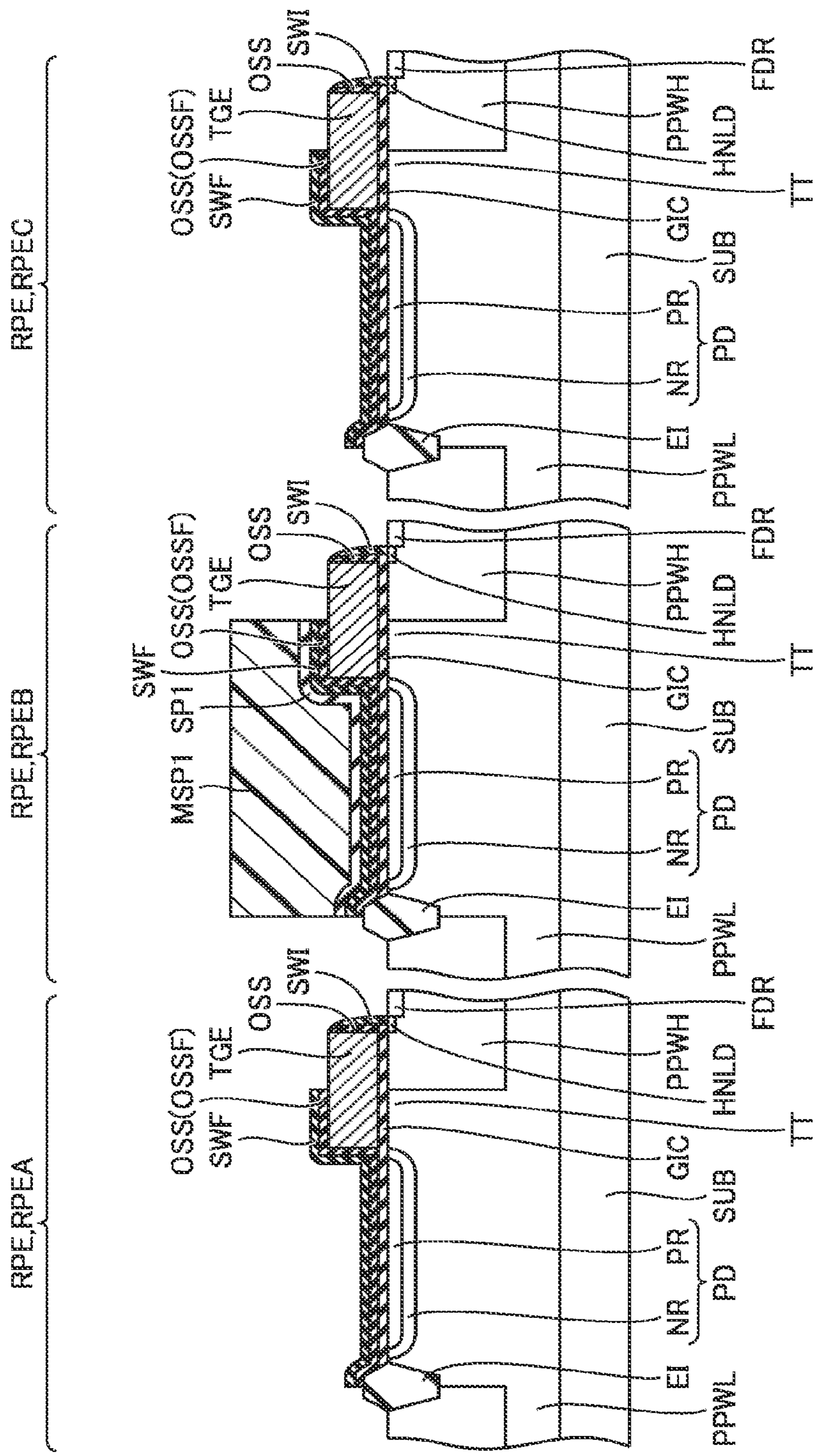
Figure 65A:
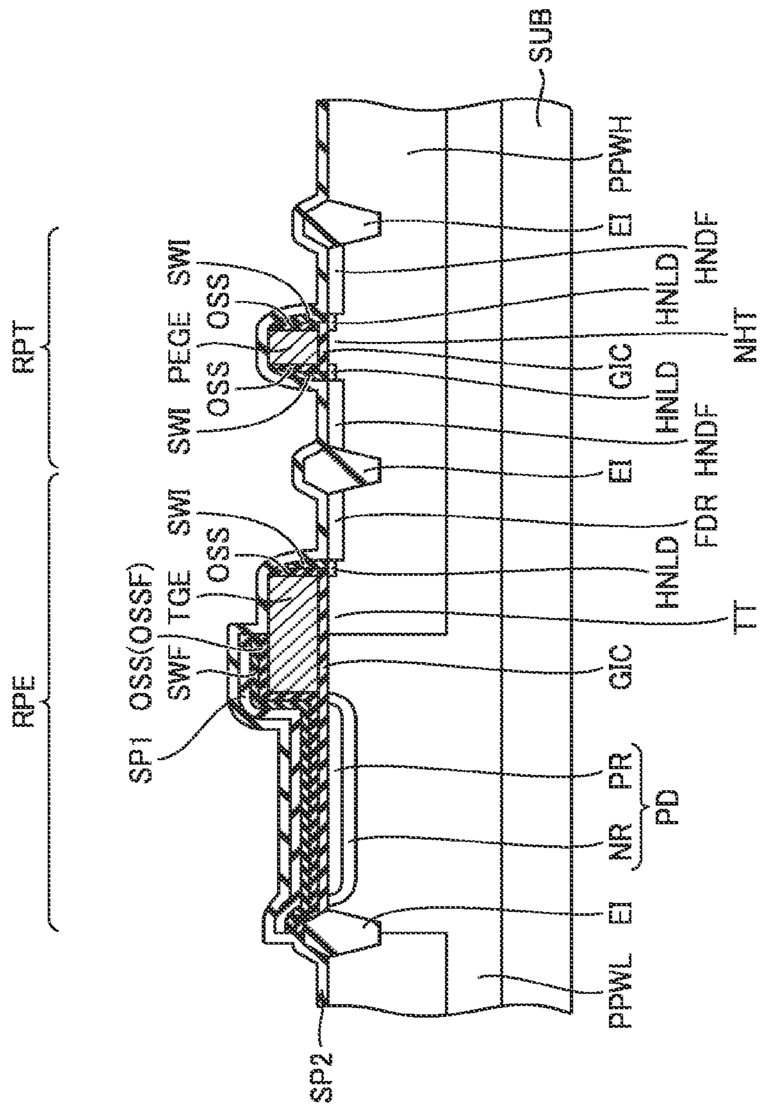

FIG. 65A is a cross sectional view of the pixel region and the like to show a step performed in the embodiment after the steps shown in FIG. 64.

Figure 65B:
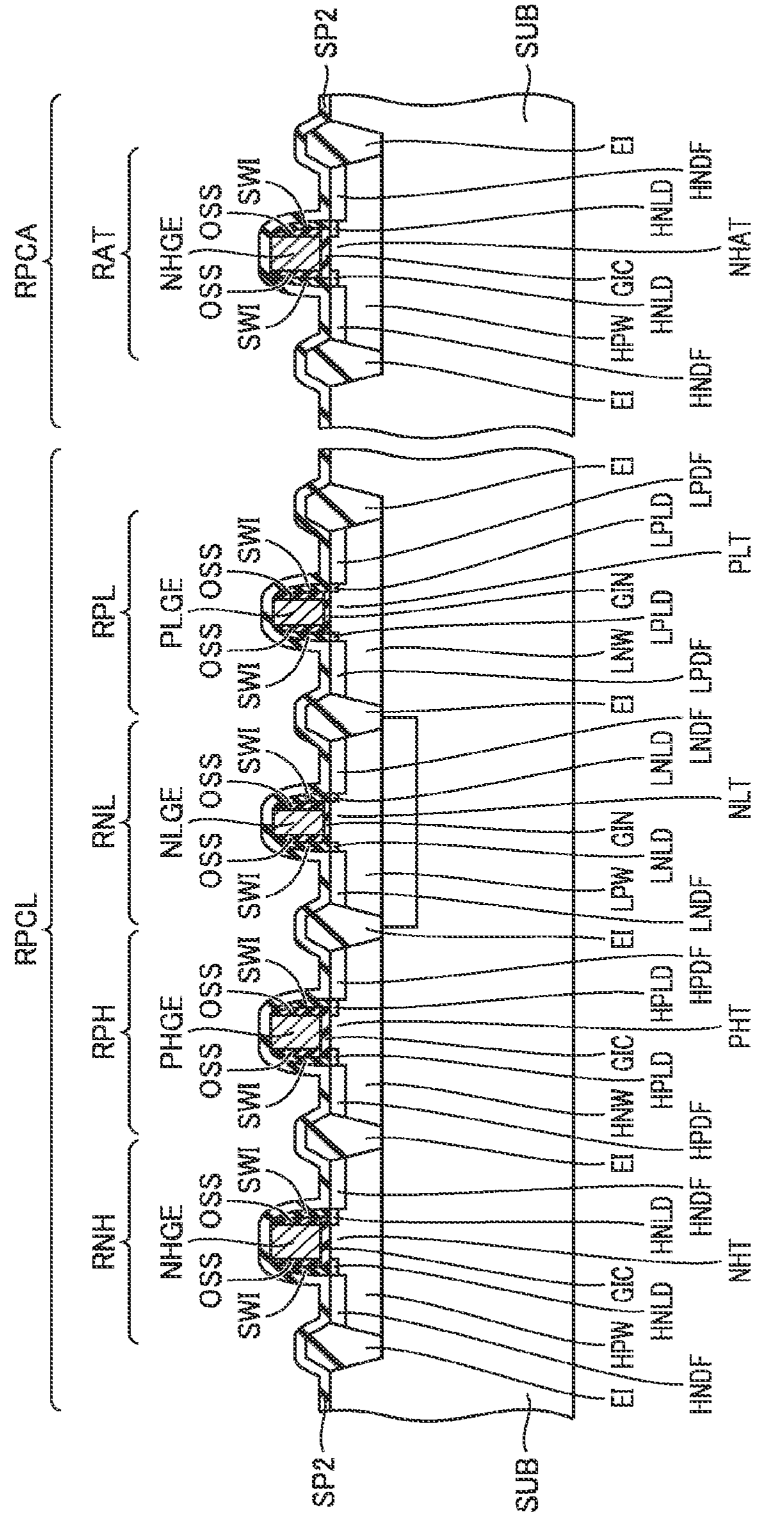

FIG. 65B is a cross sectional view of the peripheral region to show a step performed in the embodiment after the steps shown in FIG. 64.

Figure 65C:
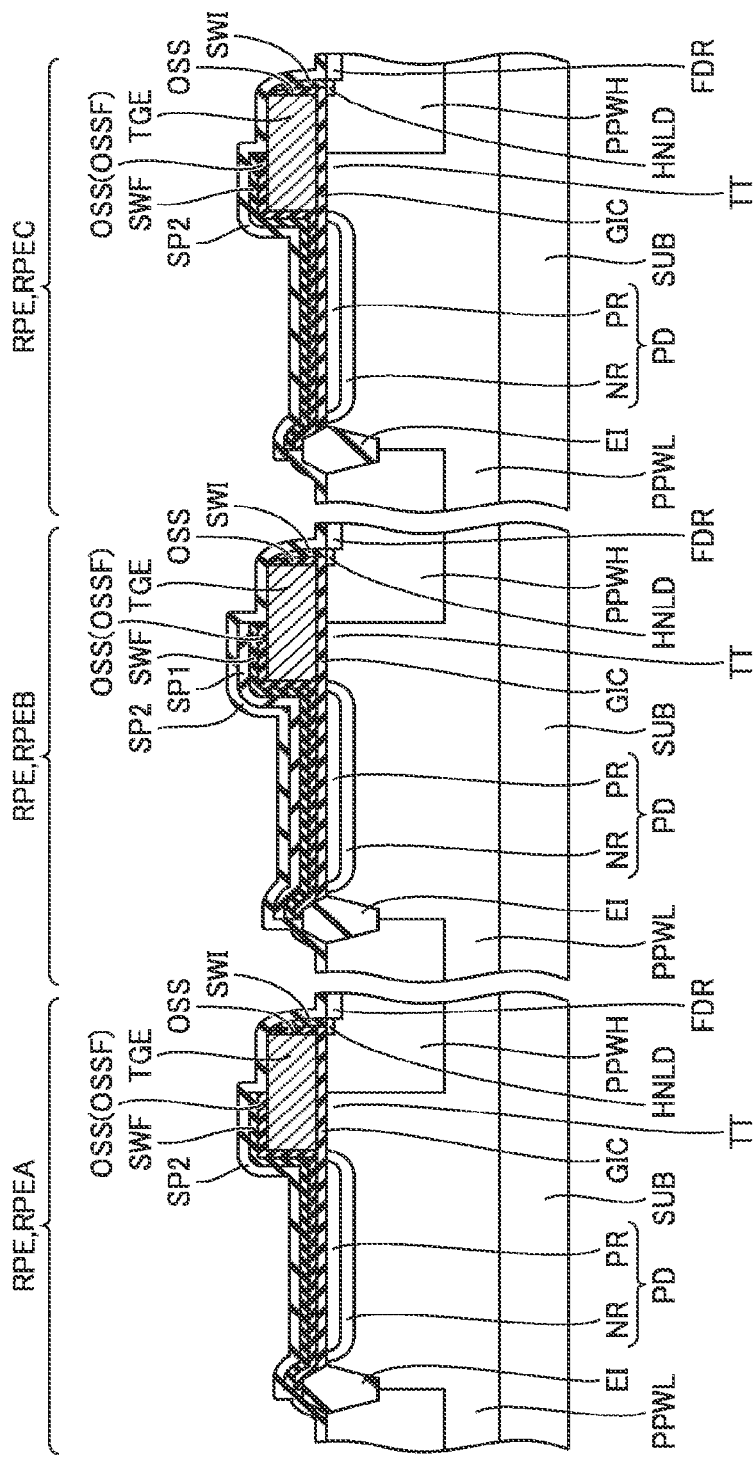

FIG. 65C is a cross sectional view of each pixel region to show a step performed in the embodiment after the steps shown in FIG. 64.

Figure 66A:
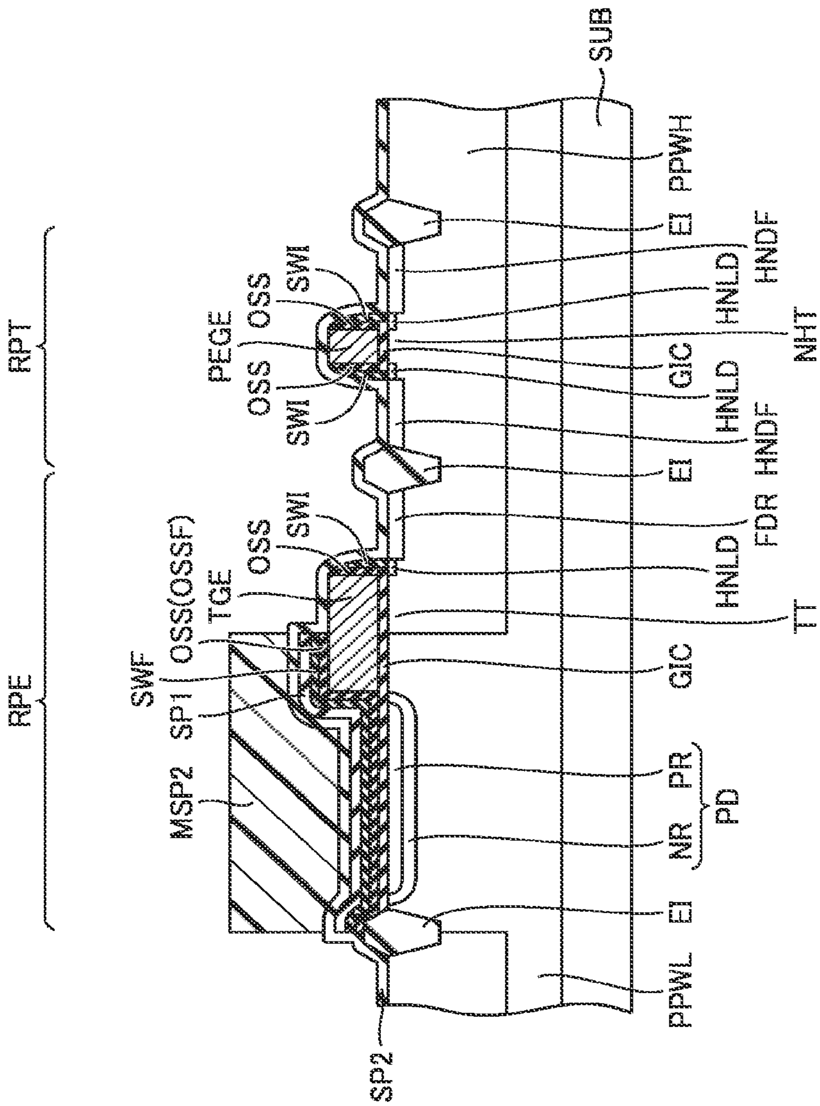

FIG. 66A is a cross sectional view of the pixel region and the like to show a step performed in the embodiment after the steps shown in FIG. 65A to FIG. 65C.

Figure 66B:
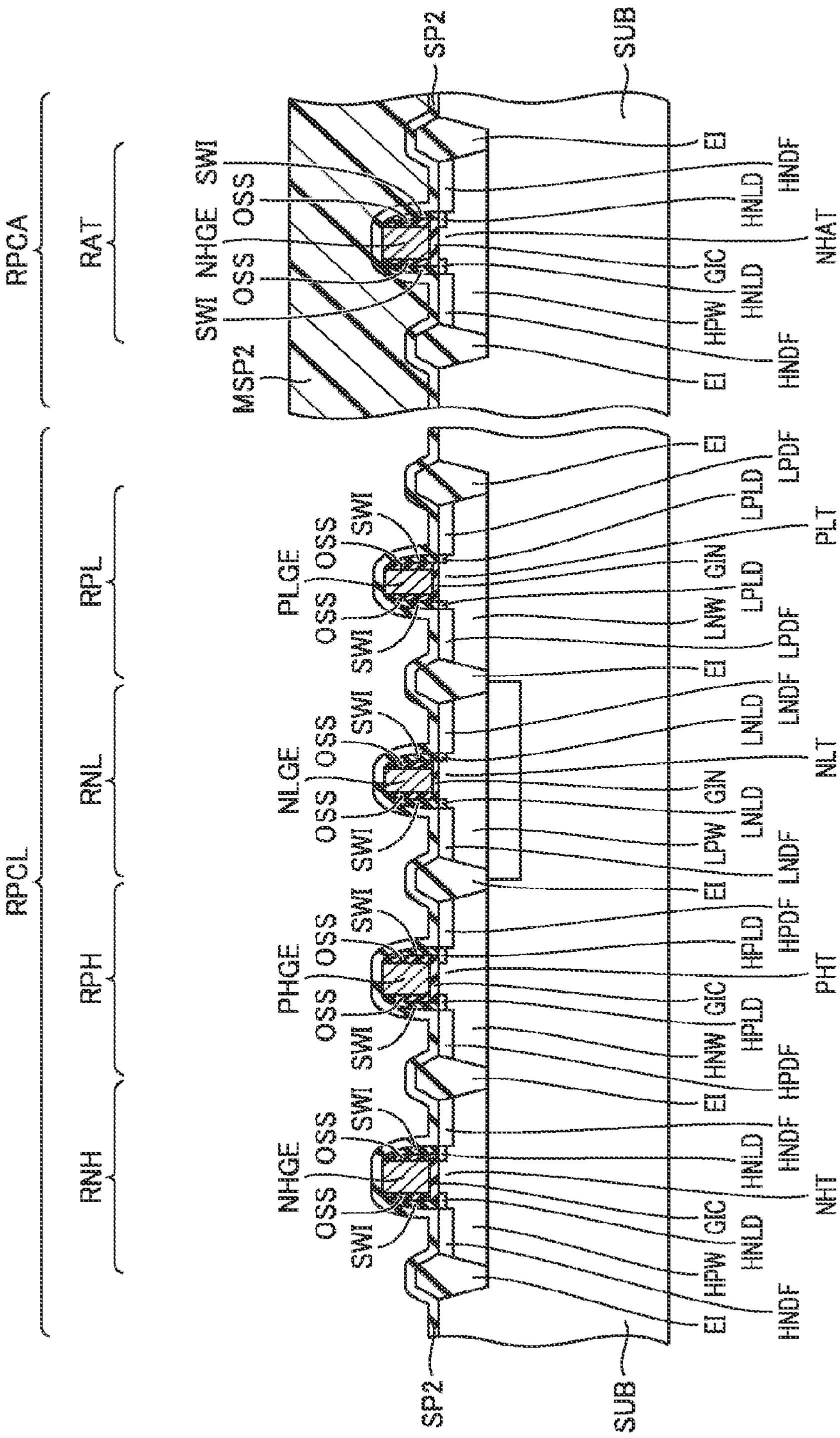

FIG. 66B is a cross sectional view of the peripheral region to show a step performed in the embodiment after the steps shown in FIG. 65A to FIG. 65C.

Figure 66C:
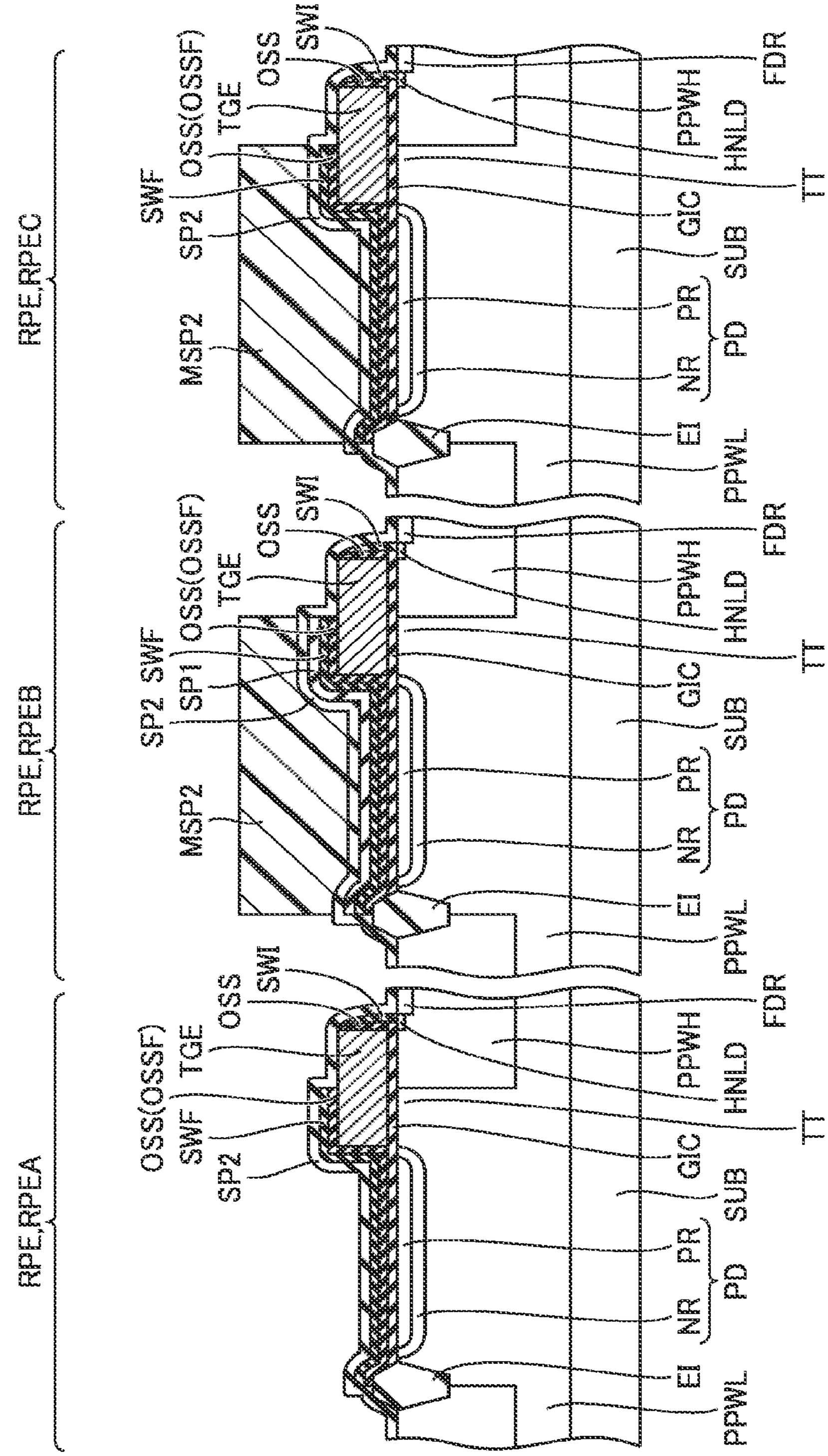

FIG. 66C is a cross sectional view of each pixel region to show a step performed in the embodiment after the steps shown in FIG. 65A to FIG. 65C.

Figure 67A:
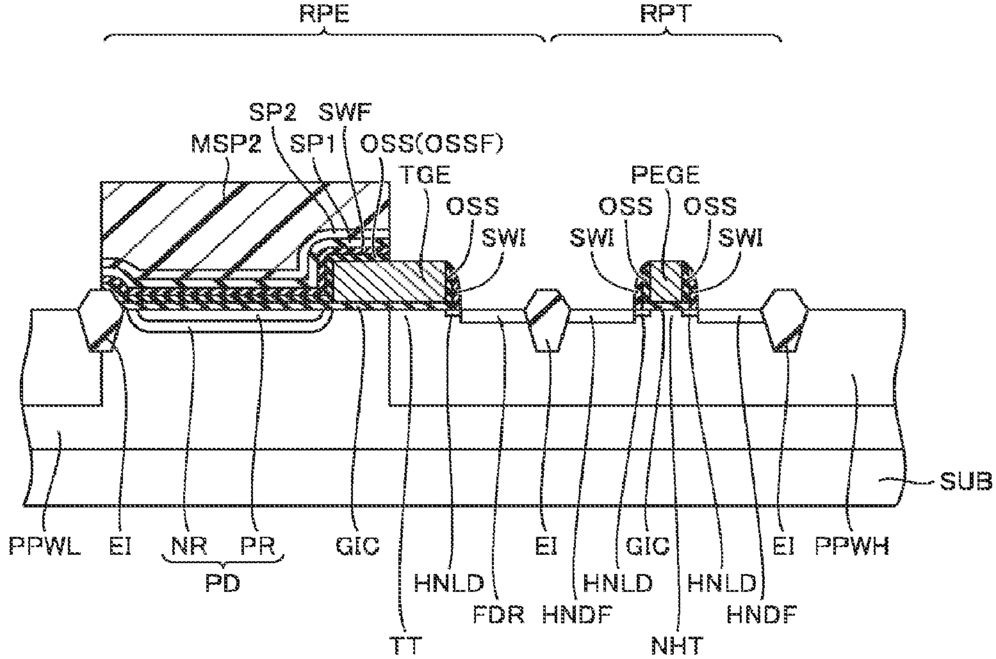

FIG. 67A is a cross sectional view of the pixel region and the like to show a step performed in the embodiment after the steps shown in FIG. 66A to FIG. 66C.

Figure 67B:
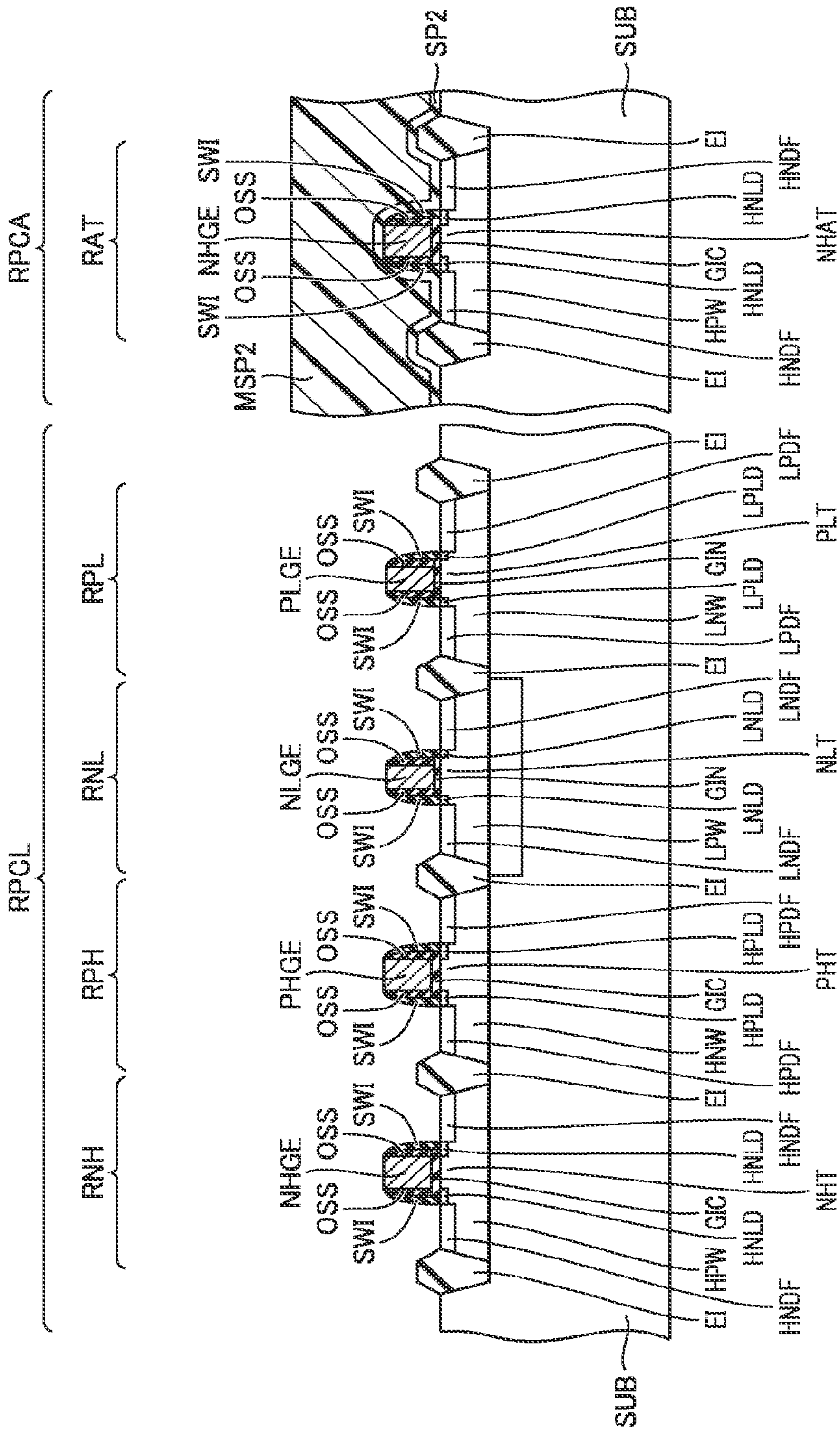

FIG. 67B is a cross sectional view of the peripheral region to show a step performed in the embodiment after the steps shown in FIG. 66A to FIG. 66C.

Figure 67C:
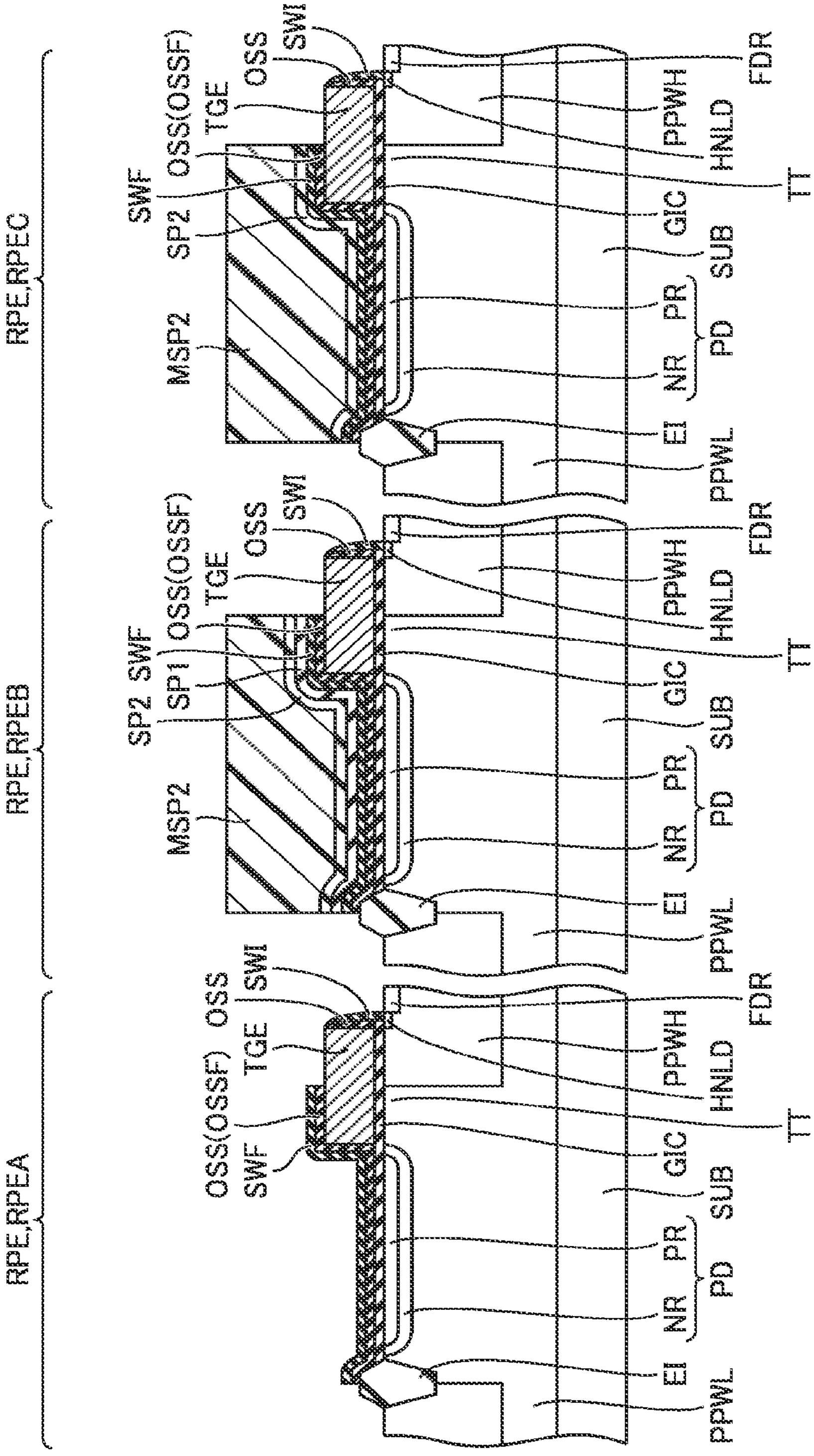

FIG. 67C is a cross sectional view of each pixel region to show a step performed in the embodiment after the steps shown in FIG. 66A to FIG. 66C.

Figure 68A:
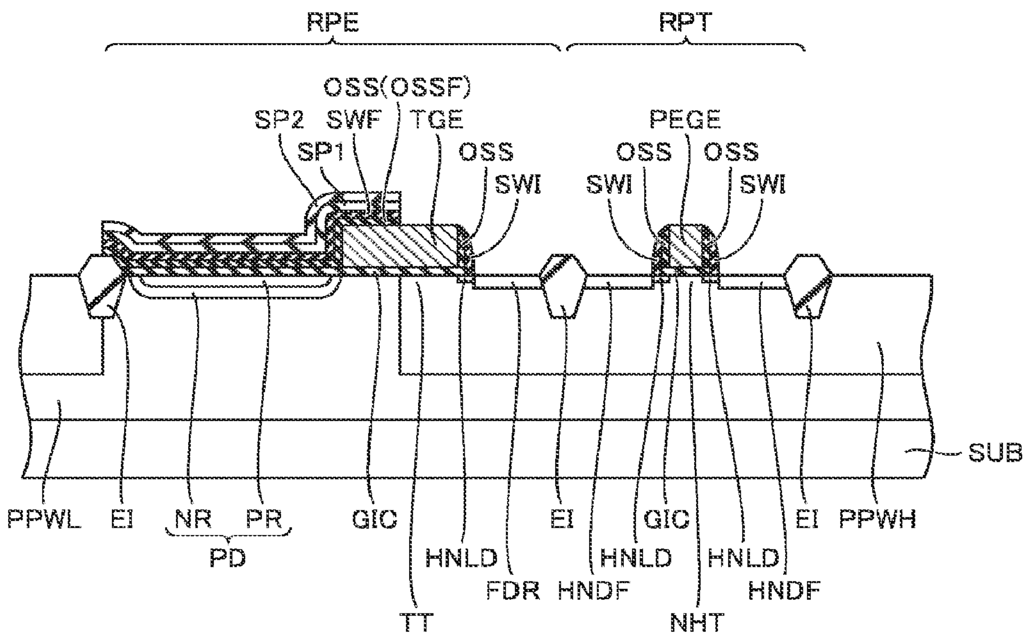

FIG. 68A is a cross sectional view of the pixel region and the like to show a step performed in the embodiment after the steps shown in FIG. 67A to FIG. 67C.

Figure 68B:
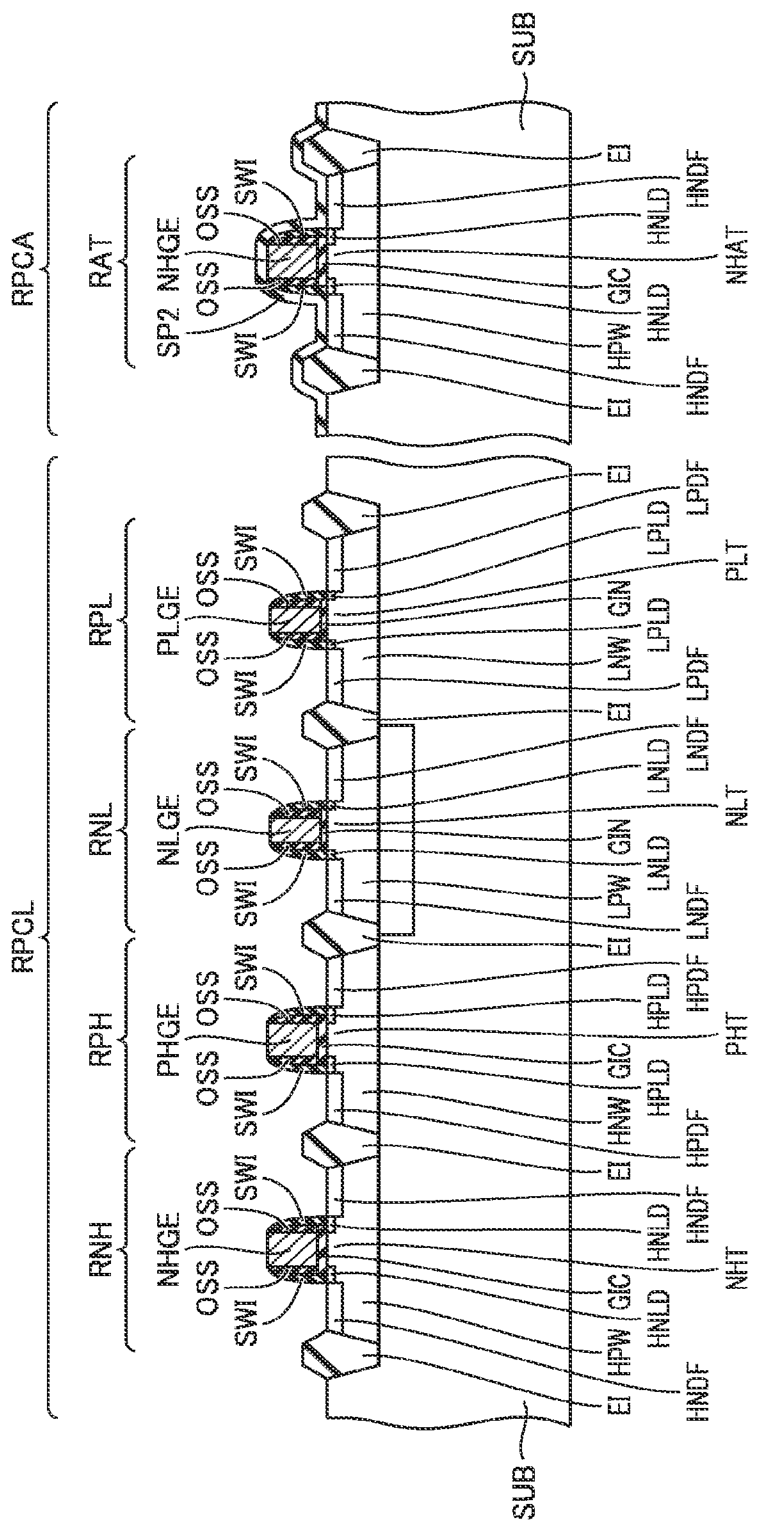

FIG. 68B is a cross sectional view of the peripheral region to show a step performed in the embodiment after the steps shown in FIG. 67A to FIG. 67C.

Figure 68C:
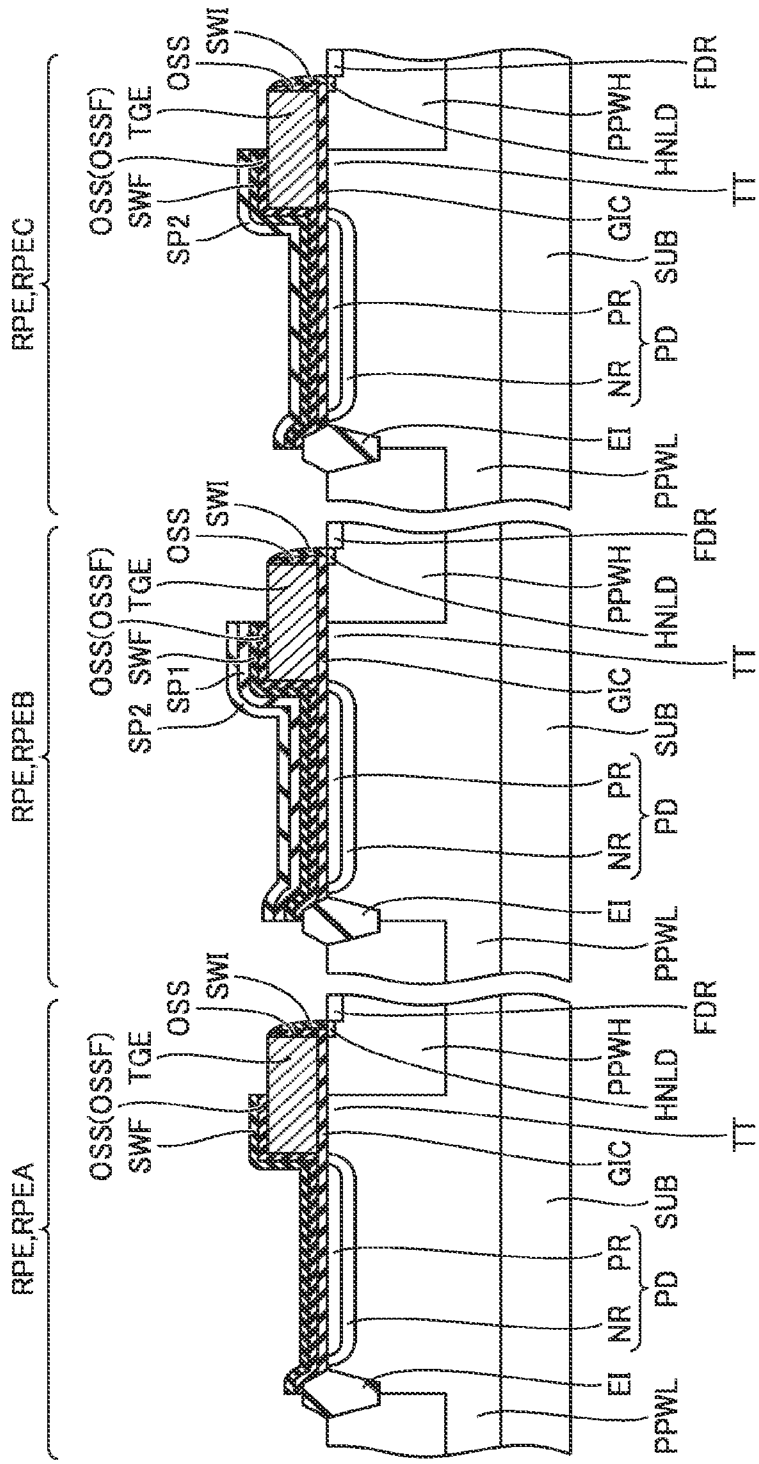

FIG. 68C is a cross sectional view of each pixel region to show a step performed in the embodiment after the steps shown in FIG. 67A to FIG. 67C.

Figure 69A:
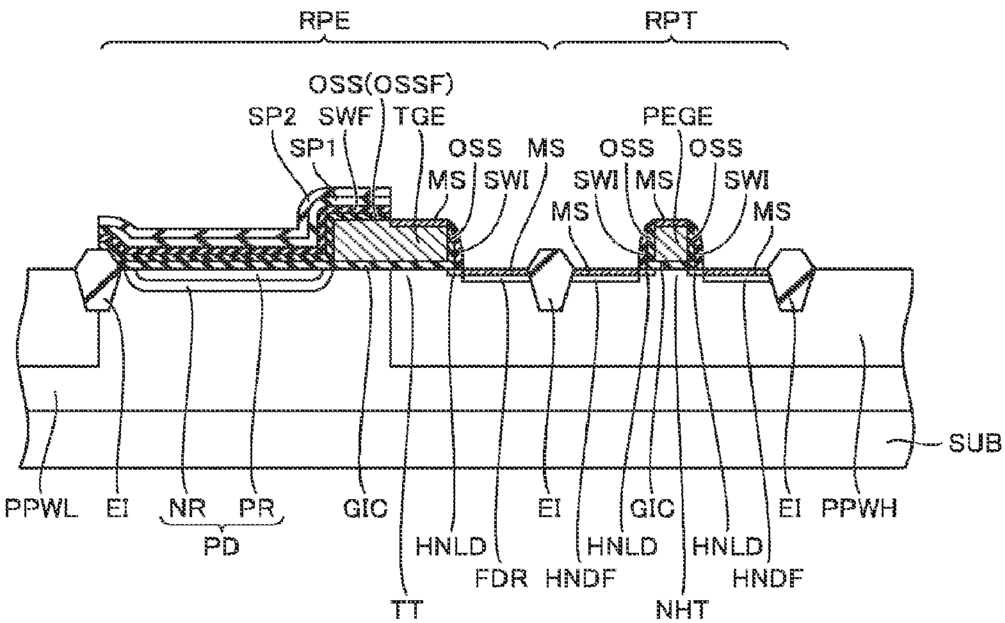

FIG. 69A is a cross sectional view of the pixel region and the like to show a step performed in the embodiment after the steps shown in FIG. 68A to FIG. 68C.

Figure 69B:
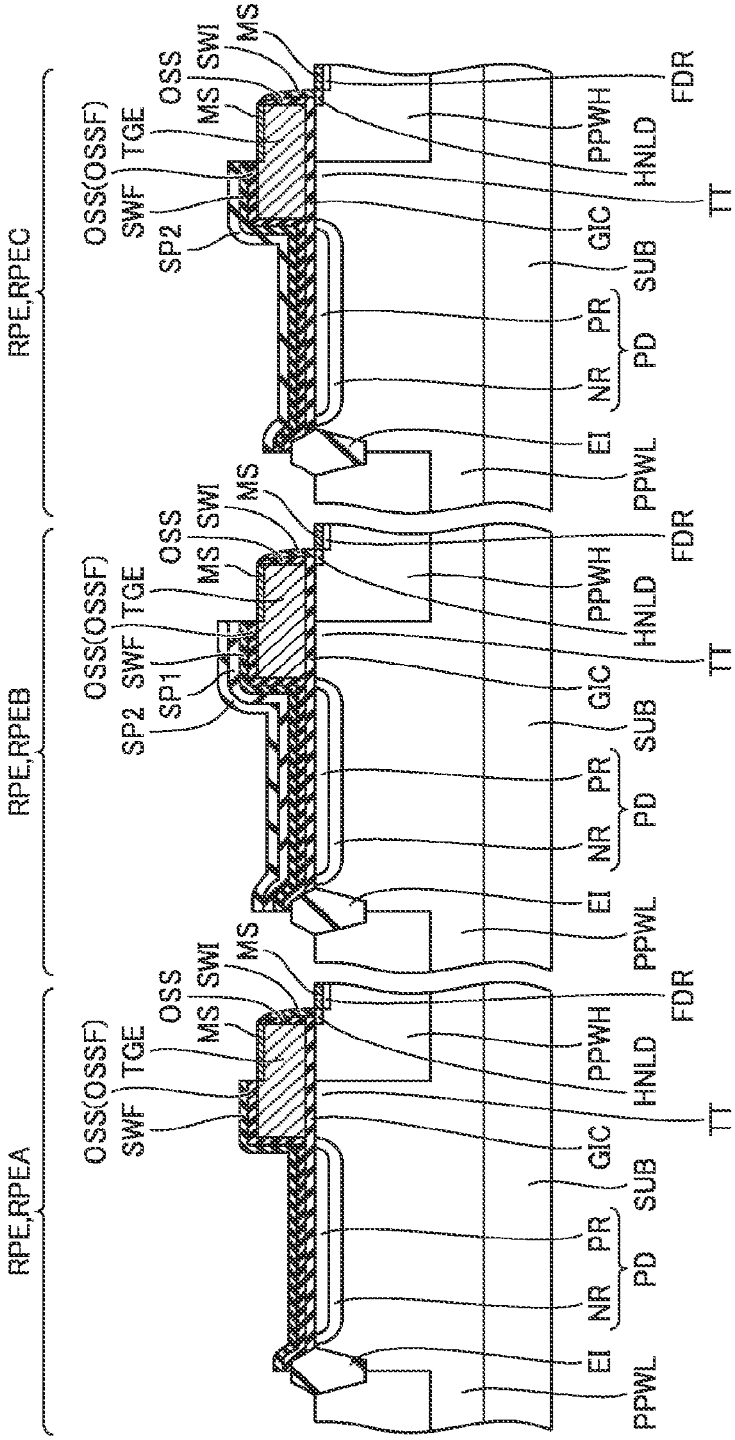

FIG. 69B is a cross sectional view of each pixel region to show a step performed in the embodiment after the steps shown in FIG. 68A to FIG. 68C.

Figure 69C:
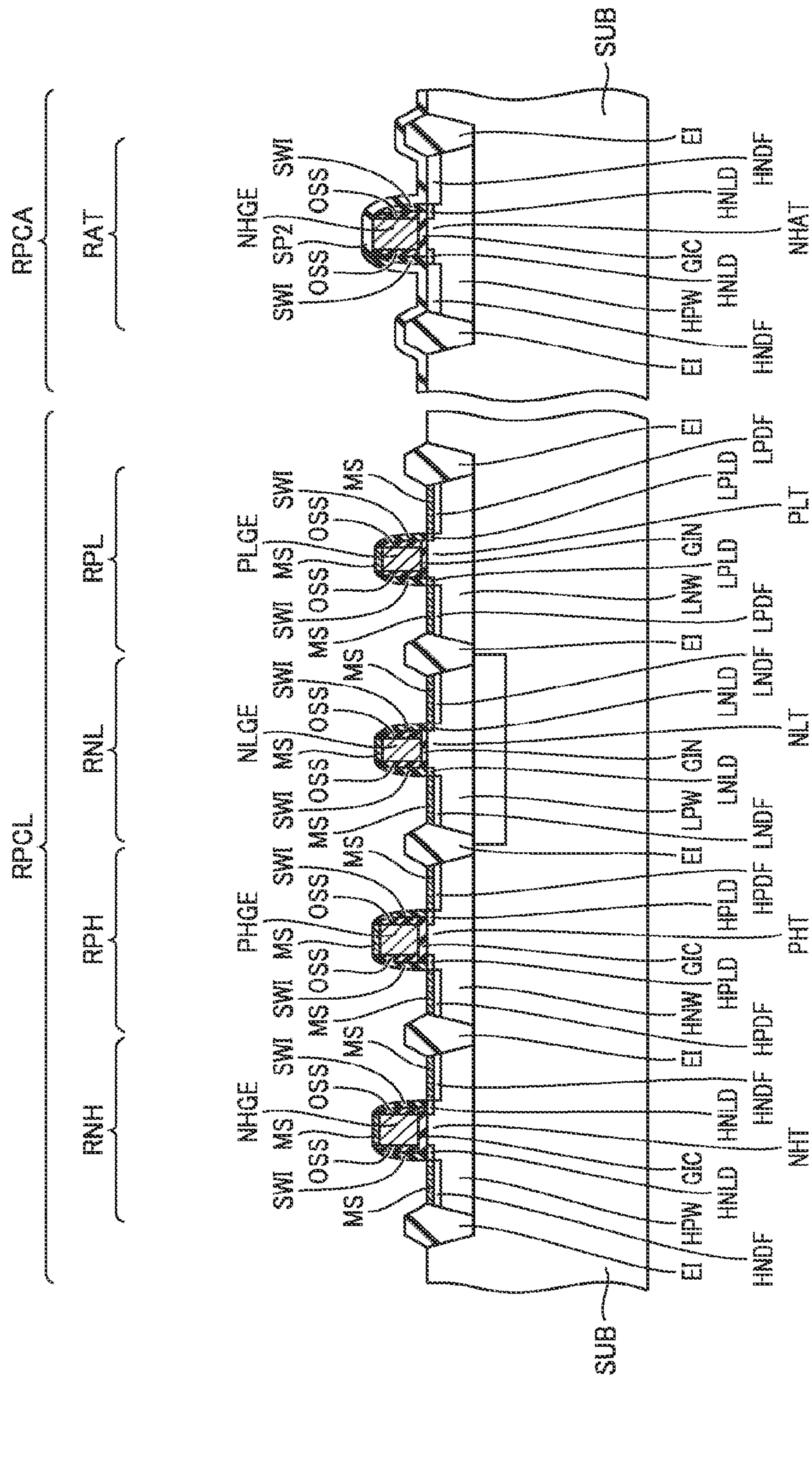

FIG. 69C is a cross sectional view of the peripheral region to show a step performed in the embodiment after the steps shown in FIG. 68A to FIG. 68C.

Figure 70A:
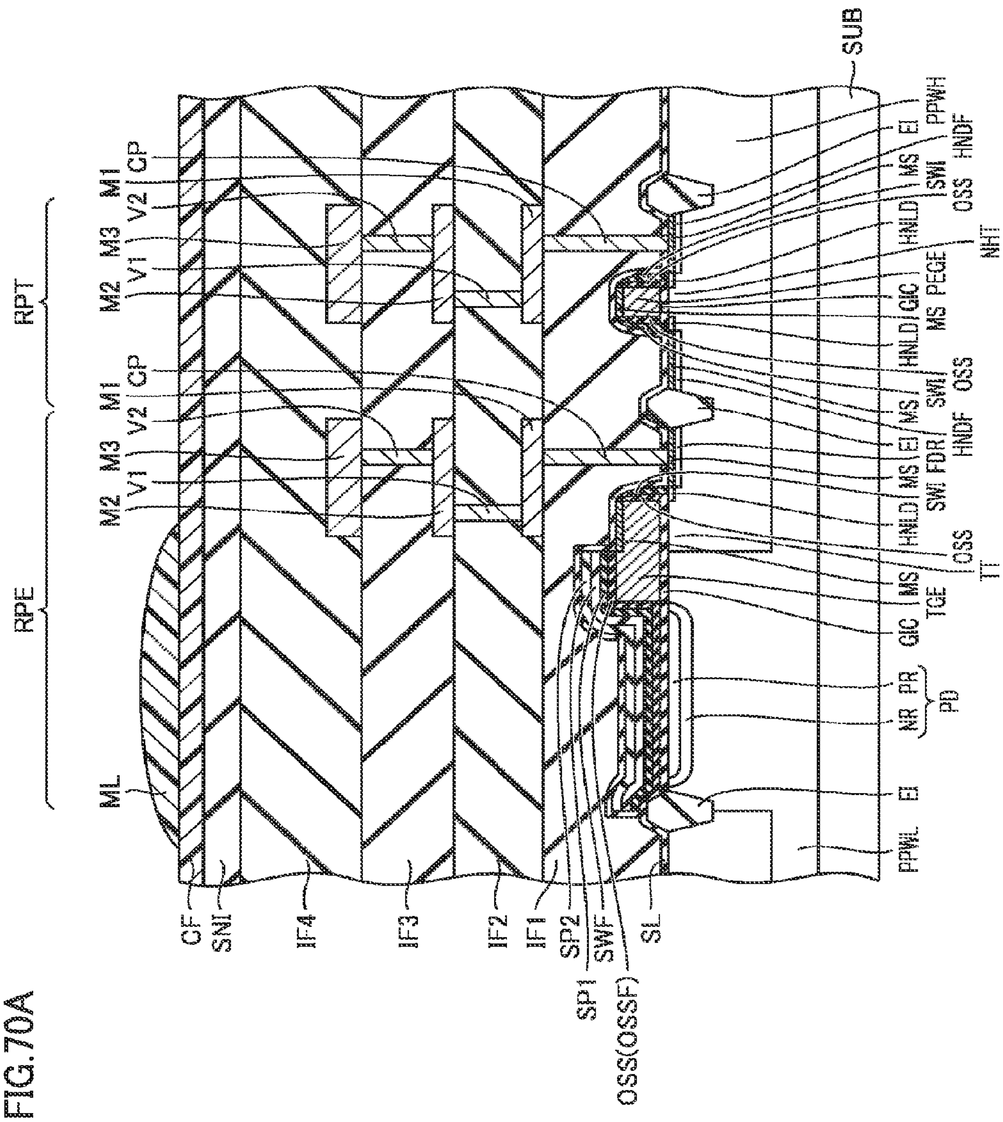

FIG. 70A is a cross sectional view of the pixel region and the like to show a step performed in the embodiment after the steps shown in FIG. 69A to FIG. 69C.

Figure 70B:
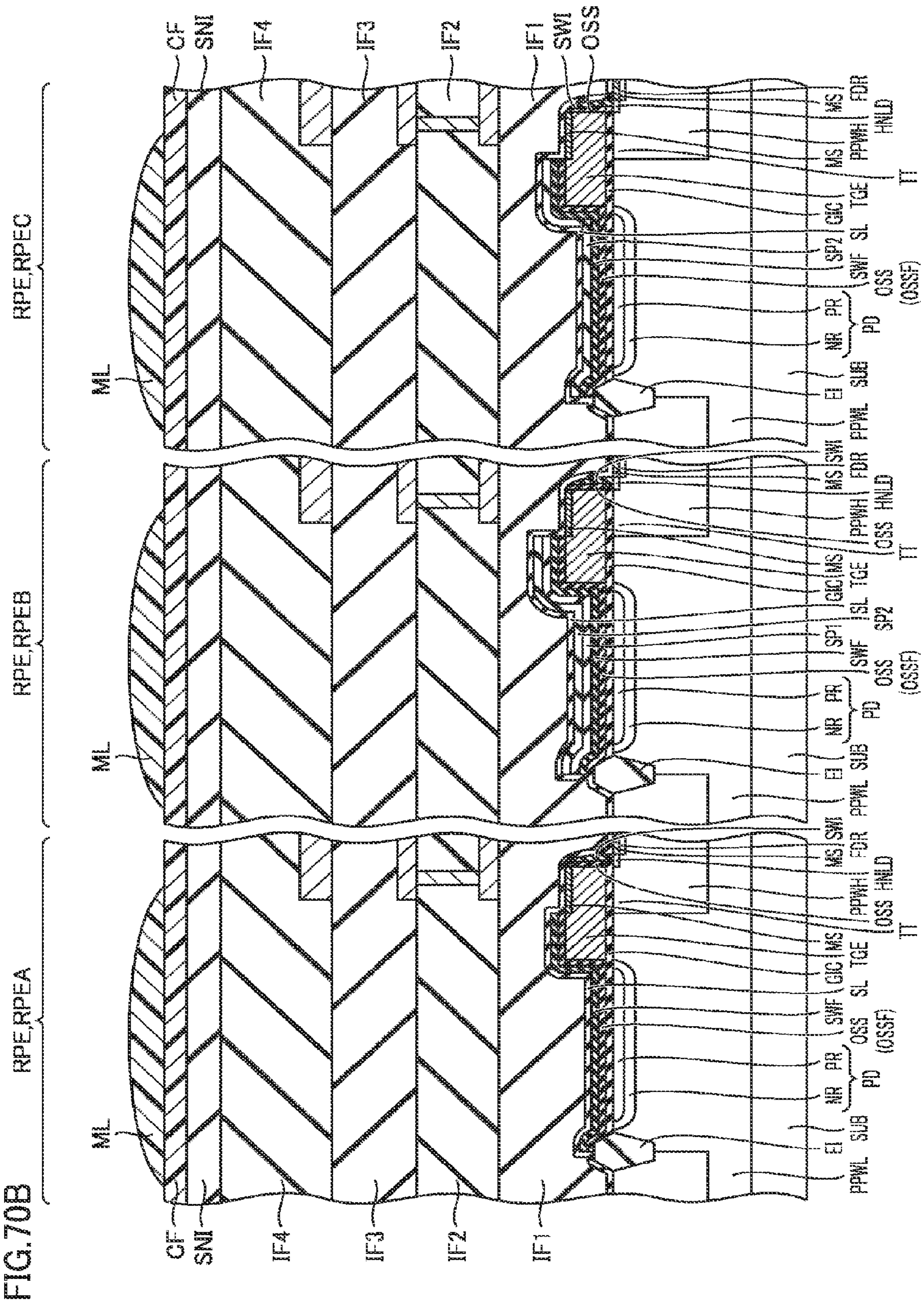

FIG. 70B is a cross sectional view of each pixel region to show a step performed in the embodiment after the steps shown in FIG. 69A to FIG. 69C.

Figure 70C:
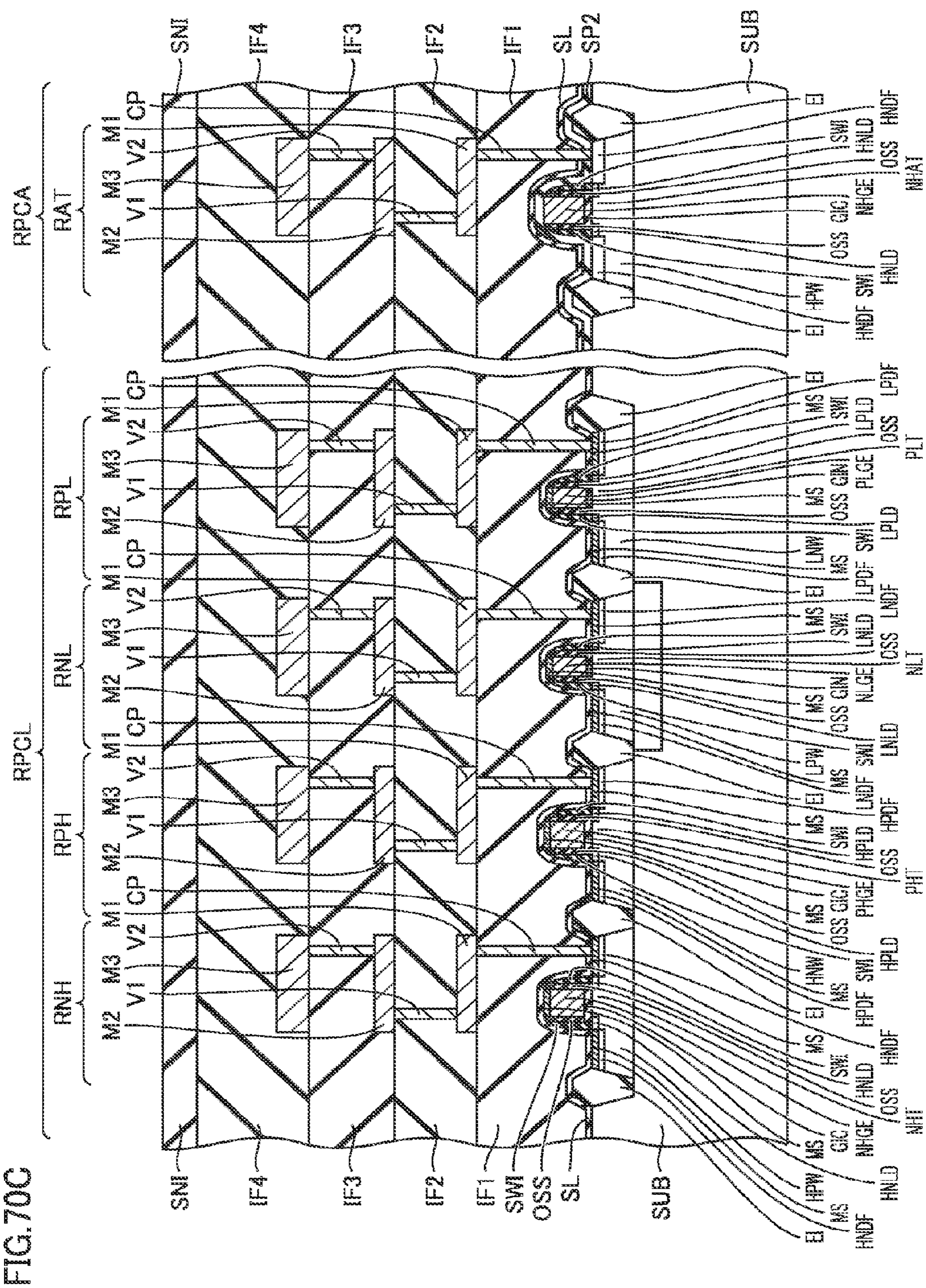

FIG. 70C is a cross sectional view of the peripheral region to show a step performed in the embodiment after the steps shown in FIG. 69A to FIG. 69C.

Figure 71:
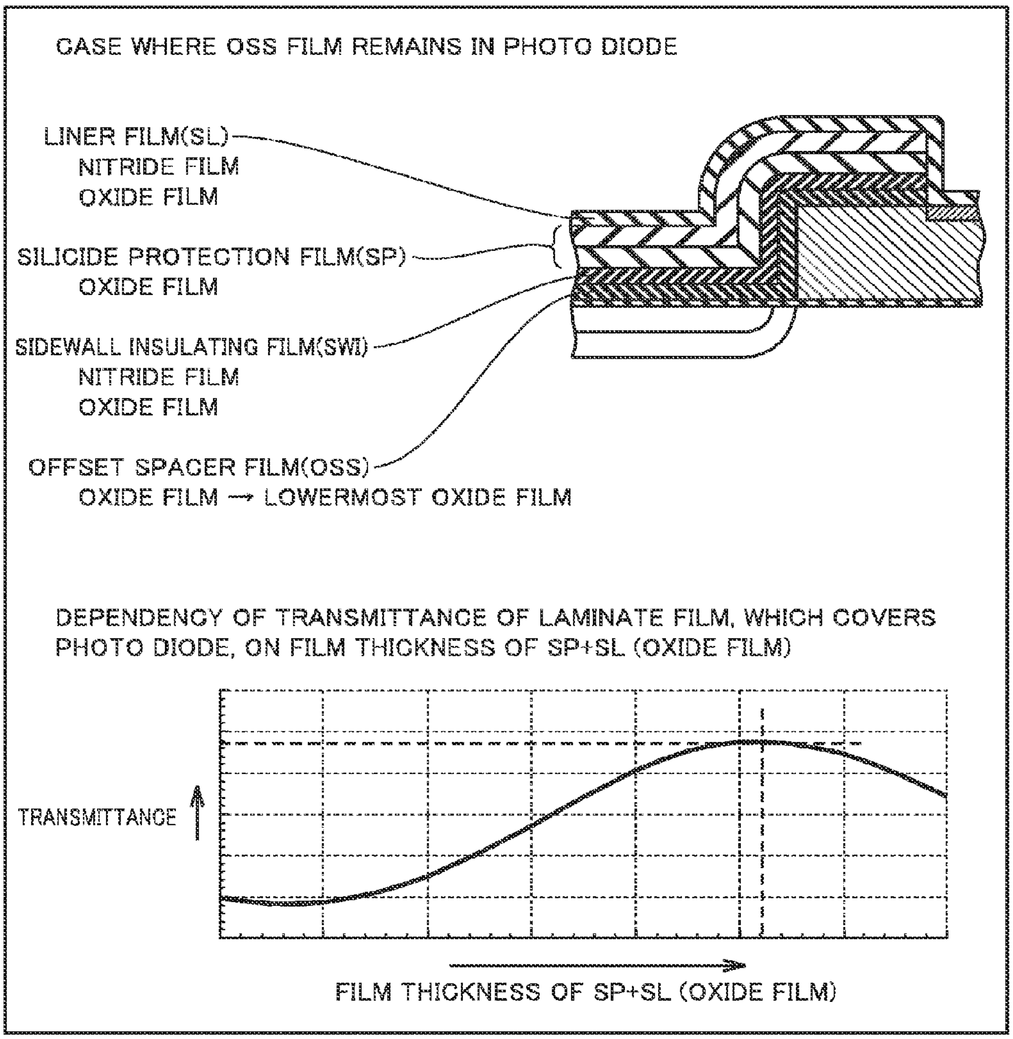

FIG. 71 illustrates functions and effects of a silicide protection film and the like in a pixel region an the image capturing device in a third or fourth embodiment.

Figure 72A:
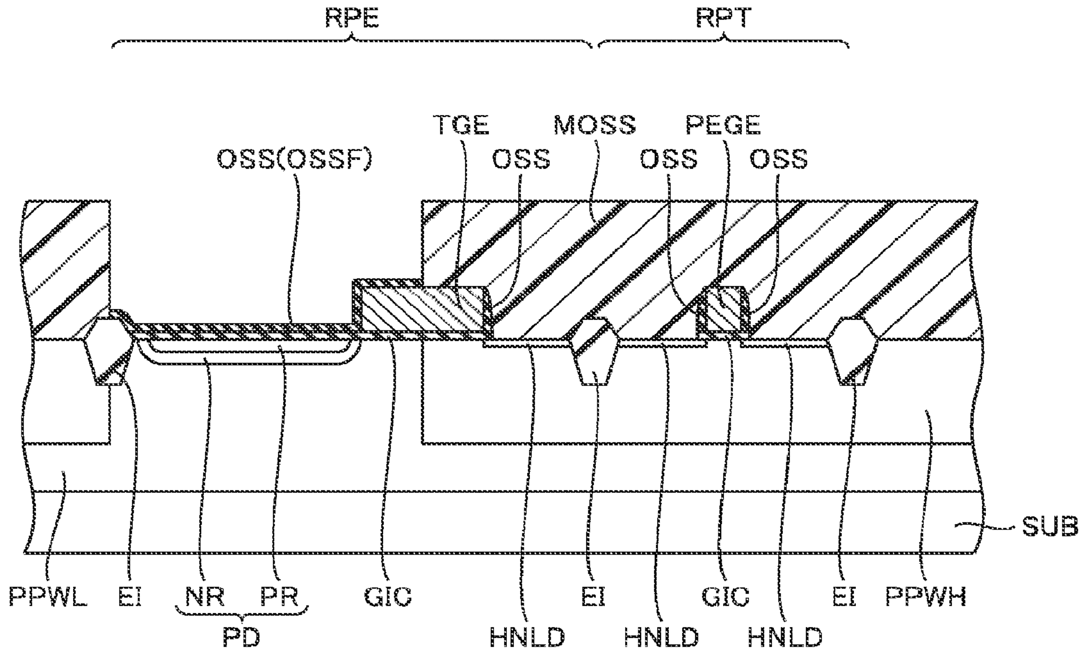

FIG. 72A is a cross sectional view of a pixel region and the like to show one step of a method for manufacturing an image capturing device according to a fifth embodiment.

Figure 72B:
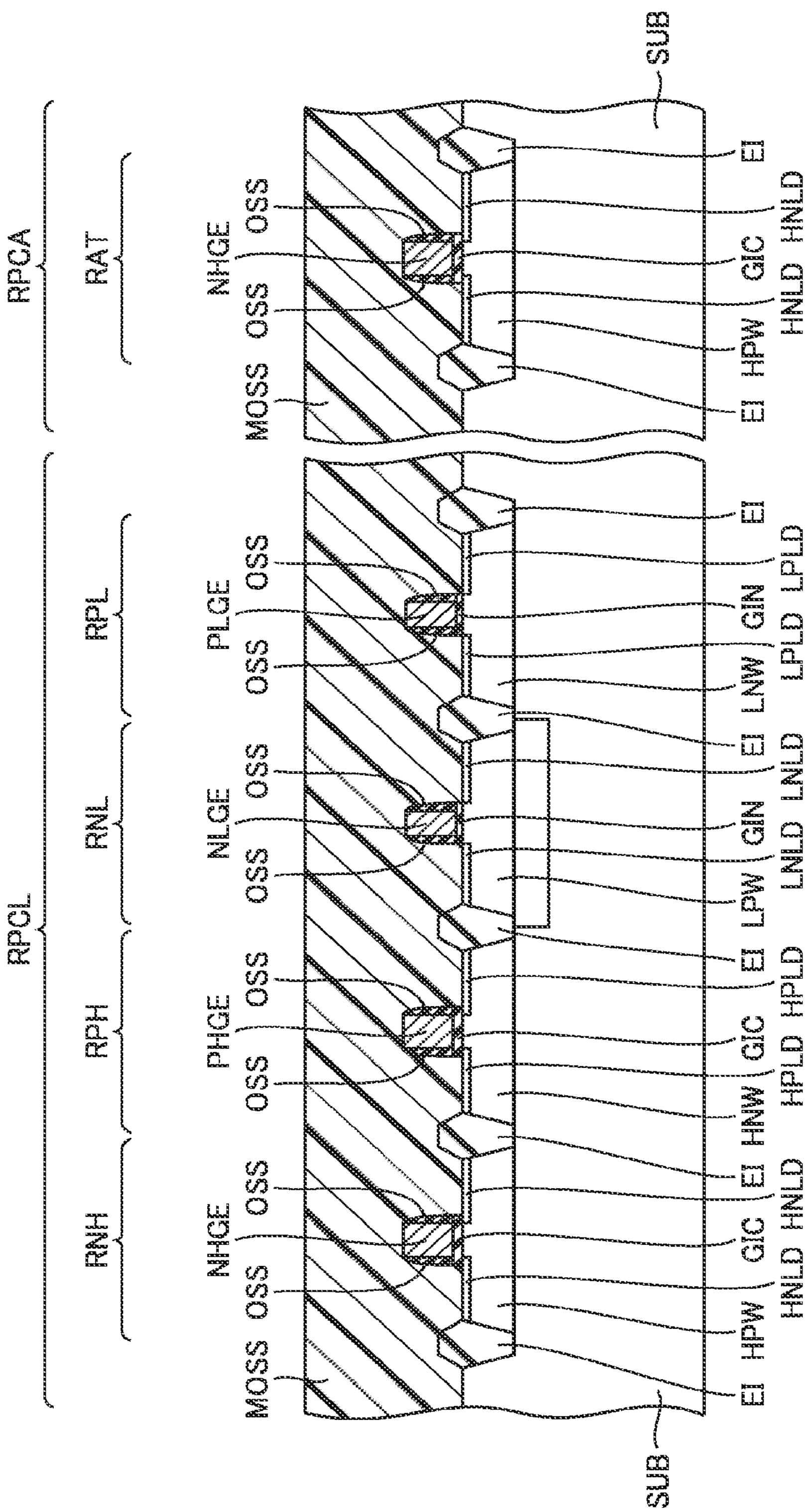

FIG. 72B is a cross sectional view of the peripheral region to show one step of the method for manufacturing the image capturing device according to the fifth embodiment.

Figure 73:
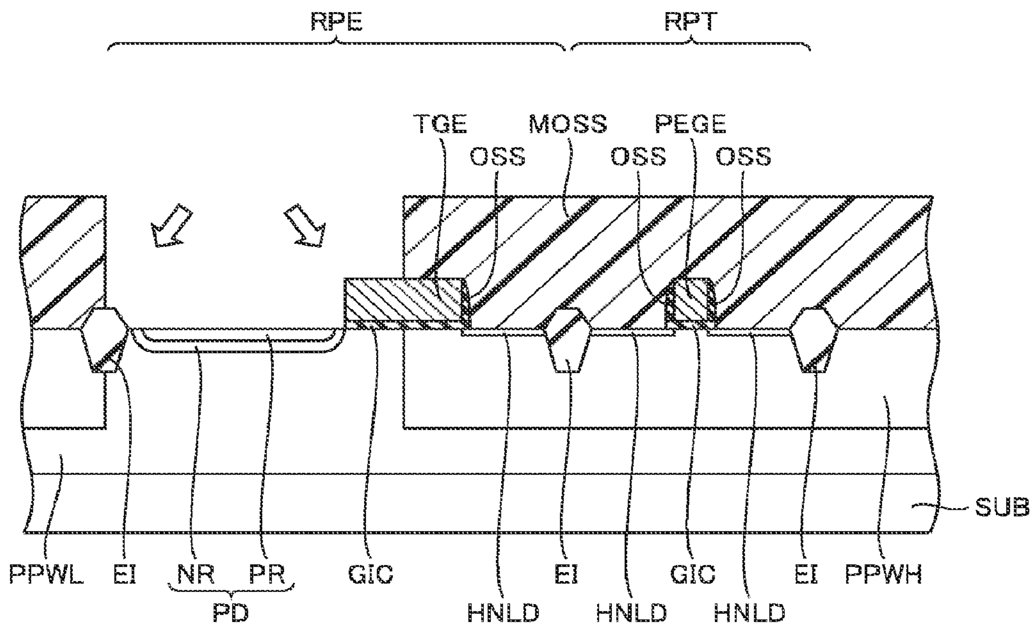

FIG. 73 is a cross sectional view of the pixel region and the like to show a step performed in the embodiment after the steps shown in FIG. 72A and FIG. 72B.

Figure 74A:
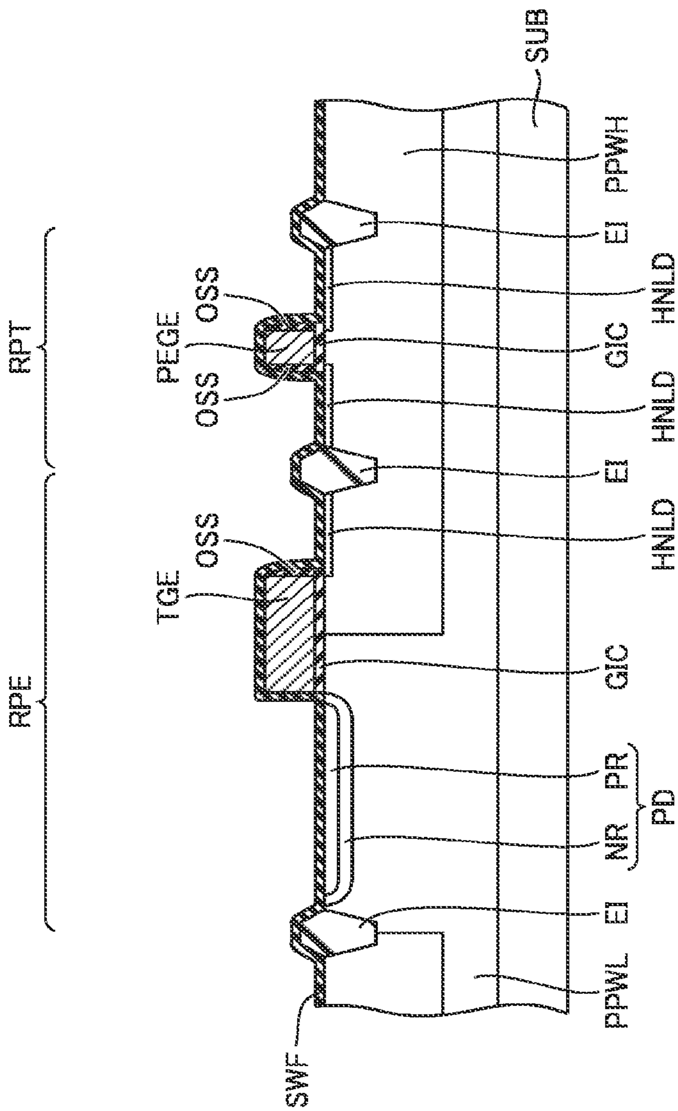

FIG. 74A is a cross sectional view of the pixel region and the like to show a step performed in the embodiment after the step shown in FIG. 73.

Figure 74B:
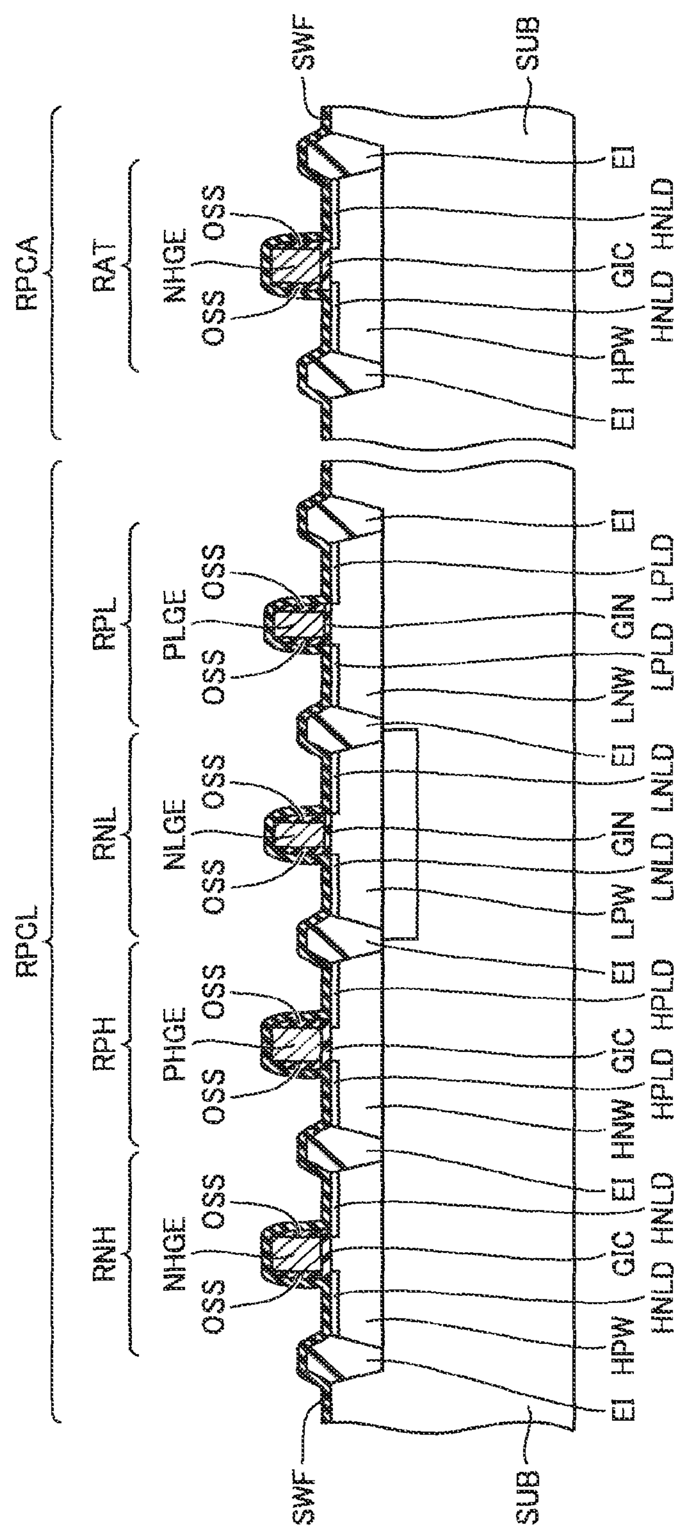

FIG. 74B is a cross sectional view of the peripheral region to show a step performed in the embodiment after the step shown in FIG. 73.

Figure 75A:
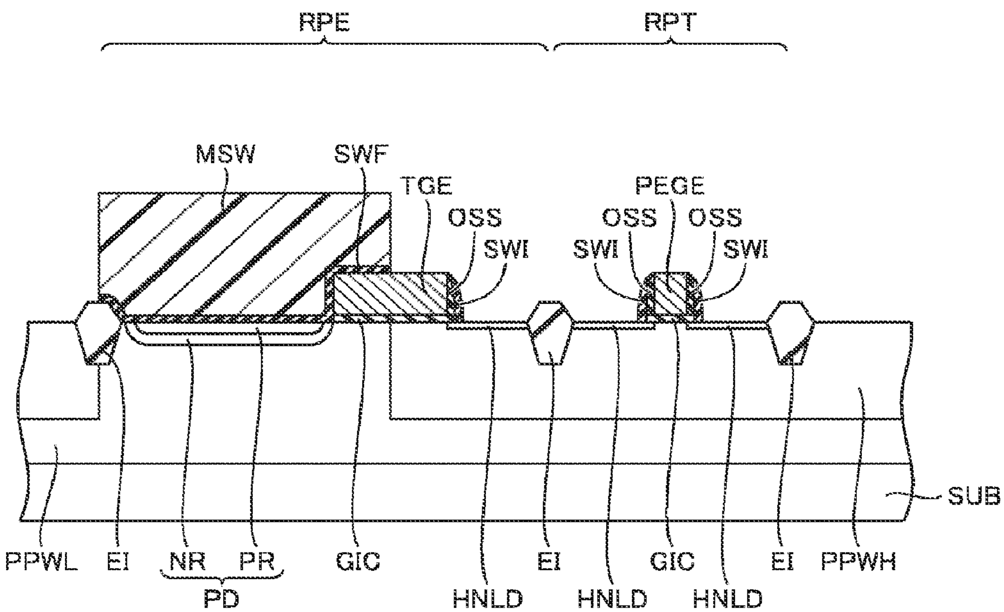

FIG. 75A is a cross sectional view of the pixel region and the like to show a step performed in the embodiment after the steps shown in FIG. 74A and FIG. 74B.

Figure 75B:
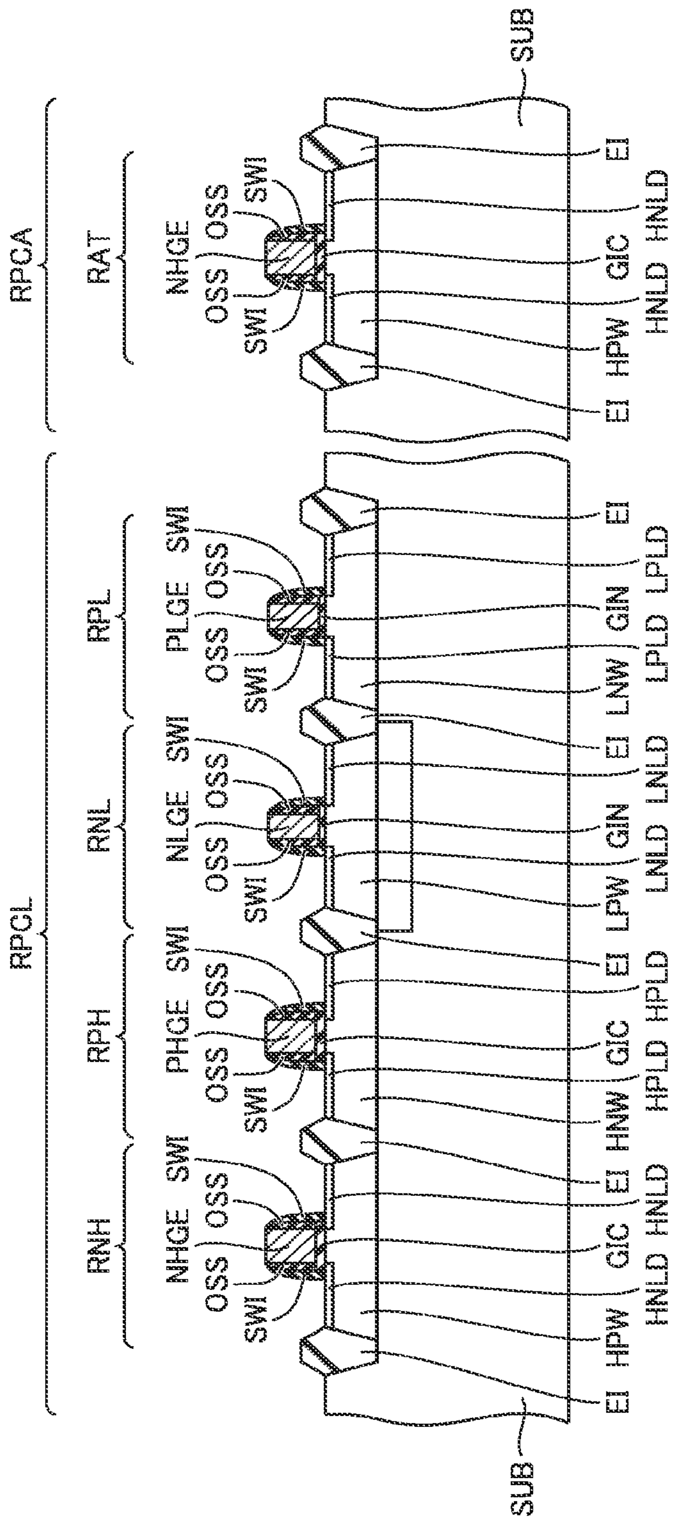

FIG. 75B is a cross sectional view of the peripheral region to show a step performed in the embodiment after the steps shown in FIG. 74A and FIG. 74B.

Figure 76A:
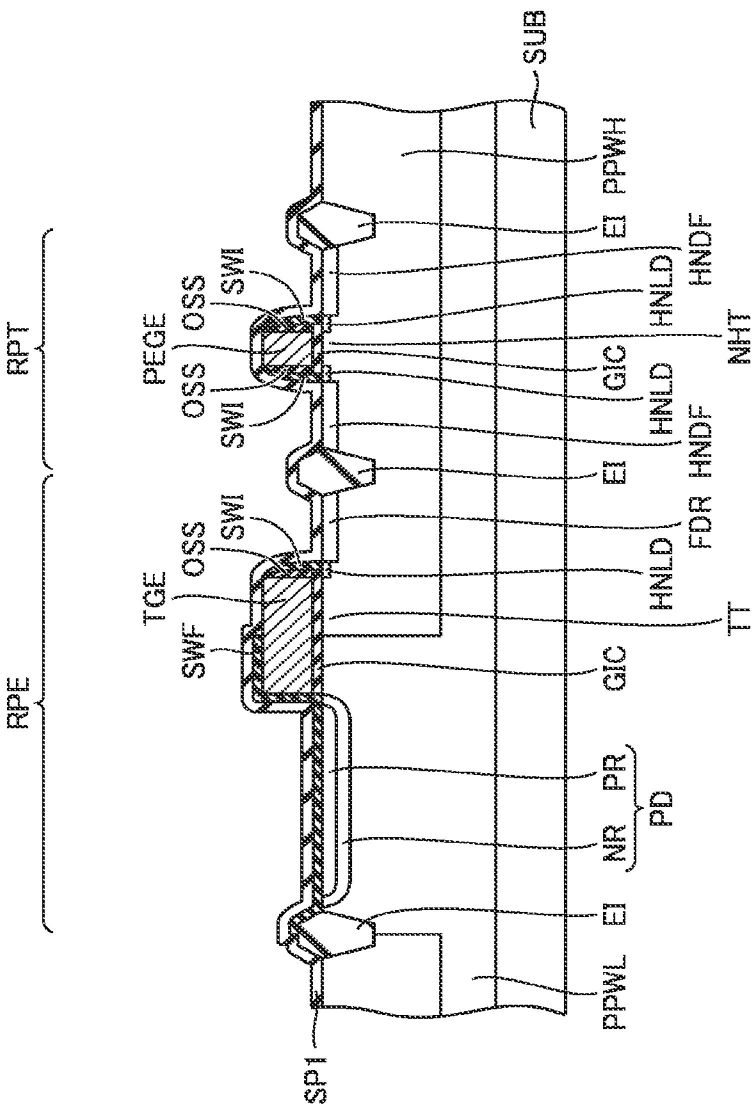

FIG. 76A is a cross sectional view of the pixel region and the like to show a step performed in the embodiment after the steps shown in FIG. 75A and FIG. 75B.

Figure 76B:
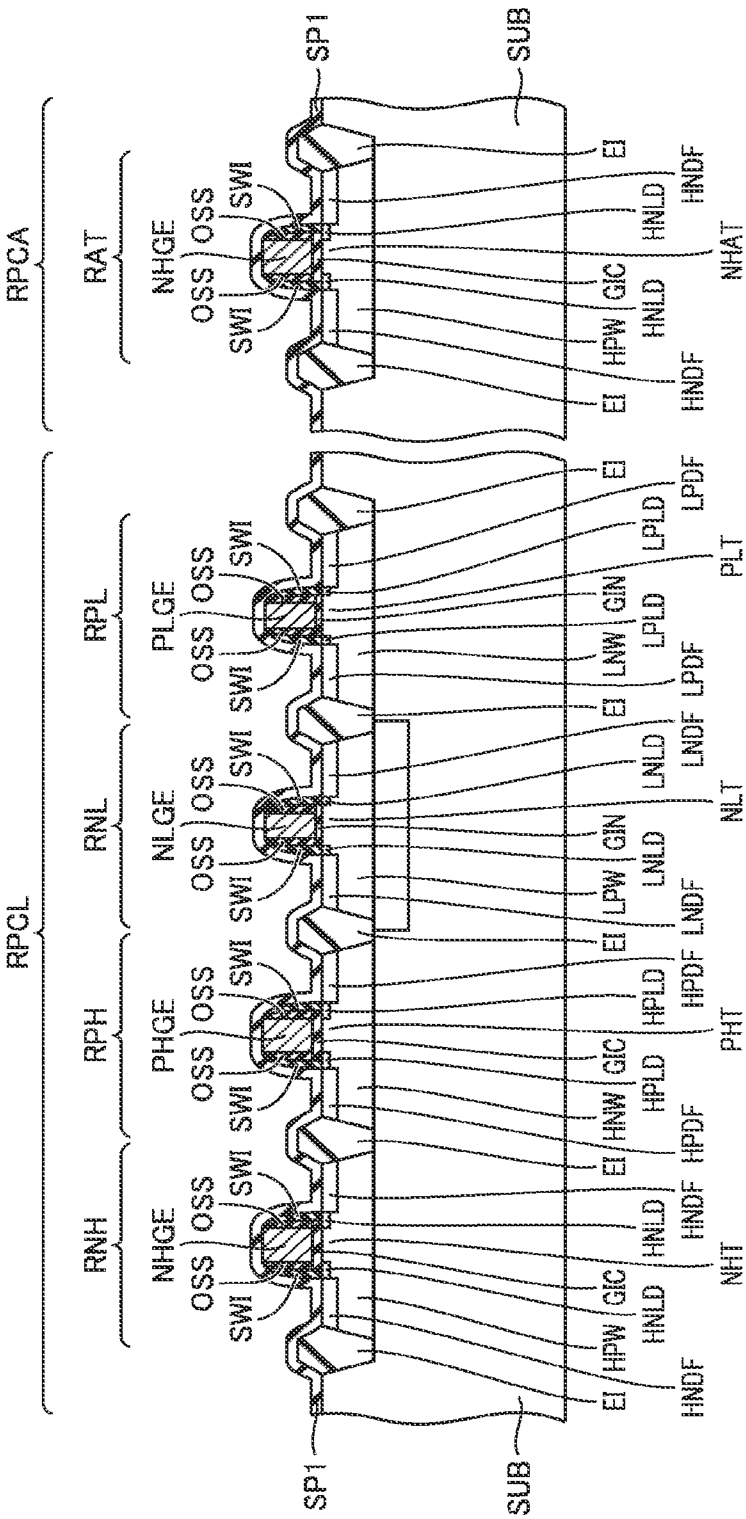

FIG. 76B is a cross sectional view of the peripheral region to show a step performed in the embodiment after the steps shown in FIG. 75A and FIG. 75B.

Figure 77A:
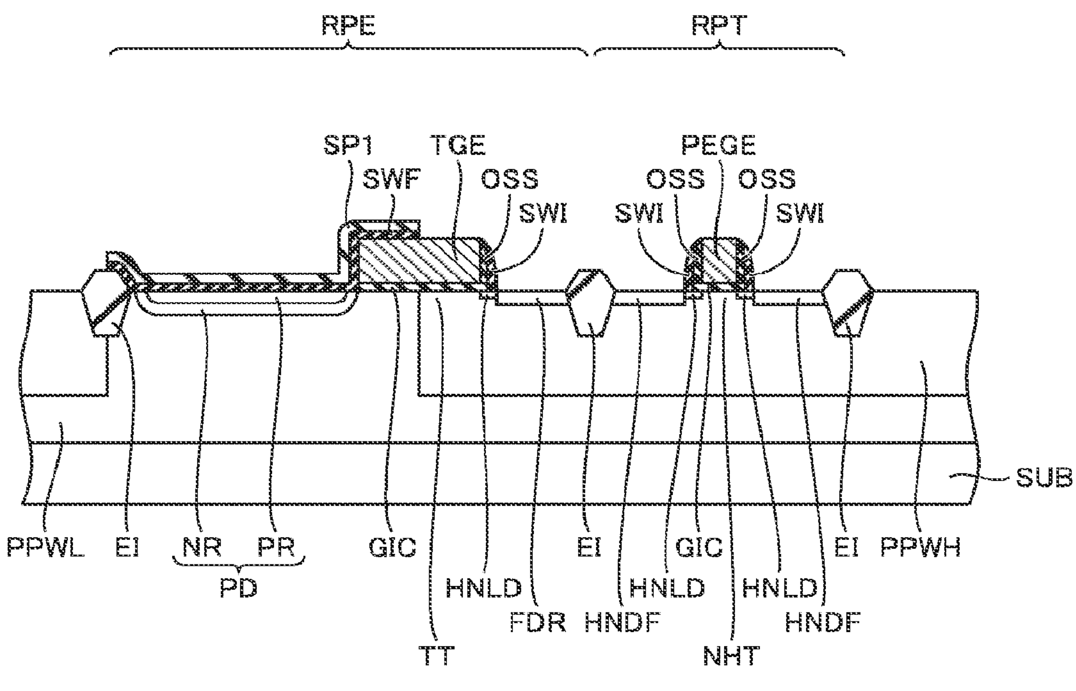

FIG. 77A is a cross sectional view of the pixel region and the like to show a step performed in the embodiment after the steps shown in FIG. 76A and FIG. 76B.

Figure 77B:
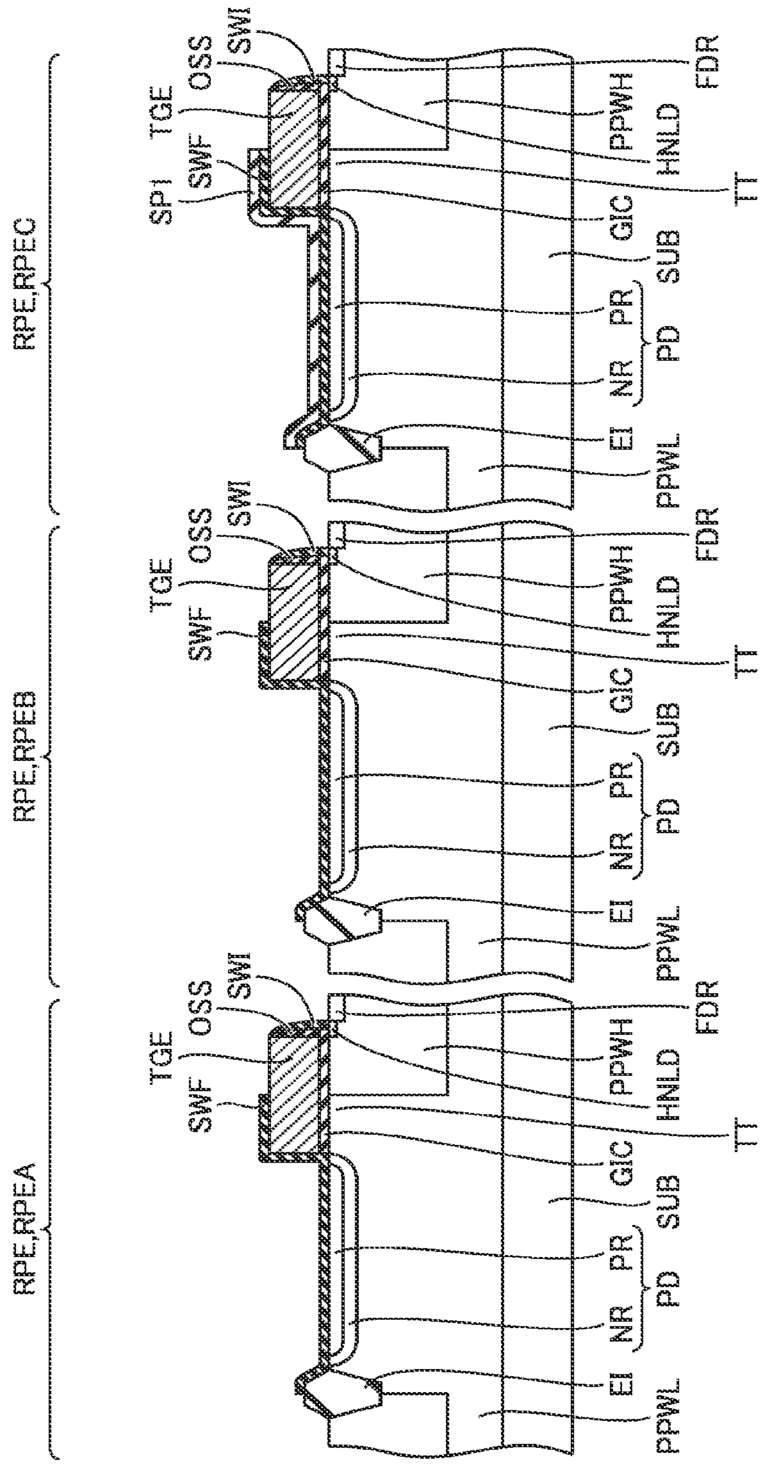

FIG. 77B is a cross sectional view of each pixel region to show a step performed in the embodiment after the steps shown in FIG. 76A and FIG. 76B.

Figure 77C:
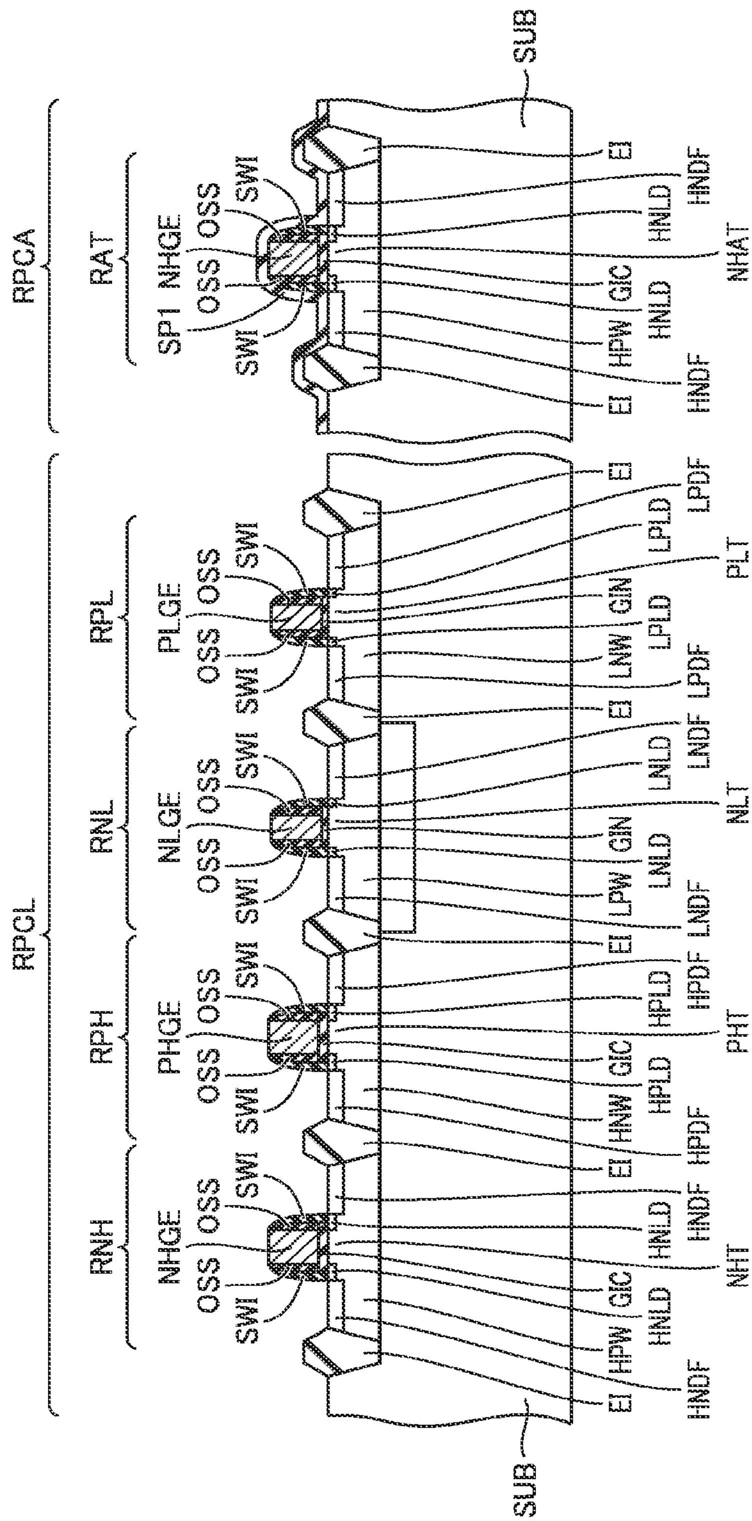

FIG. 77C is a cross sectional view of the peripheral region to show a step performed in the embodiment after the steps shown in FIG. 76A and FIG. 76B.

Figure 78A:
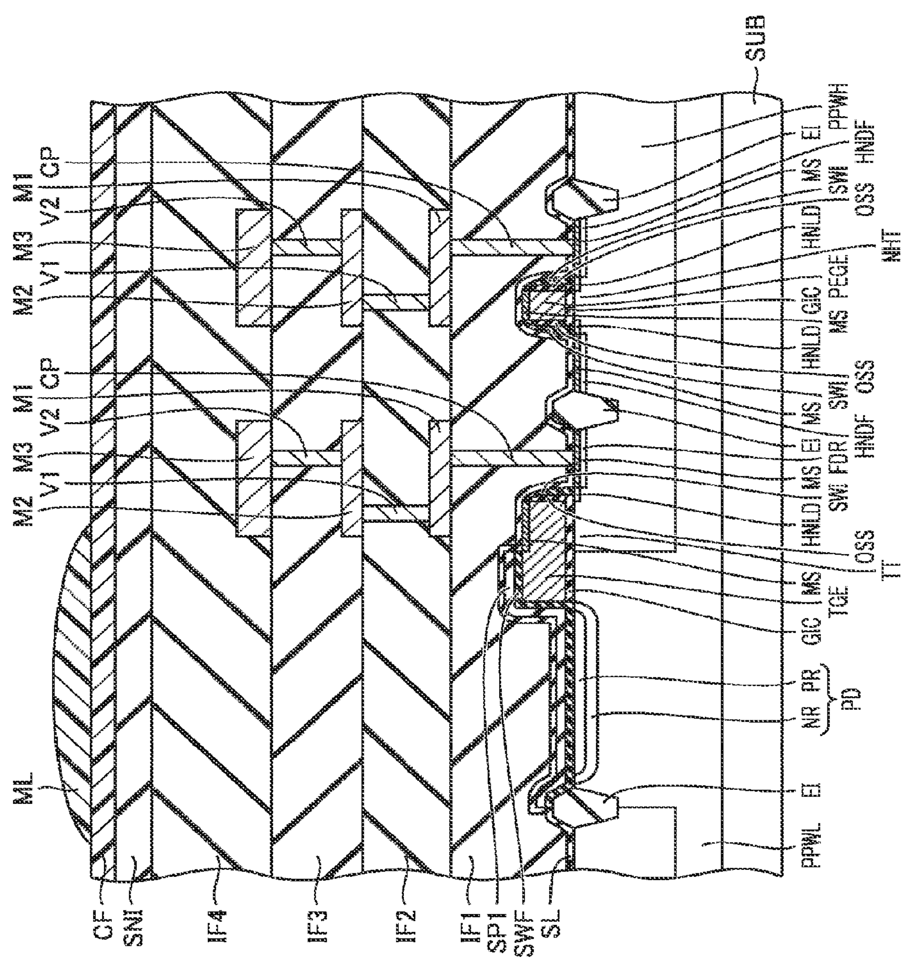

FIG. 78A is a cross sectional view of the pixel region and the like to show a step performed in the embodiment after the steps shown in FIG. 77A to FIG. 77C.

Figure 78B:
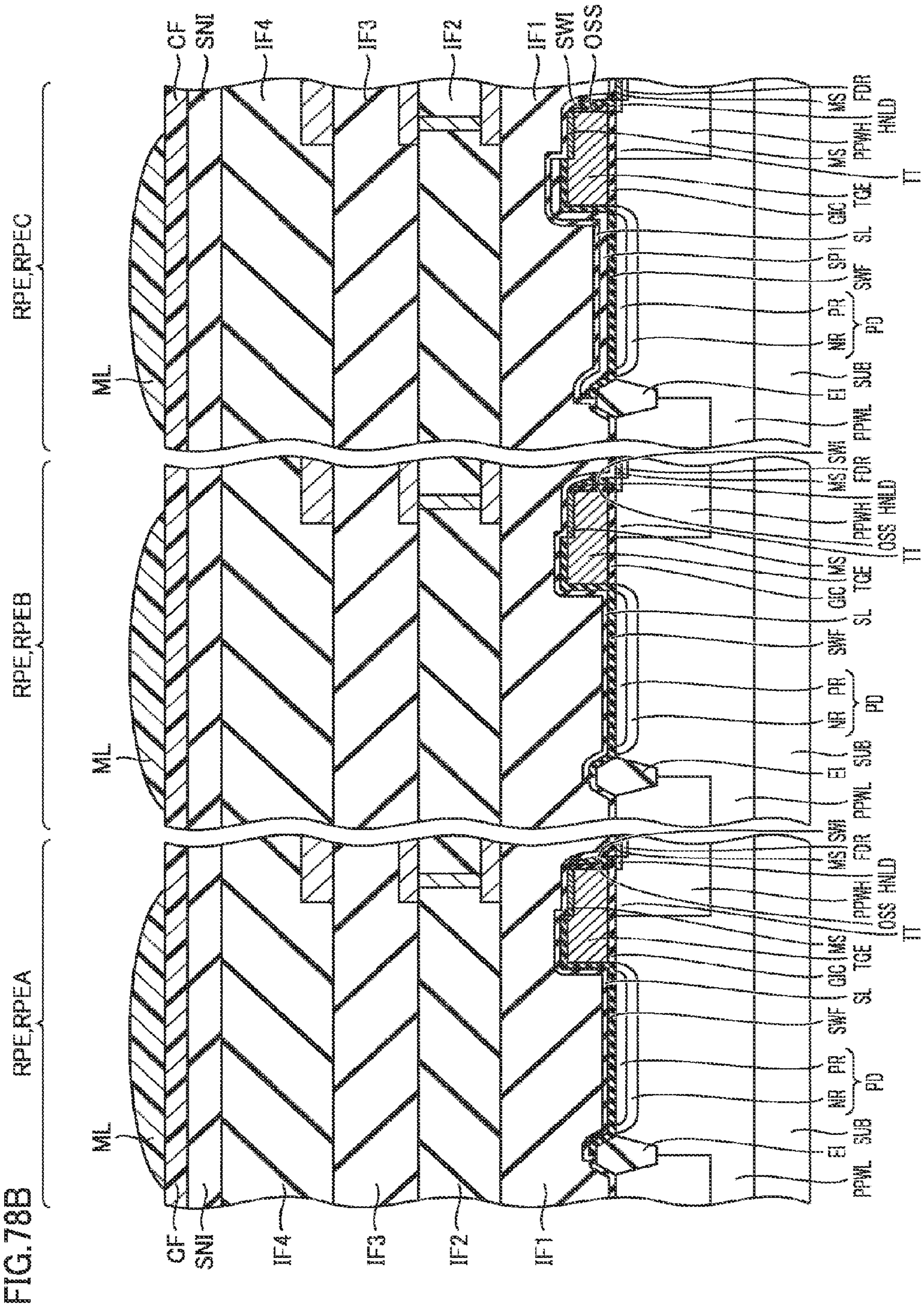

FIG. 78B is a cross sectional view of each pixel region to show a step performed in the embodiment after the steps shown in FIG. 77A to FIG. 77C.

Figure 78C:
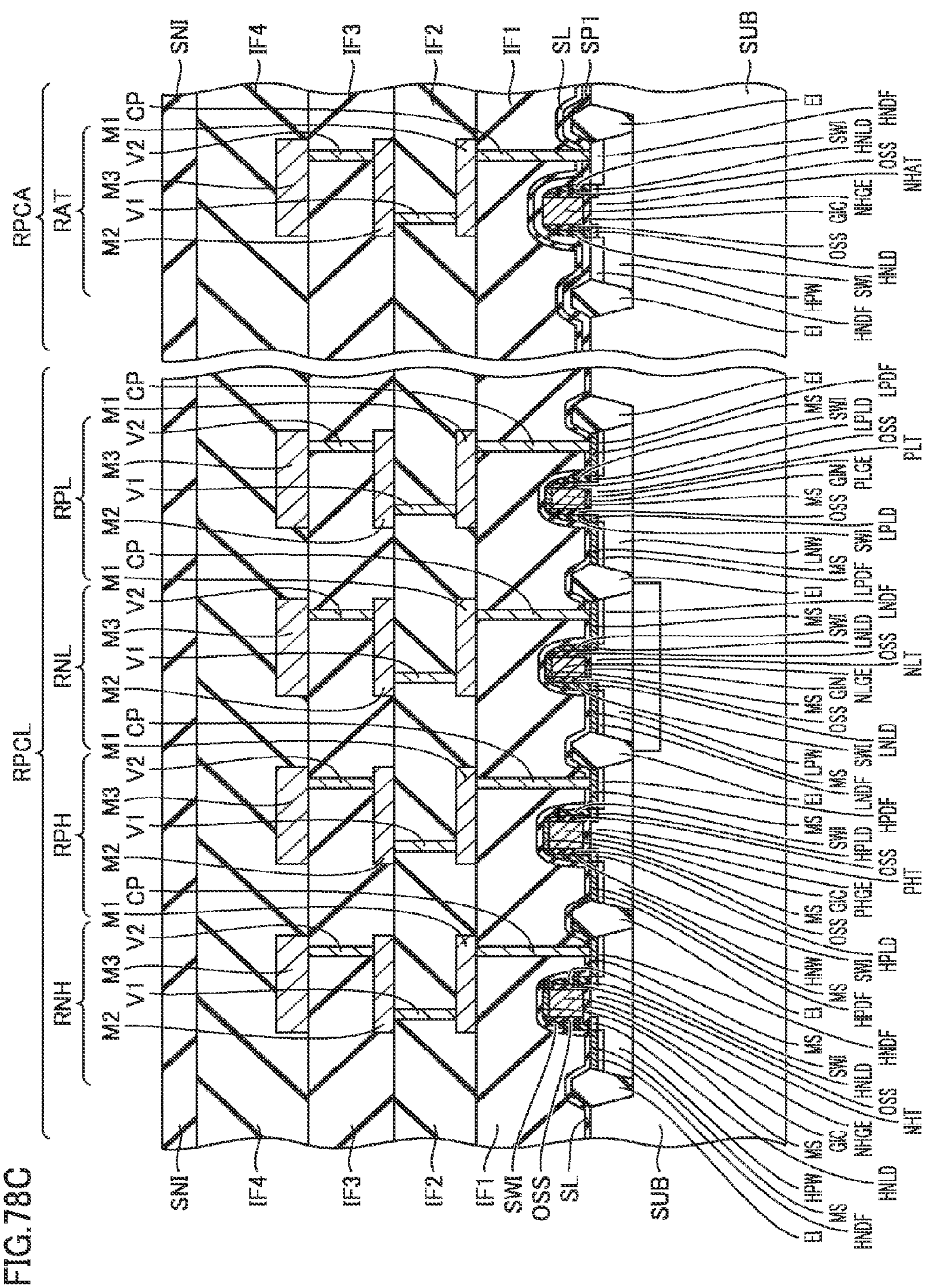

FIG. 78C is a cross sectional view of the peripheral region to show a step performed in the embodiment after the steps shown in FIG. 77A to FIG. 77C.

Figure 79A:
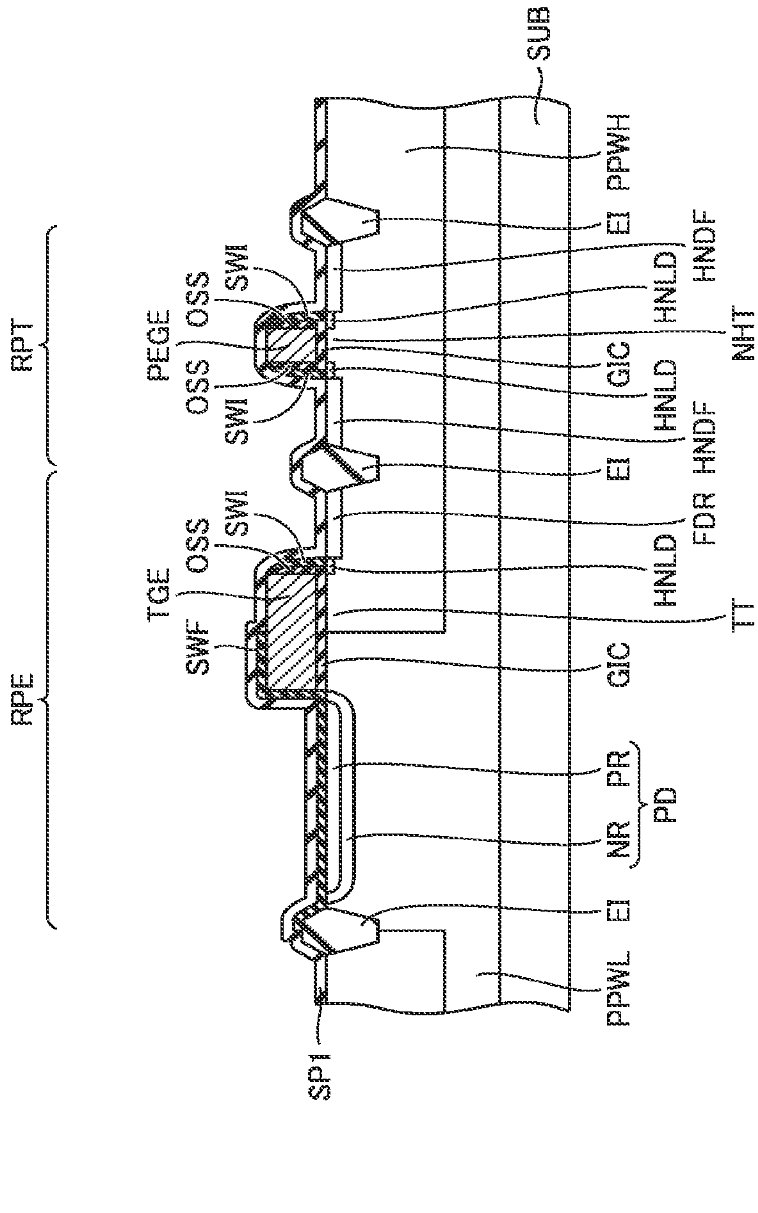

FIG. 79A is a cross sectional view of a pixel region and the like to show one step of a method for manufacturing an image capturing device according to a sixth embodiment.

Figure 79B:
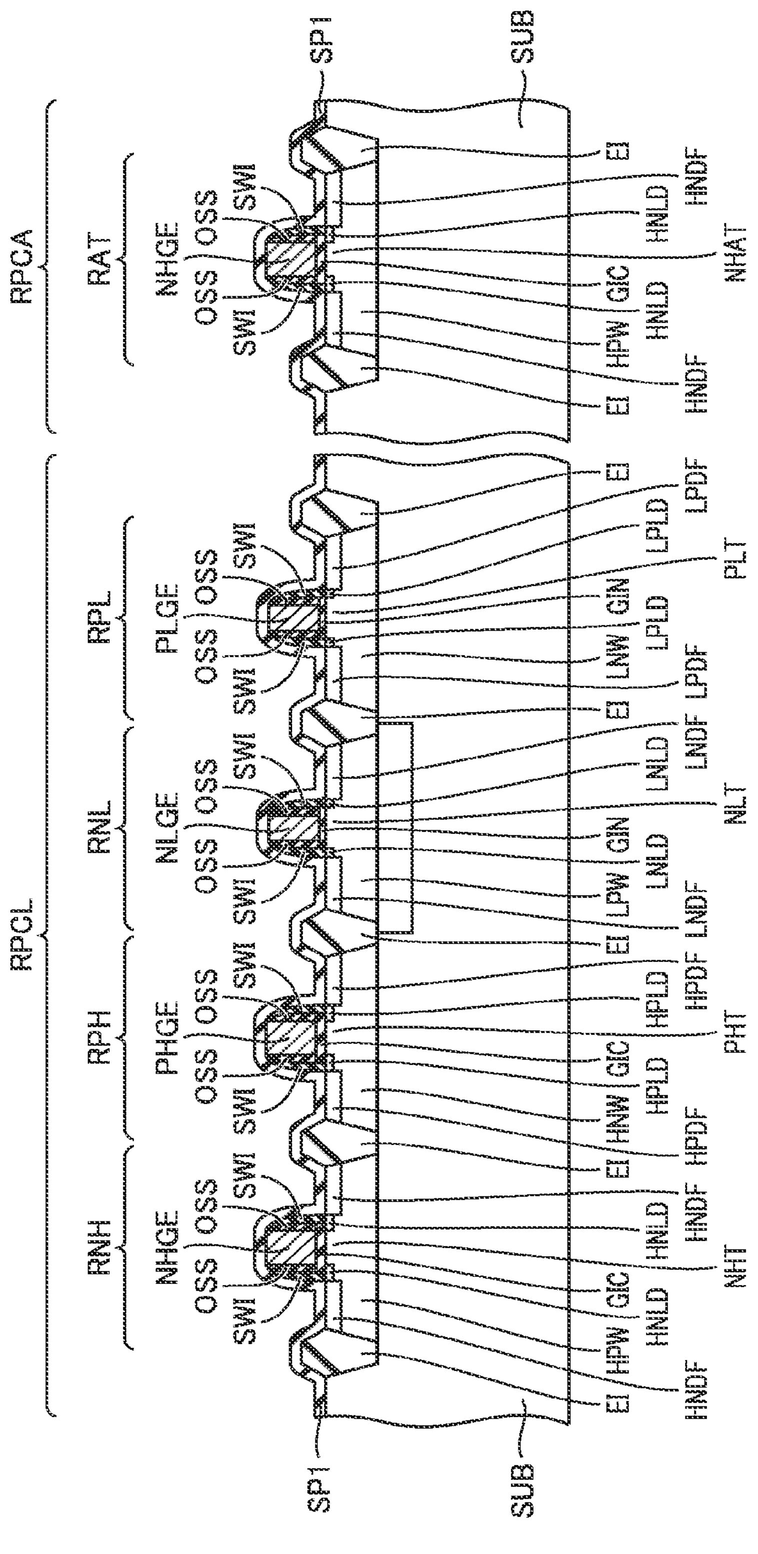

FIG. 79B is a cross sectional view of a peripheral region to show one step of the method for manufacturing the image capturing device according to the sixth embodiment.

Figure 80A:
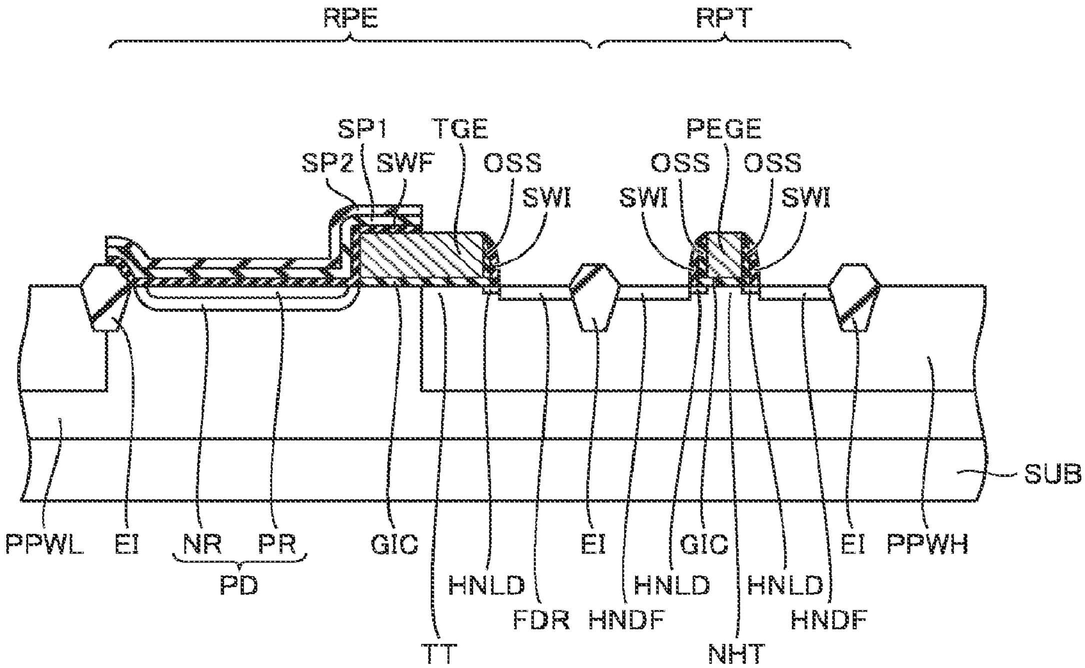

FIG. 80A is a cross sectional view of the pixel region and the like to show a step performed in the embodiment after the steps shown in FIG. 79A and FIG. 79B.

Figure 80B:
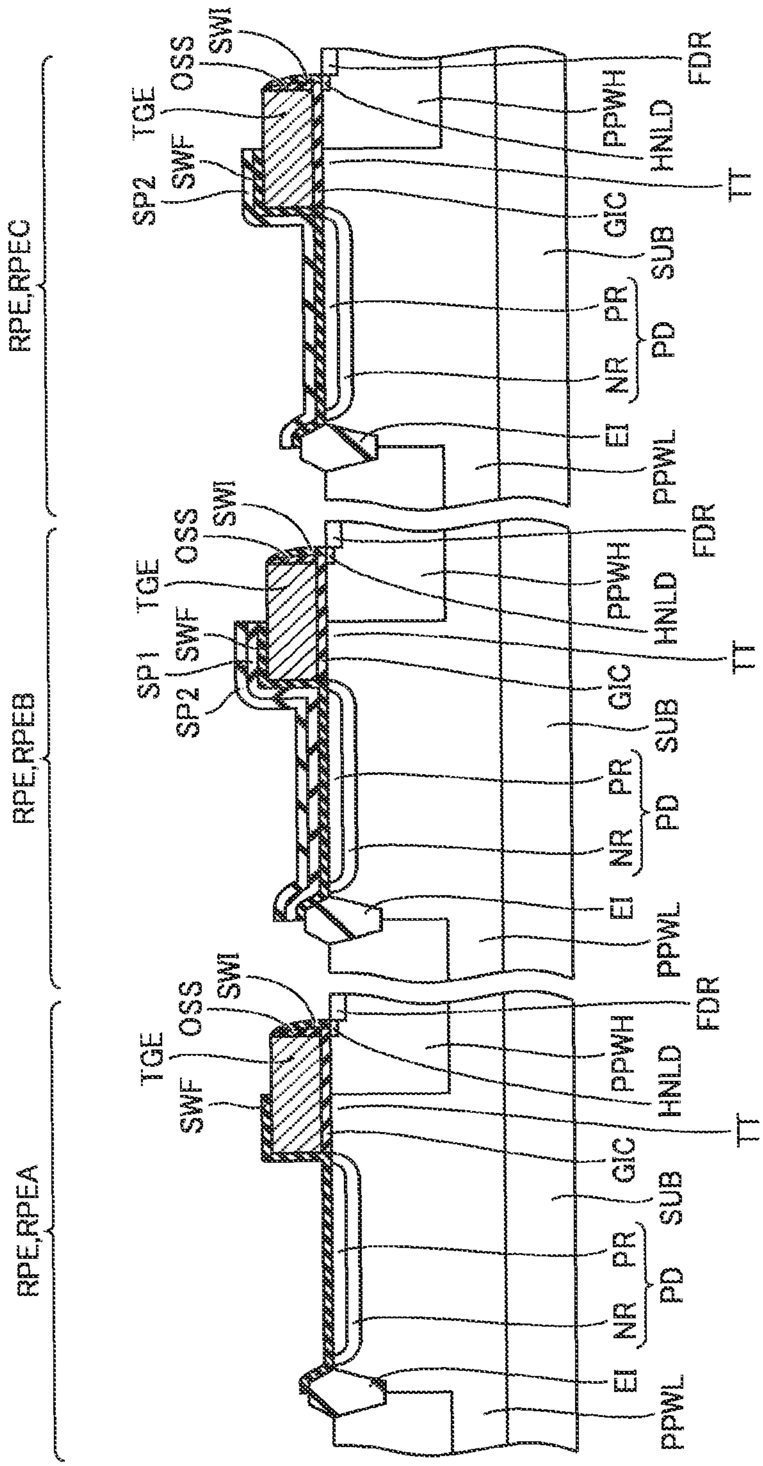

FIG. 80B is a cross sectional view of each pixel region to show a step performed in the embodiment after the steps shown in FIG. 79A and FIG. 79B.

Figure 80C:
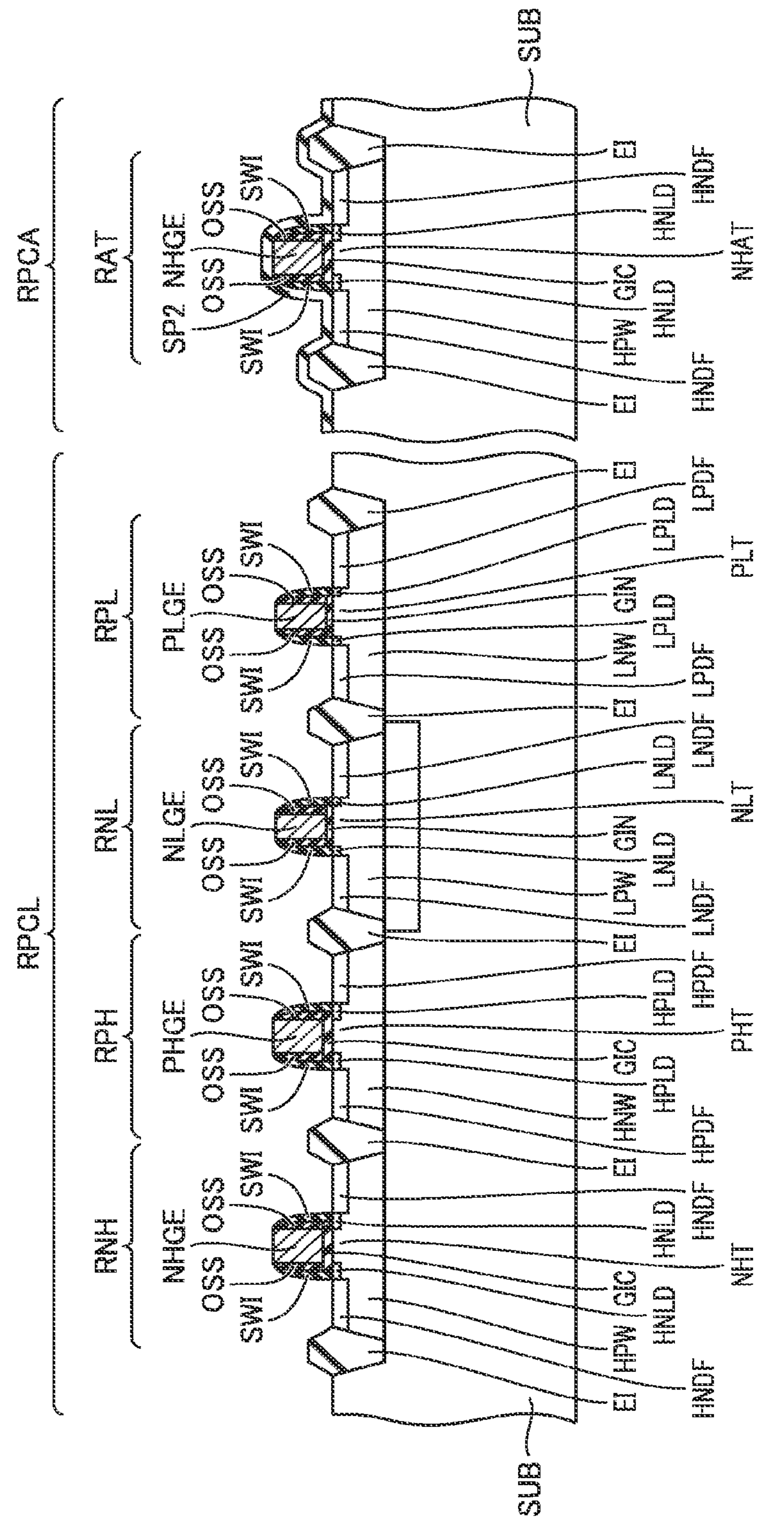

FIG. 80C is a cross sectional view of the peripheral region to show a step performed in the embodiment after the steps shown in FIG. 79A and FIG. 79B.

Figure 81A:
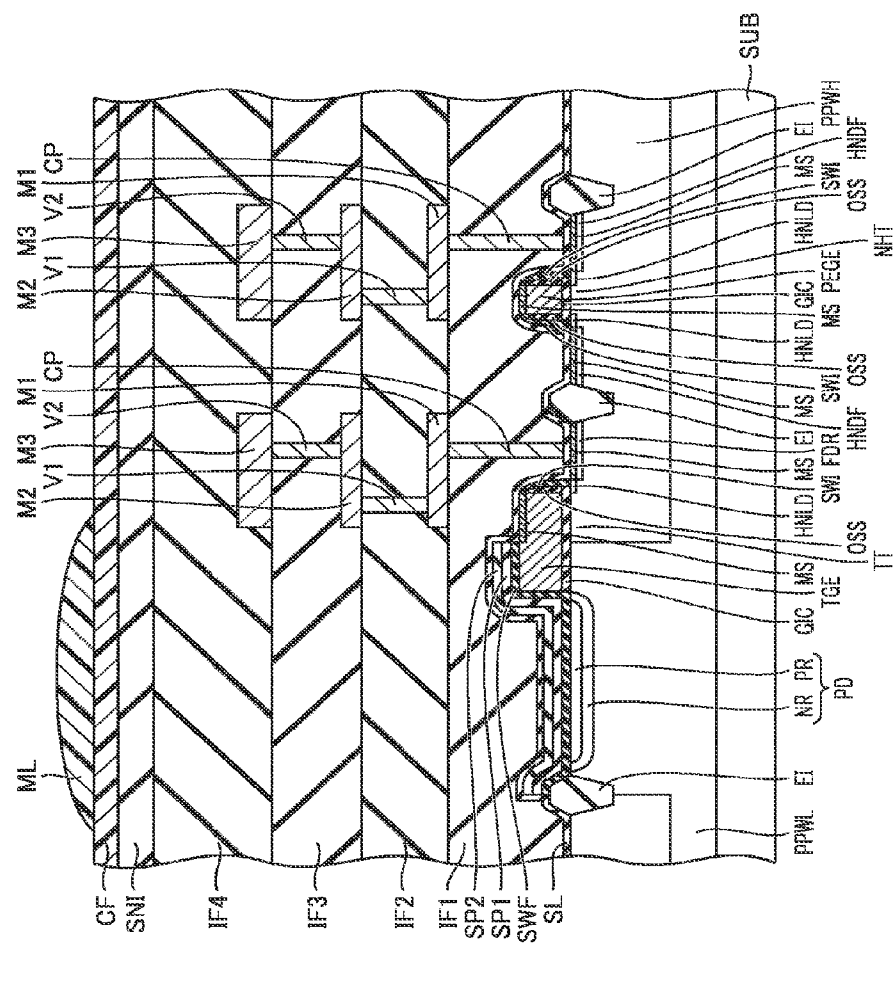

FIG. 81A is a cross sectional view of the pixel region and the like to show a step performed in the embodiment after the steps shown in FIG. 80A to FIG. 80C.

Figure 81B:
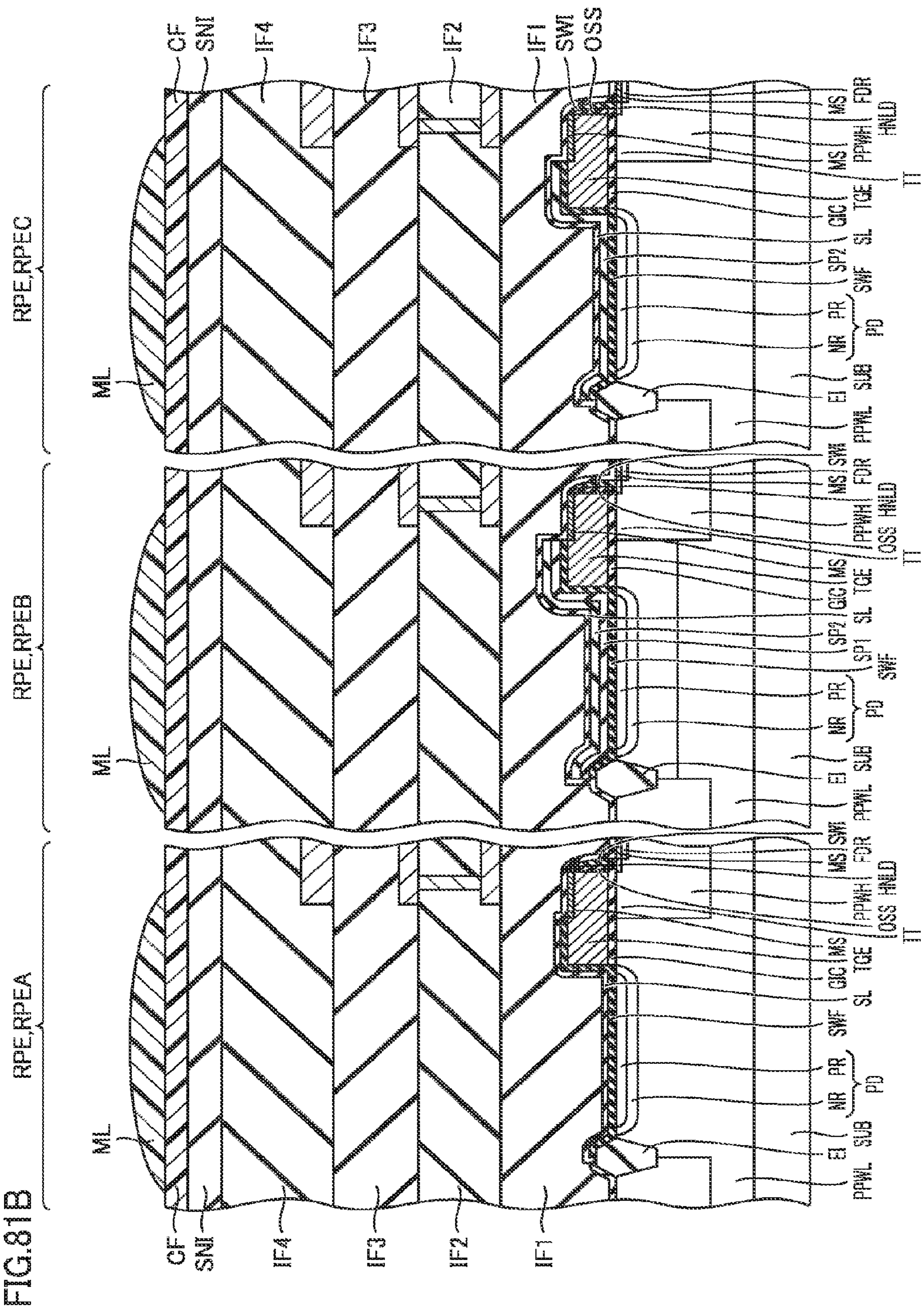

FIG. 81B is a cross sectional view of each pixel region to show a step performed in the embodiment after the steps shown in FIG. 80A to FIG. 80C.

Figure 81C:
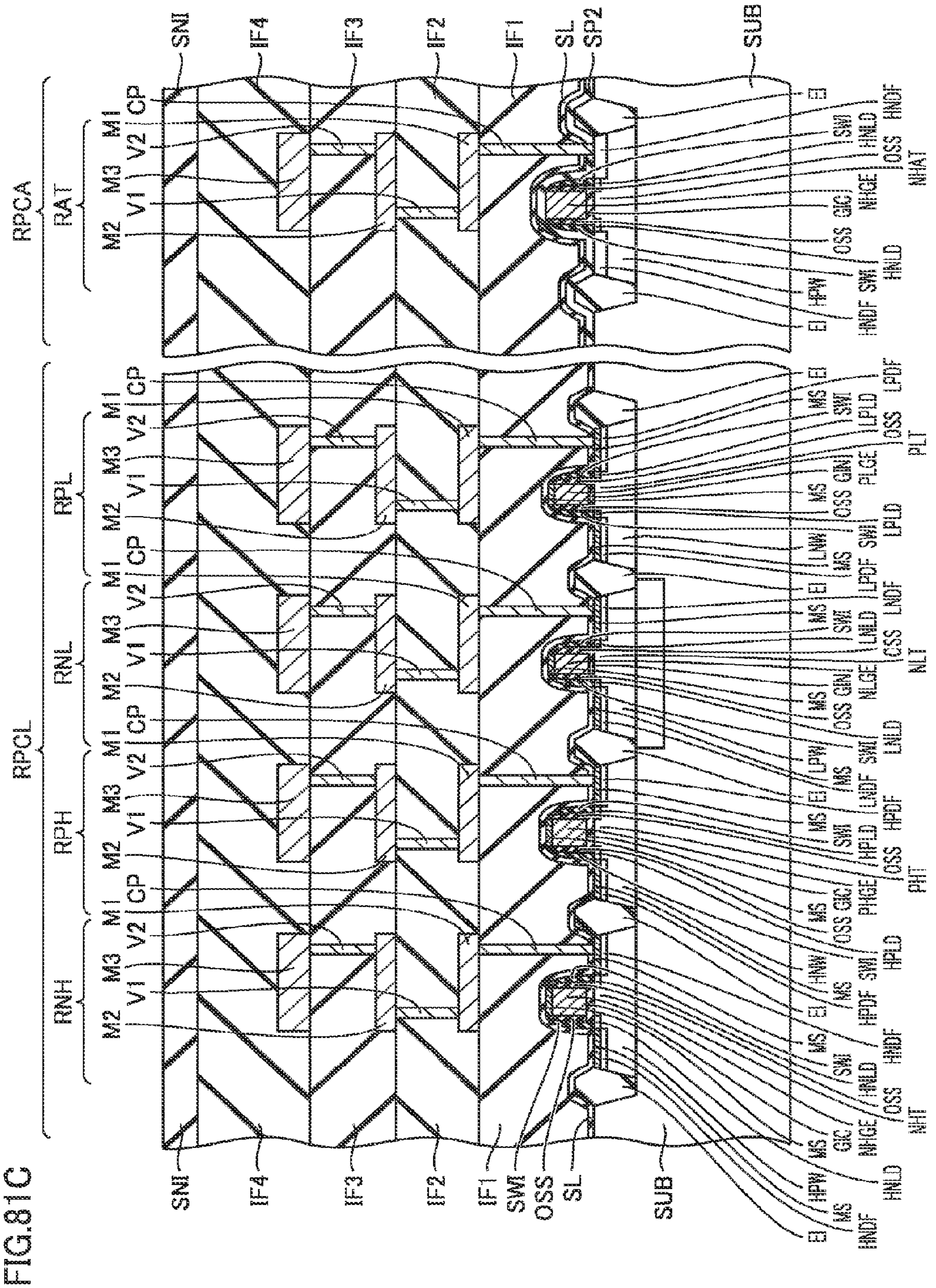

FIG. 81C is a cross sectional view of the peripheral region to show a step performed in the embodiment after the steps shown in FIG. 80A to FIG. 80C.

Figure 82A:
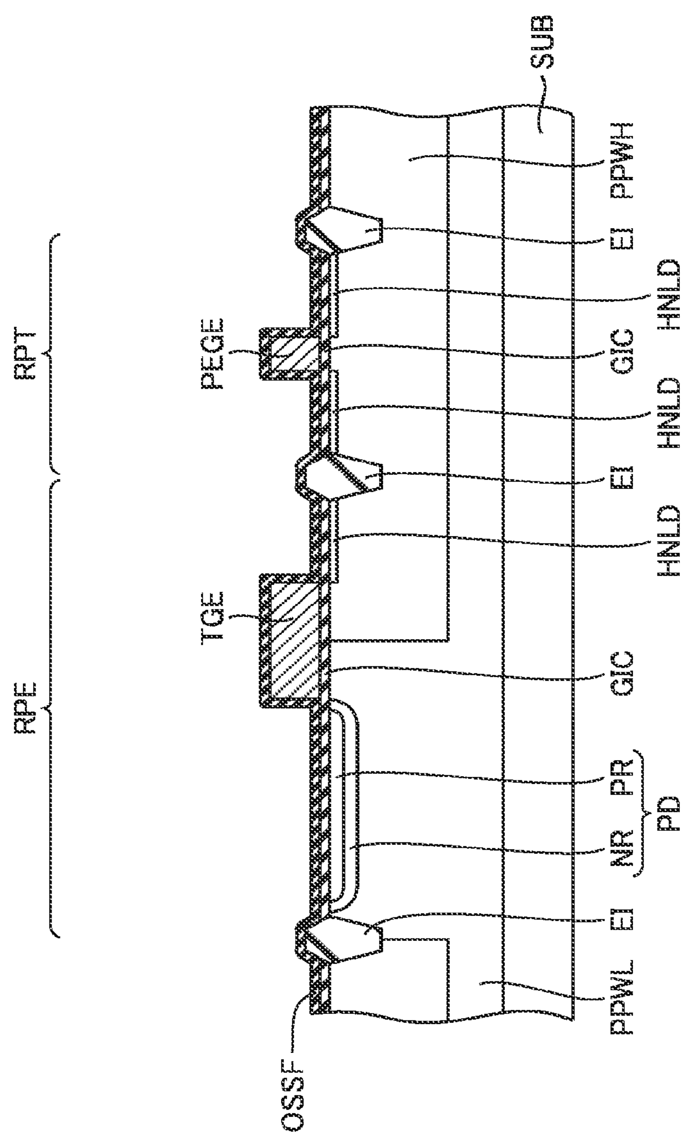

FIG. 82A is a cross sectional view of a pixel region and the like to show one step of a method for manufacturing an image capturing device according to a seventh embodiment.

Figure 82B:
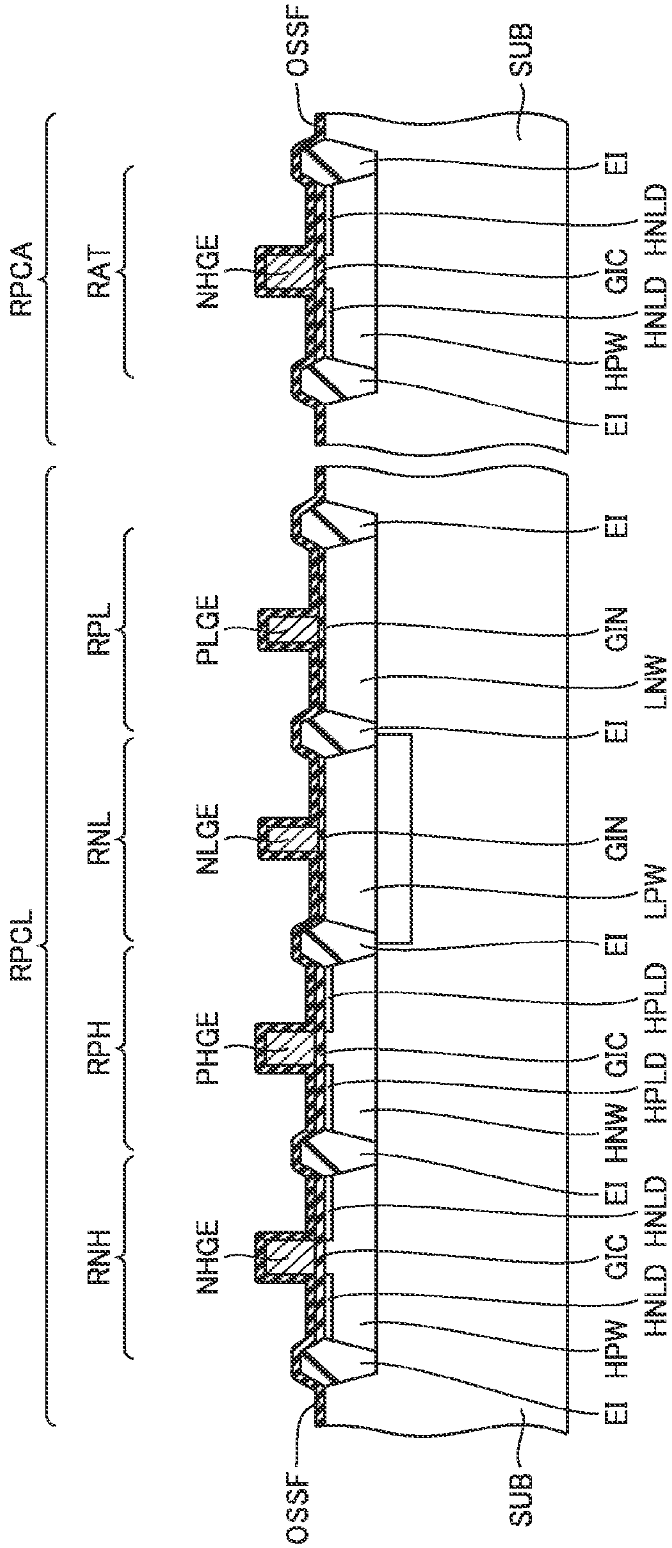

FIG. 82B is a cross sectional view of a peripheral region to show one step of the method for manufacturing the image capturing device according to the seventh embodiment.

Figure 83A:
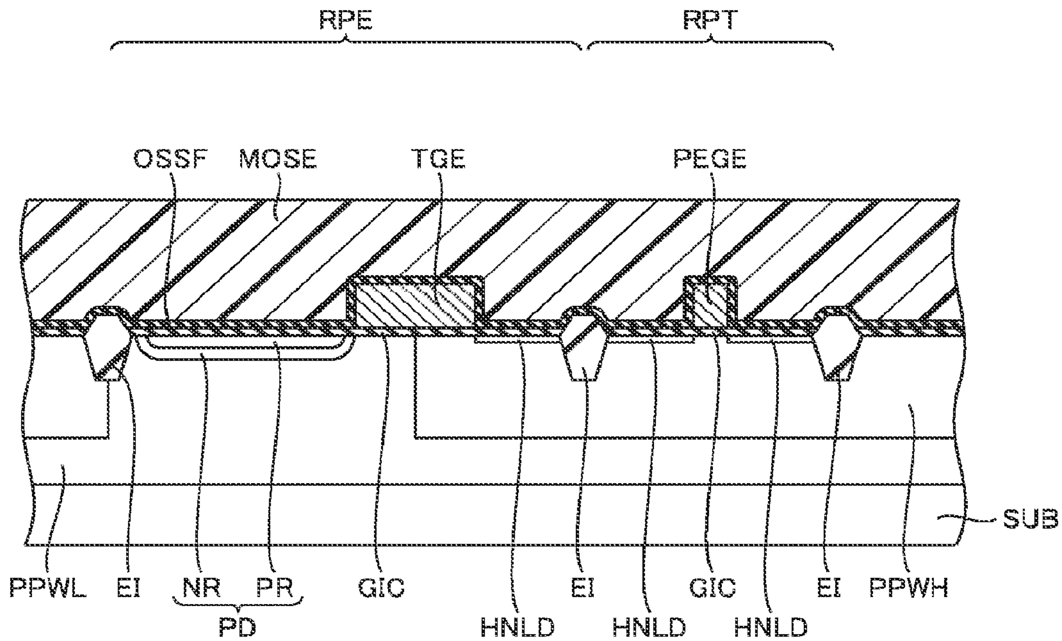

FIG. 83A is a cross sectional view of the pixel region and the like to show a step performed in the embodiment after the steps shown in FIG. 82A and FIG. 82B.

Figure 83B:
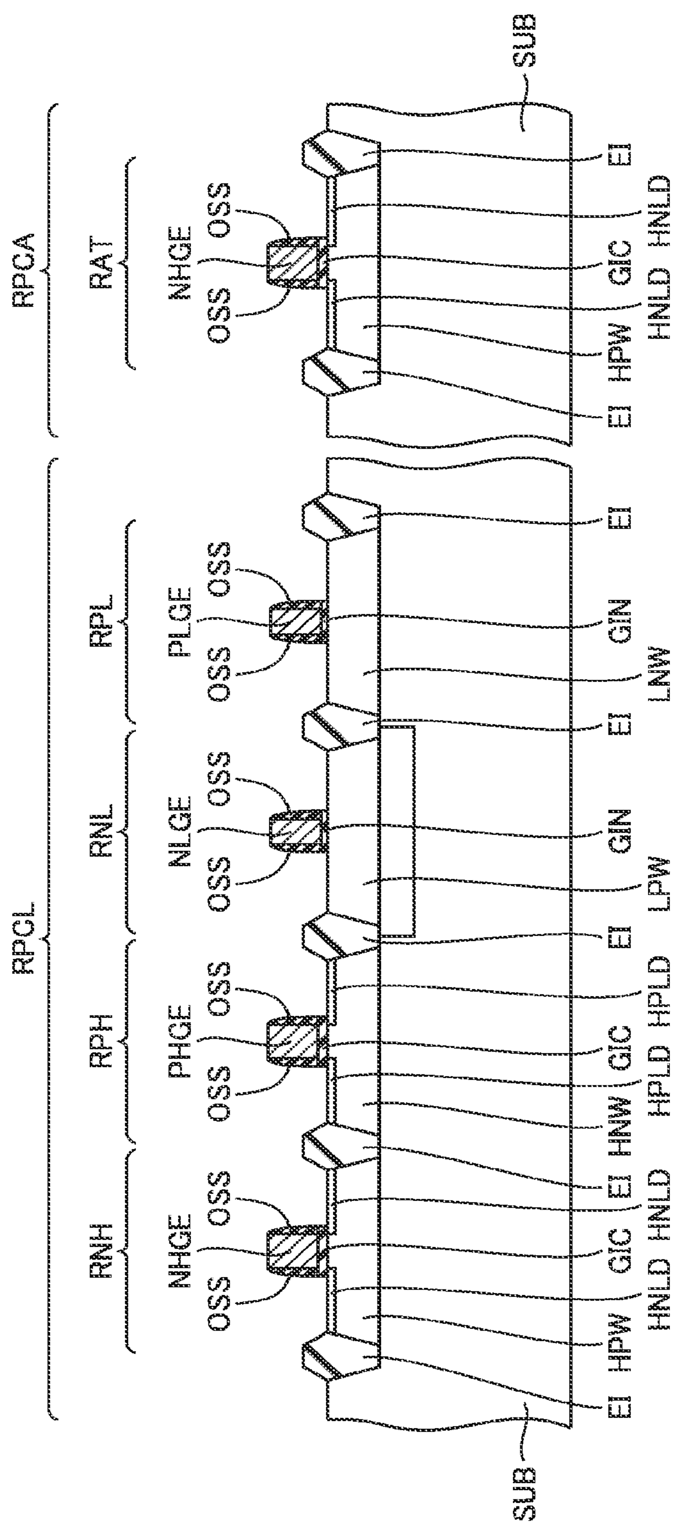

FIG. 83B is a cross sectional view of the peripheral region to show a step performed in the embodiment after the steps shown in FIG. 82A and FIG. 82B.

Figure 84A:
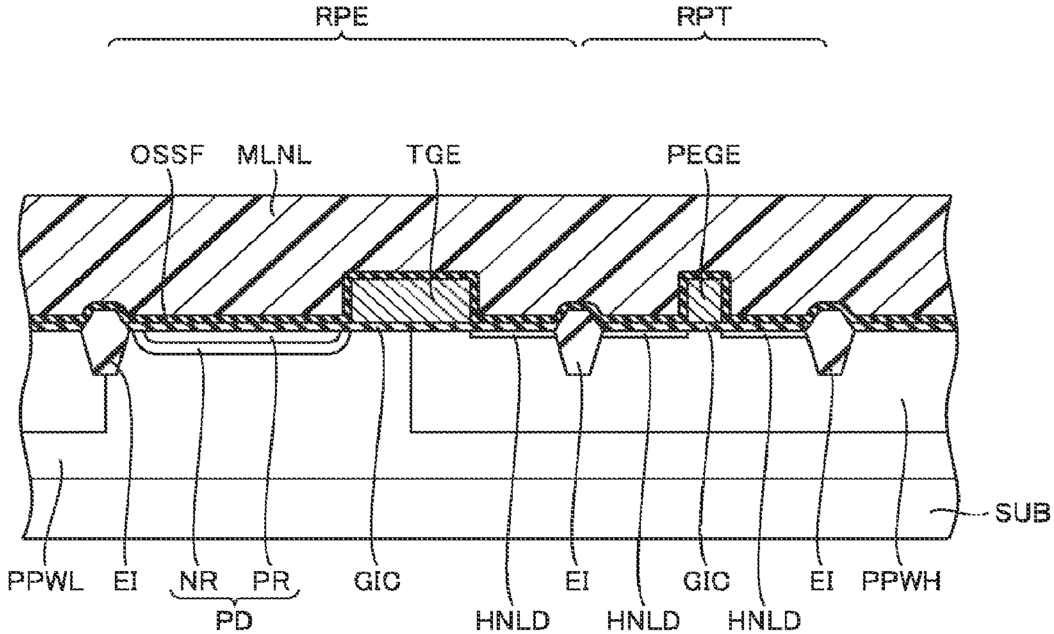

FIG. 84A is a cross sectional view of the pixel region and the like to show a step performed in the embodiment after the steps shown in FIG. 83A and FIG. 83B.

Figure 84B:
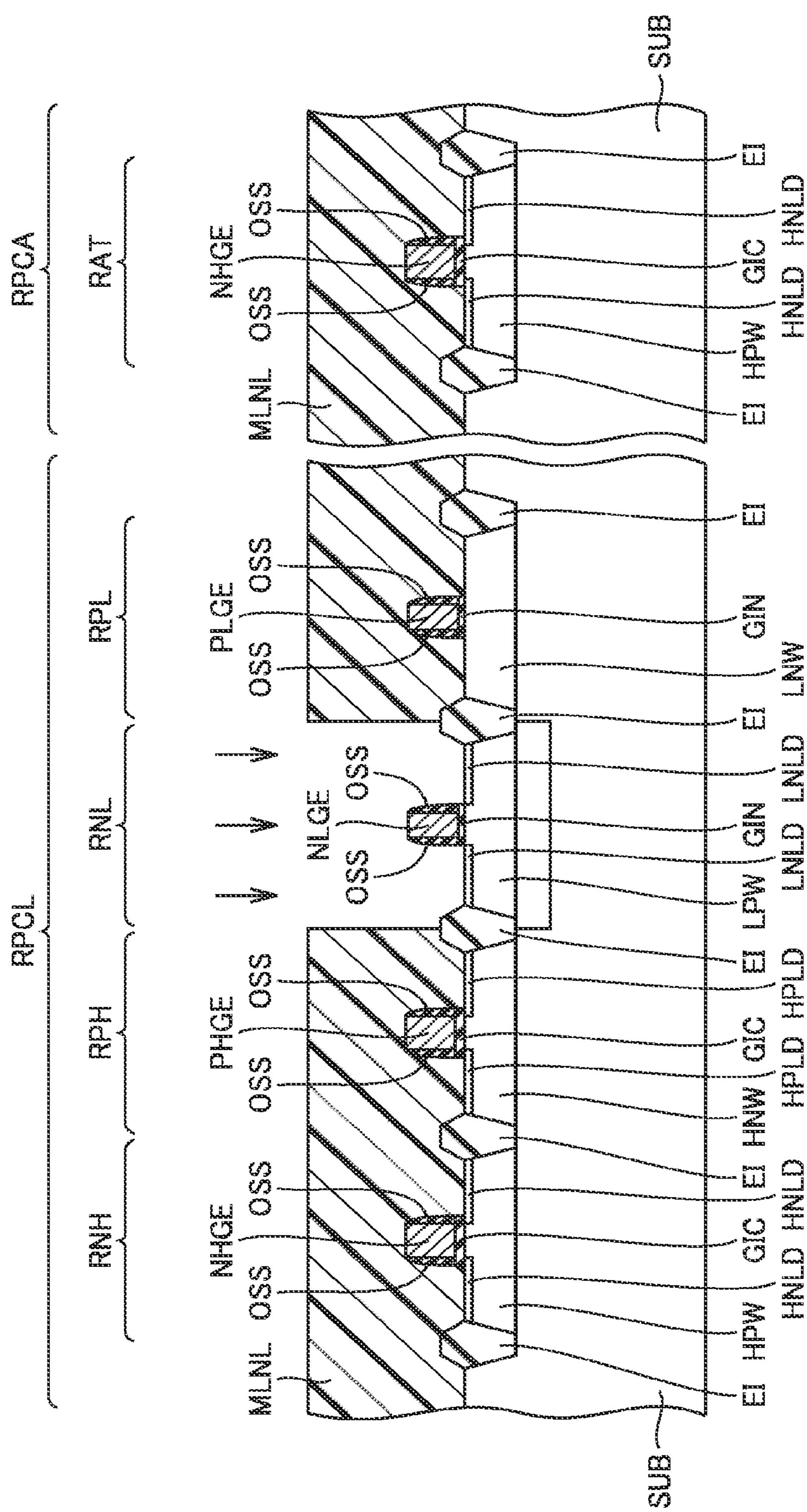

FIG. 84B is a cross sectional view of the peripheral region to show a step performed in the embodiment after the steps shown in FIG. 83A and FIG. 83B.

Figure 85A:
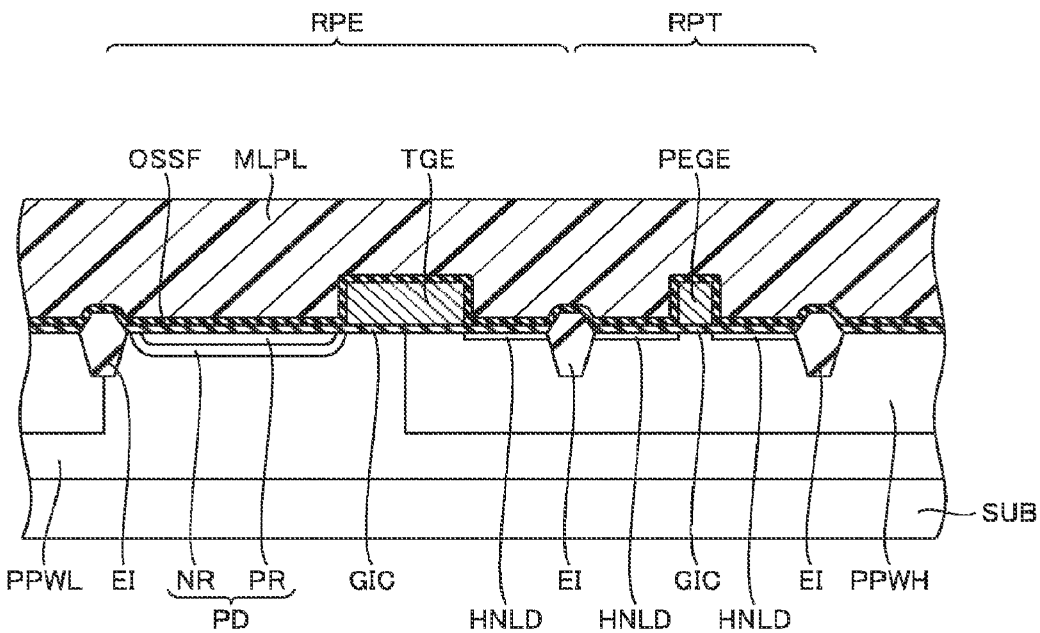

FIG. 85A is a cross sectional view of the pixel region and the like to show a step performed in the embodiment after the steps shown in FIG. 84A and FIG. 84B.

Figure 85B:
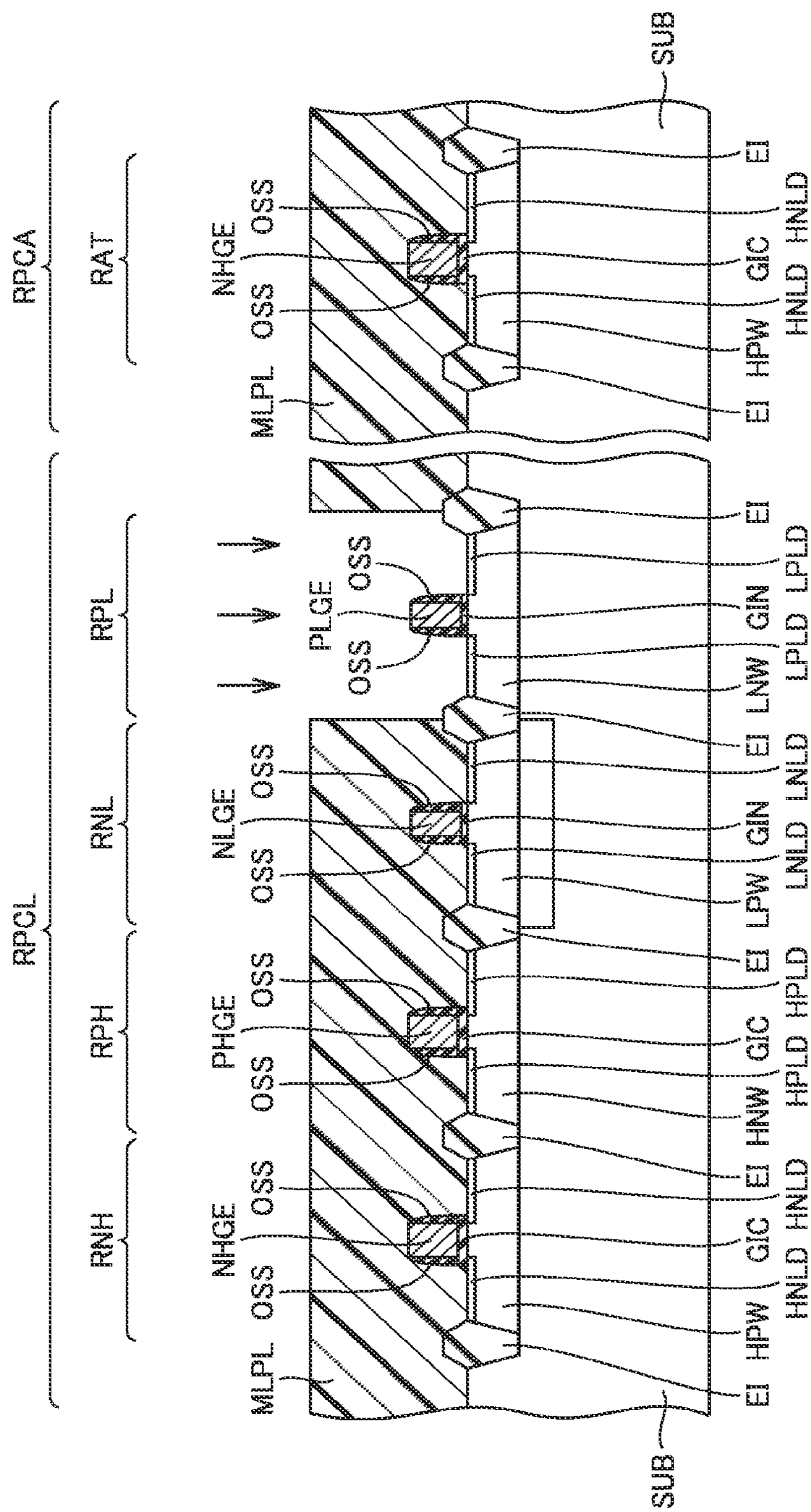

FIG. 85B is a cross sectional view of the peripheral region to show a step performed in the embodiment after the steps shown in FIG. 84A and FIG. 84B.

Figure 86A:
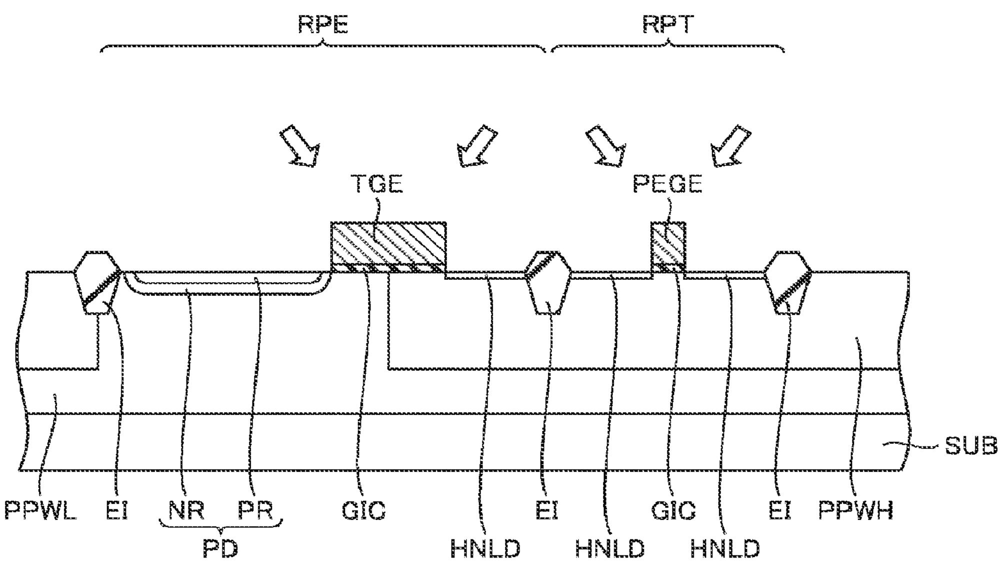

FIG. 86A is a cross sectional view of the pixel region and the like to show a step performed in the embodiment after the steps shown in FIG. 85A and FIG. 85B.

Figure 86B:
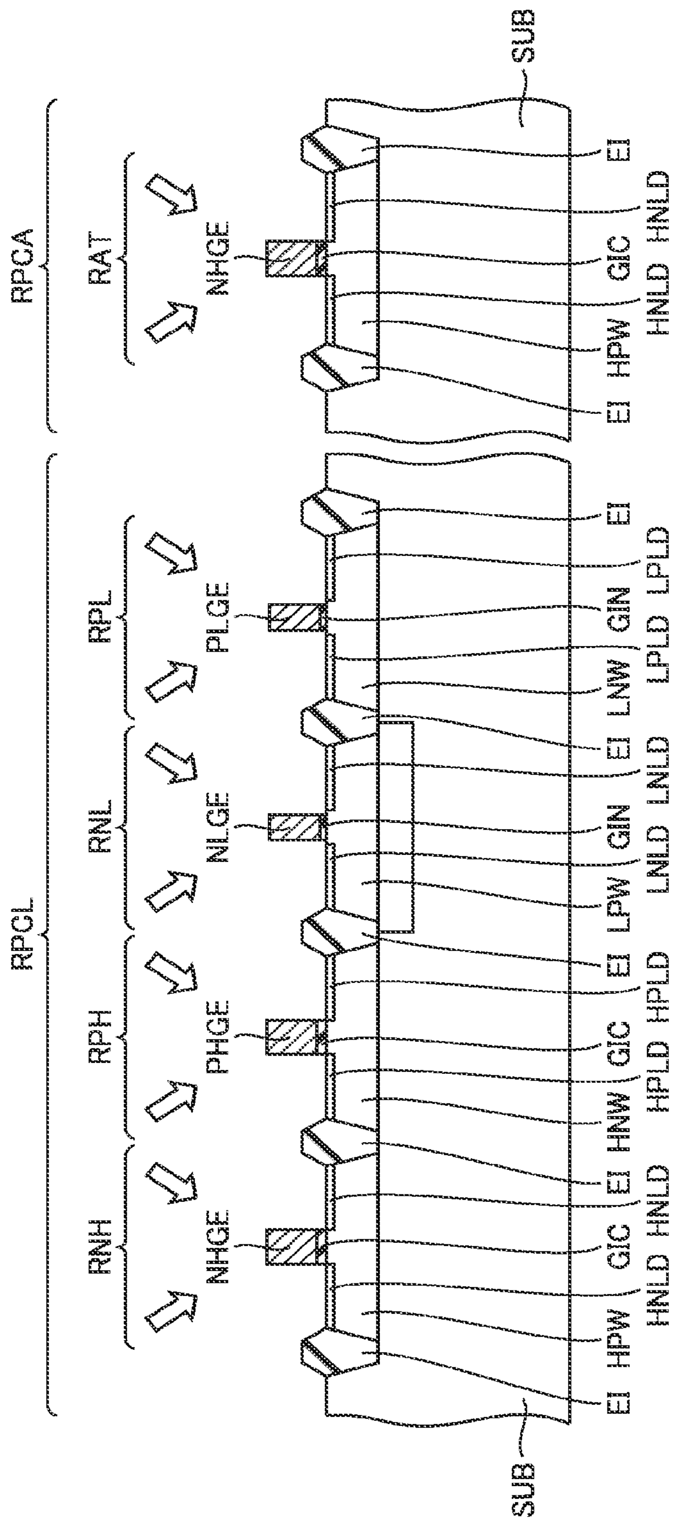

FIG. 86B is a cross sectional view of the peripheral region to show a step performed in the embodiment after the steps shown in FIG. 85A and FIG. 85B.

Figure 87A:
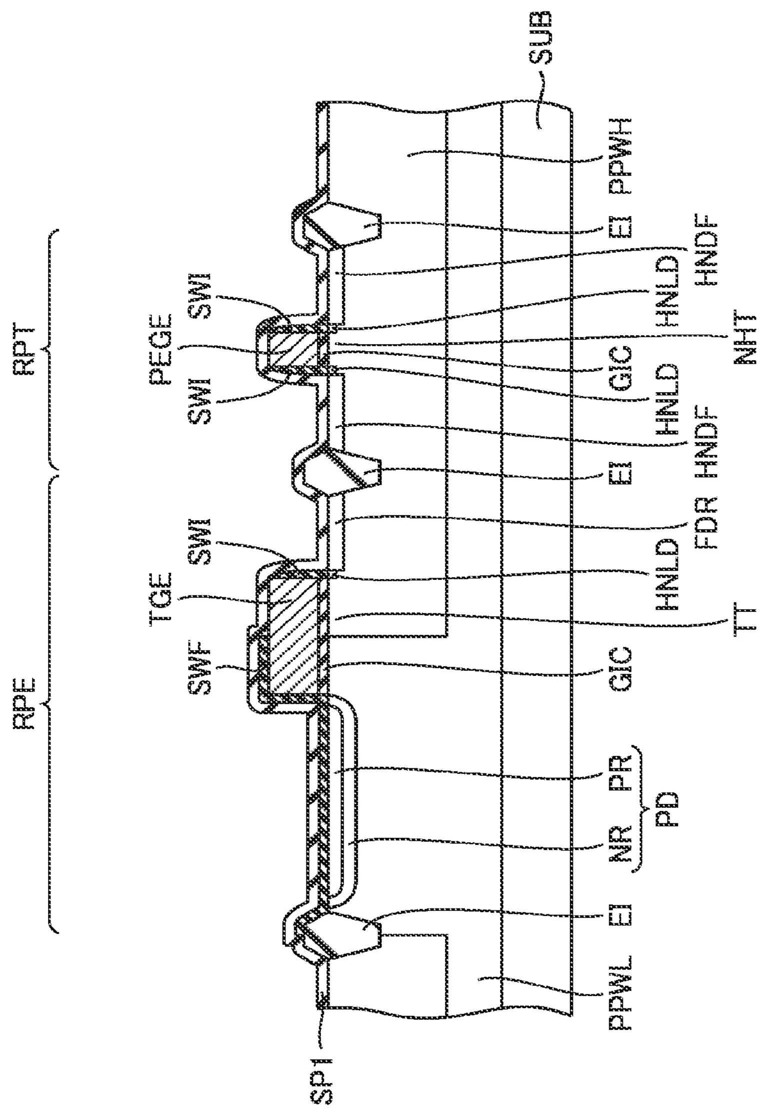

FIG. 87A is a cross sectional view of the pixel region and the like to show a step performed in the embodiment after the steps shown in FIG. 86A and FIG. 86B.

Figure 87B:
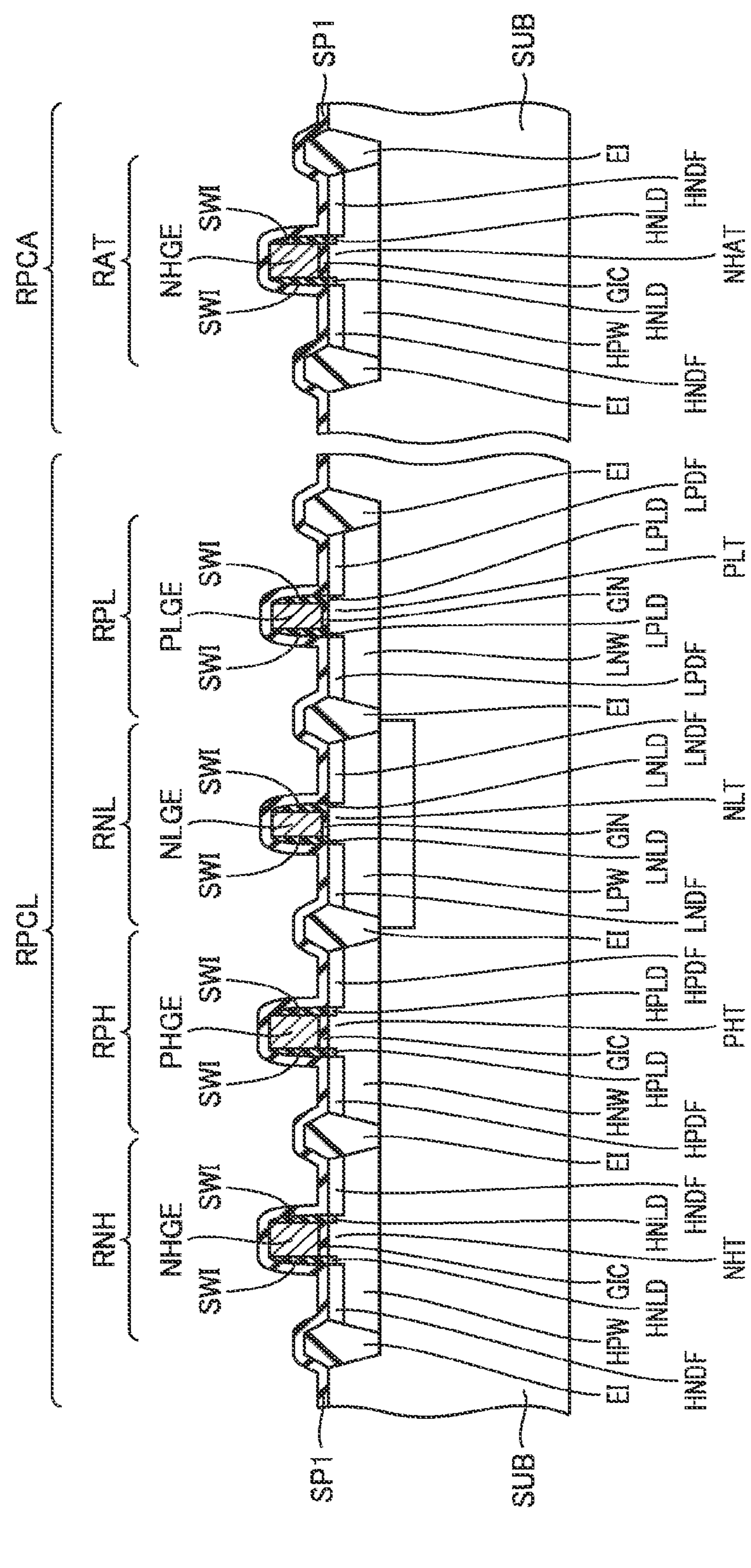

FIG. 87B is a cross sectional view of the peripheral region to show a step performed in the embodiment after the steps shown in FIG. 86A and FIG. 86B.

Figure 88A:
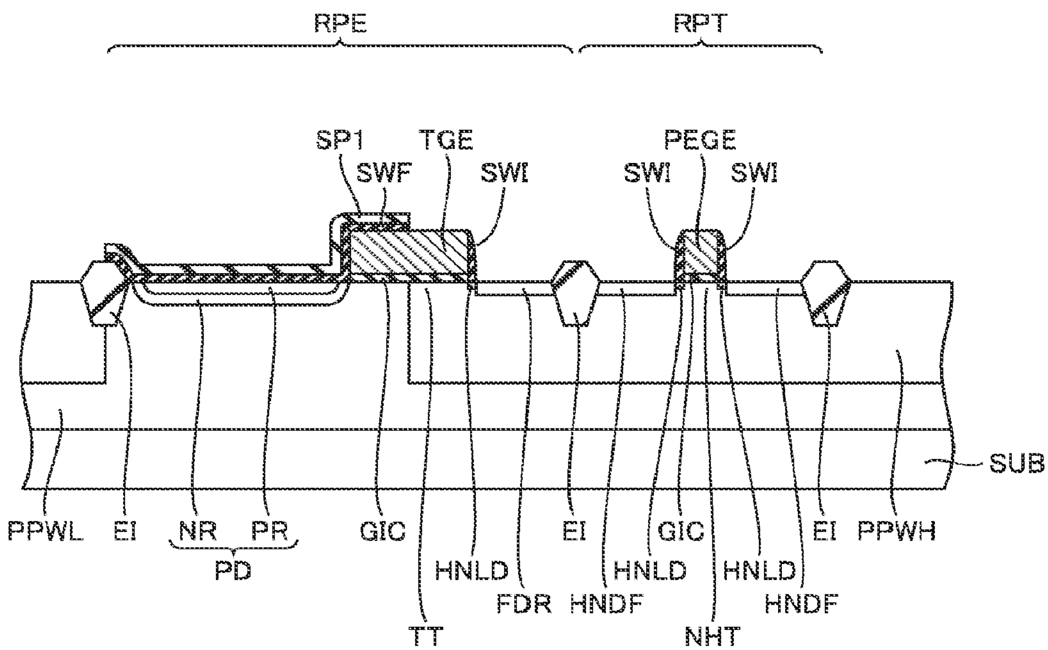

FIG. 88A is a cross sectional view of the pixel region and the like to show a step performed in the embodiment after the steps shown in FIG. 87A and FIG. 87B.

Figure 88B:
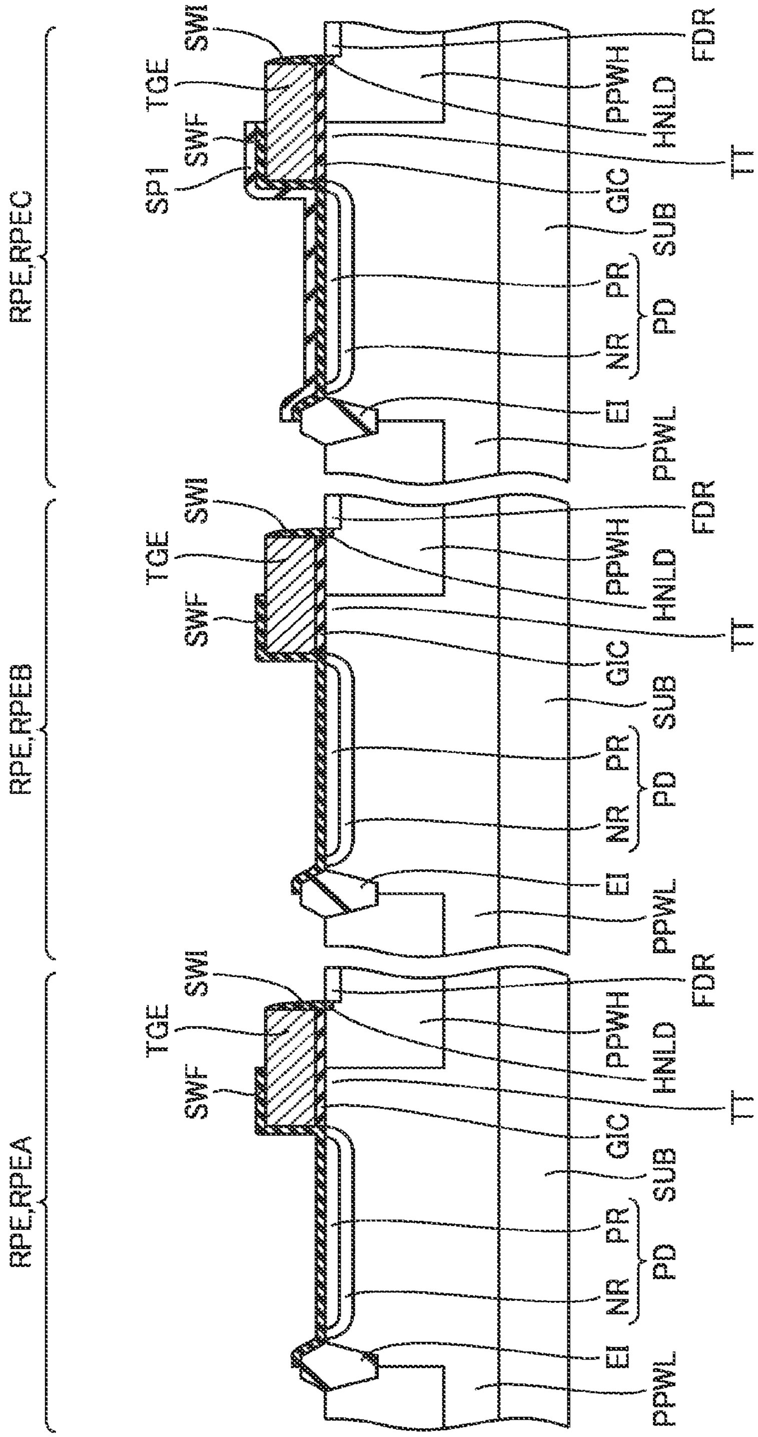

FIG. 88B is a cross sectional view of each pixel region to show a step performed in the embodiment after the steps shown in FIG. 87A and FIG. 87B.

Figure 88C:
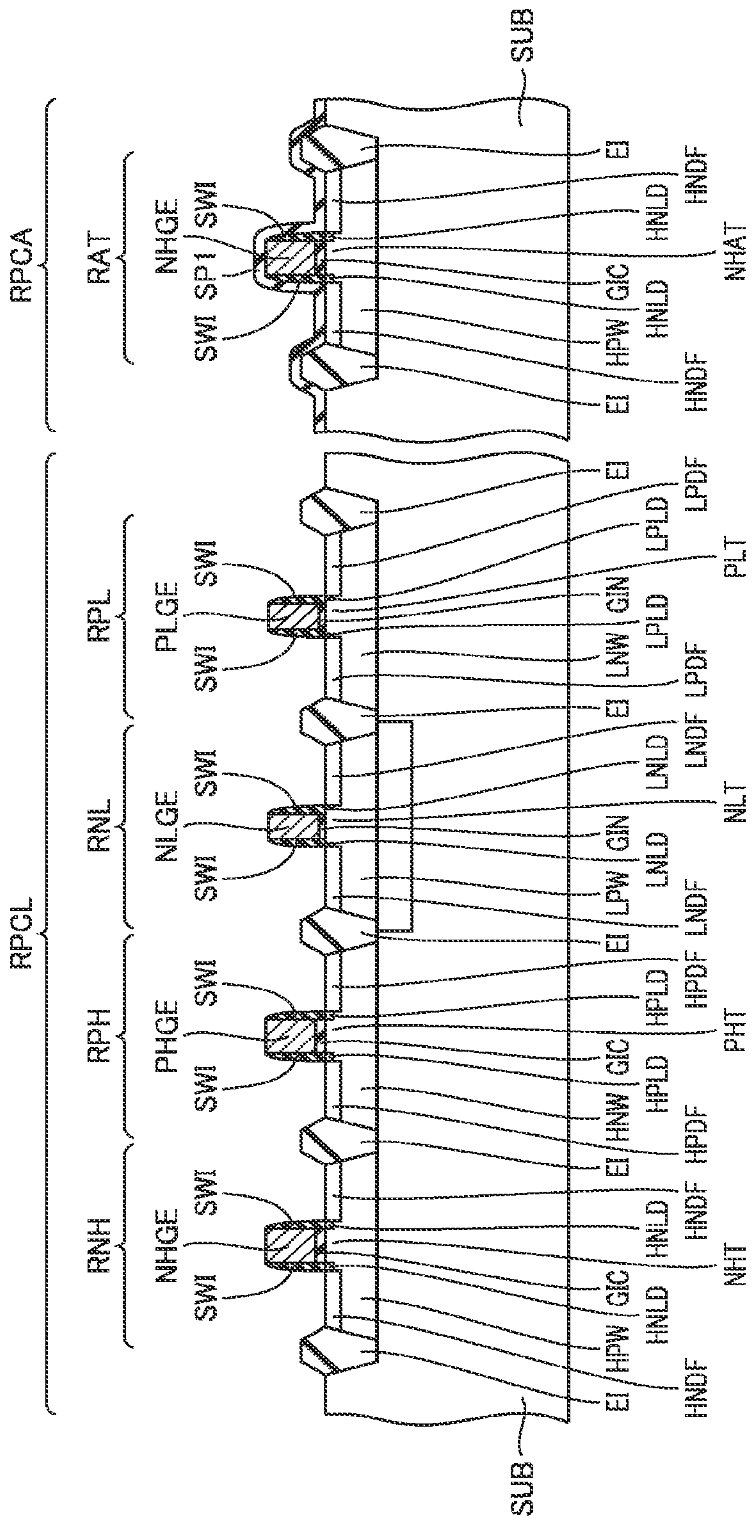

FIG. 88C is a cross sectional view of the peripheral region to show a step performed in the embodiment after the steps shown in FIG. 87A and FIG. 87B.

Figure 89A:
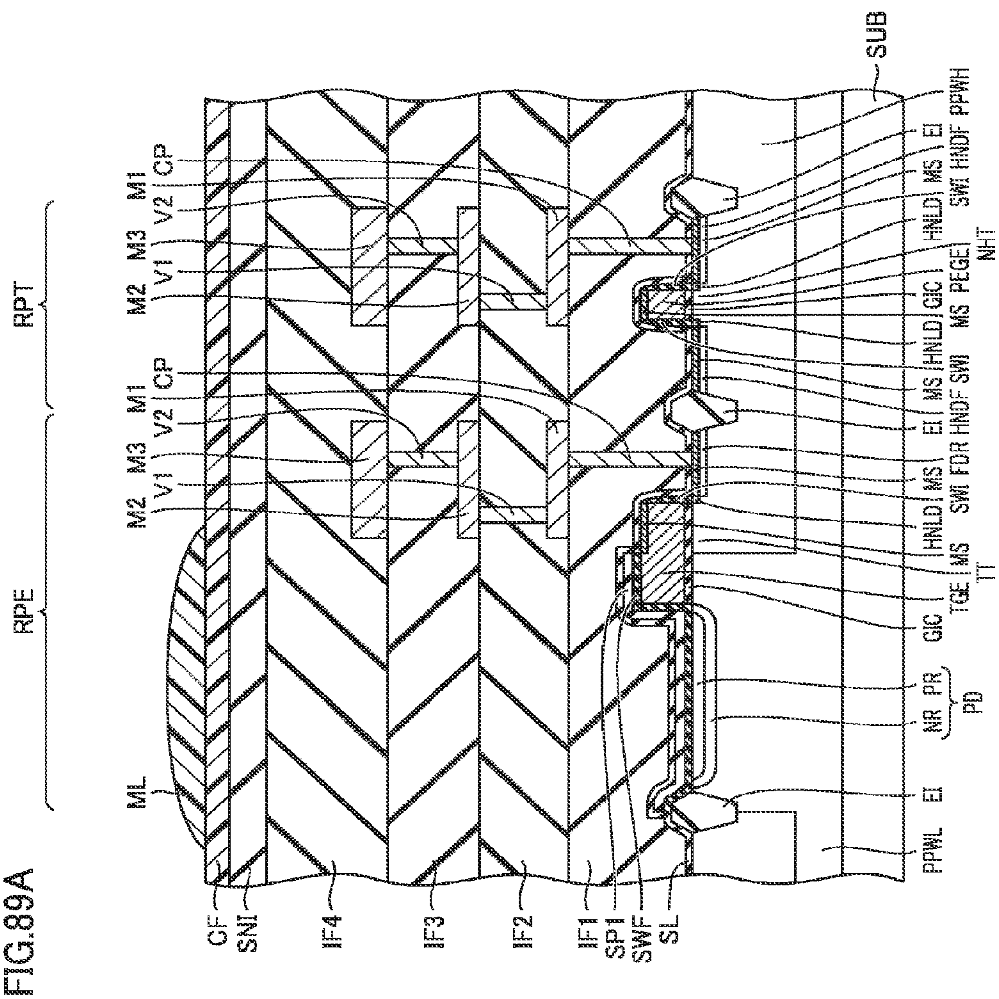

FIG. 89A is a cross sectional view of the pixel region and the like to show a step performed in the embodiment after the steps shown in FIG. 88A to FIG. 88C.

Figure 89B:
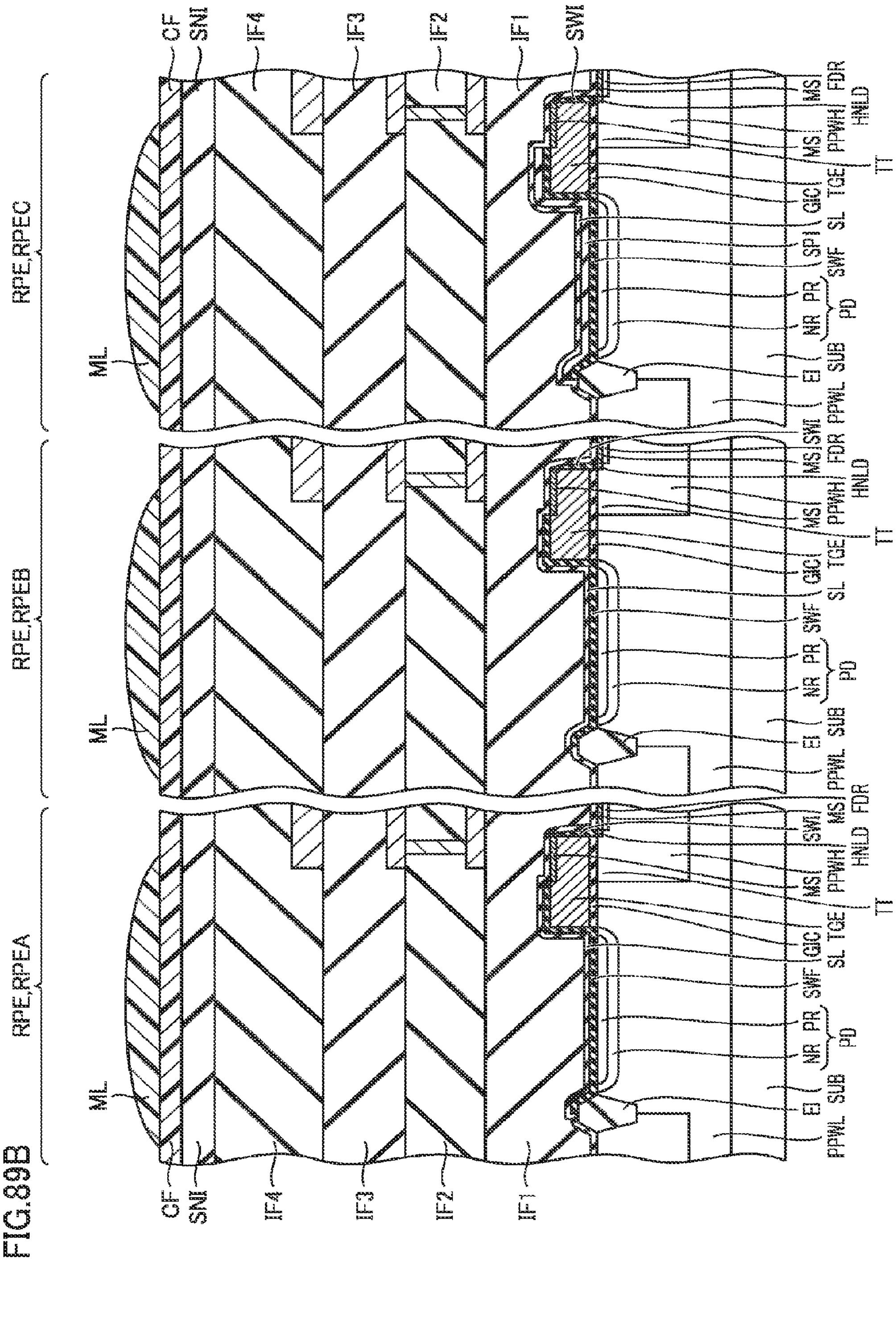

FIG. 89B is a cross sectional view of each pixel region to show a step performed in the embodiment after the steps shown in FIG. 88A to FIG. 88C.

Figure 89C:
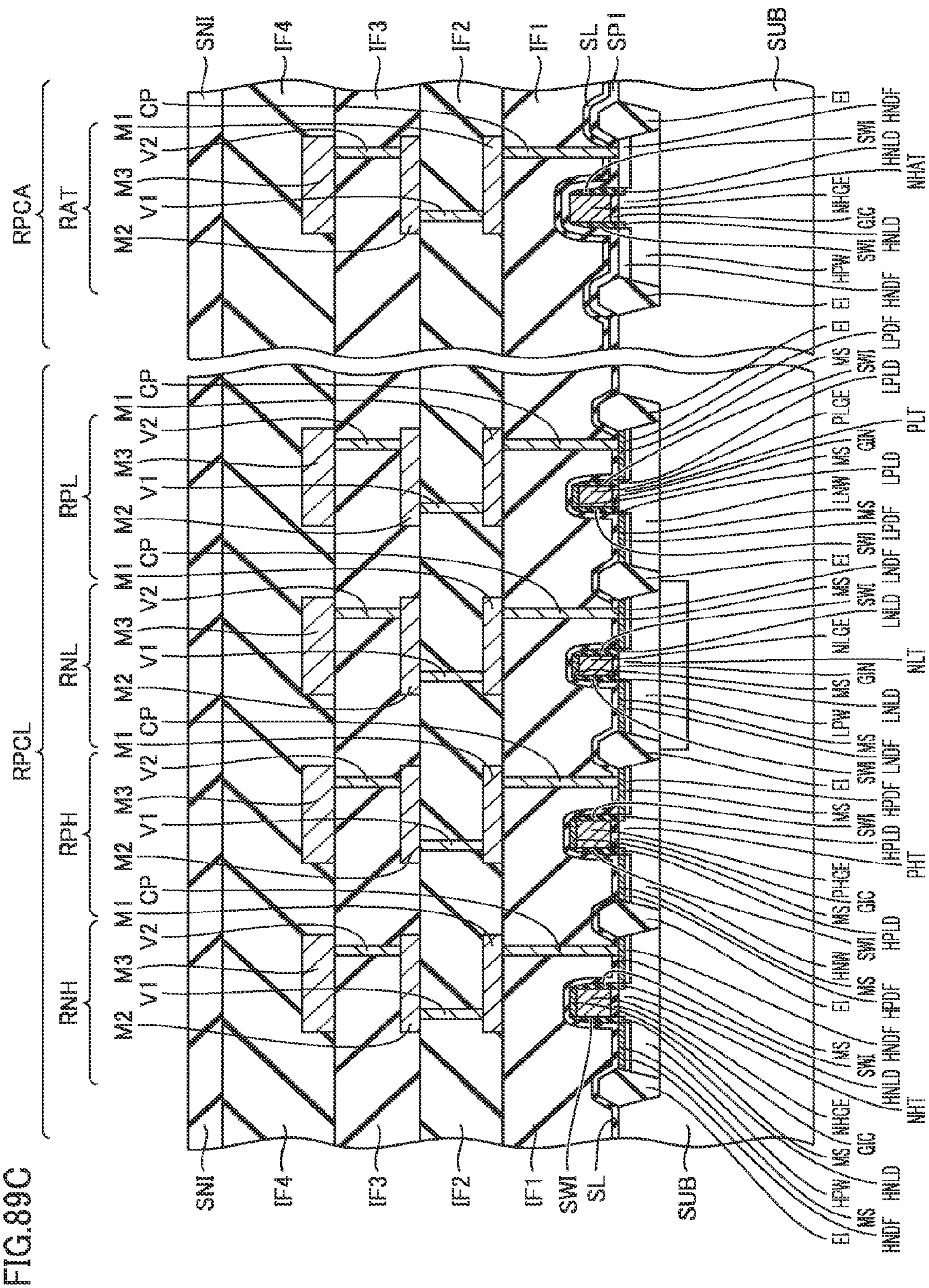

FIG. 89C is a cross sectional view of the peripheral region to show a step performed in the embodiment after the steps shown in FIG. 88A to FIG. 88C.

Figure 90A:
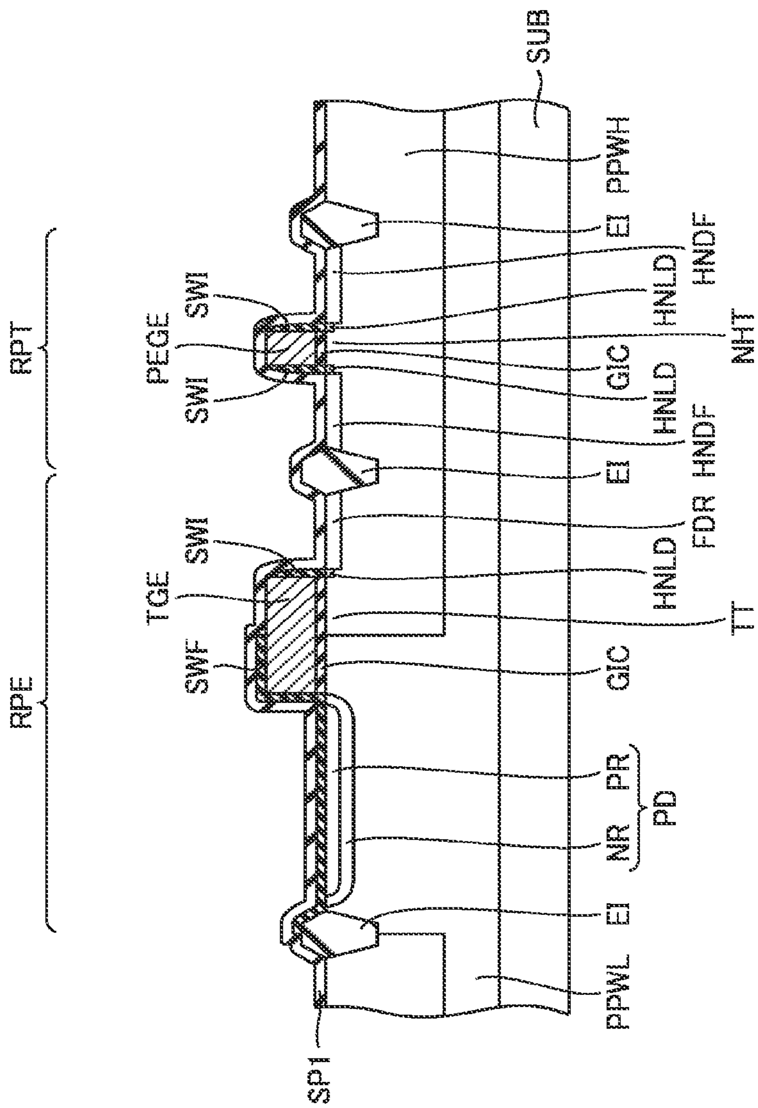

FIG. 90A is a cross sectional view of a pixel region and the like to show one step of a method for manufacturing an image capturing device according to an eighth embodiment.

Figure 90B:
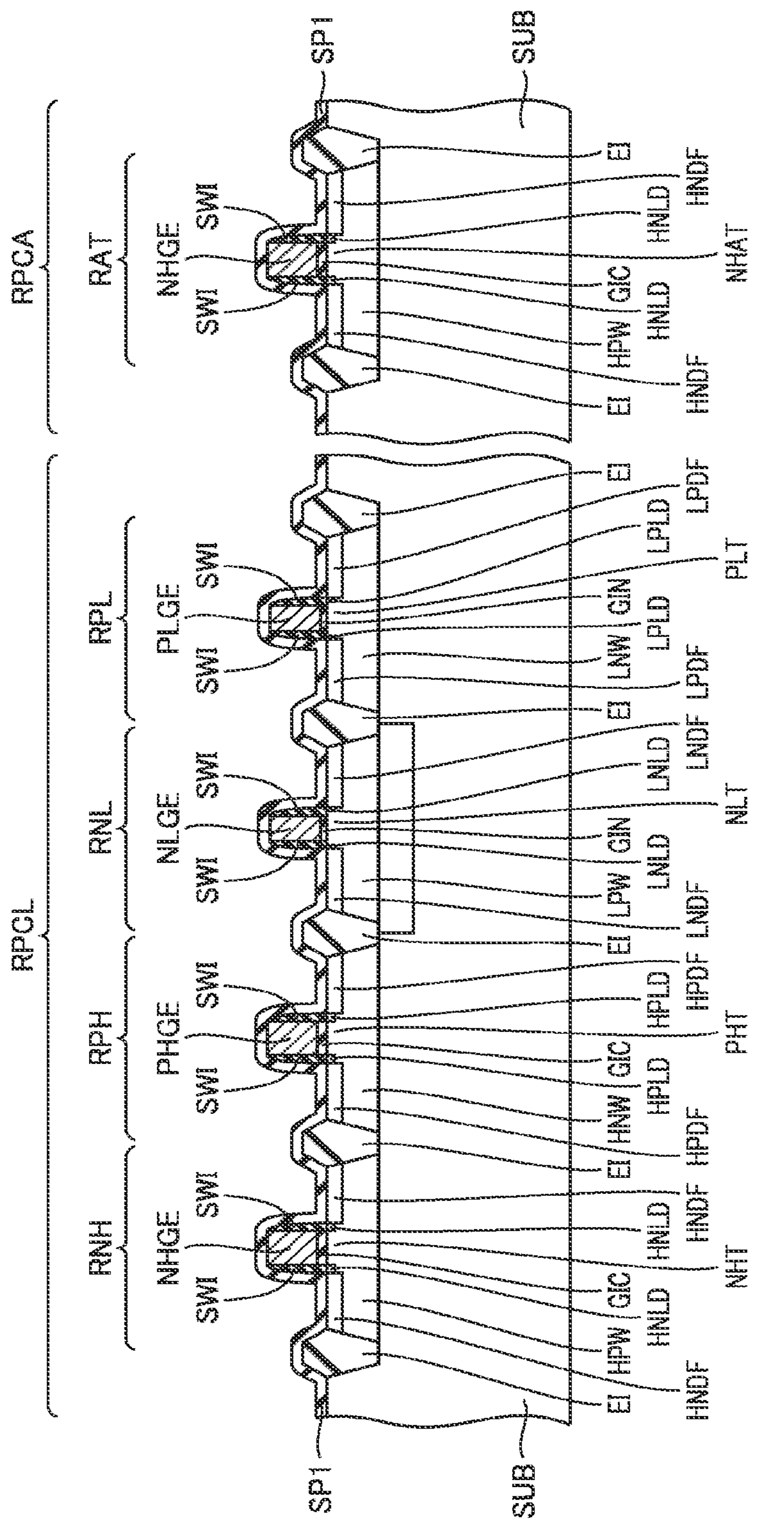

FIG. 90B is a cross sectional view of the peripheral region to show one step of the method for manufacturing the image capturing device according to the eighth embodiment.

Figure 91A:
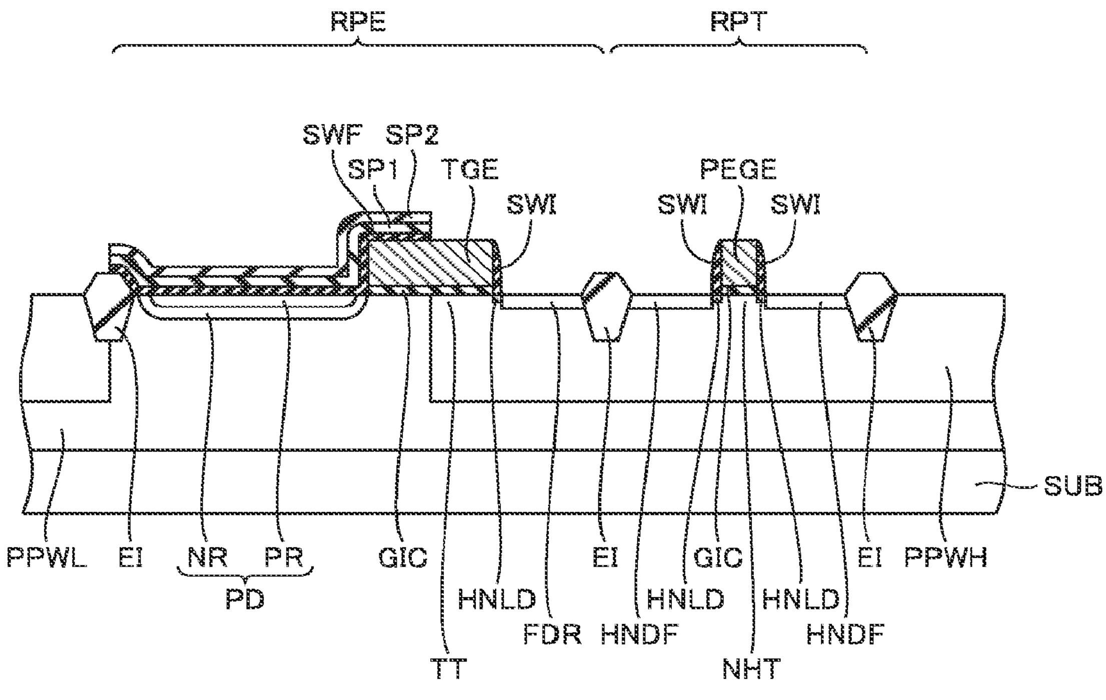

FIG. 91A is a cross sectional view of the pixel region and the like to show a step performed in the embodiment after the steps shown in FIG. 90A and FIG. 90B.

Figure 91B:
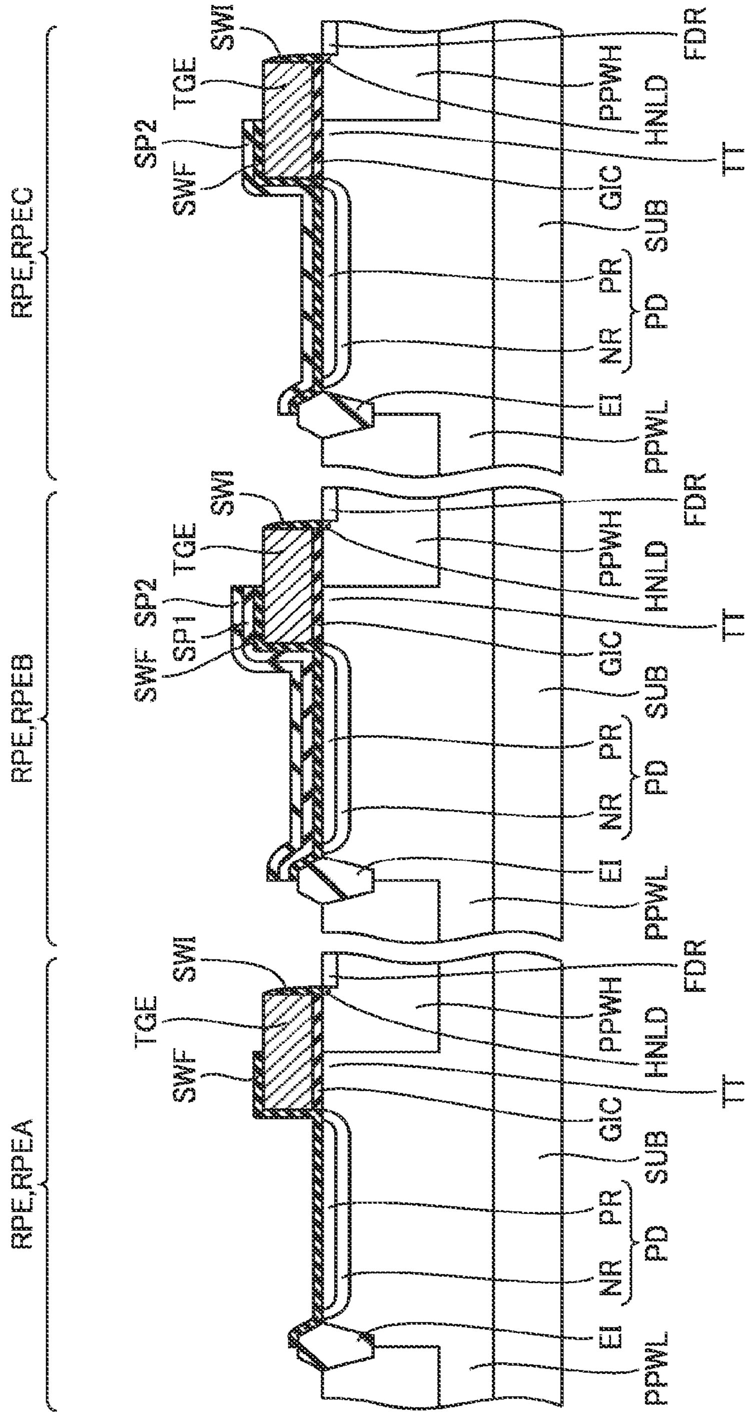

FIG. 91B is a cross sectional view of each pixel region to show a step performed in the embodiment after the steps shown in FIG. 90A and FIG. 90B.

Figure 91C:
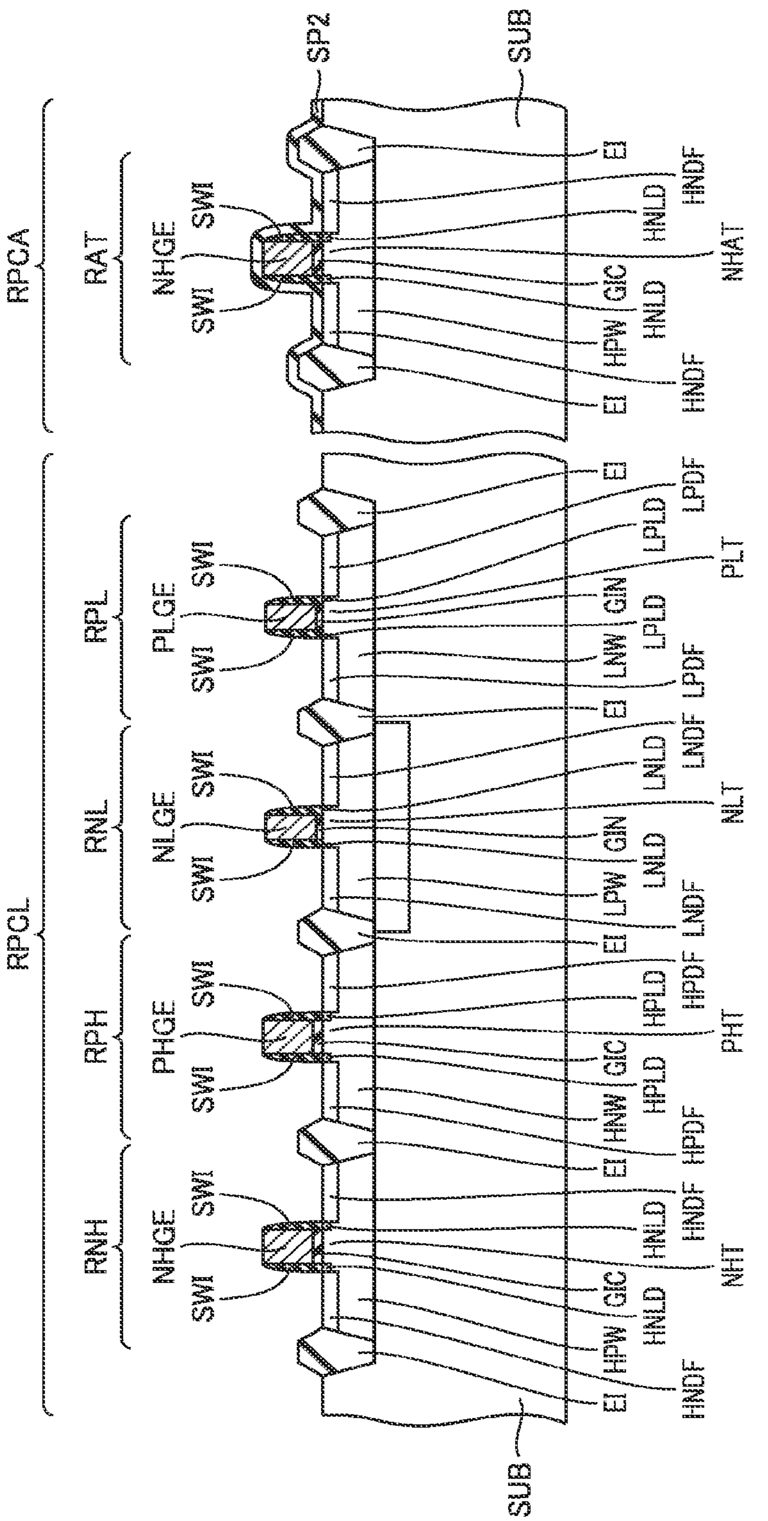

FIG. 91C is a cross sectional view of the peripheral region to show a step performed in the embodiment after the steps shown in FIG. 90A and FIG. 90B.

Figure 92A:
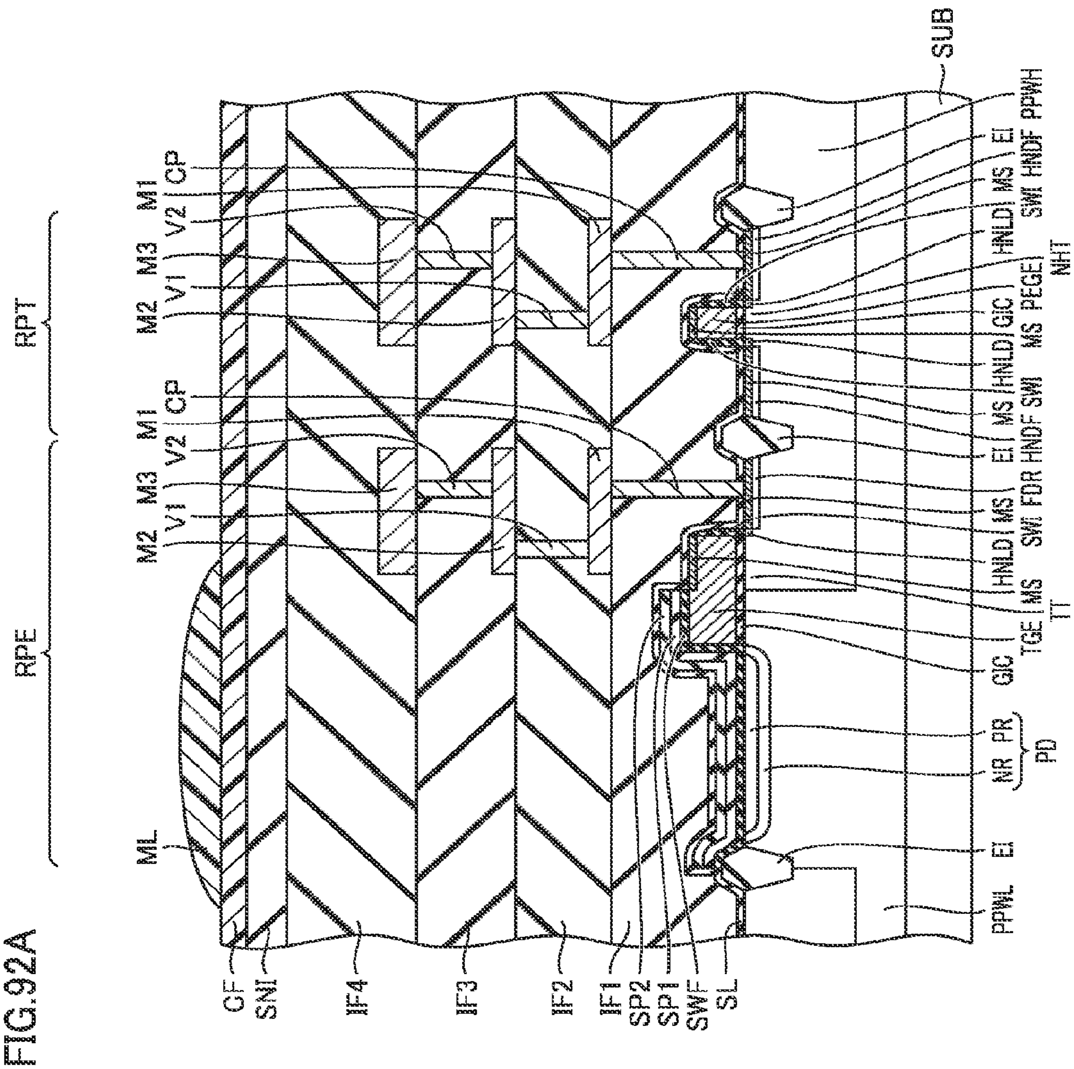

FIG. 92A is a cross sectional view of the pixel region and the like to show a step performed in the embodiment after the steps shown in FIG. 91A to FIG. 91C.

Figure 92B:
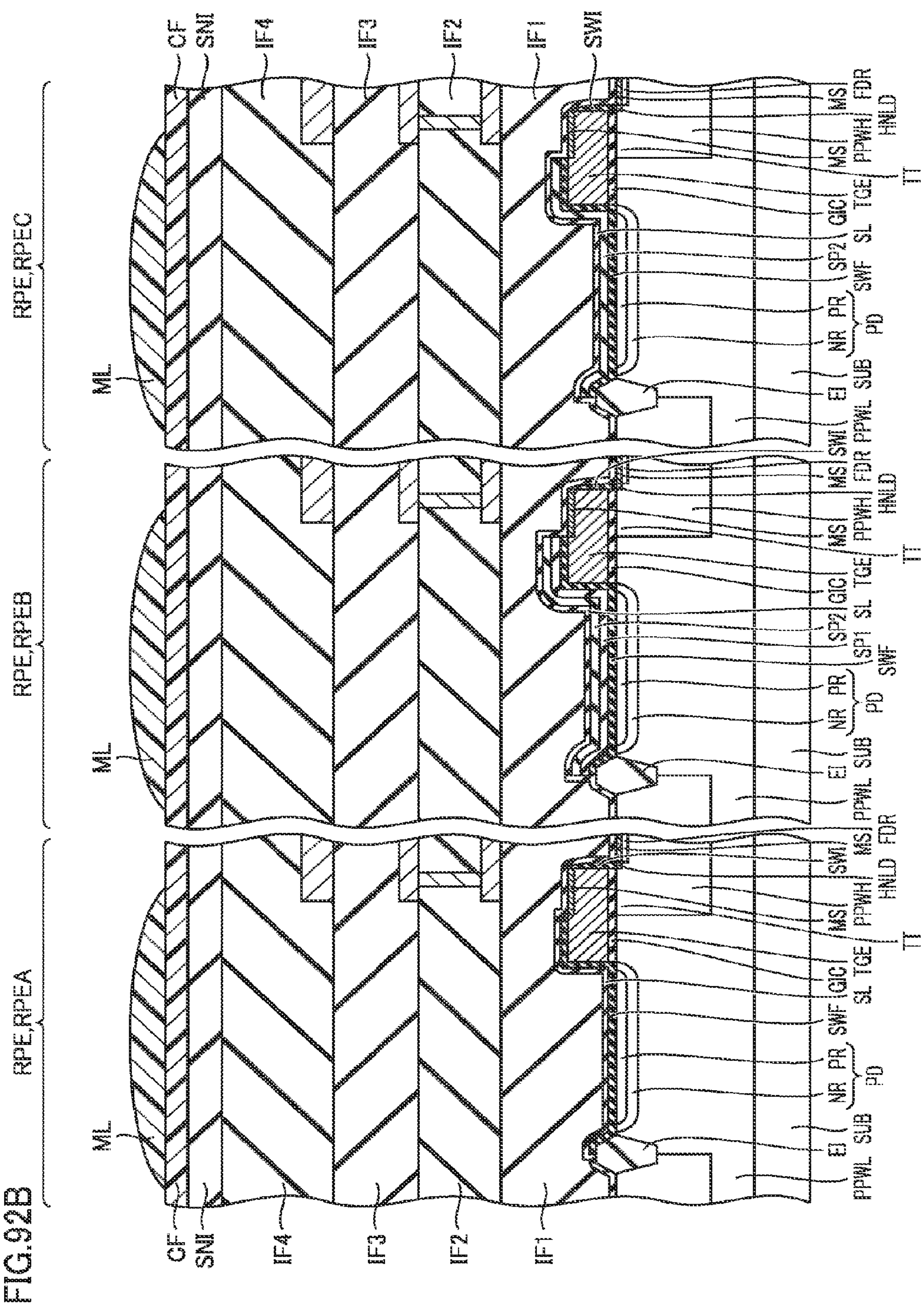

FIG. 92B is a cross sectional view of each pixel region to show a step performed in the embodiment after the steps shown in FIG. 91A to FIG. 91C.

Figure 92C:
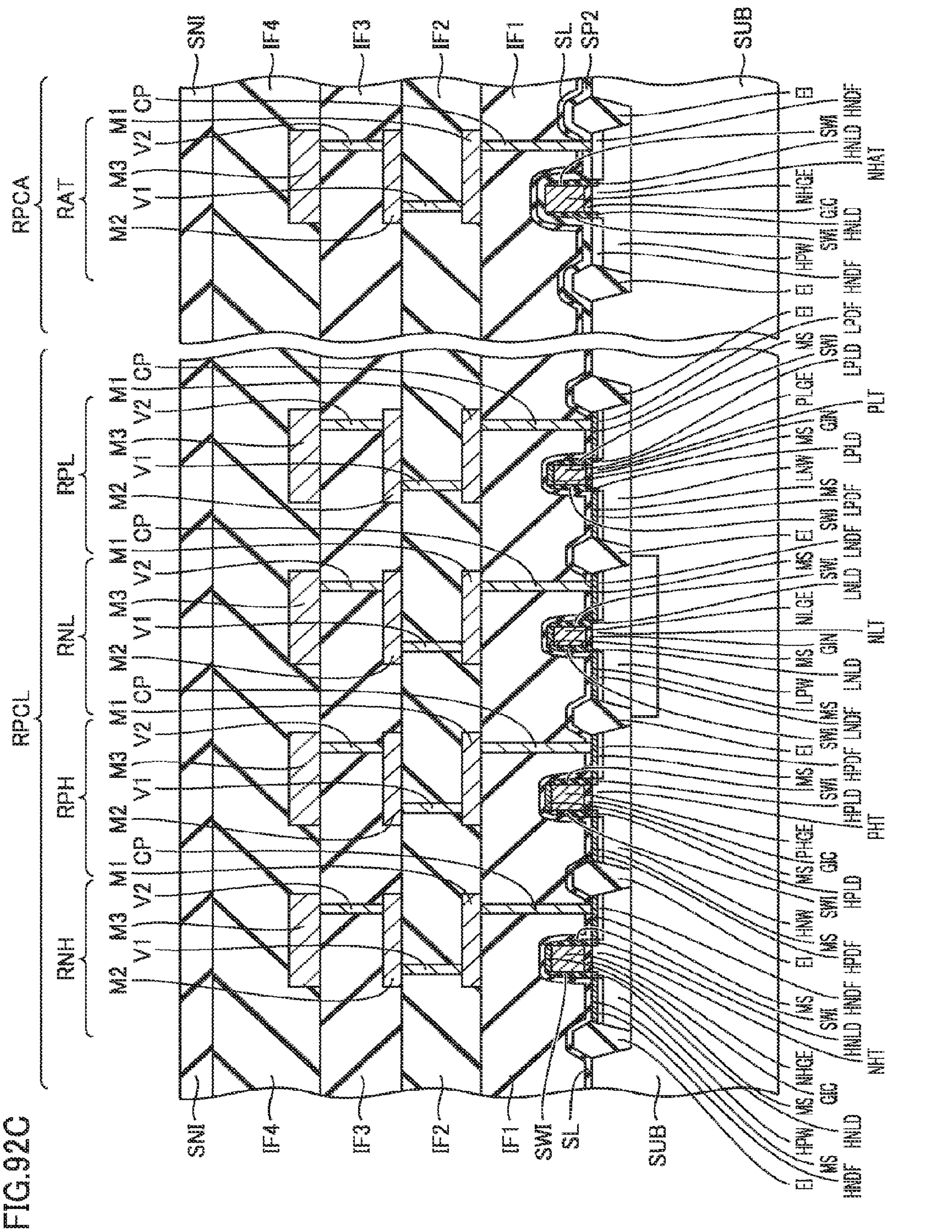

FIG. 92C is a cross sectional view of the peripheral region to show a step performed in the embodiment after the steps shown in FIG. 91A to FIG. 91C.

Figure 93A:
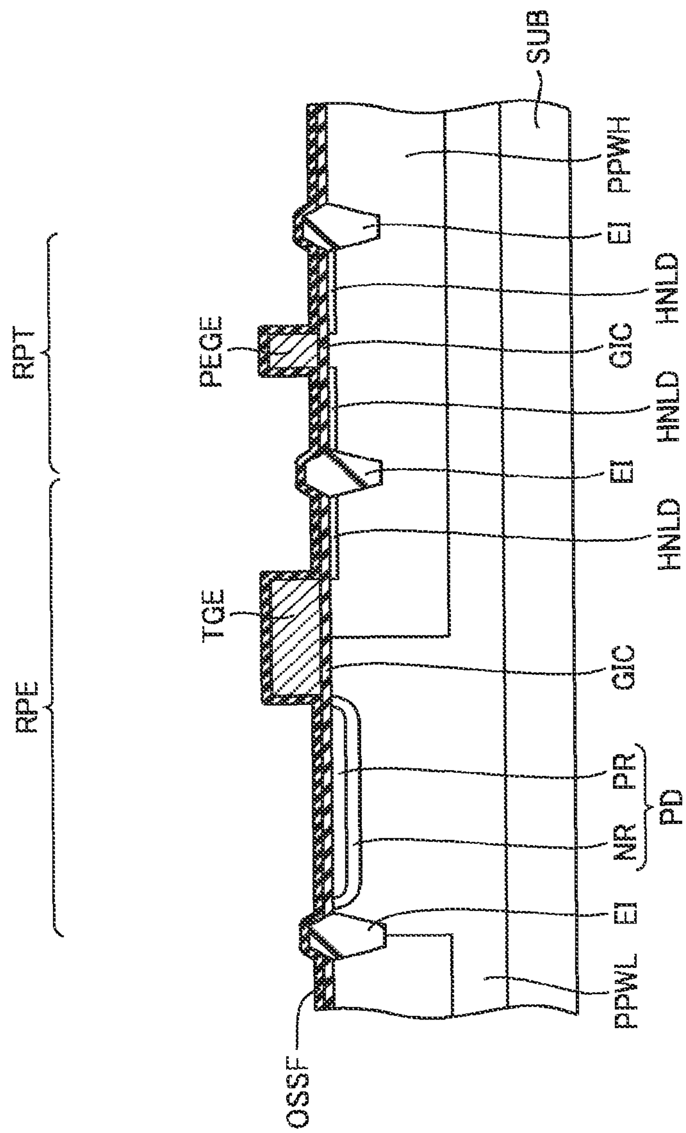

FIG. 93A is a cross sectional view of a pixel region and the like to show one step of a method for manufacturing an image capturing device according to a ninth embodiment.

Figure 93B:
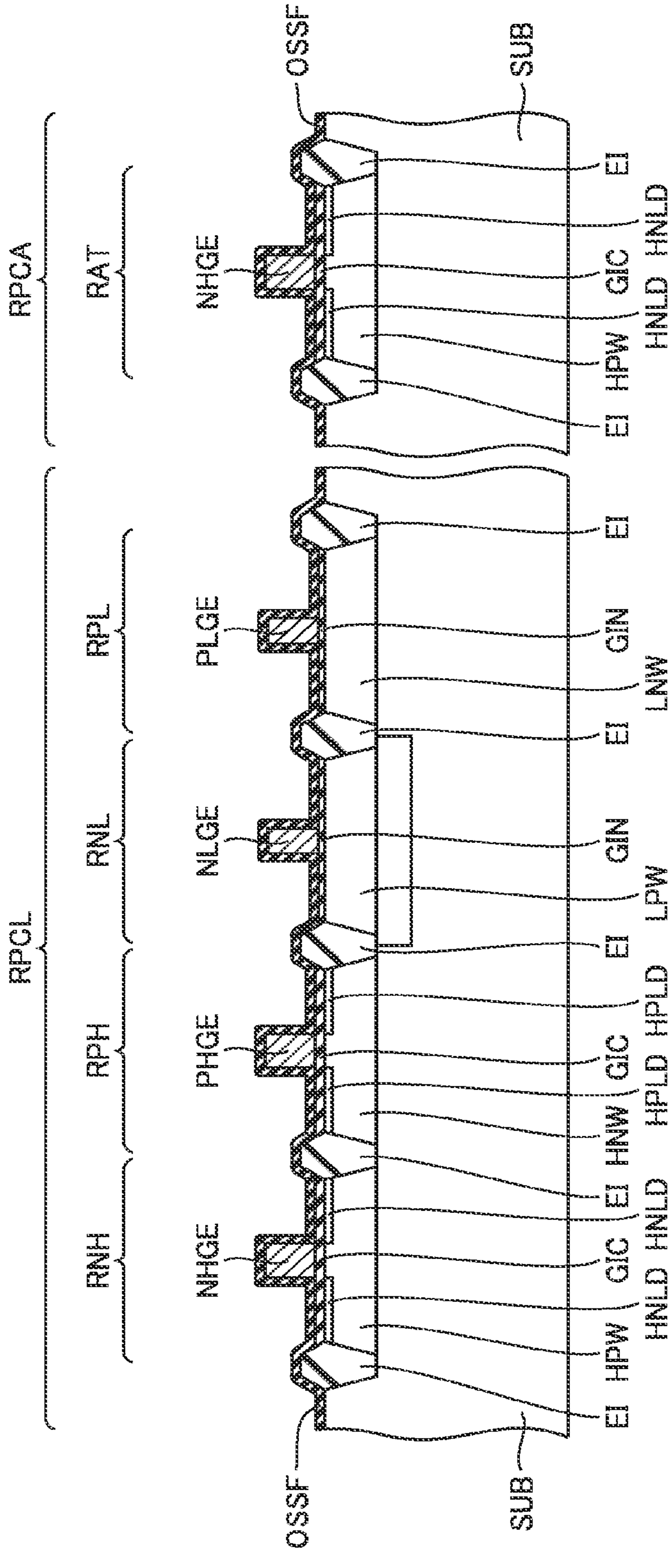

FIG. 93B is a cross sectional view of a peripheral region to show one step of the method for manufacturing the image capturing device according to the ninth embodiment.

Figure 94A:
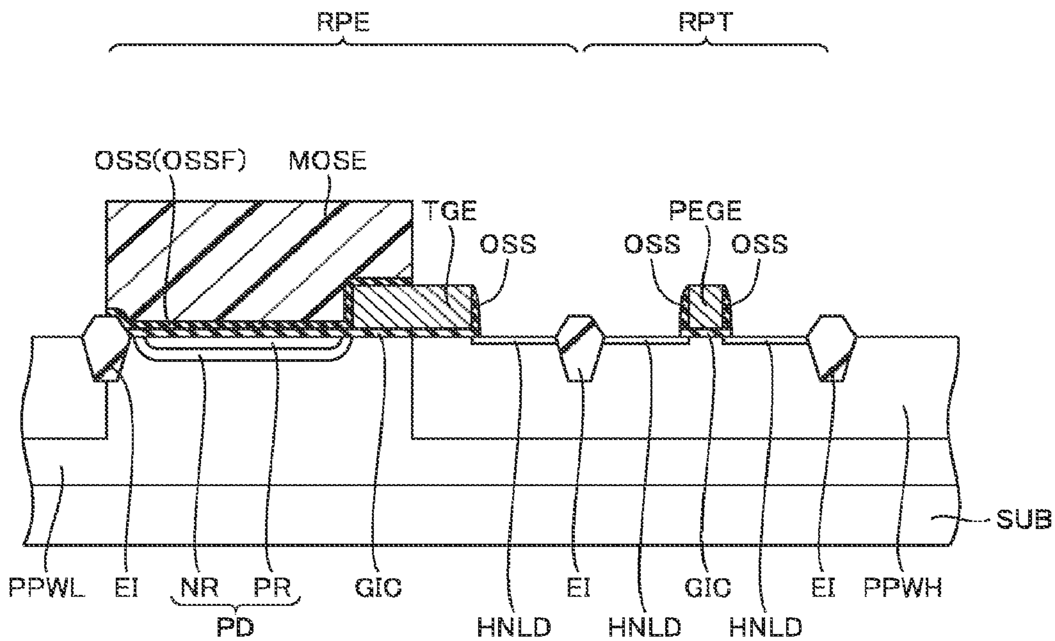

FIG. 94A is a cross sectional view of the pixel region and the like to show a step performed in the embodiment after the steps shown in FIG. 93A and FIG. 93B.

Figure 94B:
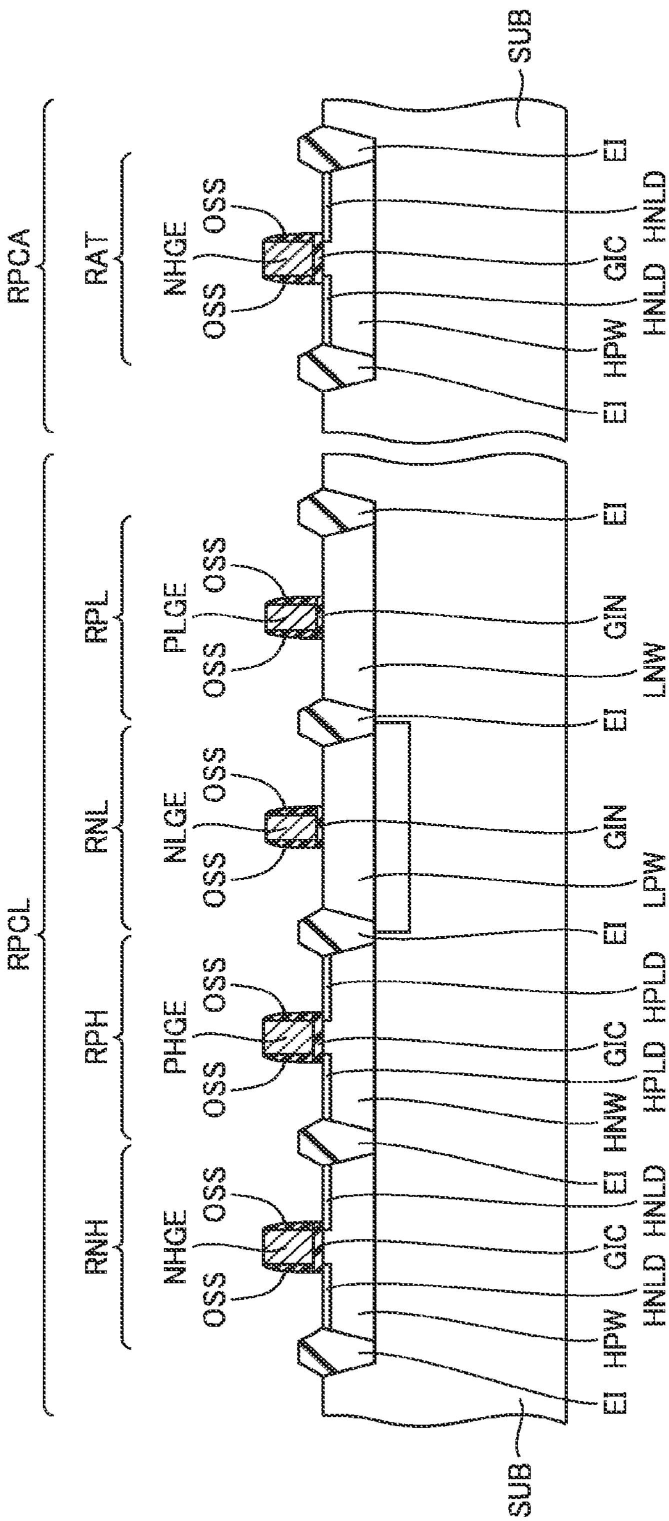

FIG. 94B is a cross sectional view of the peripheral region to show a step performed in the embodiment after the steps shown in FIG. 93A and FIG. 93B.

Figure 95A:
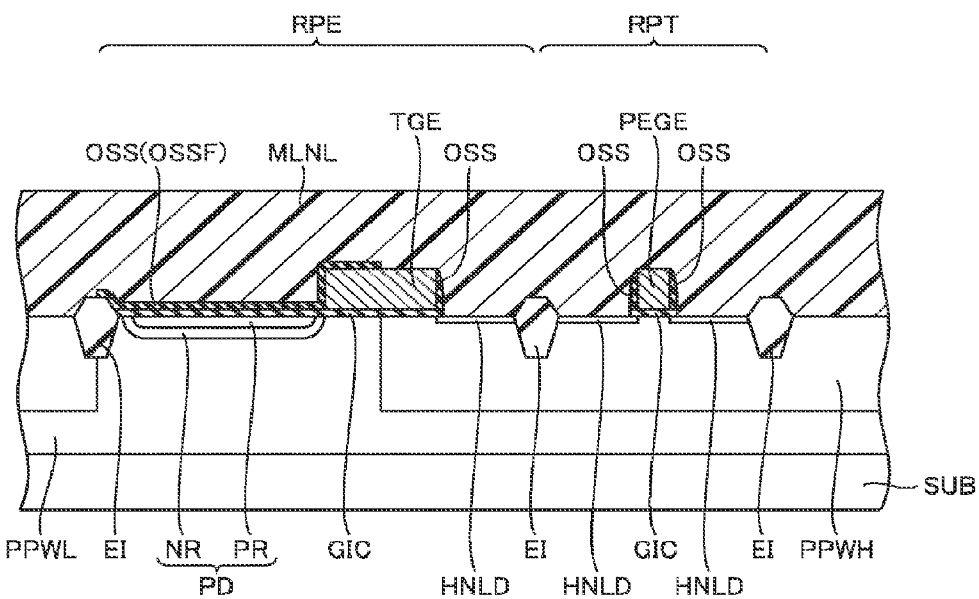

FIG. 95A is a cross sectional view of the pixel region and the like to show a step performed in the embodiment after the steps shown in FIG. 94A and FIG. 94B.

Figure 95B:
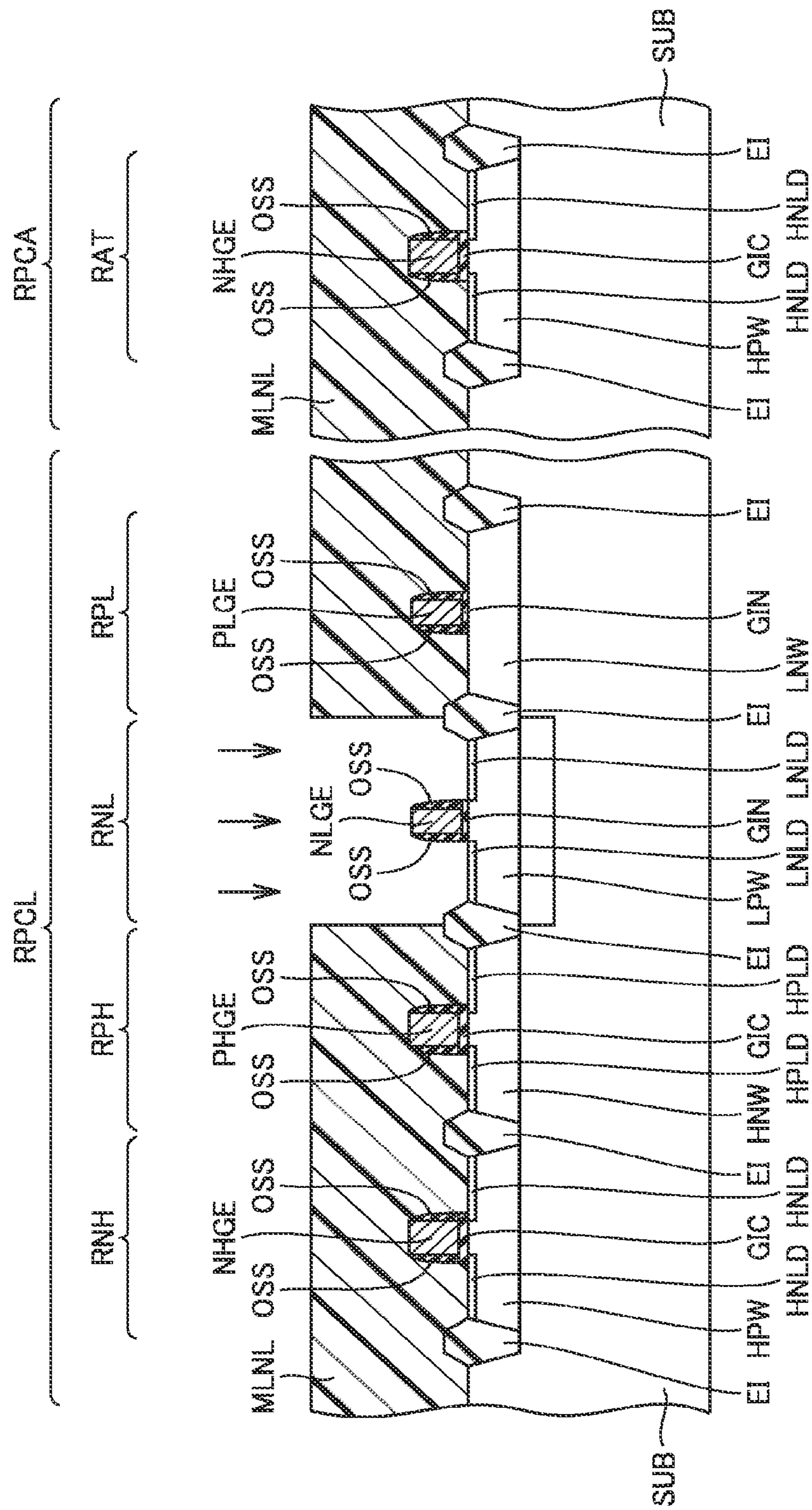

FIG. 95B is a cross sectional view of the peripheral region to show a step performed in the embodiment after the steps shown in FIG. 94A and FIG. 94B.

Figure 96A:
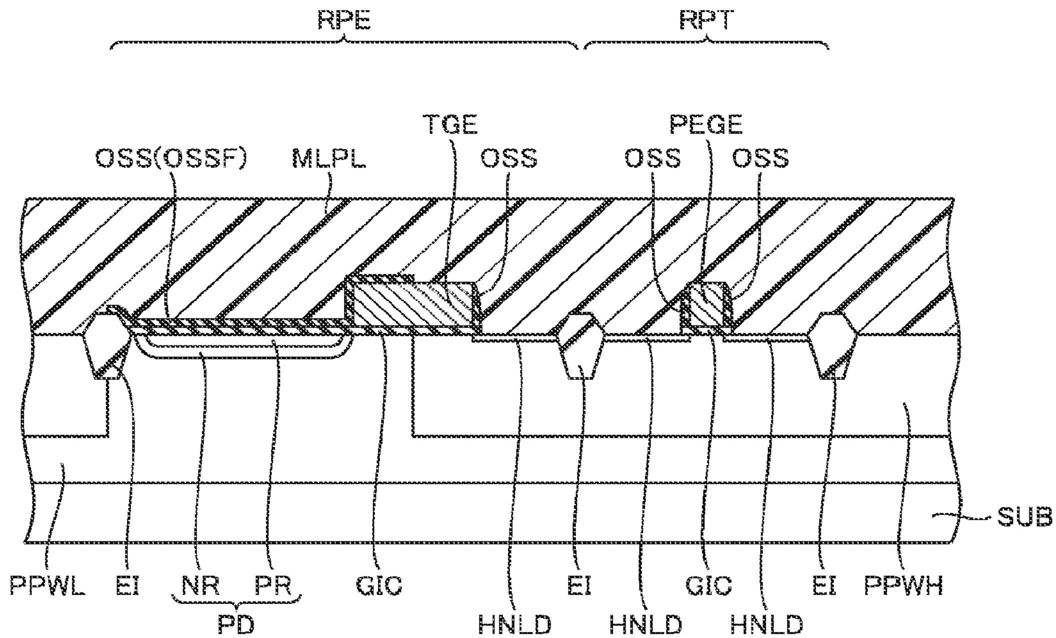

FIG. 96A is a cross sectional view of the pixel region and the like to show a step performed in the embodiment after the steps shown in FIG. 95A and FIG. 95B.

Figure 96B:
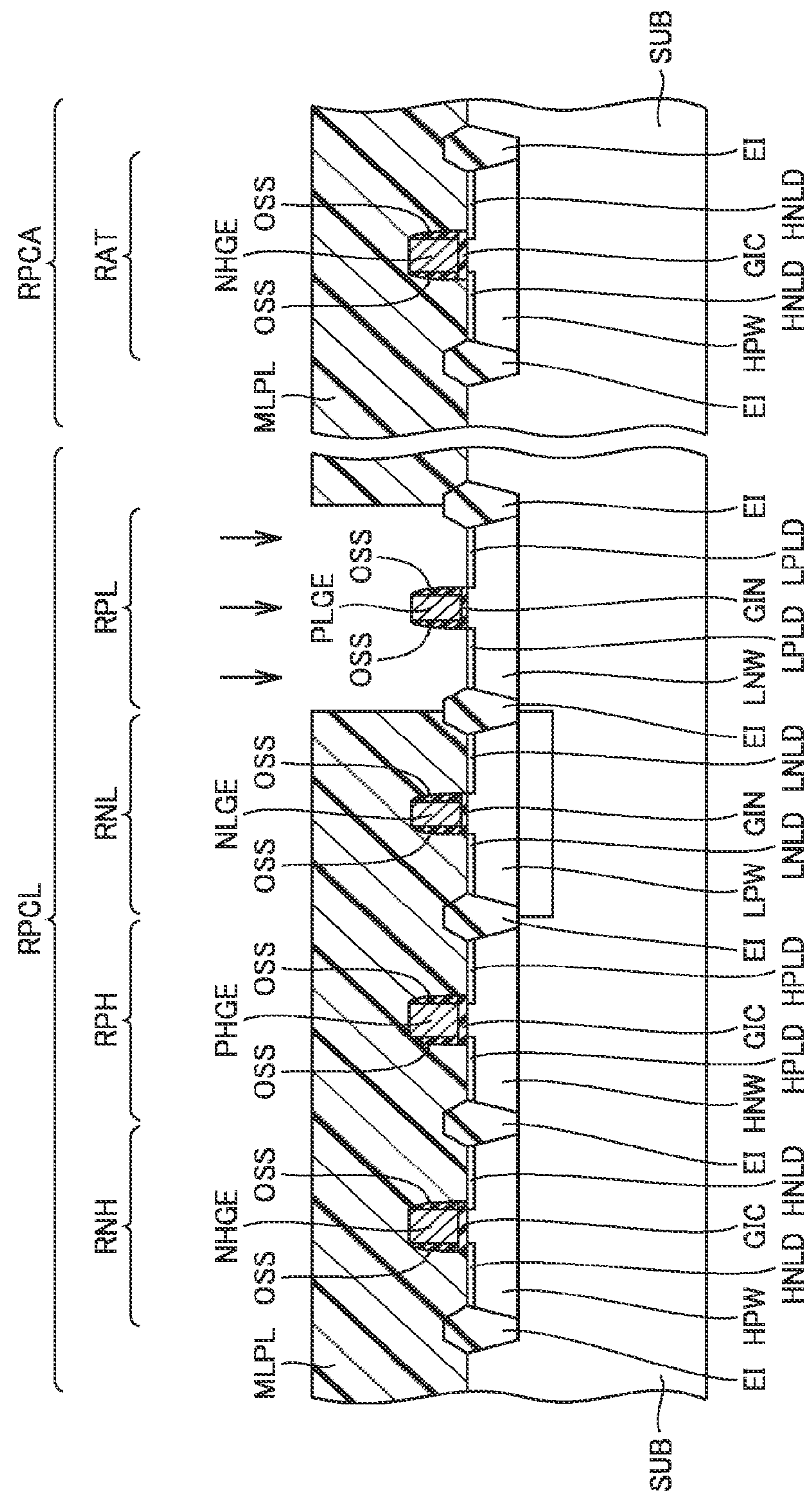

FIG. 96B is a cross sectional view of the peripheral region to show a step performed in the embodiment after the steps shown in FIG. 95A and FIG. 95B.

Figure 97A:
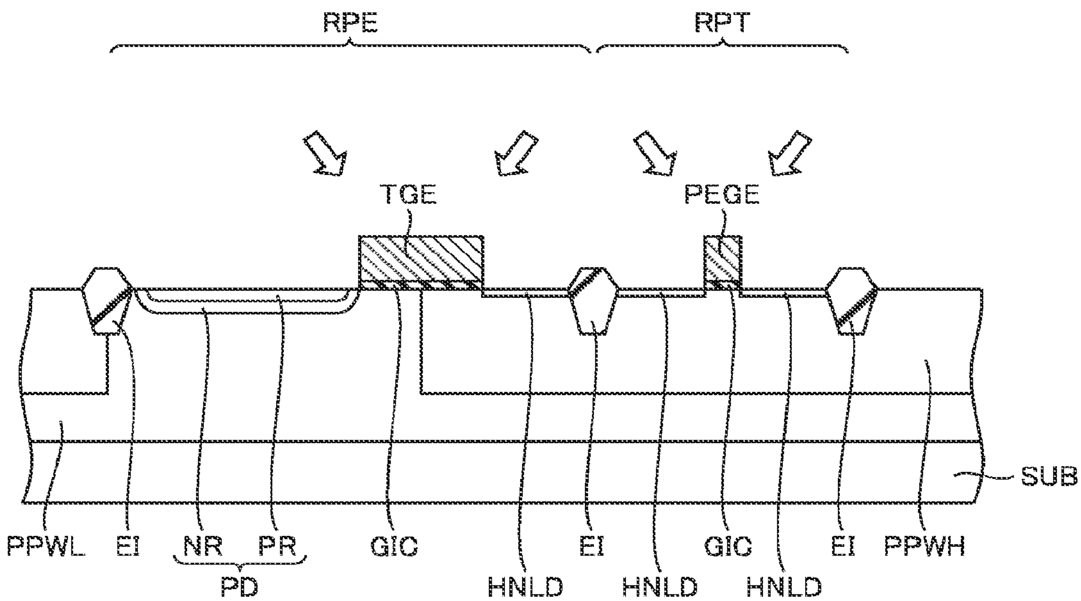

FIG. 97A is a cross sectional view of the pixel region and the like to show a step performed in the embodiment after the steps shown in FIG. 96A and FIG. 96B.

Figure 97B:
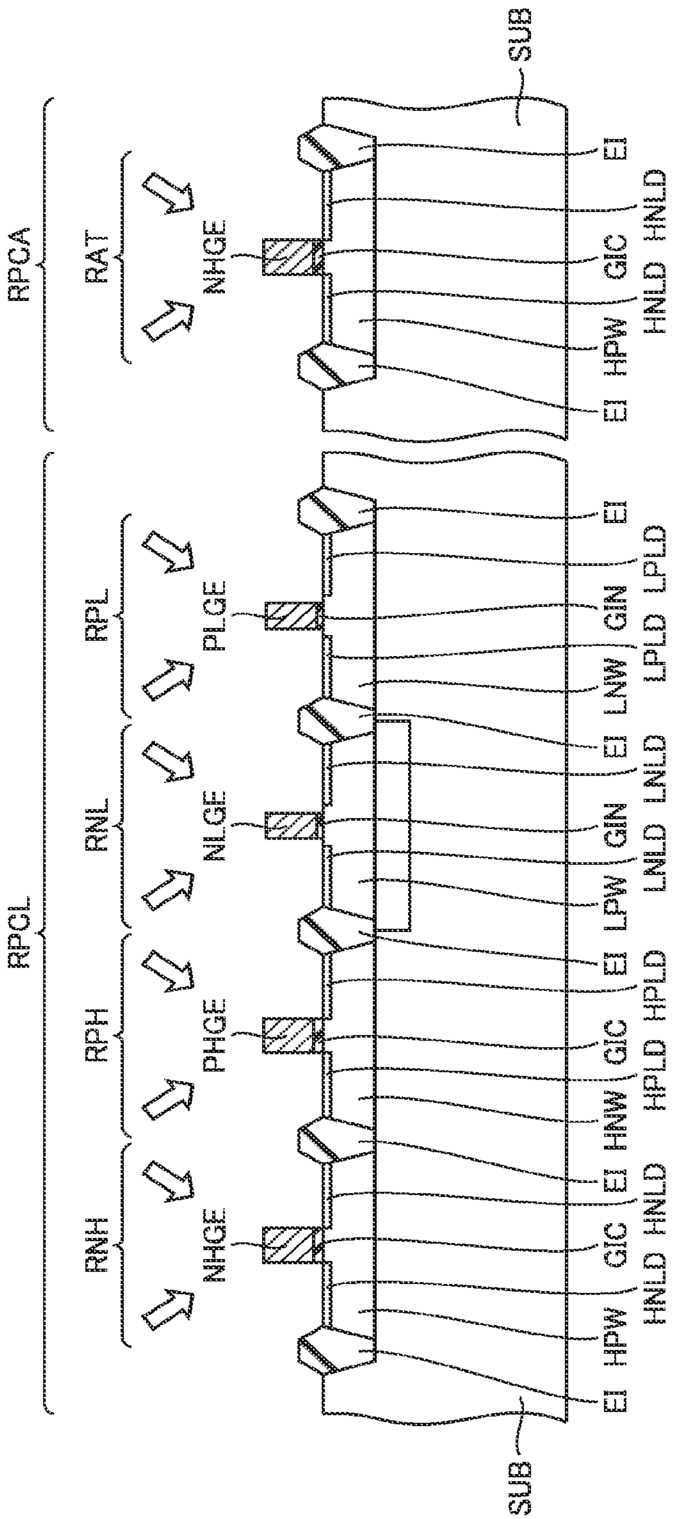

FIG. 97B is a cross sectional view of the peripheral region to show a step performed in the embodiment after the steps shown in FIG. 96A and FIG. 96B.

Figure 98A:
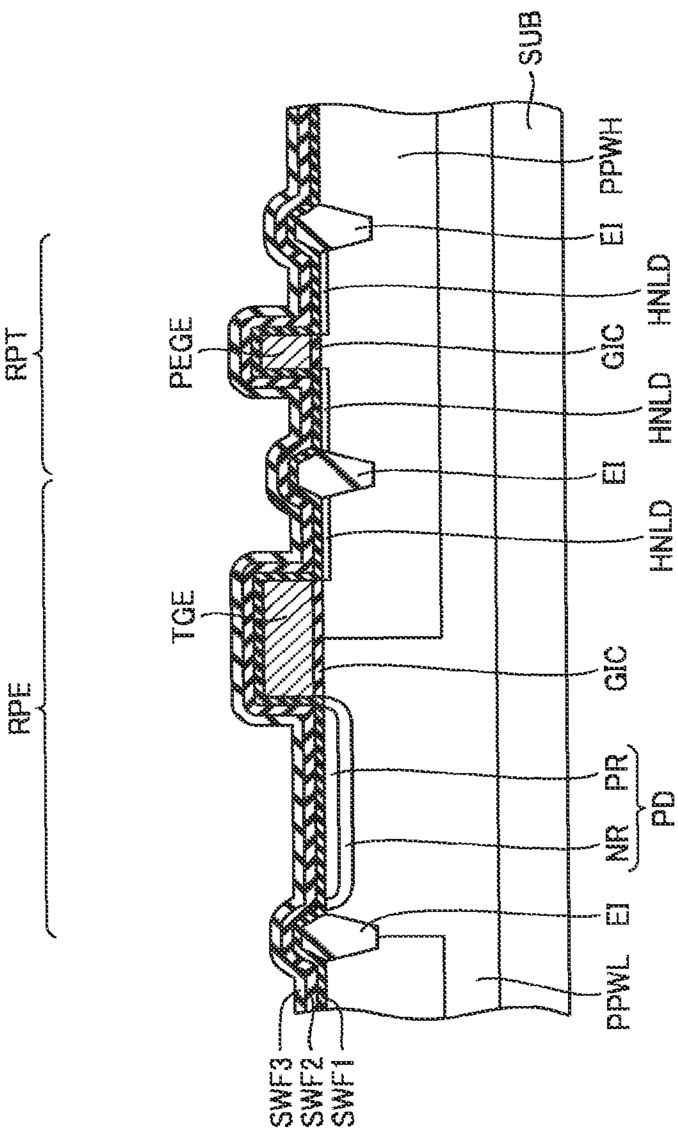

FIG. 98A is a cross sectional view of the pixel region and the like to show a step performed in the embodiment after the steps shown in FIG. 97A and FIG. 97B.

Figure 98B:
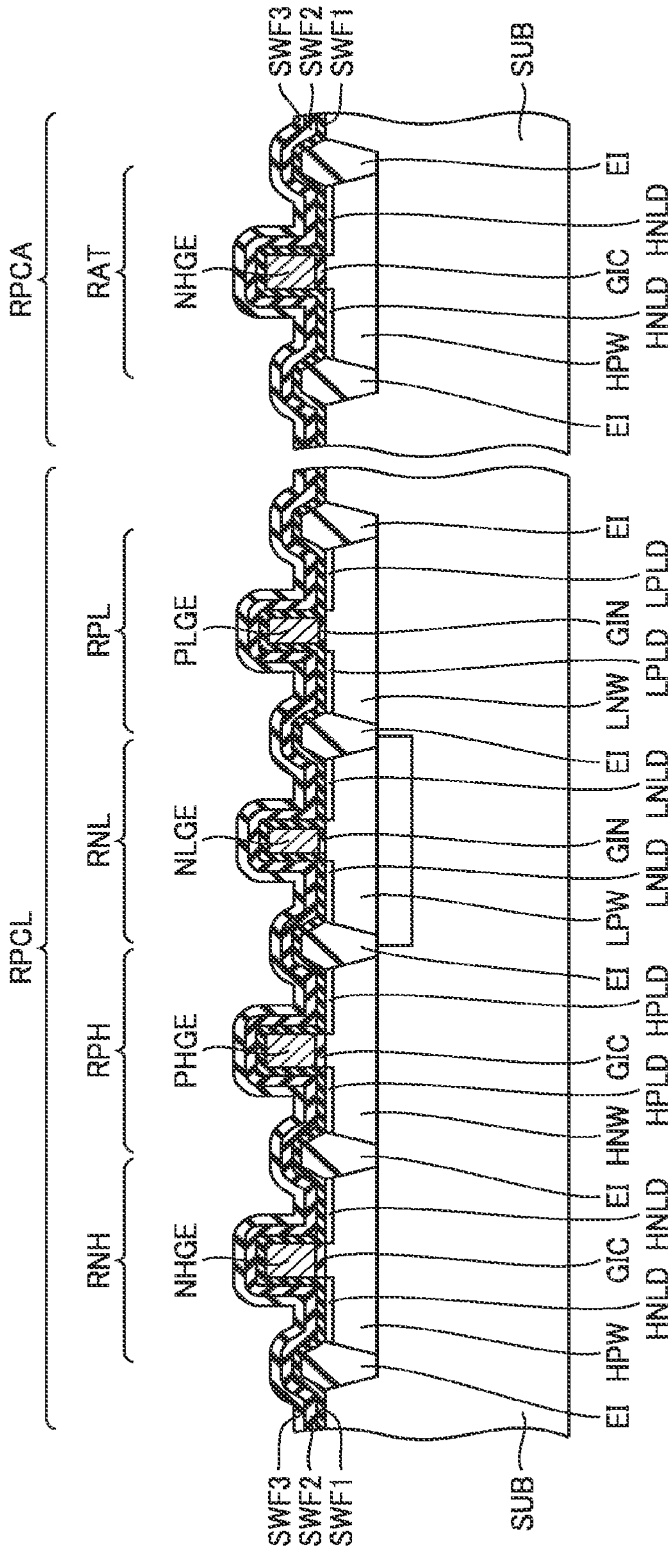

FIG. 98B is a cross sectional view of the peripheral region to show a step performed in the embodiment after the steps shown in FIG. 97A and FIG. 97B.

Figure 99A:
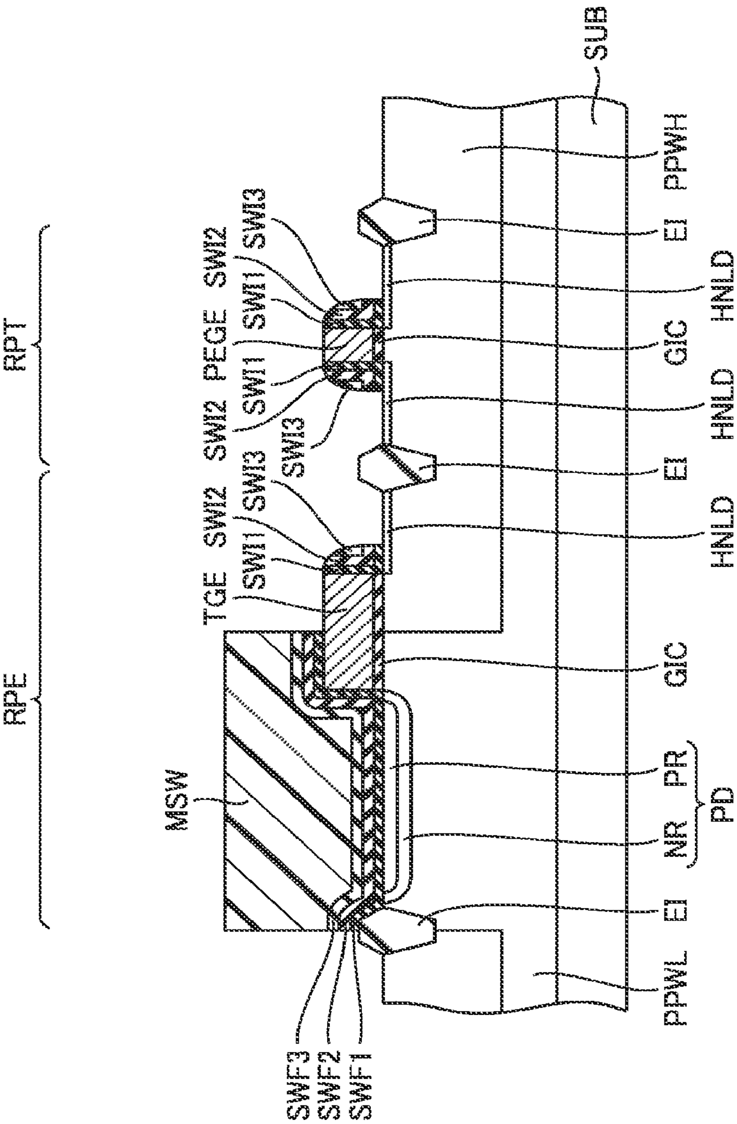

FIG. 99A is a cross sectional view of the pixel region and the like to show a step performed in the embodiment after the steps shown in FIG. 98A and FIG. 98B.

Figure 99B:
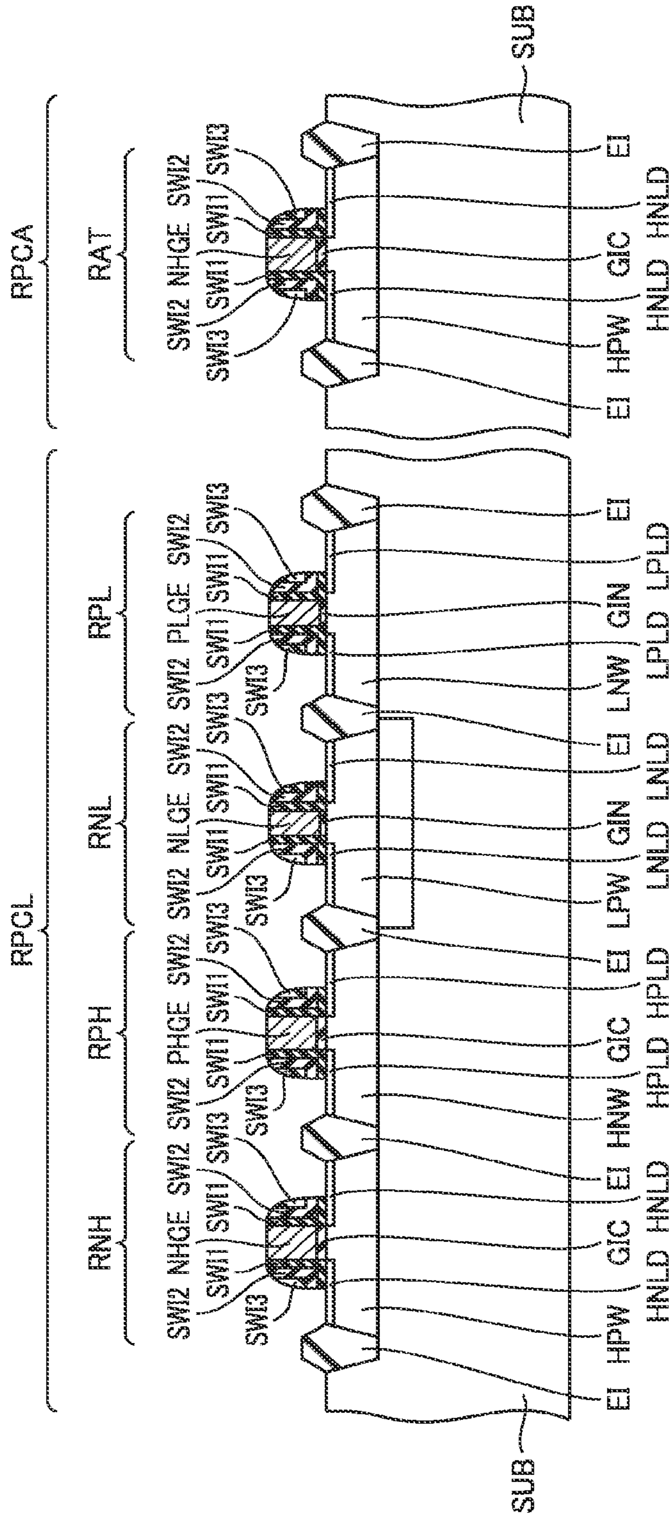

FIG. 99B is a cross sectional view of the peripheral region to show a step performed in the embodiment after the steps shown in FIG. 98A and FIG. 98B.

Figure 100A:
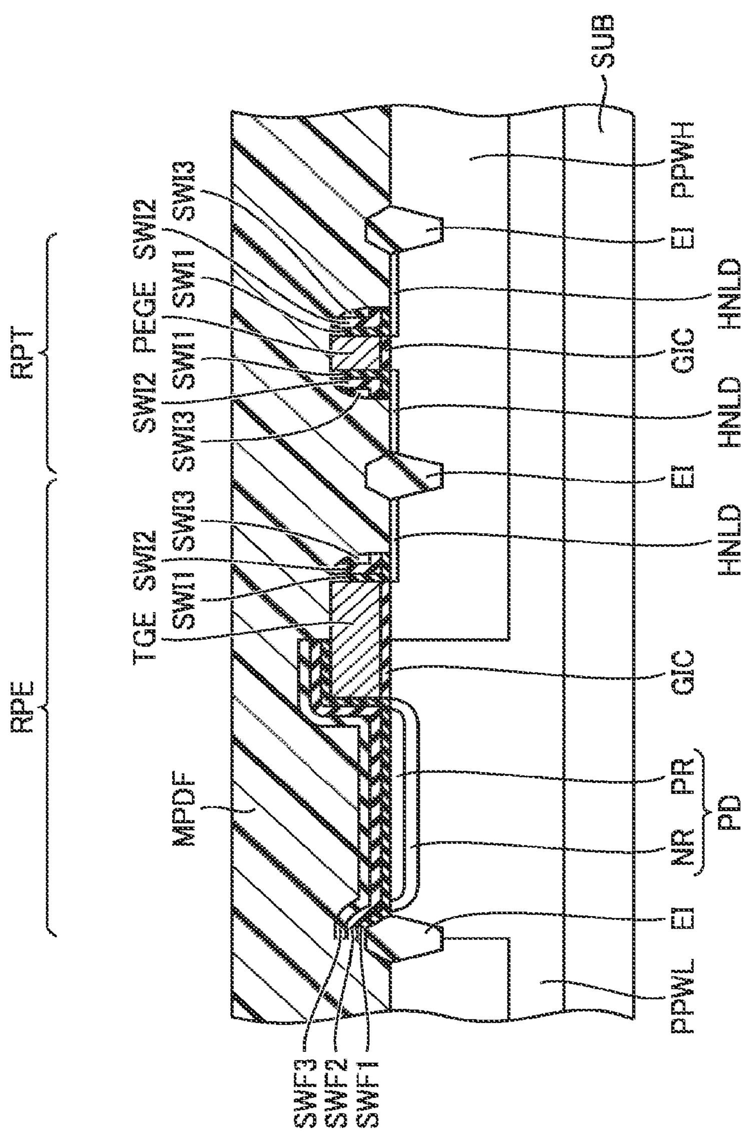

FIG. 100A is a cross sectional view of the pixel region and the like to show a step performed in the embodiment after the steps shown in FIG. 99A and FIG. 99B.

Figure 100B:
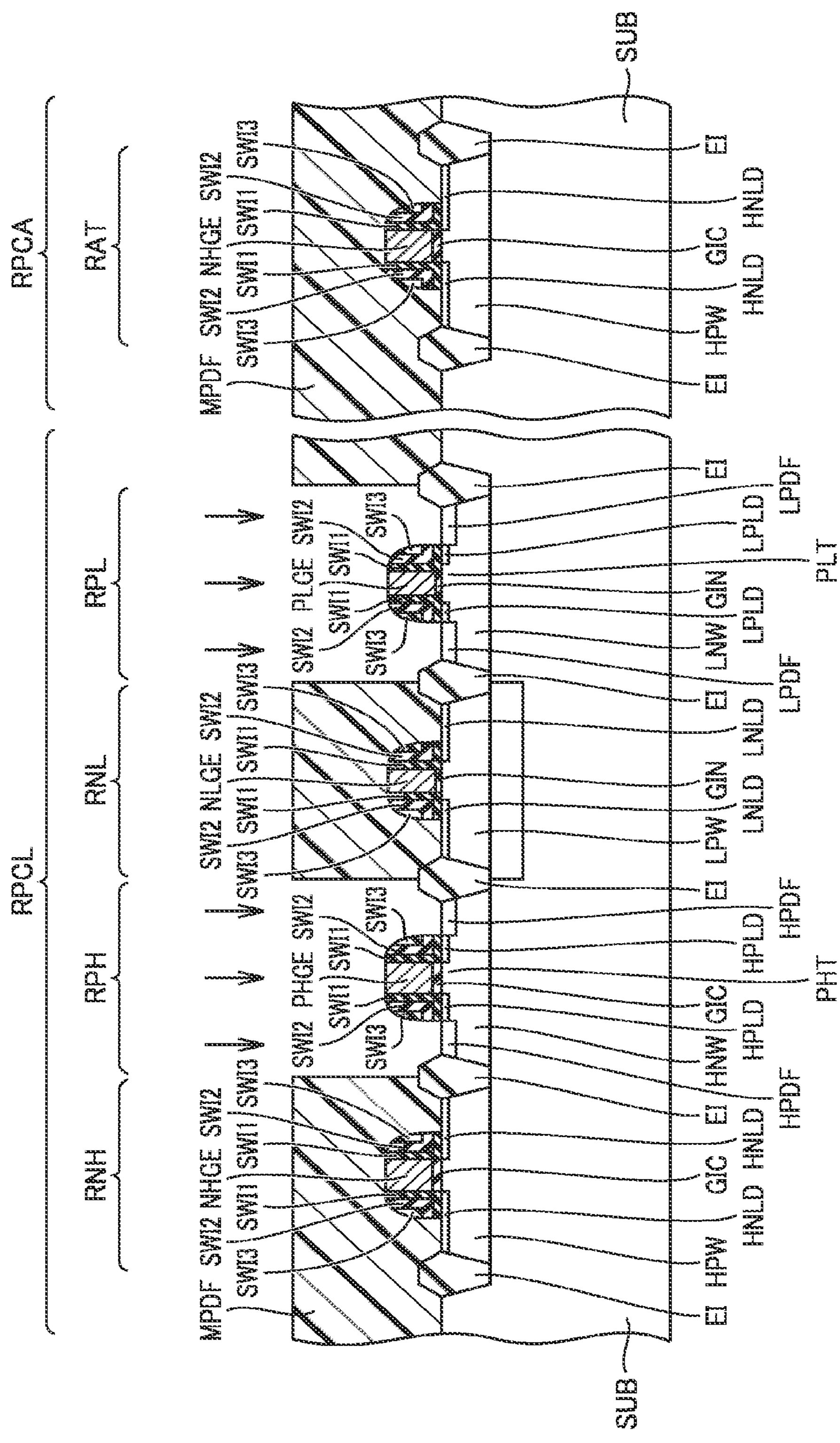

FIG. 100B is a cross sectional view of the peripheral region to show a step performed in the embodiment after the steps shown in FIG. 99A and FIG. 99B.

Figure 101A:
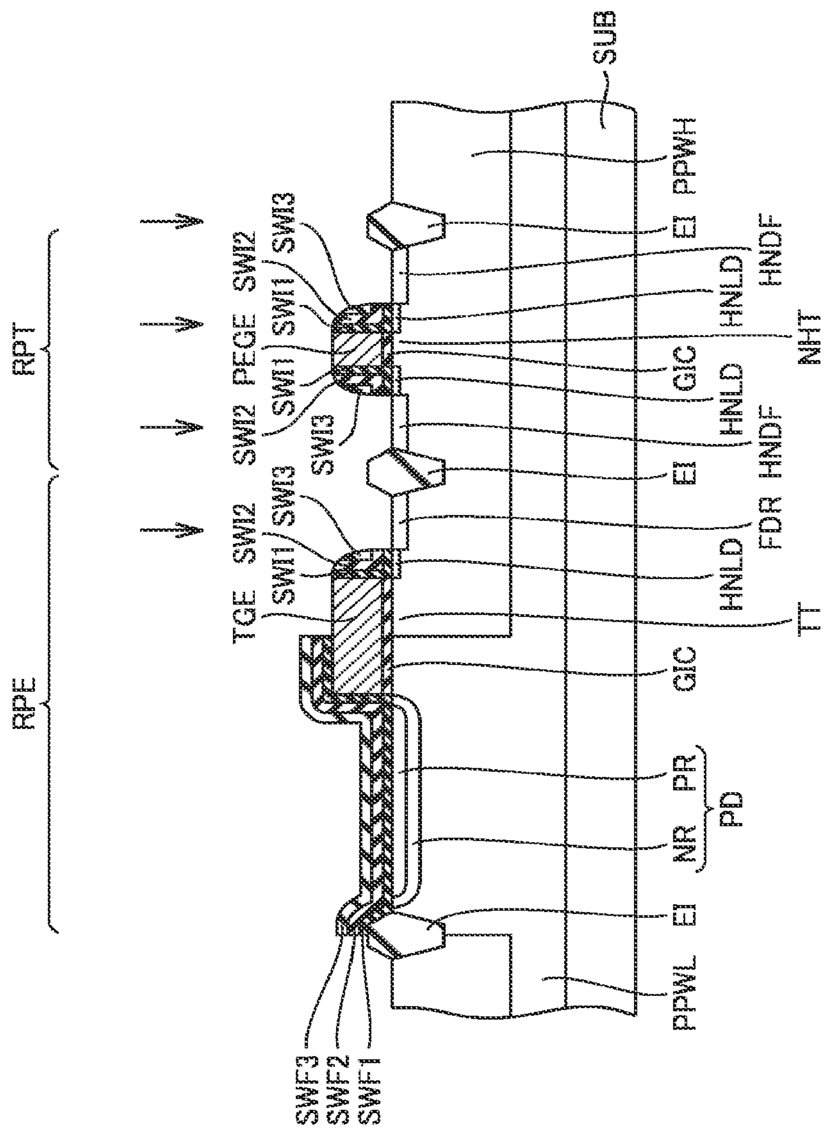

FIG. 101A is a cross sectional view of the pixel region and the like to show a step performed in the embodiment after the steps shown in FIG. 100A and FIG. 100B.

Figure 101B:
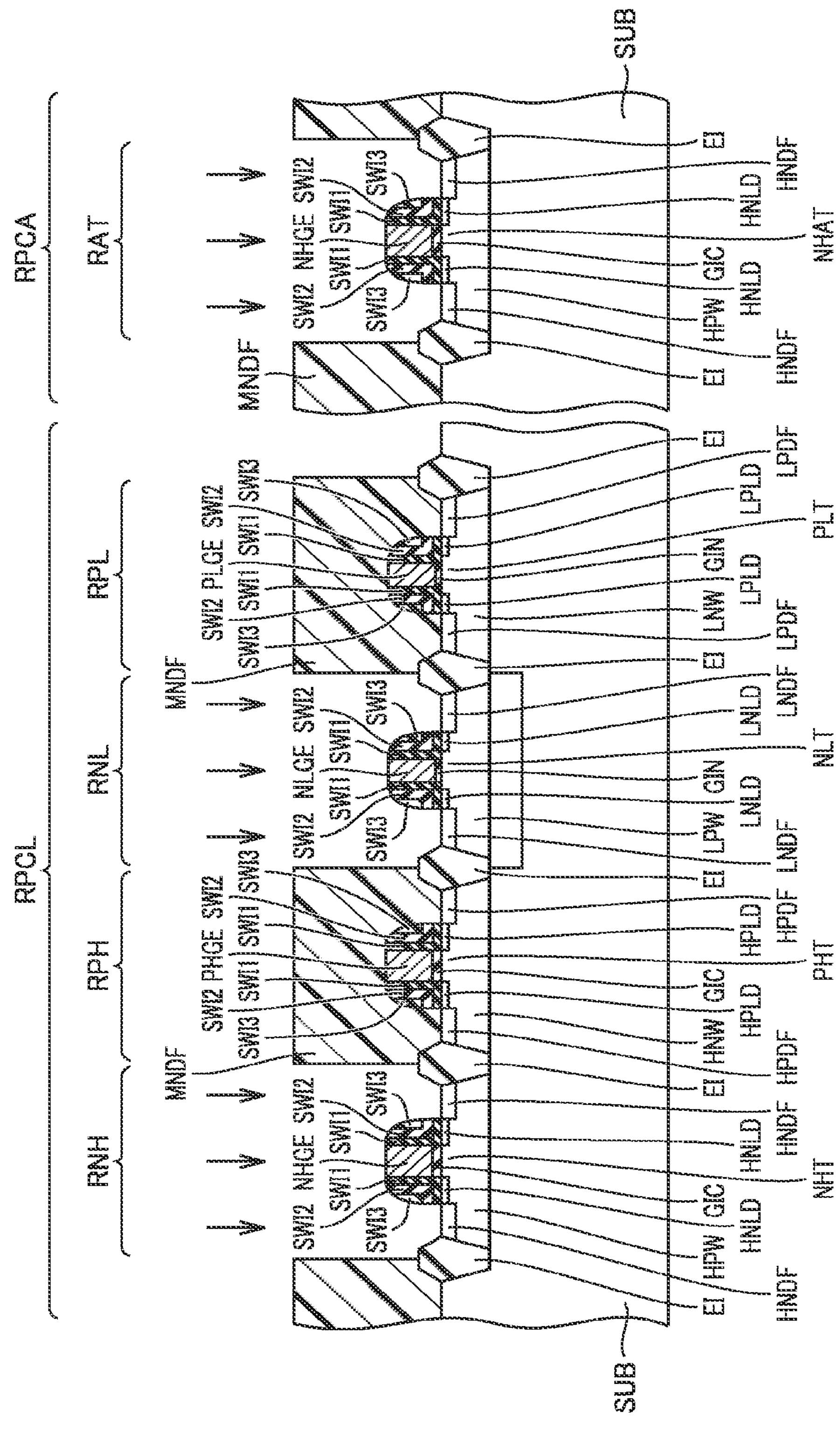

FIG. 101B is a cross sectional view of the peripheral region to show a step performed in the embodiment after the steps shown in FIG. 100A and FIG. 100B.

Figure 102A:
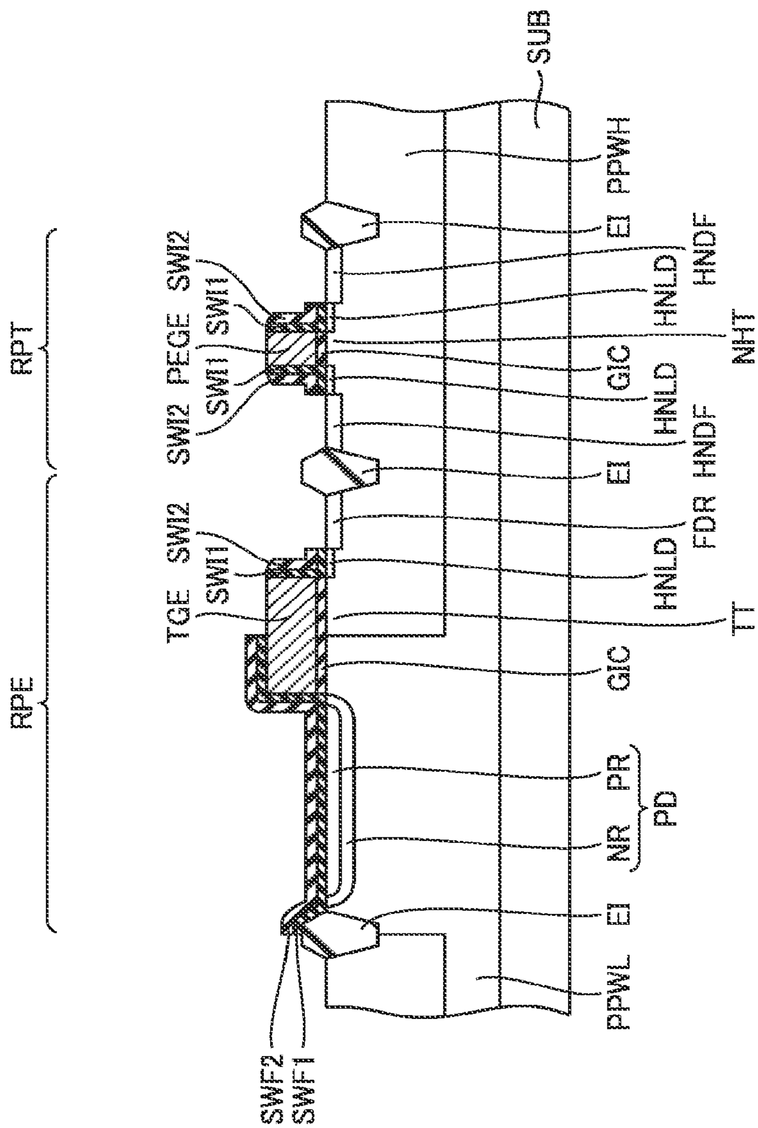

FIG. 102A is a cross sectional view of the pixel region and the like to show a step performed in the embodiment after the steps shown in FIG. 101A and FIG. 101B.

Figure 102B:
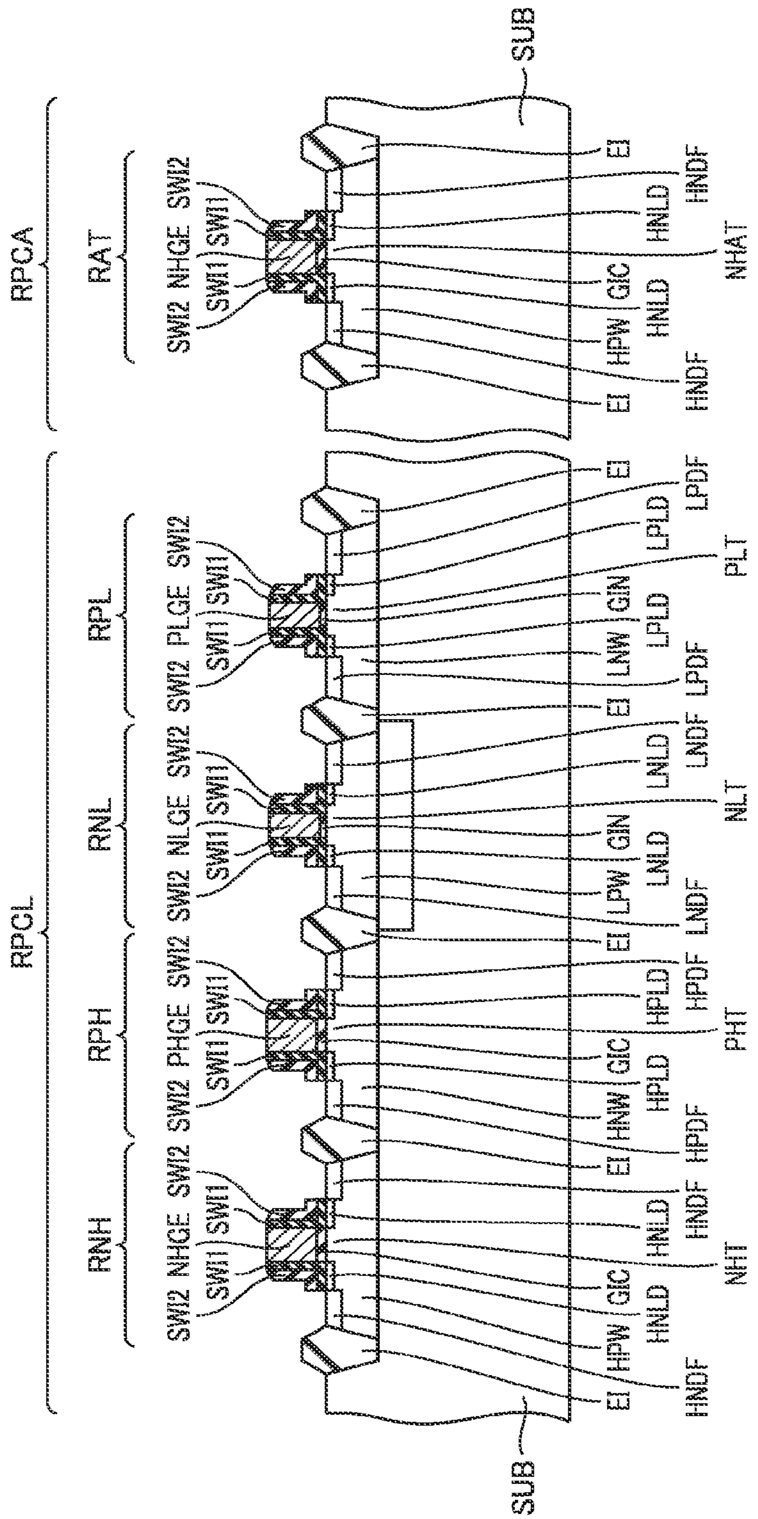

FIG. 102B is a cross sectional view of the peripheral region to show a step performed in the embodiment after the steps shown in FIG. 101A and FIG. 101B.

Figure 103A:
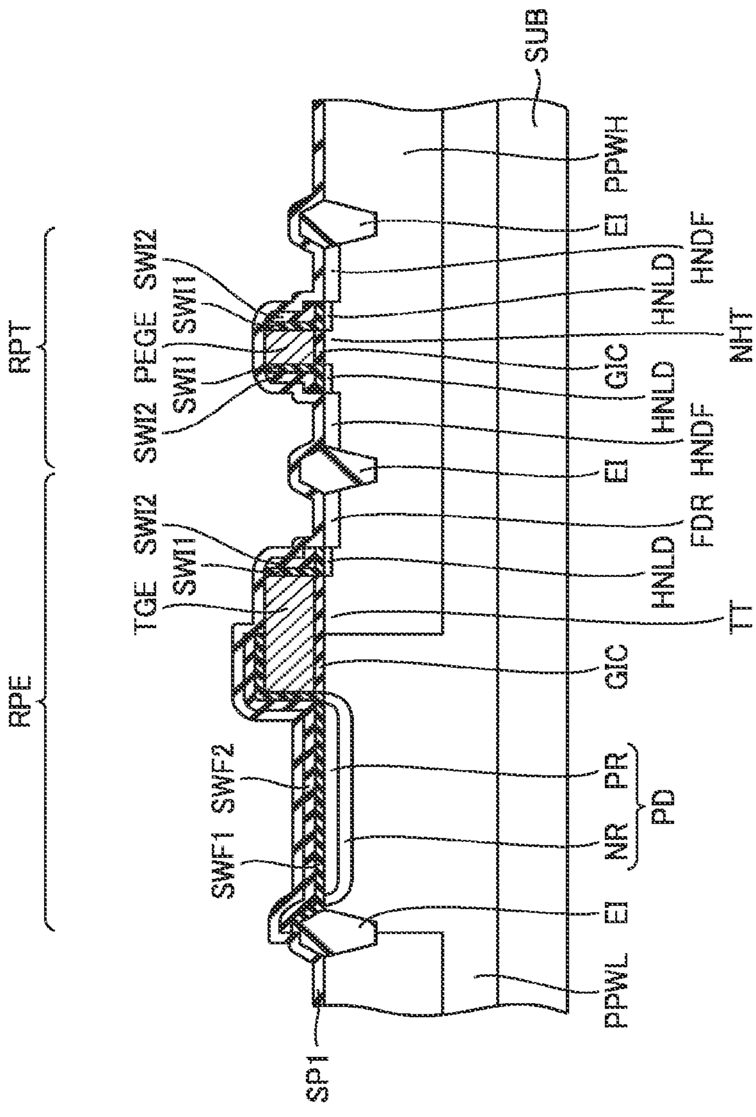

FIG. 103A is a cross sectional view of the pixel region and the like to show a step performed in the embodiment after the steps shown in FIG. 102A and FIG. 102B.

Figure 103B:
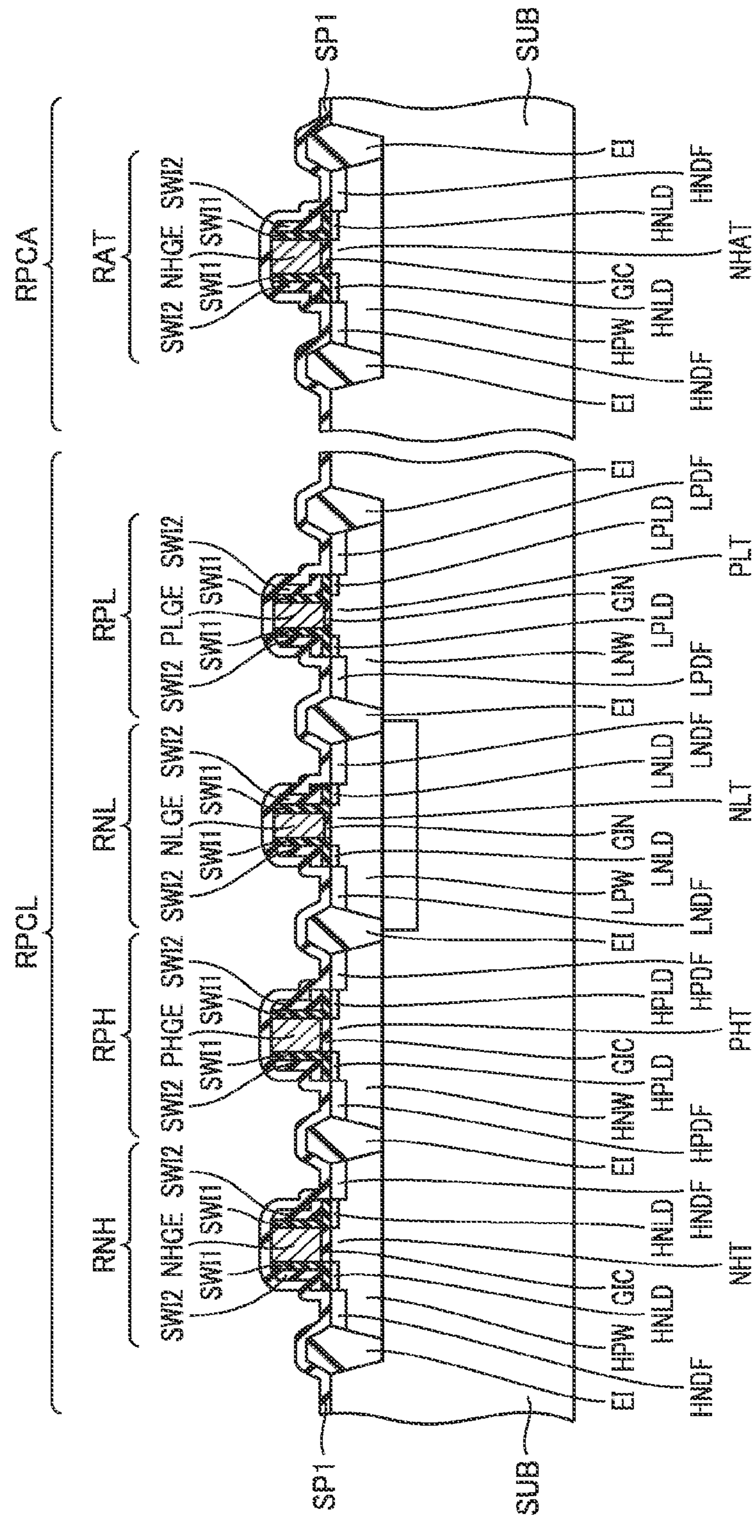

FIG. 103B is a cross sectional view of the peripheral region to show a step performed in the embodiment after the steps shown in FIG. 102A and FIG. 102B.

Figure 104A:
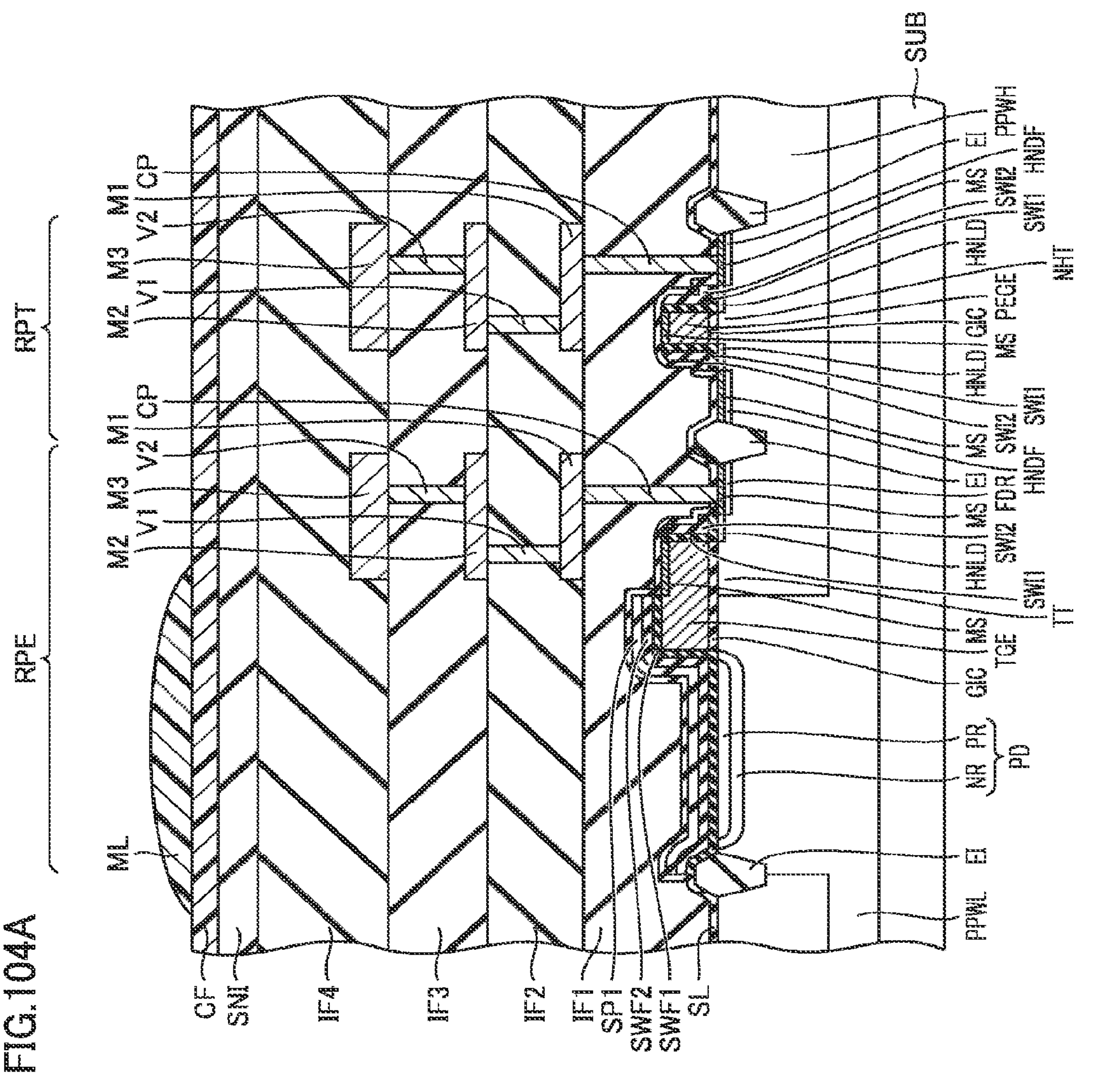

FIG. 104A is a cross sectional view of the pixel region and the like to show a step performed in the embodiment after the steps shown in FIG. 103A and FIG. 103B.

Figure 104B:
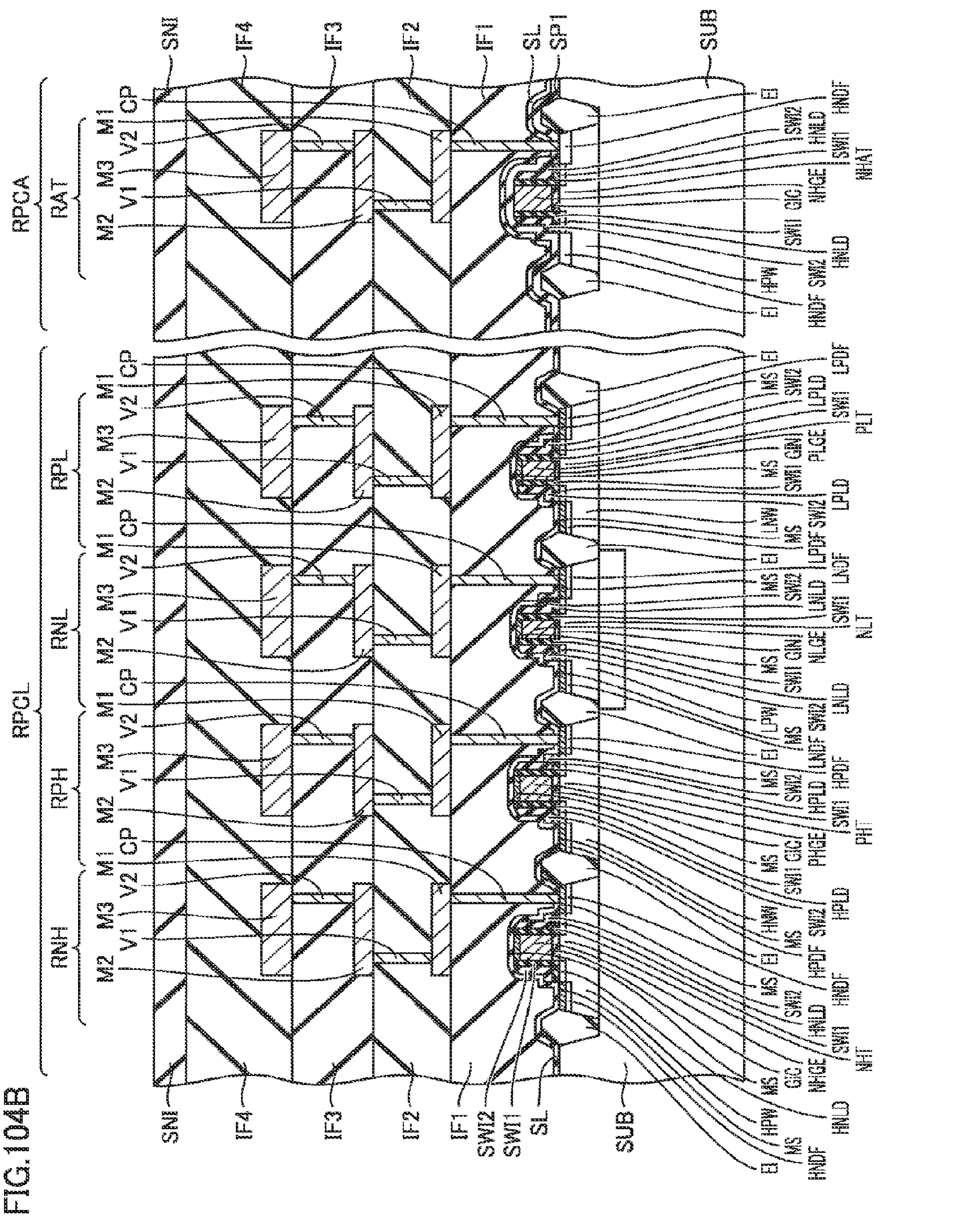

FIG. 104B is a cross sectional view of the peripheral region to show a step performed in the embodiment after the steps shown in FIG. 103A and FIG. 103B.

Figure 105:
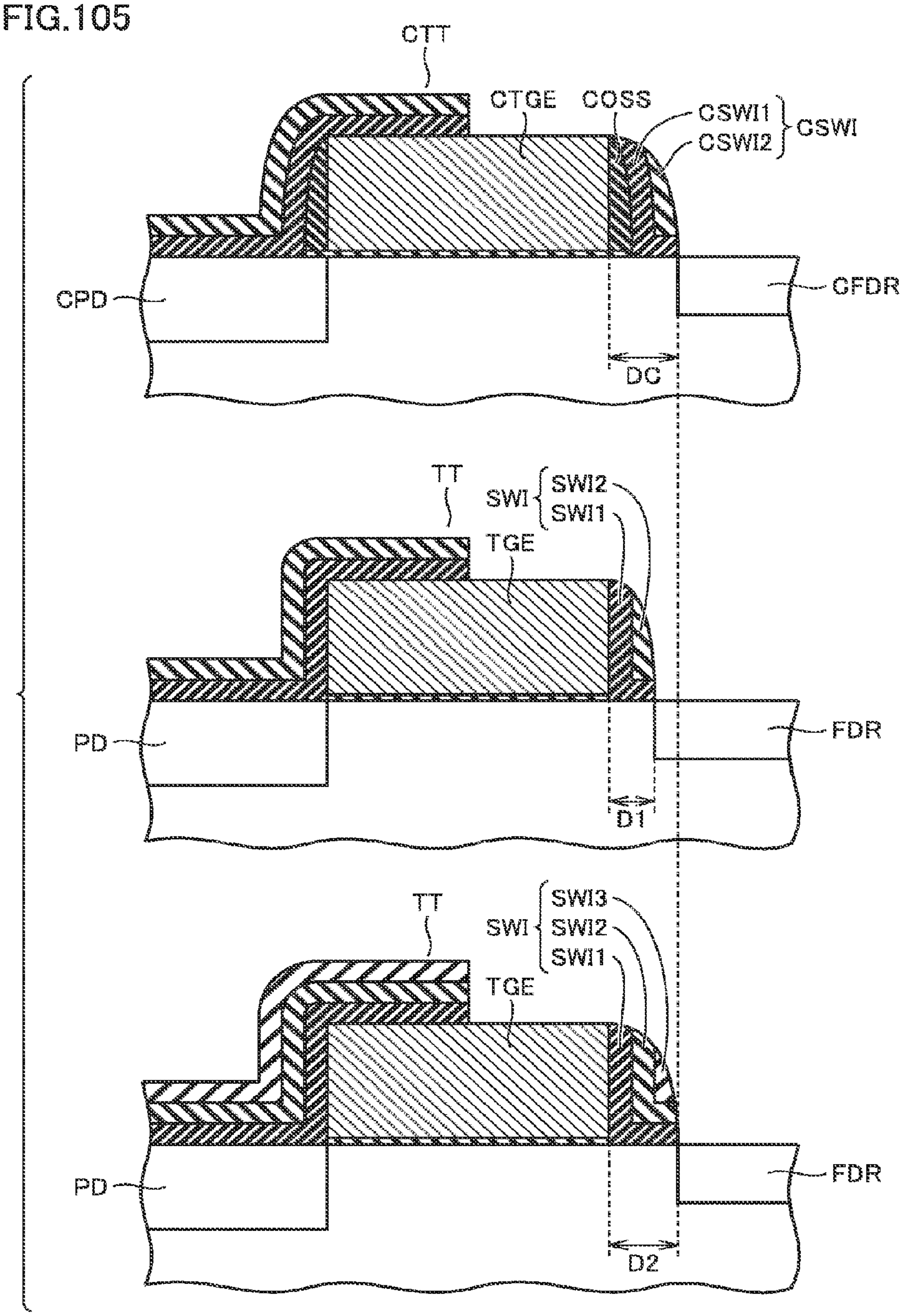

FIG. 105 illustrates function and effect provided by a sidewall insulating film constituted of three layers in the embodiment.

DESCRIPTION OF EMBODIMENTS

Figure 1:
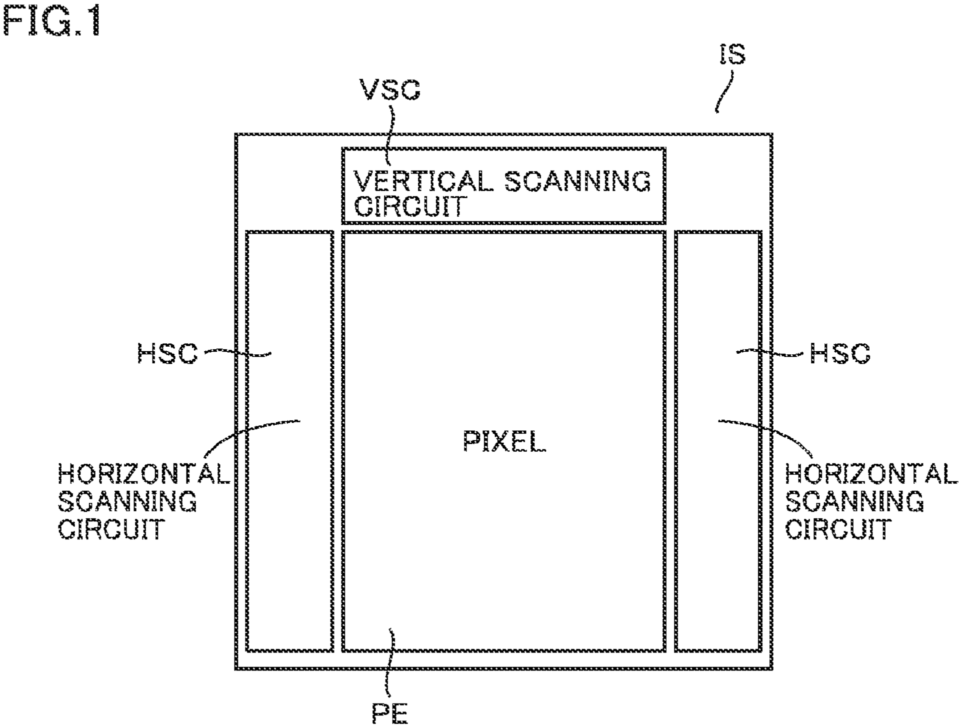
FIG. 1 is a block diagram showing a circuit of a pixel region in an image capturing device according to each embodiment.
Figure 2:
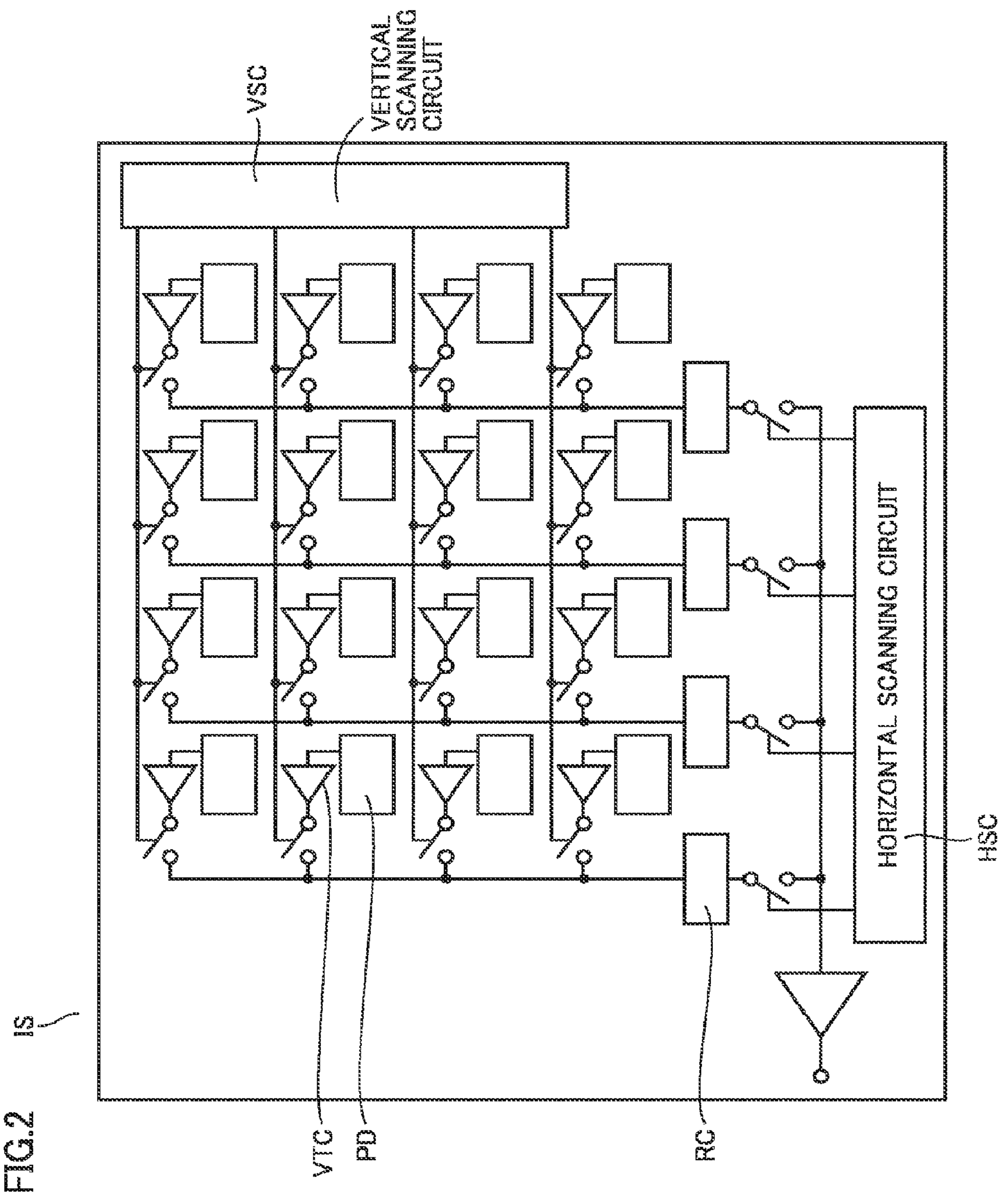
FIG. 2 shows an equivalent circuit of the pixel region of the image capturing device according to each embodiment.

First, the following describes overview of an image capturing device. As shown in FIG. 1 and FIG. 2, an image capturing device IS is constituted of a plurality of pixels PE arranged in the form of matrix. In each of pixels PE, a pn junction type photo diode PD is formed. A charge obtained through photoelectric conversion in photo diode PD is converted into voltage by a voltage conversion circuit VTC in each pixel. The signal converted into the voltage is read out to a horizontal scanning circuit HSC and a vertical scanning circuit VSC through a signal line. A row circuit RC is connected between horizontal scanning circuit HVC and voltage conversion circuit VTC.

Figure 3:
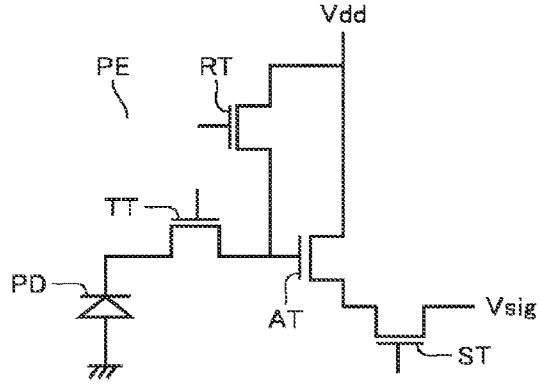
FIG. 3 shows an equivalent circuit of one pixel region of the image capturing device according to each embodiment.

In each pixel, as shown in FIG. 3, a photo diode PD, a transfer transistor TT, an amplification transistor AT, a selection transistor ST, and a resetting transistor RT are electrically connected to one another. In photo diode PD, light from a subject to be captured in image is accumulated as a charge. Transfer transistor TT transfers the charge to an impurity region (floating diffusion region). Before the charge is transferred to the floating diffusion region, resetting transistor RT resets a charge of the floating diffusion region.

The charge transferred to the floating diffusion region is input to a gate electrode of amplification transistor AT, is converted into voltage (Vdd), and is then amplified. When a signal to select a specific row of pixels is input to the gate electrode of selection transistor ST, the signal converted into the voltage is read as an image signal (Vsig).

Figure 4:
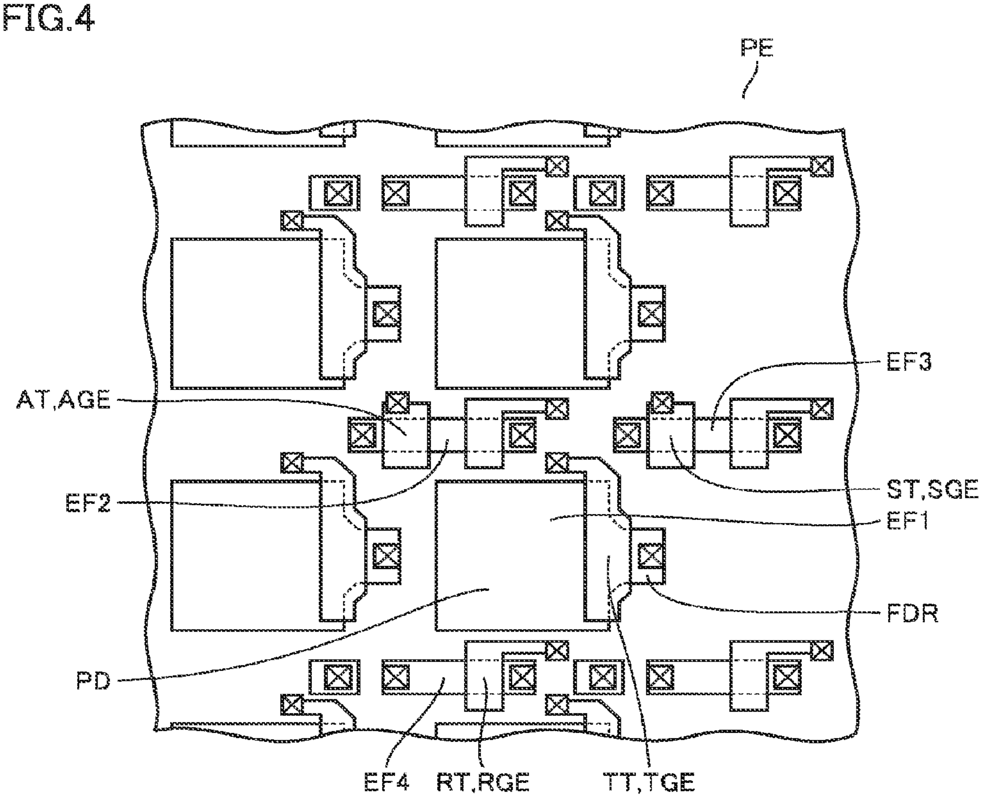
FIG. 4 is a partial plan view showing one example of a plan layout of a lower portion of the pixel region of the image capturing device according to each embodiment.

As shown in FIG. 4, photo diode PD, transfer transistor TT, amplification transistor AT, selection transistor ST, and resetting transistor RT are disposed at predetermined element formation regions EF1, EF2, EF3, EF4 in a plurality of element formation regions defined by forming an element isolation insulating film on the semiconductor substrate.

Transfer transistor TT is formed in element formation region EF1. Gate electrode TGE of transfer transistor TT is formed to cross element formation region EF1. Photo diode PD is formed at a portion of element formation region EF1 on one side relative to gate electrode TGE, and floating diffusion region FDR is formed at a portion of element formation region EF1 on the other side. Amplification transistor AT including a gate electrode AGE is formed in element formation region EF2. Selection transistor ST including a gate electrode SGE is formed in element formation region EF3. Resetting transistor RT including a gate electrode RGE is formed in element formation region EF4.

Figure 5:
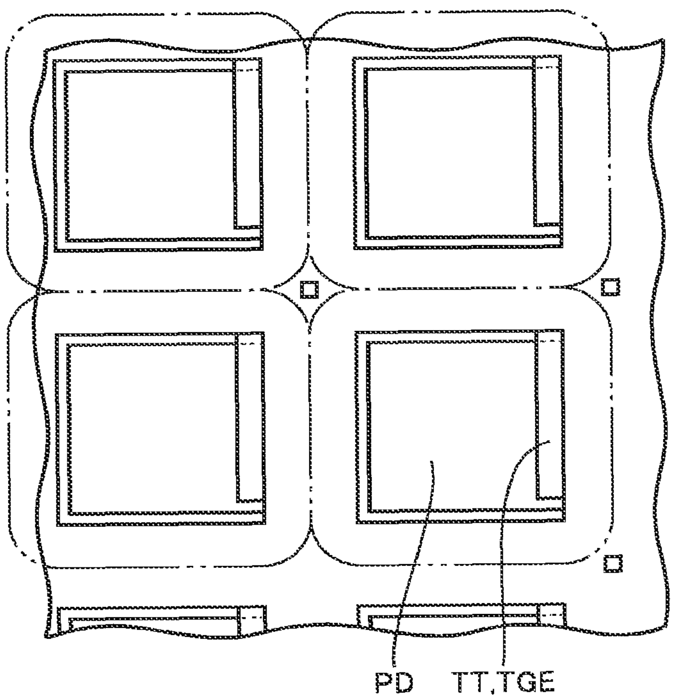
FIG. 5 is a partial plan view showing one example of a plan layout of an upper portion of the pixel region of the image capturing device according to each embodiment.

A plurality of interlayer insulating films (not shown) are formed to cover photo diode PD, transfer transistor TT, amplification transistor AT, selection transistor ST, and resetting transistor RT. A metal interconnection is formed between one interlayer insulating film and another interlayer insulating film. As shown in FIG. 5, a metal interconnection including a third interconnection M3 is formed not to cover the region in which photo diode PD is disposed. Just above photo diode PD, a micro lens ML is disposed to collect light.

The following describes overview of a method for manufacturing the image capturing device. In the method for manufacturing the image capturing device according to each embodiment, in order to prevent etching damage in the photo diode when forming an offset spacer film, the following process is performed: the offset spacer film is formed to cover the region in which the photo diode is disposed; and thereafter the offset spacer film covering the photo diode is removed by wet etching process or the offset spacer film remains without any modification.

Figure 6:
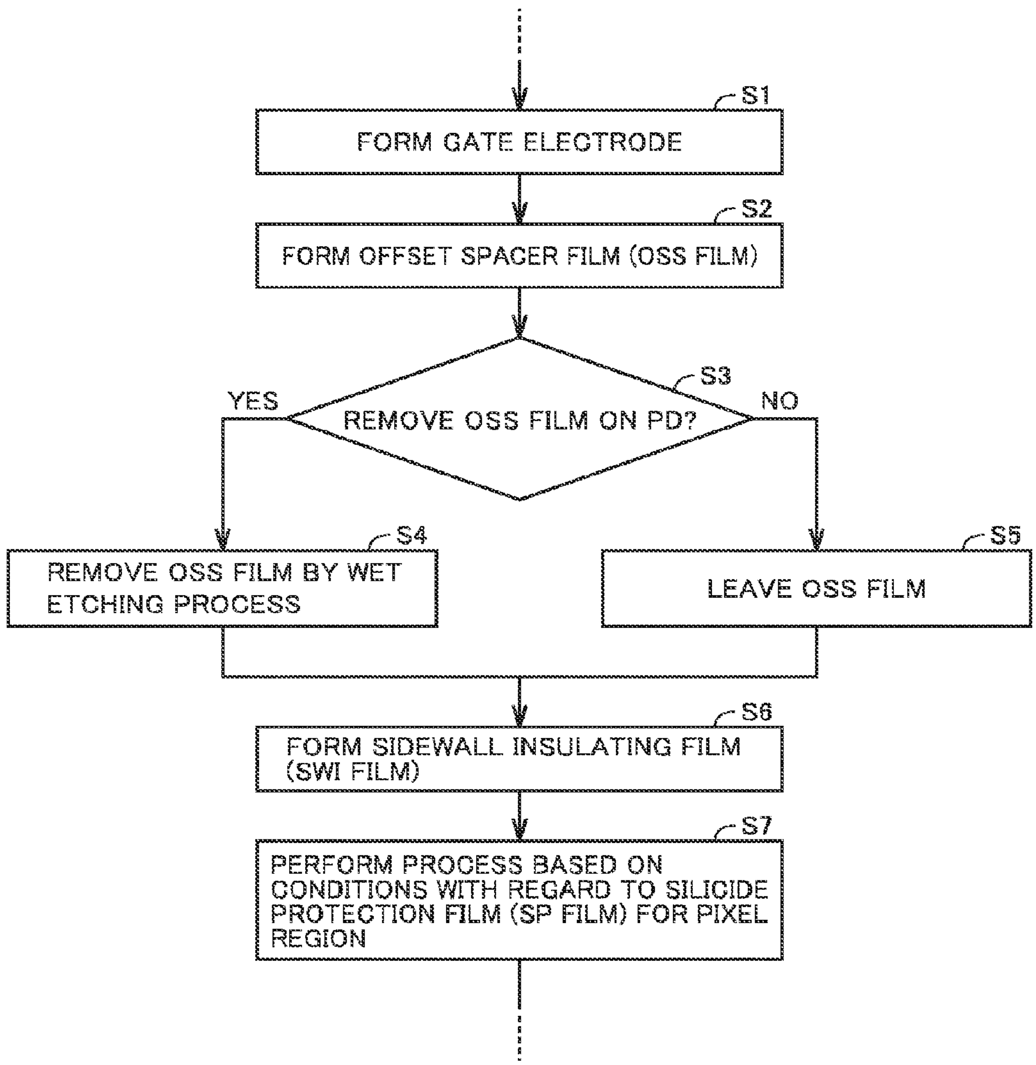
FIG. 6 is a partial flowchart showing a main part in a method for manufacturing the image capturing device according to each embodiment.

FIG. 6 shows a flowchart of main steps thereof. As shown in FIG. 6, the gate electrodes of the field effect transistors including the transfer transistor are formed (step S1). Next, the offset spacer film is formed on the side wall surface of each of the gate electrodes to cover the region in which the photo diode is disposed (step S2). Then, the extension (LDD) region of the field effect transistor is formed using the offset spacer film and the like as an implantation mask.

Next, in the case of removing the offset spacer film covering the region in which the photo diode is disposed, the offset spacer film is removed by wet etching process (step S3 and step S4). On the other hand, in the case of not removing the offset spacer film covering the region in which the photo diode is disposed, the offset spacer film remains without any modification (step S3 and step S5).

Next, a sidewall insulating film is formed on the side wall surface of the gate electrode (step S6). Then, using the sidewall insulating film and the like as an implantation mask, a source-drain region of the field effect transistor is formed. Next, in order to increase an amount of light coming into the photo diode, a process is performed based on conditions with regard to silicide protection films (step S7). In the pixels, the silicide protection films are formed for a case where the offset spacer film (insulating film) covering the photo diode remains and a case where the offset spacer film (insulating film) does not remain.

The following specifically describes variations of the manner of formation of the offset spacer film and the silicide protection film in each of the embodiments.

First Embodiment

Explained here is a case where wet etching process is provided to the entire surface to remove the offset spacer film and the pixel region is divided into a pixel region having the silicide protection film formed therein and a pixel region having no silicide protection film formed therein.

Figure 7A:
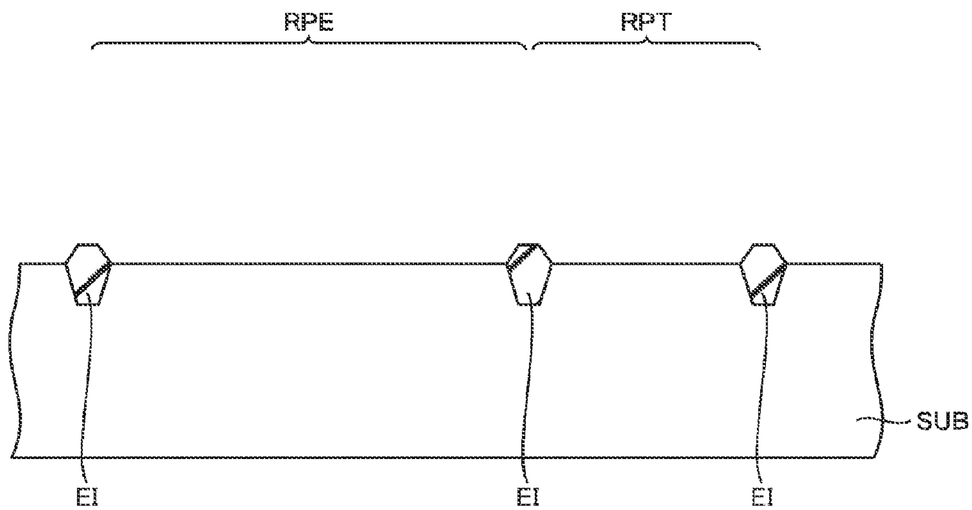
FIG. 7A is a cross sectional view of the pixel region and the like to show one step of the method for manufacturing the image capturing device according to the first embodiment.
Figure 7B:
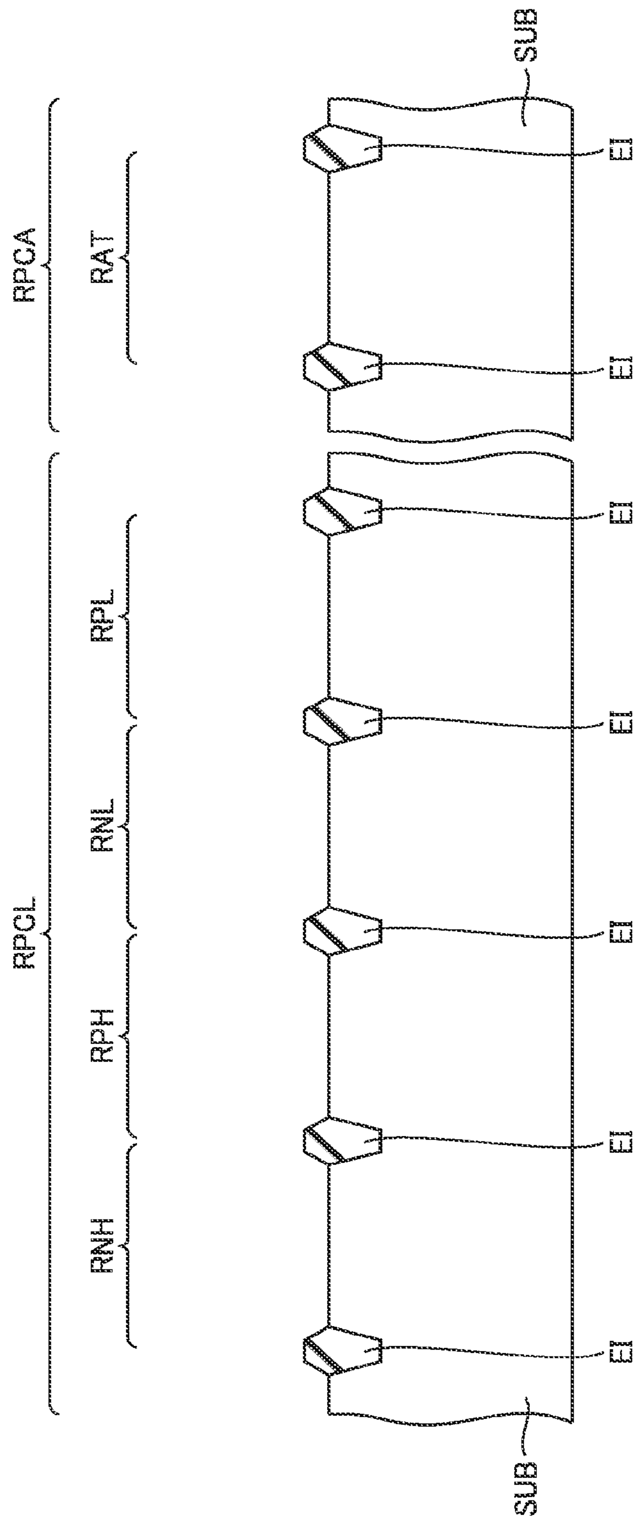
FIG. 7B is a cross sectional view of a peripheral region to show one step of the method for manufacturing the image capturing device according to the first embodiment.

As shown in FIG. 7A and FIG. 7B, by forming an element isolation insulating film EI in the semiconductor substrate, a pixel region RPE, a pixel transistor region RPT, a first peripheral region RPCL, and a second peripheral region RPCA are defined as the element formation regions. In pixel region RPE, the photo diode and the transfer transistor are formed. In pixel transistor region RPT, the resetting transistor, the amplification transistor, and the selection transistor are formed. It should be noted that as a process diagram, these transistors are represented by one transistor for simplicity of the drawings.

In first peripheral region RPCL, regions RNH, RPH, RNL, RPL are further defined as the regions in which field effect transistors are formed. In region RNH, an n channel type field effect transistor driven with a relatively high voltage (for example, about 3.3 V) is formed. On the other hand, in region RPH, a p channel type field effect transistor driven with a relatively high voltage (for example, about 3.3 V) is formed. In region RNL, an n channel type field effect transistor driven with a relatively low voltage (for example, about 1.5 V) is formed. Moreover, in region RPL, a p channel type field effect transistor driven with a relatively low voltage (for example, about 1.5 V) is formed.

In second peripheral region RPCA, a region RAT is defined as a region in which a field effect transistor is formed. In region RAT, an n channel type field effect transistor driven with a relatively high voltage (for example, about 3.3 V) is formed. The field effect transistor formed in region RAT processes an analog signal.

Figure 8A:
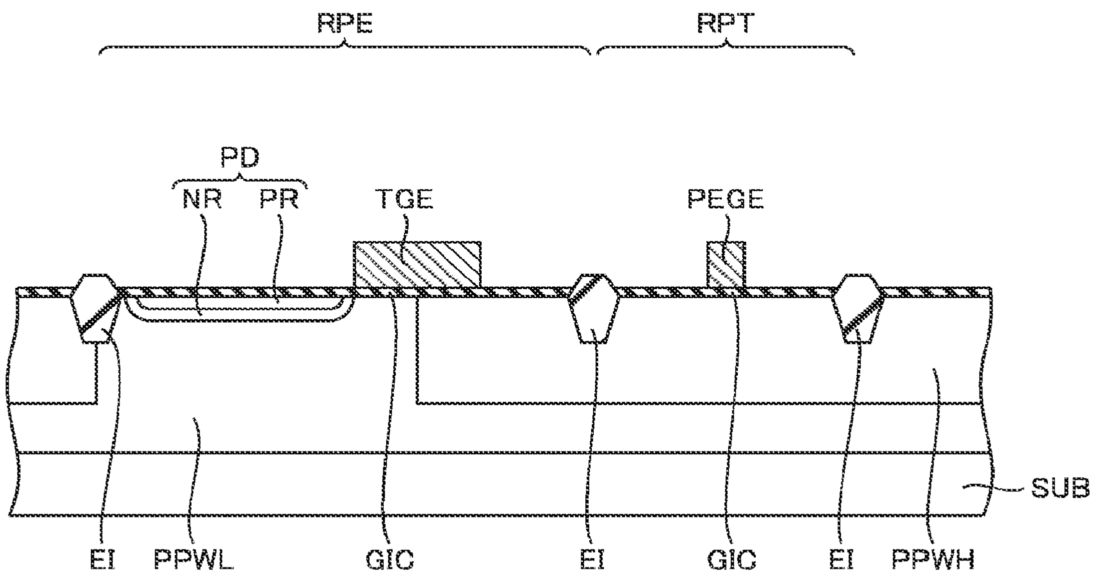
FIG. 8A is a cross sectional view of the pixel region and the like to show a step performed in the embodiment after the steps shown in FIG. 7A and FIG. 7B.
Figure 8B:
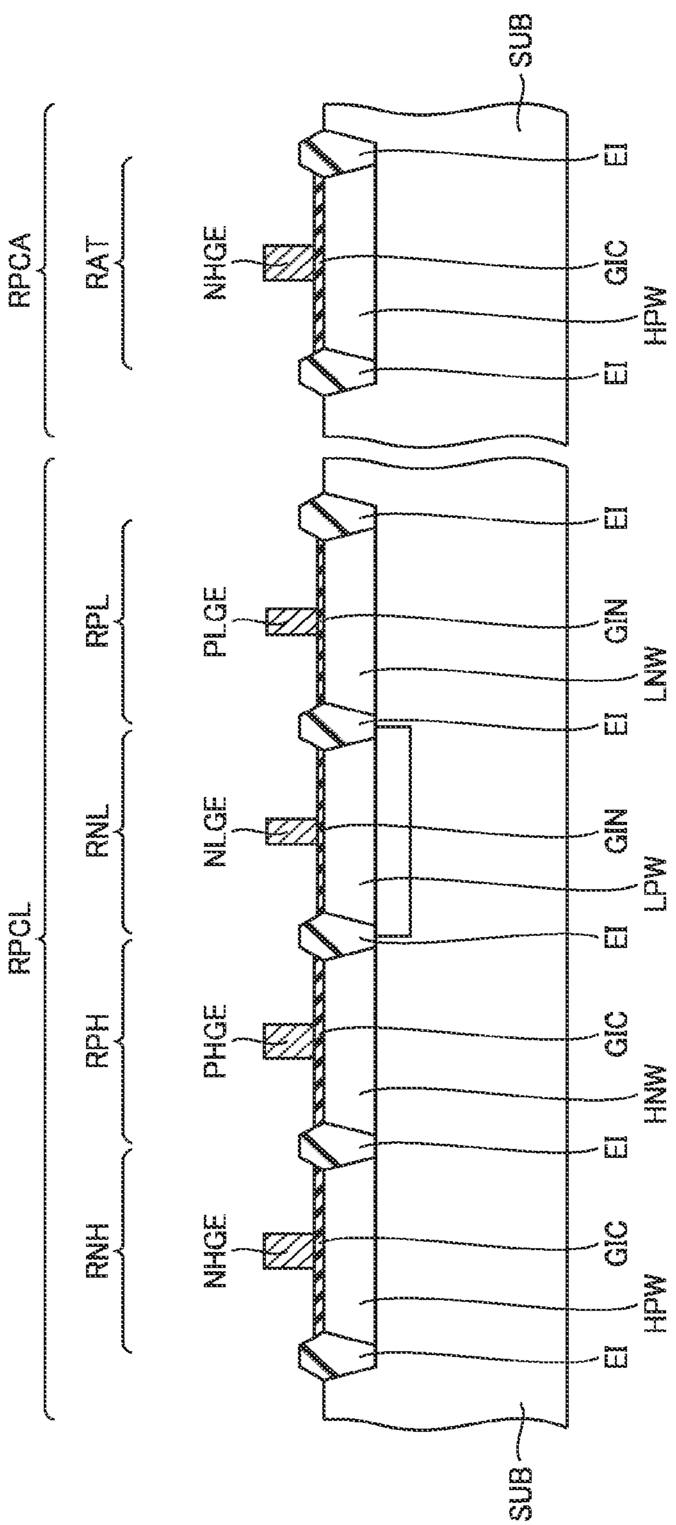
FIG. 8B is a cross sectional view of the peripheral region to show a step performed in the embodiment after the steps shown in FIG. 7A and FIG. 7B.

Next, a predetermined resist pattern (not shown) is formed by a photolithographic process, and is then used as an implantation mask to sequentially perform steps of implanting impurities of predetermined conductivity types, thereby forming wells of the predetermined conductivity types, respectively. As shown in FIG. 8A and FIG. 8B, in pixel region RPE and pixel transistor region RPT, a P well PPWL and a P well PPWH are formed. In first peripheral region RPCL, P wells HPW, LPW and N wells HNW, LNW are formed. In second peripheral region RPCA, a P well HPW is formed.

P well PPWL has an impurity concentration lower than the impurity concentration of P well PPWH. P well PPWH is formed to extend from the surface of semiconductor substrate SUB to a region shallower than P well PPWL. P wells HPW, LPW and N wells HNW, LNW are formed to extend from the surface of semiconductor substrate SUB to a predetermined depth.

Next, by combining thermal oxidation process with a process of partially removing the insulating film formed by the thermal oxidation process, gate insulating films having different film thicknesses are formed. In each of pixel region RPE and pixel transistor region RPT, a gate insulating film GIC having a relatively thick film thickness is formed. In each of regions RNH, RPH, RAT of first peripheral region RPCL, a gate insulating film GIC having a relatively thick film thickness is formed. In each of regions RNL, RPL of first peripheral region RPCL, a gate insulating film GIN having a relatively thin film thickness is formed. The film thickness of gate insulating film GIC is set at about 7 nm, for example.

Next, in order to cover gate insulating films GIC, GIN, conductive films (not shown), such as polysilicon films, to serve as the gate electrodes are formed. Next, predetermined photolithographic process and etching process are performed onto the conductive films, thereby forming the gate electrodes. In pixel region RPE, gate electrode TGE of the transfer transistor is formed. In pixel transistor region RPT, gate electrode PEGE of the resetting transistor, the amplification transistor, or the selection transistor is formed.

In region RNH of first peripheral region RPCL, gate electrode NHGE is formed. In region RPH, gate electrode PHGE is formed. In region RNL, gate electrode NLGE is formed. In region RPL, gate electrode PLGE is formed. In region RAT of second peripheral region RPCA, gate electrode NHGE is formed. Gate electrodes PEGE, NHGE, PHGE are formed to have longer lengths in the gate length direction than the lengths of gate electrodes NLGE, PLGE in the gate length direction.

Next, the photo diode is formed in pixel region RPE. A resist pattern (not shown) is formed to expose the surface of P well PPWL on one side relative to gate electrode TGE and to cover the other regions. Next, by implanting an n type impurity using the resist pattern as an implantation mask, an n type region NR is formed to extend from the surface (surface of P well PPWL) of semiconductor substrate SUB to the predetermined depth. Further, by implanting a p type impurity, a P type region PR is formed to extend from the surface of semiconductor substrate SUB to a depth shallower than a predetermined depth. Photo diode PD is formed by a pn junction between n type region NR and p well PPWL.

Figure 9A:
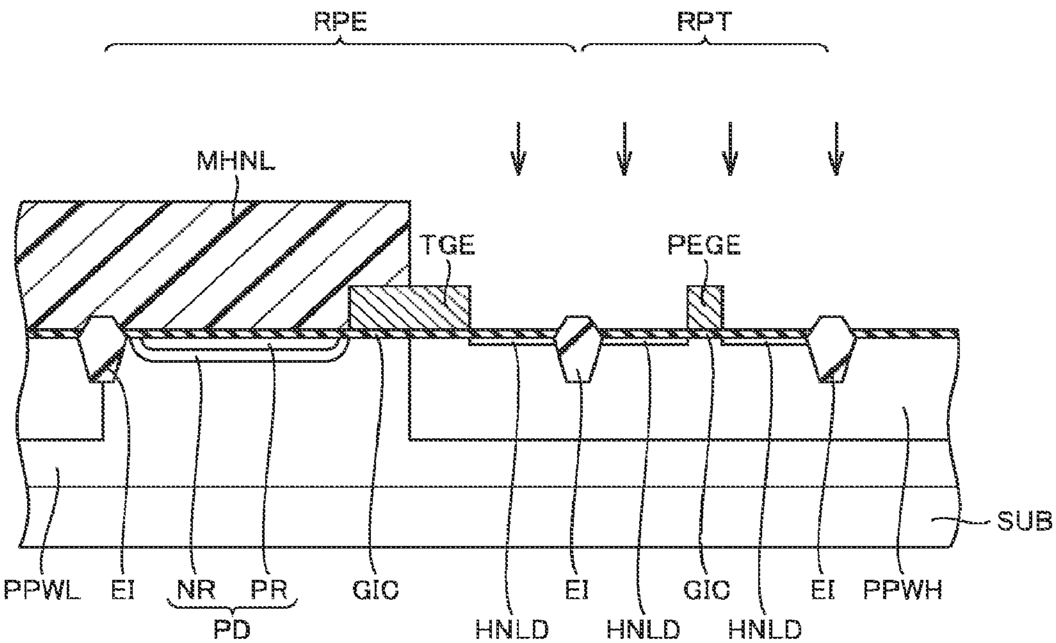
FIG. 9A is a cross sectional view of the pixel region and the like to show a step performed in the embodiment after the steps shown in FIG. 8A and FIG. 8B.
Figure 9B:
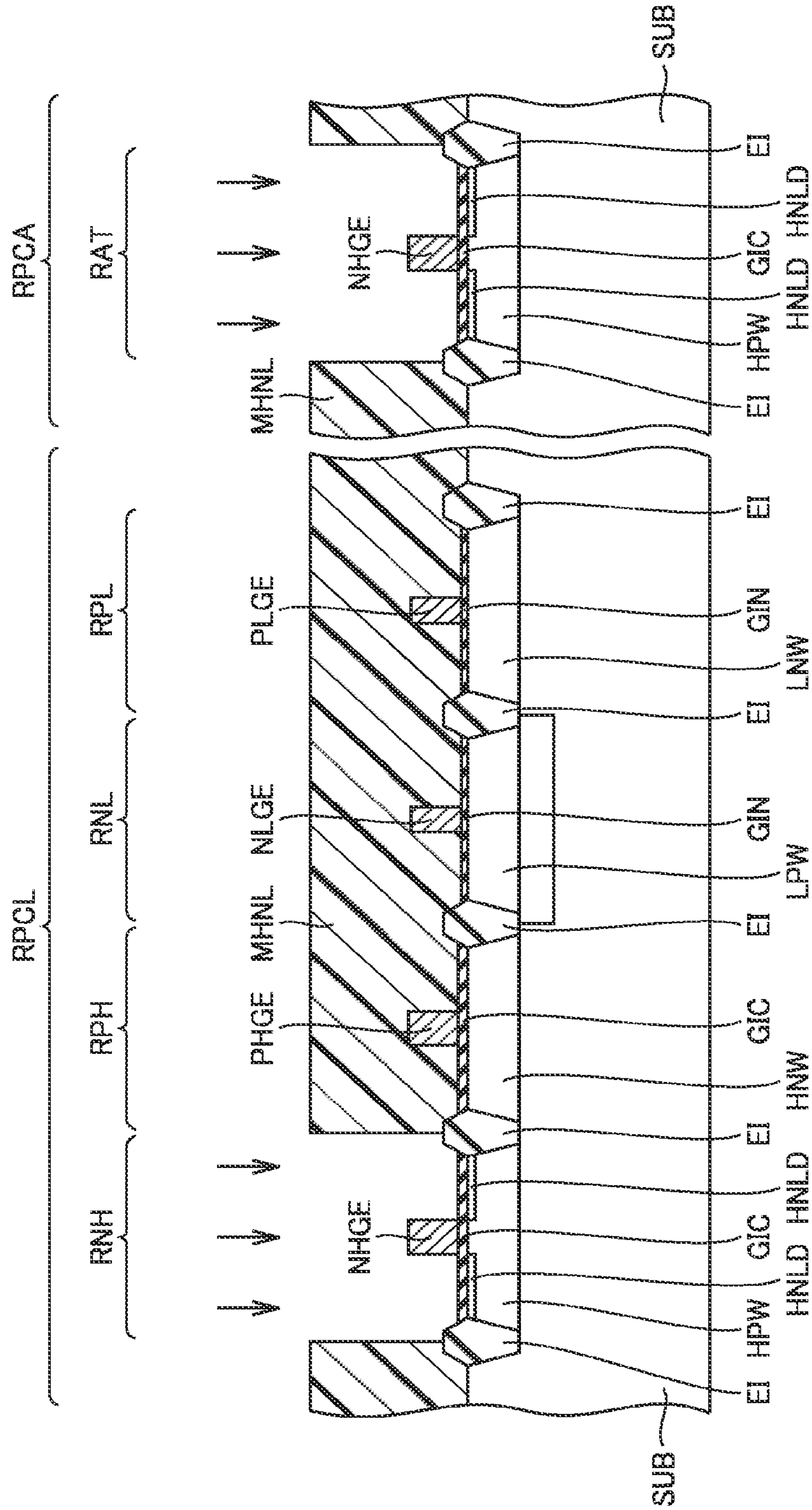
FIG. 9B is a cross sectional view of the peripheral region to show a step performed in the embodiment after the steps shown in FIG. 8A and FIG. 8B.

Next, an extension (LDD) region is formed in each of regions RPT, RNH, RAT, RPH in each of which a field effect transistor driven with a relatively high voltage is formed. As shown in FIG. 9A and FIG. 9B, by performing a predetermined photolithographic process, a resist pattern MHNL is formed to expose pixel transistor region RPT, region RNH, and region RAT and cover the other regions.

Next, by implanting an n type impurity using resist pattern MHNL, gate electrodes PEGE, NHGE, and the like as an implantation mask, an n type extension region HNLD is formed in each of pixel transistor region RPT, region RNH, and region RAT, each of which is exposed. On the other hand, in pixel region RPE, extension region HNLD is formed at a portion of P well PPWH on a side opposite to the side, on which photo diode PD is formed, relative to gate electrode TGE. Then, resist pattern MHNL is removed.

Figure 10A:
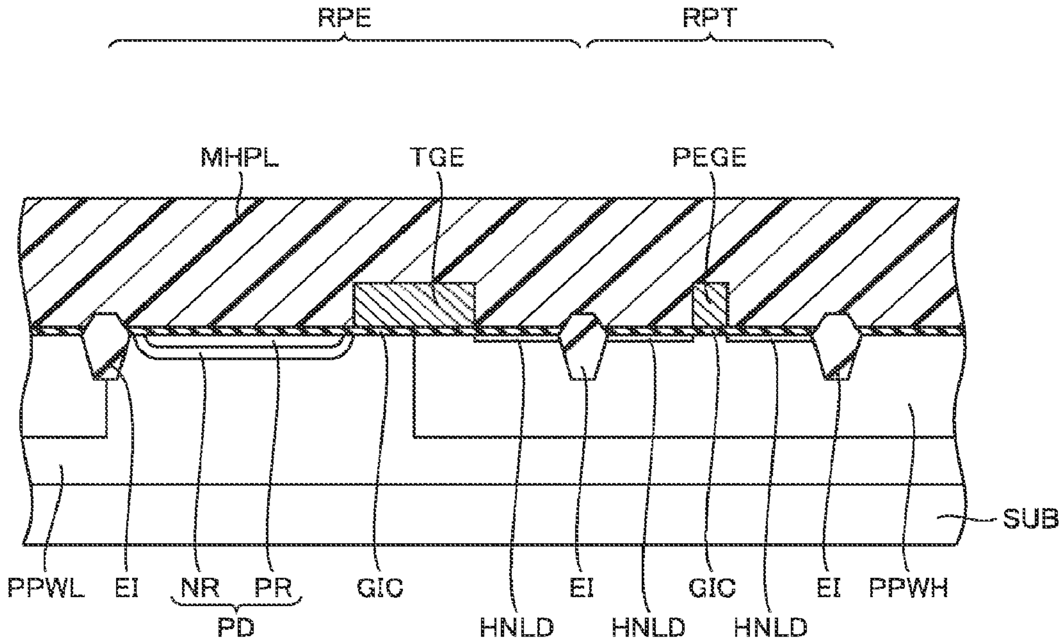
FIG. 10A is a cross sectional view of the pixel region and the like to show a step performed in the embodiment after the steps shown in FIG. 9A and FIG. 9B.
Figure 10B:
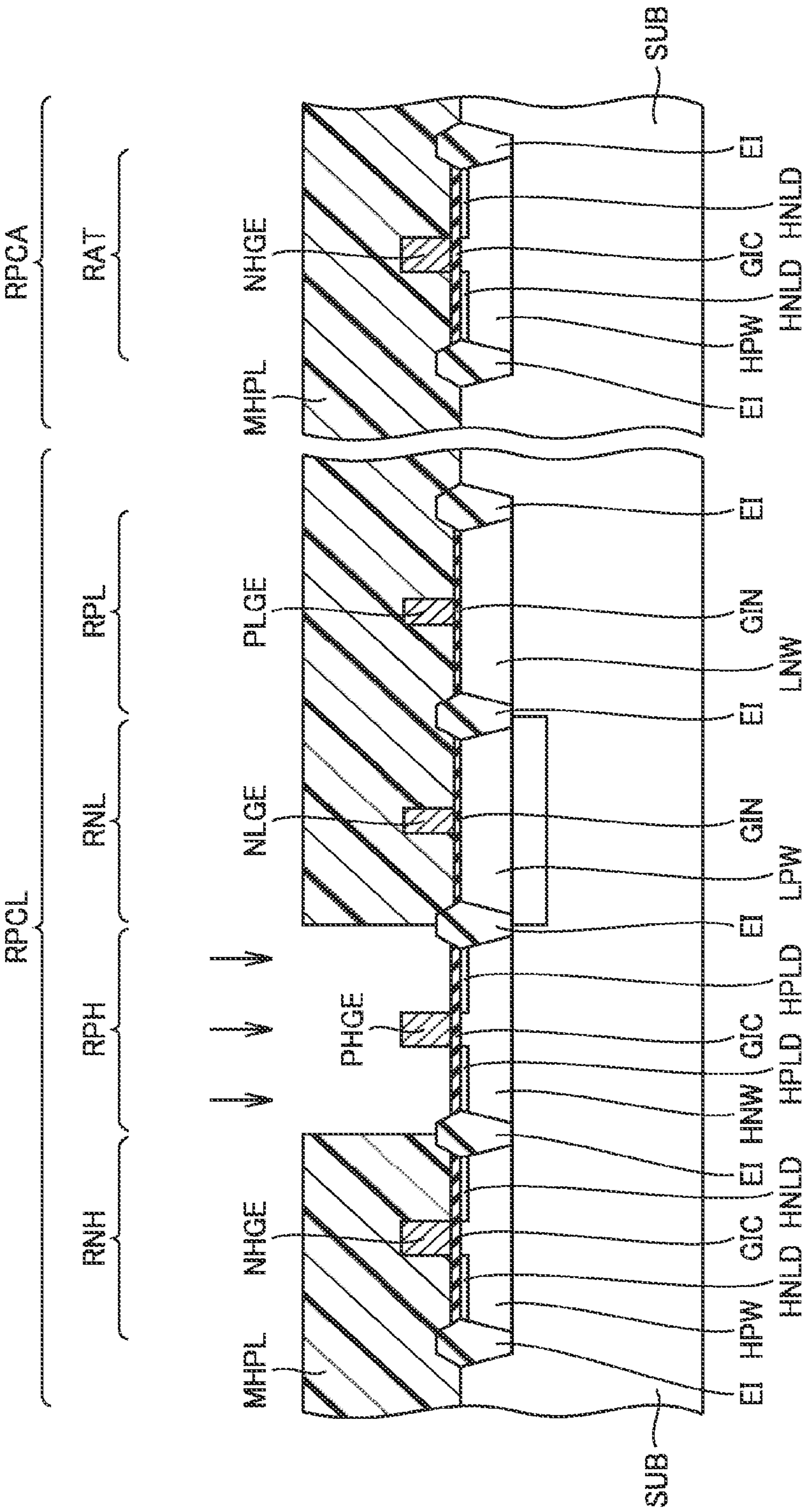
FIG. 10B is a cross sectional view of the peripheral region to show a step performed in the embodiment after the steps shown in FIG. 9A and FIG. 9B.

Next, by performing a predetermined photolithographic process, a resist pattern MHPL is formed to expose region RPH and cover the other regions as shown in FIG. 10A and FIG. 10B. Next, a p type impurity is implanted using resist pattern MHPL and gate electrode PHGE as an implantation mask, thereby forming a p type extension region HPLD in exposed region RPH. Then, resist pattern MHPL is removed.

Figure 11A:
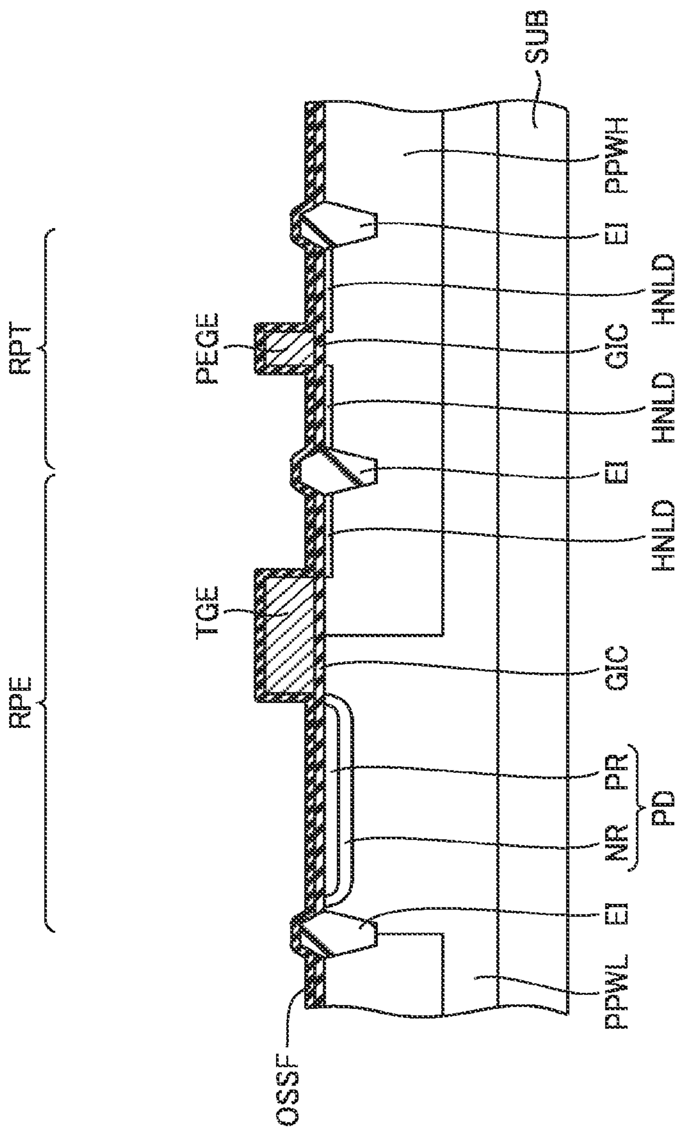
FIG. 11A is a cross sectional view of the pixel region and the like to show a step performed in the embodiment after the steps shown in FIG. 10A and FIG. 10B.
Figure 11B:
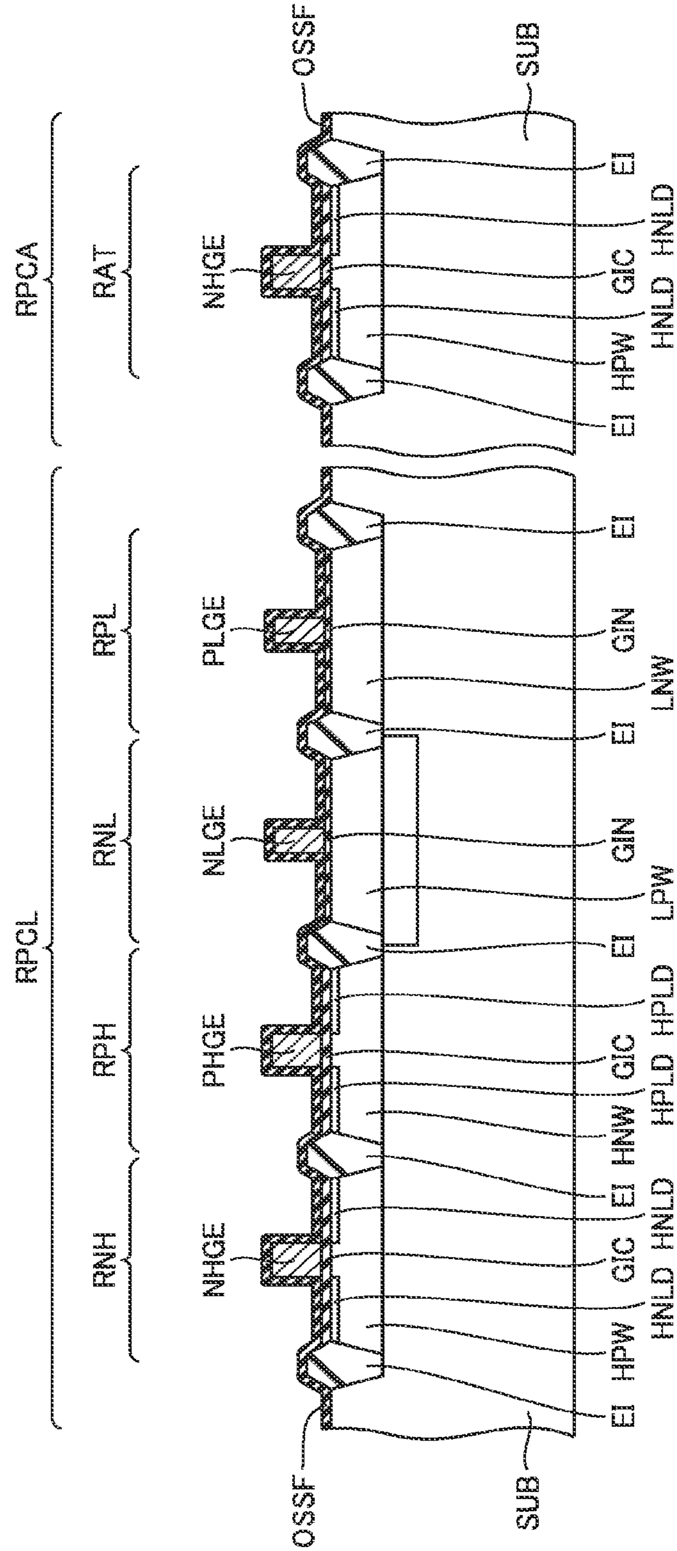
FIG. 11B is a cross sectional view of the peripheral region to show a step performed in the embodiment after the steps shown in FIG. 10A and FIG. 10B.

Next, as shown in FIG. 11A and FIG. 11B, an insulating film OSSF to serve as the offset spacer film is formed to cover gate electrodes TGE, PEGE, NHGE, PHGE, NLGE, PLGE. This insulating film OSSF is formed of, for example, a TEOS (Tetra Ethyl Ortho Silicate glass) based silicon oxide film or the like. Further, insulating film OSSF has a film thickness of, for example, about 15 nm.

Figure 12A:
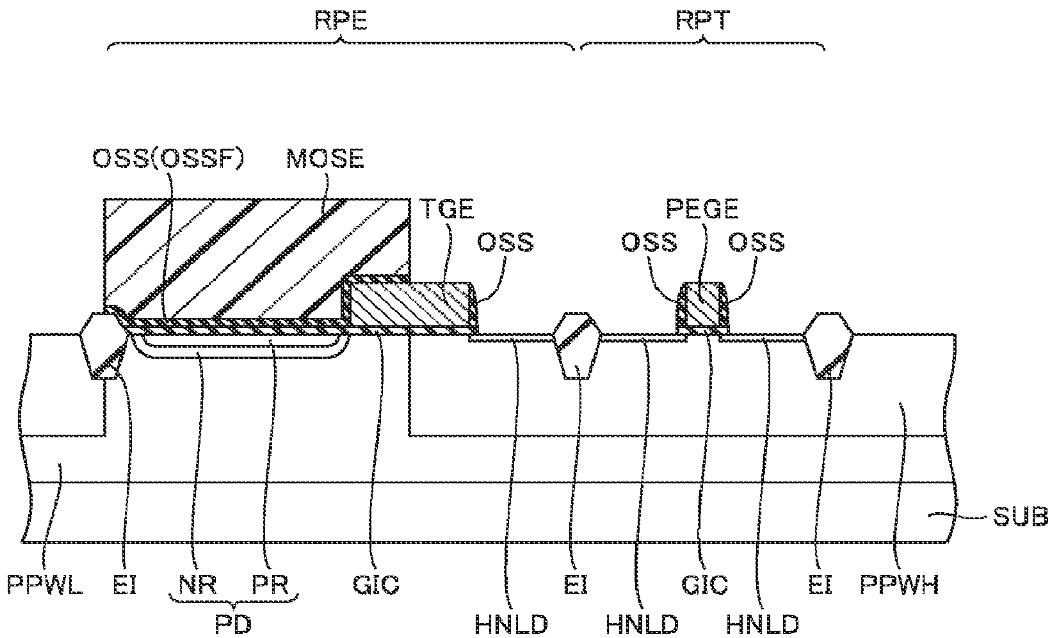
FIG. 12A is a cross sectional view of the pixel region and the like to show a step performed in the embodiment after the steps shown in FIG. 11A and FIG. 11B.
Figure 12B:
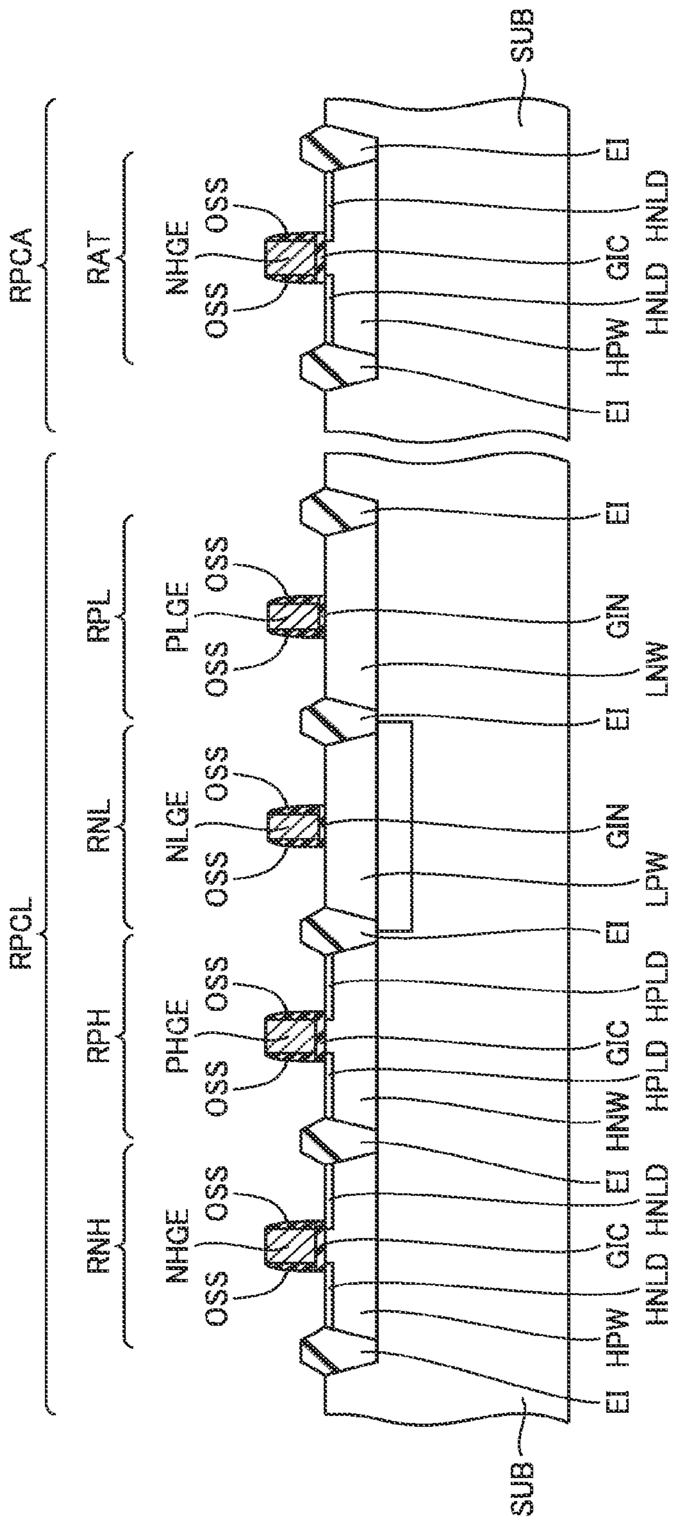
FIG. 12B is a cross sectional view of the peripheral region to show a step performed in the embodiment after the steps shown in FIG. 11A and FIG. 11B.

Next, a predetermined photolithographic process is performed, thereby forming a resist pattern MOSE (see FIG. 12A) to cover the region in which photo diode PD is disposed and expose the other regions. Next, as shown in FIG. 12A and FIG. 12B, anisotropic etching process is provided to exposed insulating film OSSF using resist pattern MOSE as an etching mask. Accordingly, portions of insulating film OSSF are removed from the upper surfaces of gate electrodes TGE, PEGE, NHGE, PHGE, NLGE, PLGE, thereby forming offset spacer films OSS constituted of the remaining portions of insulating film OSSF on the side wall surfaces of gate electrodes TGE, PEGE, NHGE, PHGE, NLGE, PLGE. Then, resist pattern MOSE is removed.

Figure 13A:
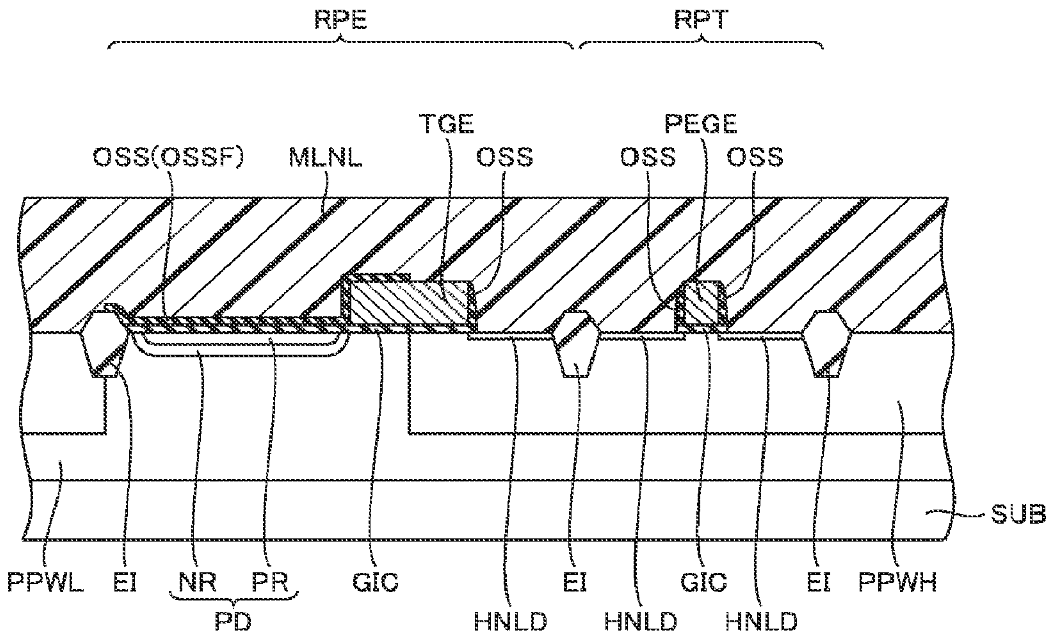
FIG. 13A is a cross sectional view of the pixel region and the like to show a step performed in the embodiment after the steps shown in FIG. 12A and FIG. 12B.
Figure 13B:
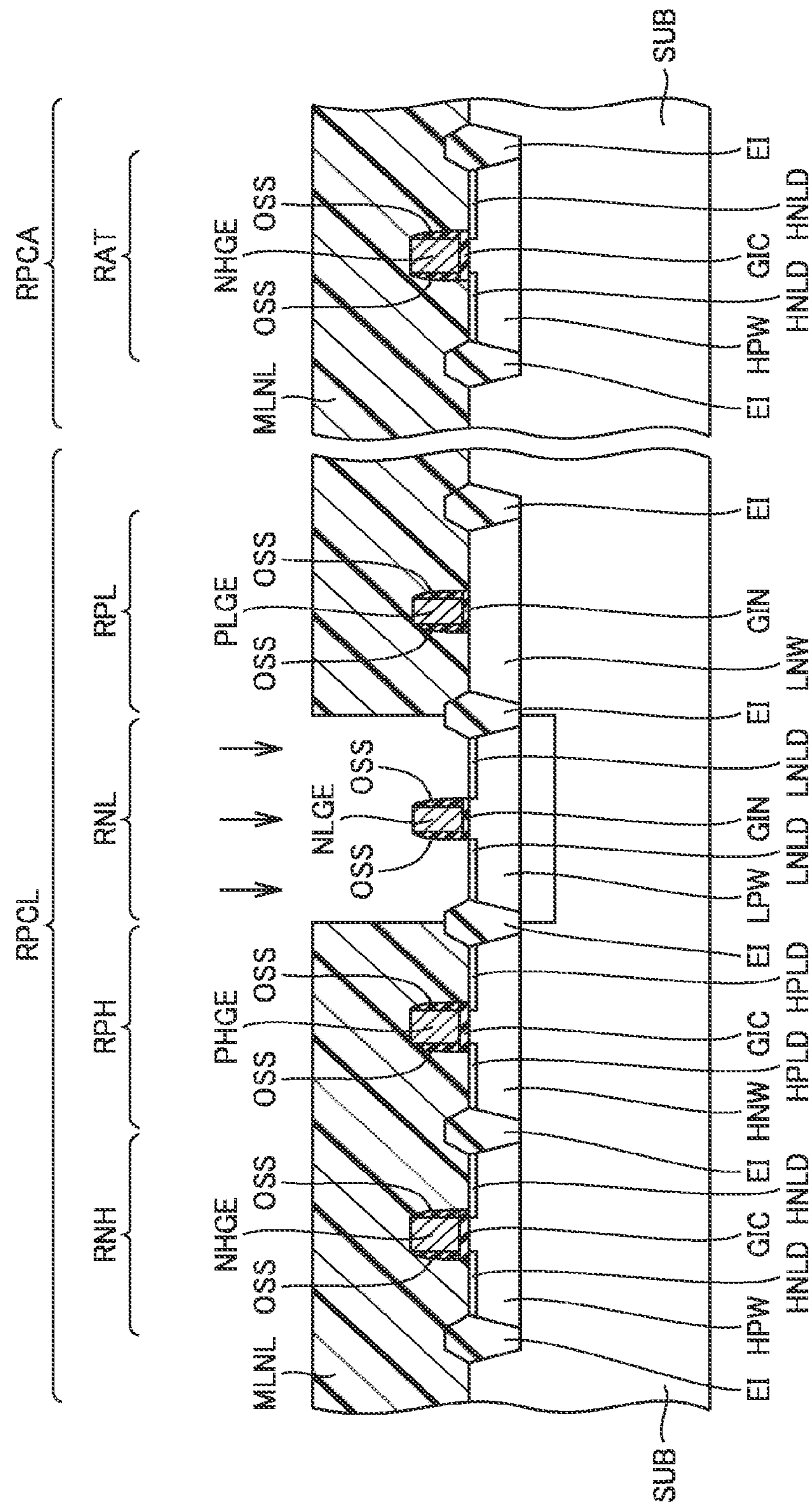
FIG. 13B is a cross sectional view of the peripheral region to show a step performed in the embodiment after the steps shown in FIG. 12A and FIG. 12B.

Next, extension (LDD) regions are formed in regions RNL, RPL in which the field effect transistors driven with a relatively low voltage are formed. As shown in FIG. 13A and FIG. 13B, a predetermined photolithographic process is performed, thereby forming resist pattern MLNL to expose region RNL and cover the other regions. Next, an n type impurity is implanted using resist pattern MLNL, offset spacer film OSS, and gate electrode NLGE as an implantation mask, thereby forming an extension region LNLD in exposed region RNL. Then, resist pattern MLNL is removed.

Figure 14A:
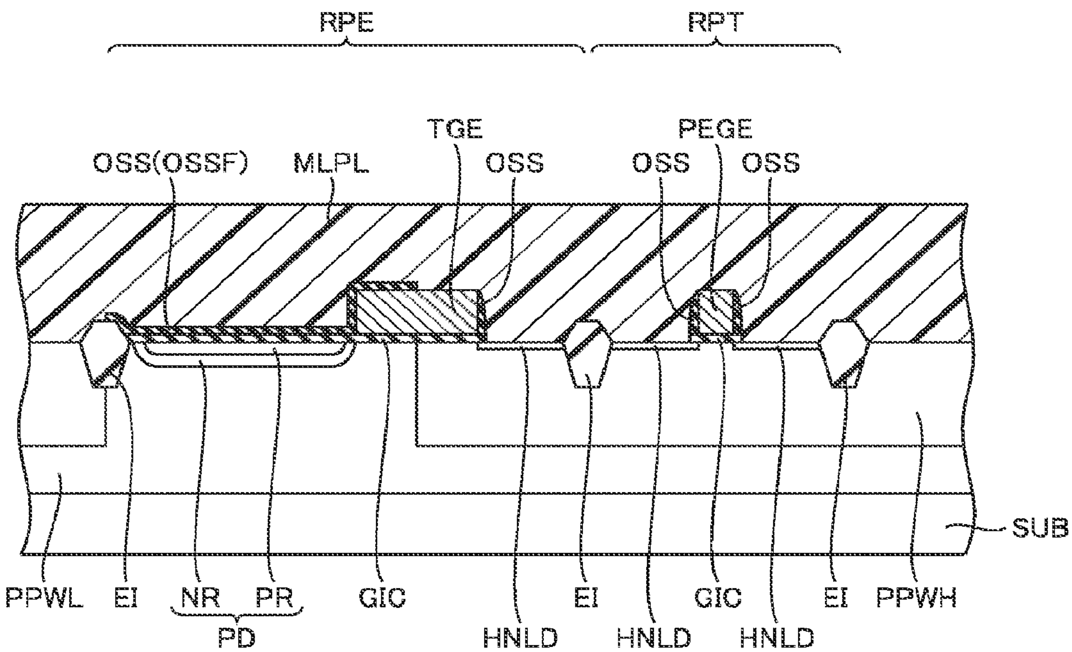
FIG. 14A is a cross sectional view of the pixel region and the like to show a step performed in the embodiment after the steps shown in FIG. 13A and FIG. 13B.
Figure 14B:
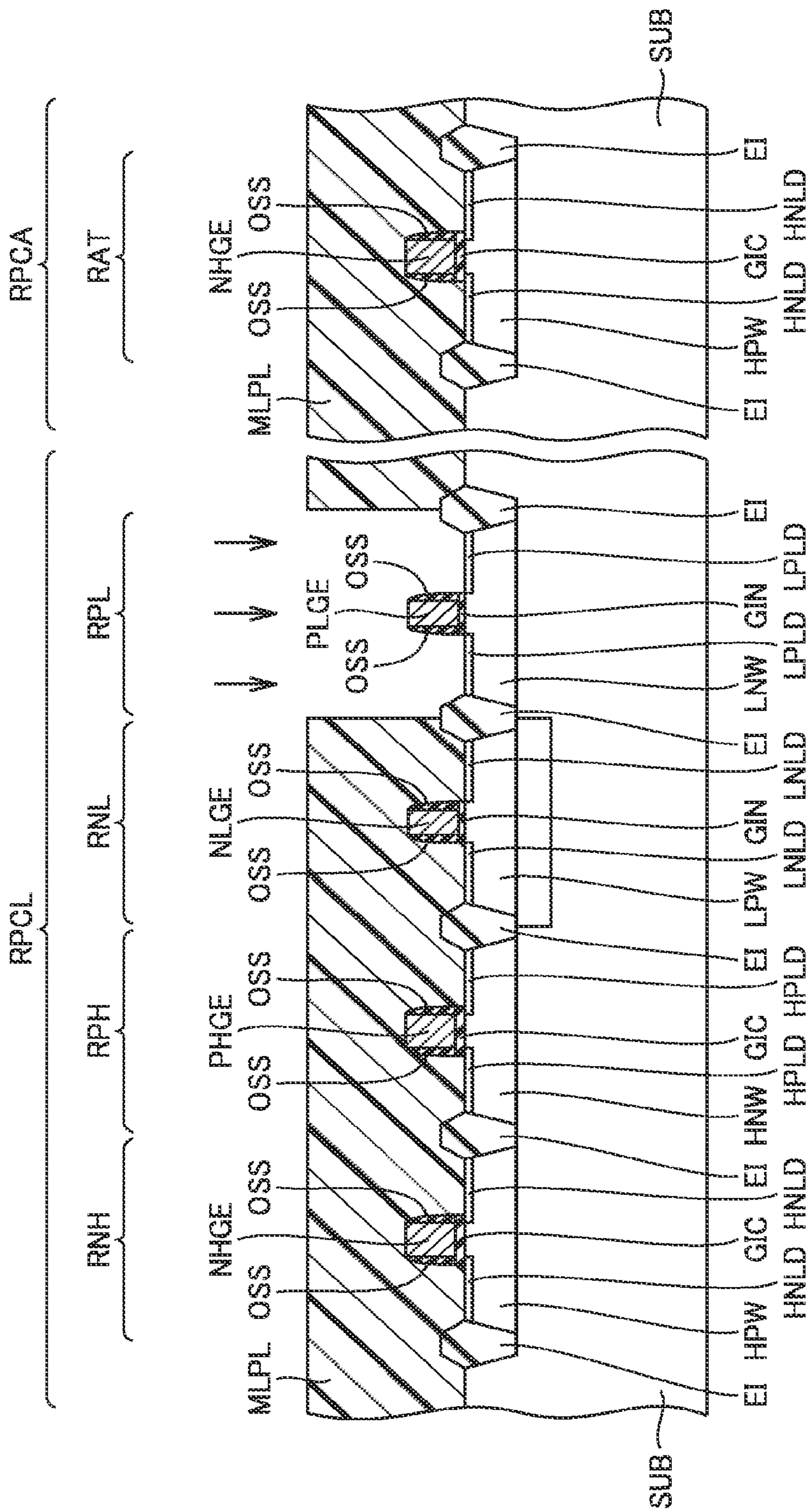
FIG. 14B is a cross sectional view of the peripheral region to show a step performed in the embodiment after the steps shown in FIG. 13A and FIG. 13B.

Next, as shown in FIG. 14A and FIG. 14B, a predetermined photolithographic process is provided, thereby forming a resist pattern MLPL to expose region RPL and cover the other regions. Next, a p type impurity is implanted using resist pattern MLPL, offset spacer film OSS, and gate electrode PLGE as an implantation mask, thereby forming extension region LPLD in exposed region RPL. Then, resist pattern MLPL is removed.

Figure 15A:
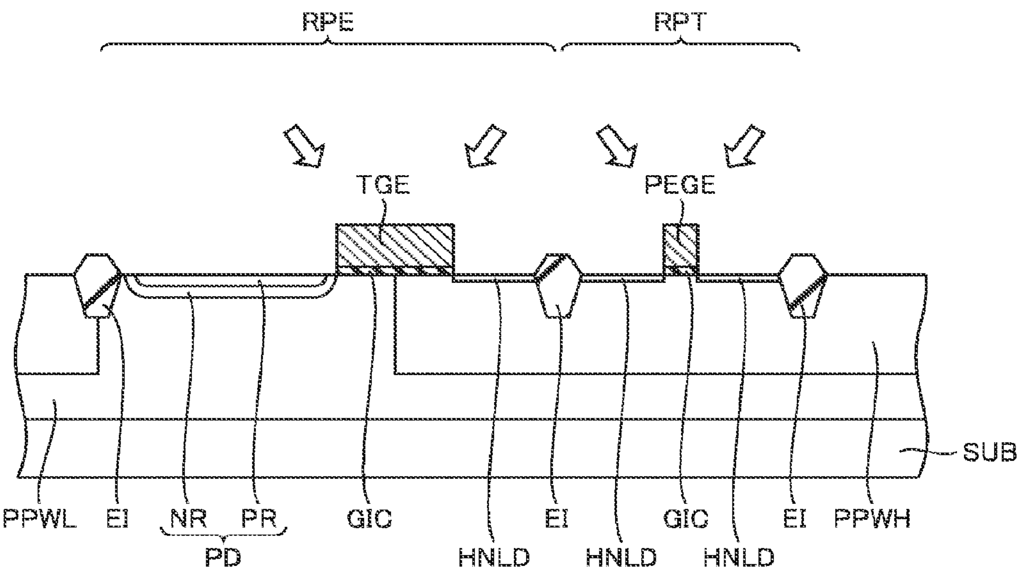
FIG. 15A is a cross sectional view of the pixel region and the like to show a step performed in the embodiment after the steps shown in FIG. 14A and FIG. 14B.
Figure 15B:
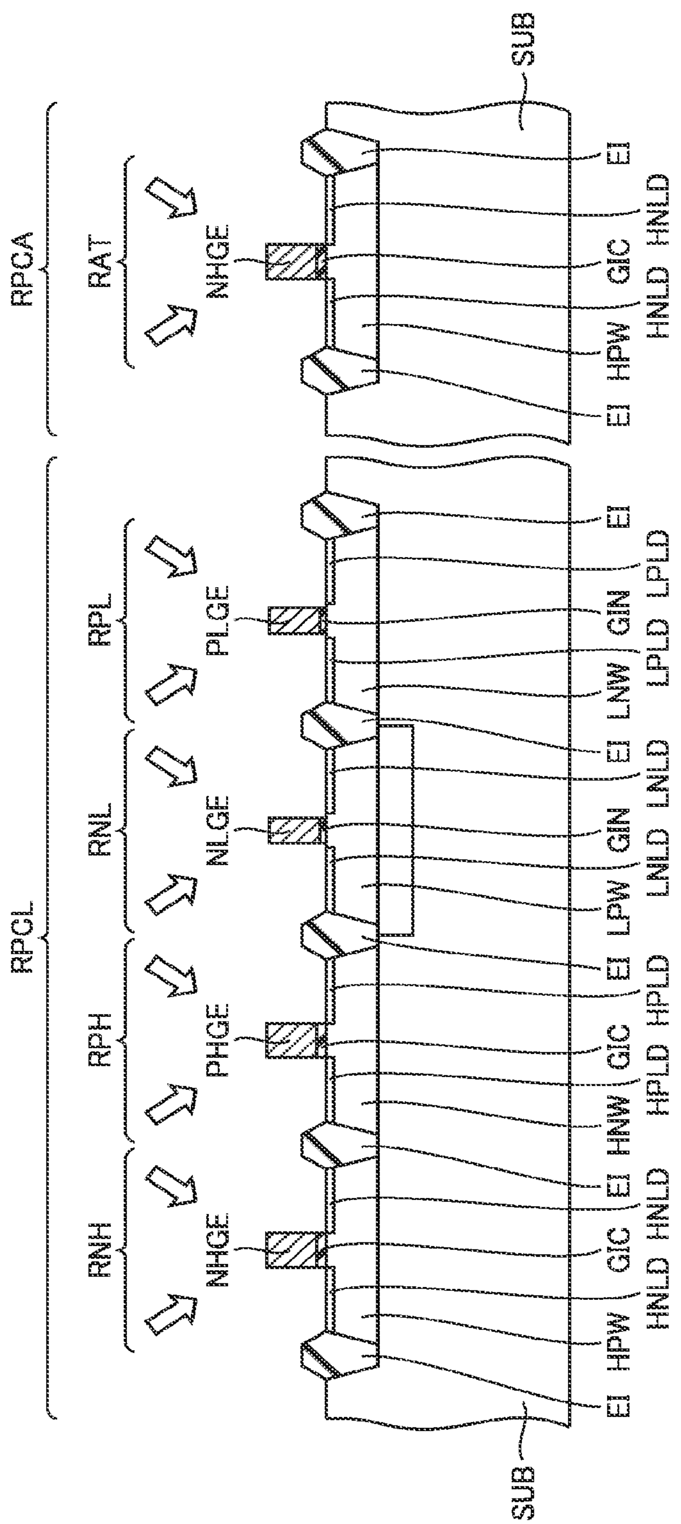
FIG. 15B is a cross sectional view of the peripheral region to show a step performed in the embodiment after the steps shown in FIG. 14A and FIG. 14B.

Next, as shown in FIG. 15A and FIG. 15B, wet etching process (see double arrows) is performed onto the entire surface of semiconductor substrate SUB, thereby removing offset spacer film OSS (insulating film OSSF) covering photo diode PD and offset spacer film OSS formed on the side wall surface of each of gate electrodes TGE, PEGE, NHGE, PHGE, NLGE, PLGE. On this occasion, the removal of offset spacer film OSS (insulating film OSSF) by the wet etching process in photo diode PD does not cause damage as compared with a case where the offset spacer film is removed by dry etching process.

Figure 16A:
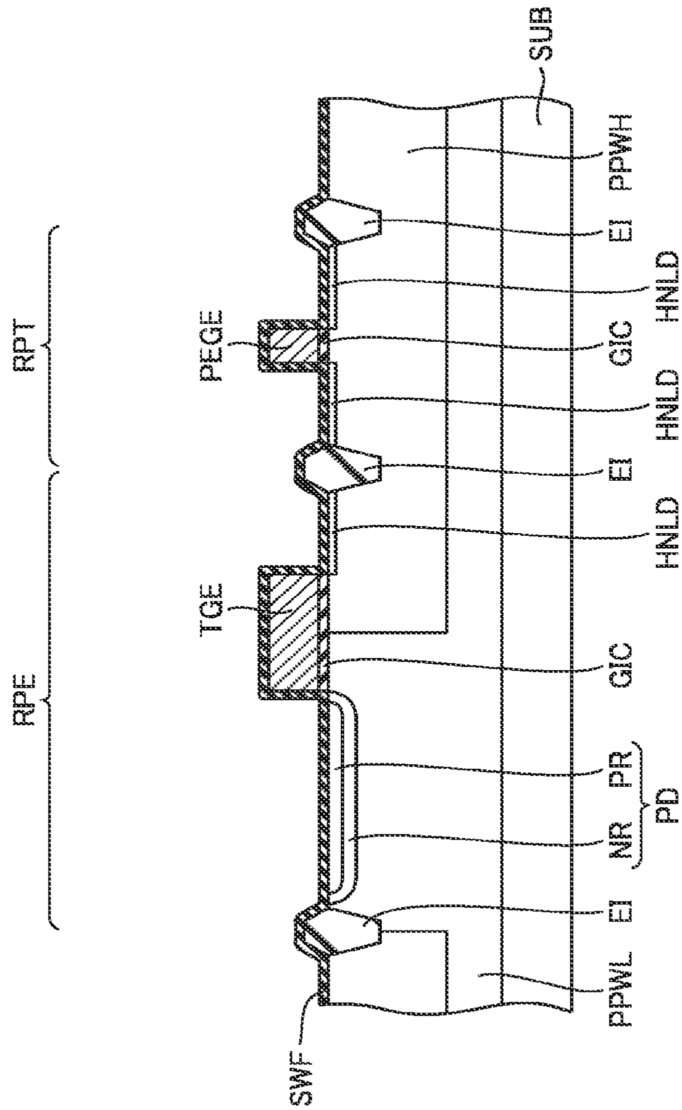
FIG. 16A is a cross sectional view of the pixel region and the like to show a step performed in the embodiment after the steps shown in FIG. 15A and FIG. 15B.
Figure 16B:
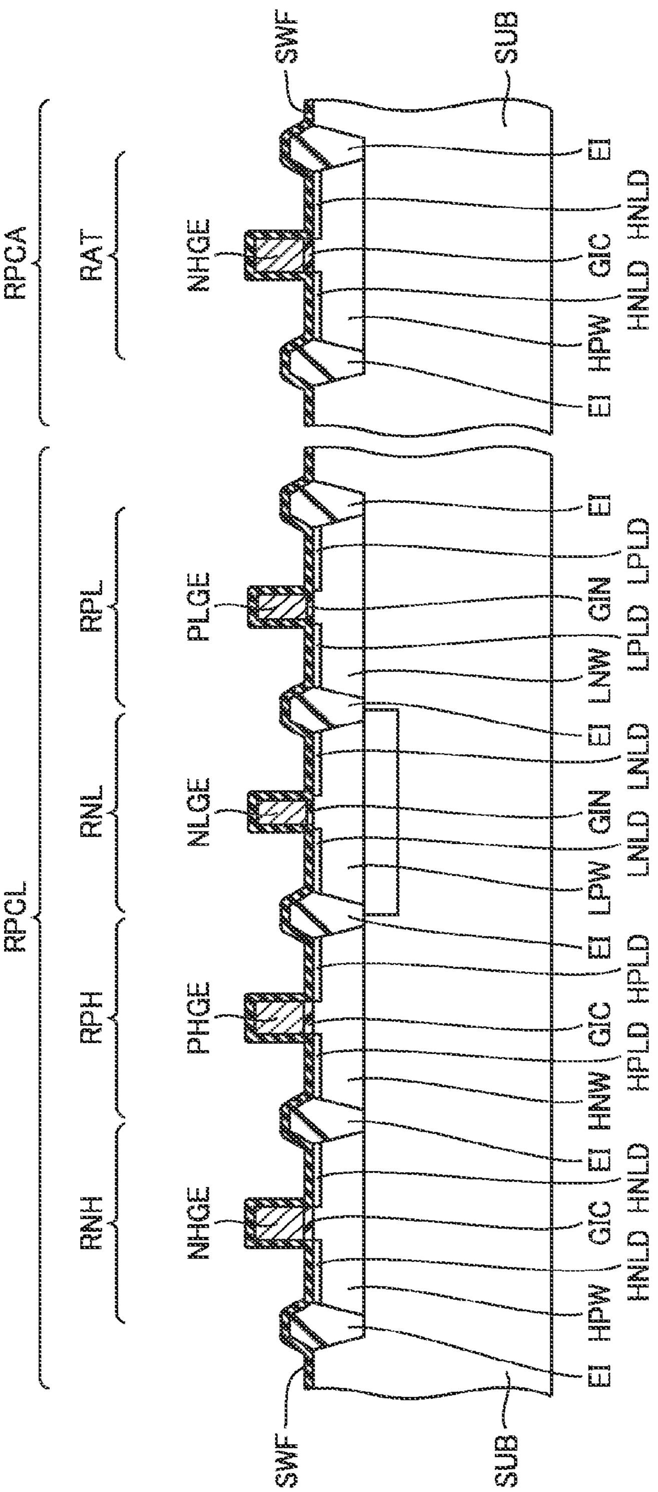
FIG. 16B is a cross sectional view of the peripheral region to show a step performed in the embodiment after the steps shown in FIG. 15A and FIG. 15B.

Next, as shown in FIG. 16A and FIG. 16B, an insulating film SWF to serve as the sidewall insulating film is formed to cover each of gate electrodes TGE, PEGE, NHGE, PHGE, NLGE, PLGE. As insulating film SWF, there is formed an insulating film constituted of two layers obtained by forming a nitride film on an oxide film. It should be noted that in each of the figures, insulating film SWF is shown as a single layer for simplicity of the drawings.

Figure 17A:
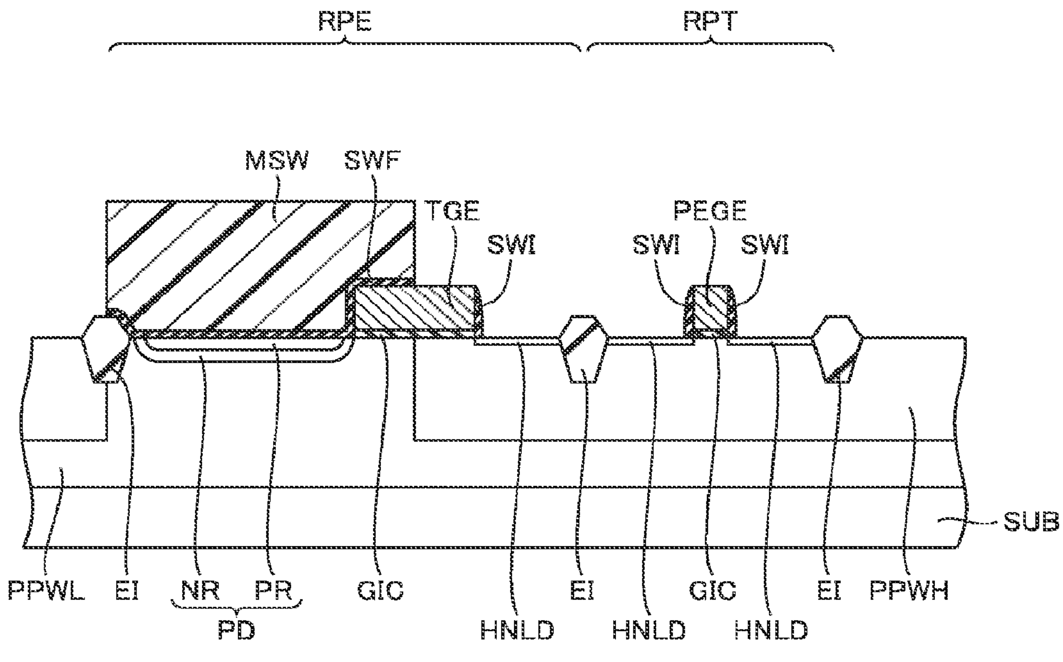
FIG. 17A is a cross sectional view of the pixel region and the like to show a step performed in the embodiment after the steps shown in FIG. 16A and FIG. 16B.
Figure 17B:
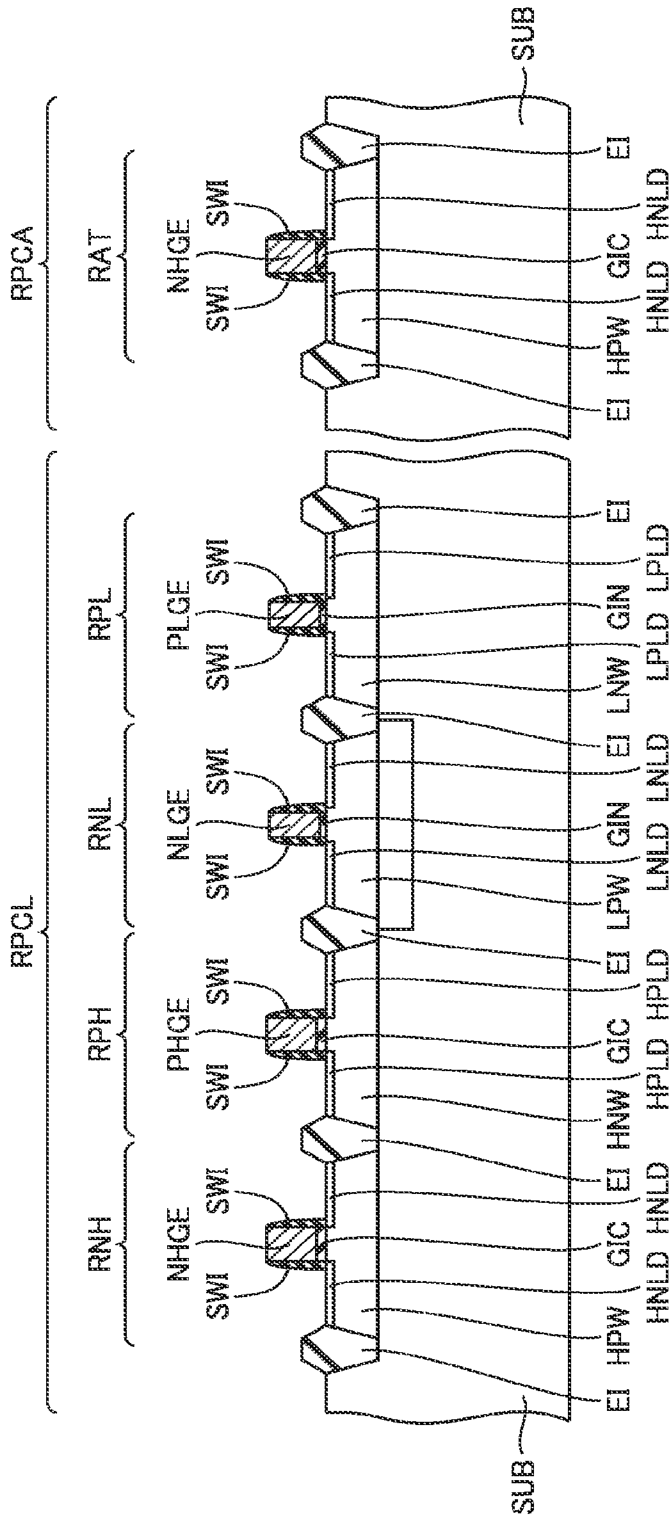
FIG. 17B is a cross sectional view of the peripheral region to show a step performed in the embodiment after the steps shown in FIG. 16A and FIG. 16B.

Next, a resist pattern MSW (see FIG. 17A) is formed to cover the region in which photo diode PD is disposed and expose the other regions. Next, as shown in FIG. 17A and FIG. 17B, anisotropic etching process is performed onto exposed insulating film SWF using resist pattern MSW as an etching mask. Accordingly, portions of insulating film SWF on the upper surfaces of gate electrodes TGE, PEGE, NHGE, PHGE, NLGE, PLGE are removed, and portions of insulating film SWF remaining on the side wall surfaces of gate electrodes TGE, PEGE, NHGE, PHGE, NLGE, PLGE form sidewall insulating films SWI. Then, resist pattern MSW is removed.

Figure 18A:
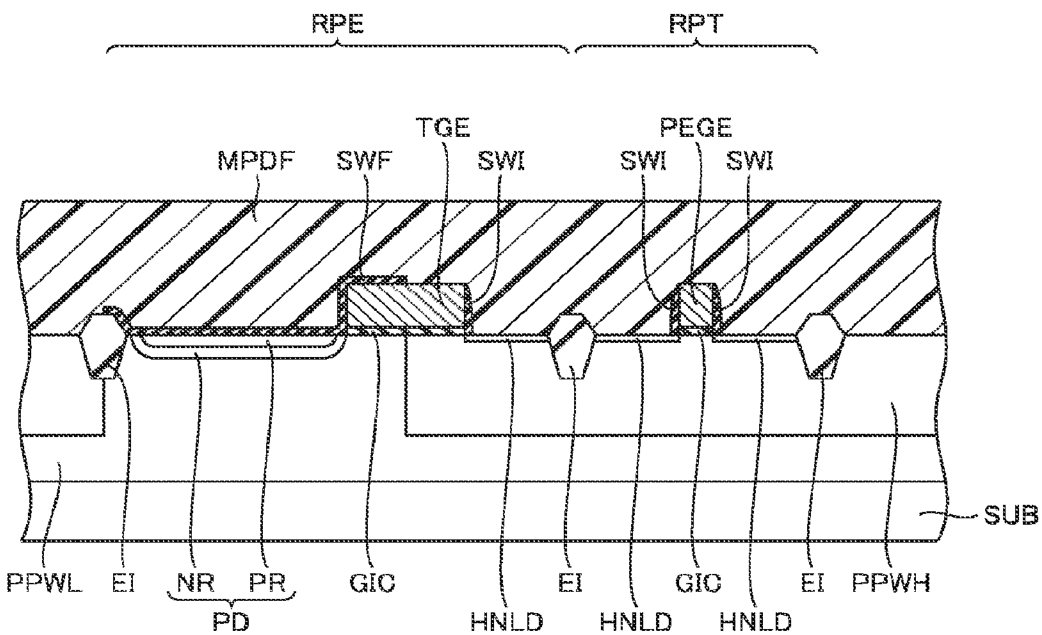
FIG. 18A is a cross sectional view of the pixel region and the like to show a step performed in the embodiment after the steps shown in FIG. 17A and FIG. 17B.
Figure 18B:
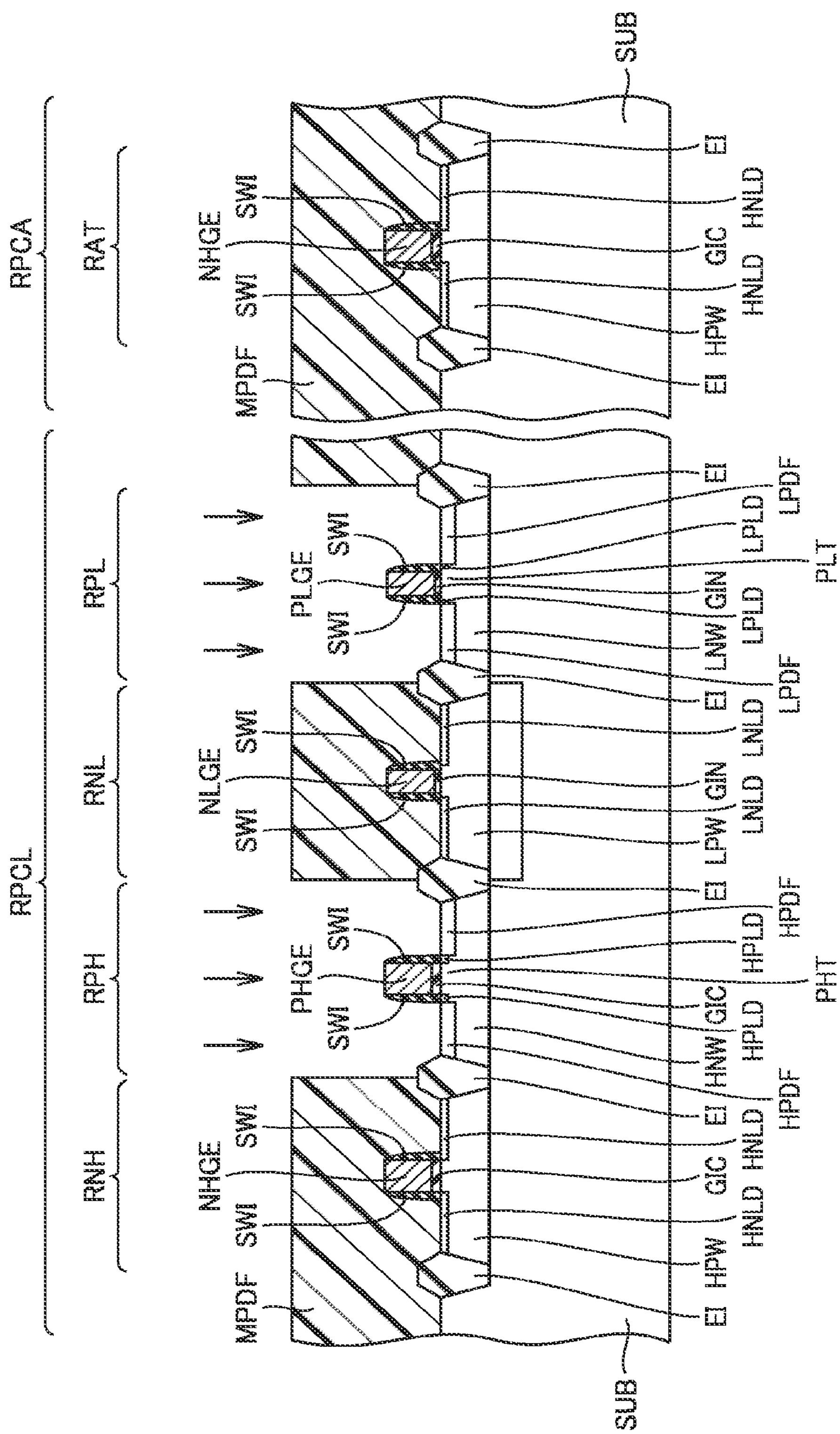
FIG. 18B is a cross sectional view of the peripheral region to show a step performed in the embodiment after the steps shown in FIG. 17A and FIG. 17B.

Next, a source-drain region is formed in each of regions RPH, RPL in each of which a p channel type field effect transistor is formed. As shown in FIG. 18A and FIG. 18B, a predetermined photolithographic process is performed, thereby forming a resist pattern MPDF to expose regions RPH, RPL and cover the other regions. Next, a p type impurity is implanted using resist pattern MPDF, sidewall insulating films SWI and gate electrodes PHGE, PLGE as an implantation mask, thereby forming a source-drain region HPDF in region RPH and forming a source-drain region LPDF in region RPL. Then, resist pattern MPDF is removed.

Figure 19A:
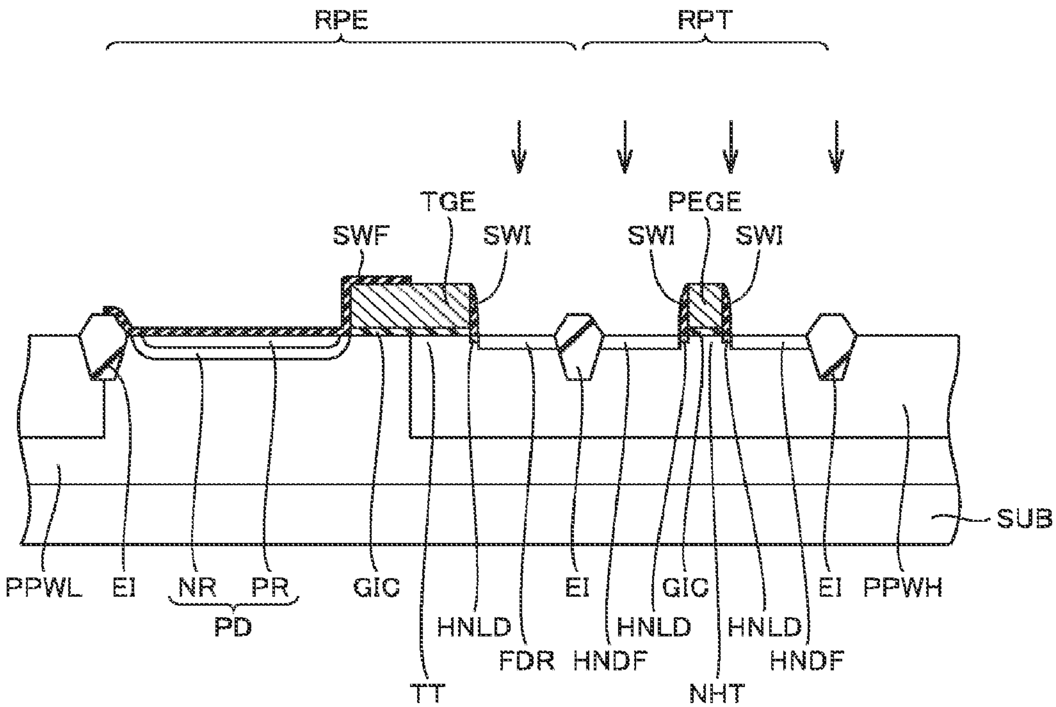
FIG. 19A is a cross sectional view of the pixel region and the like to show a step performed in the embodiment after the steps shown in FIG. 18A and FIG. 18B.
Figure 19B:
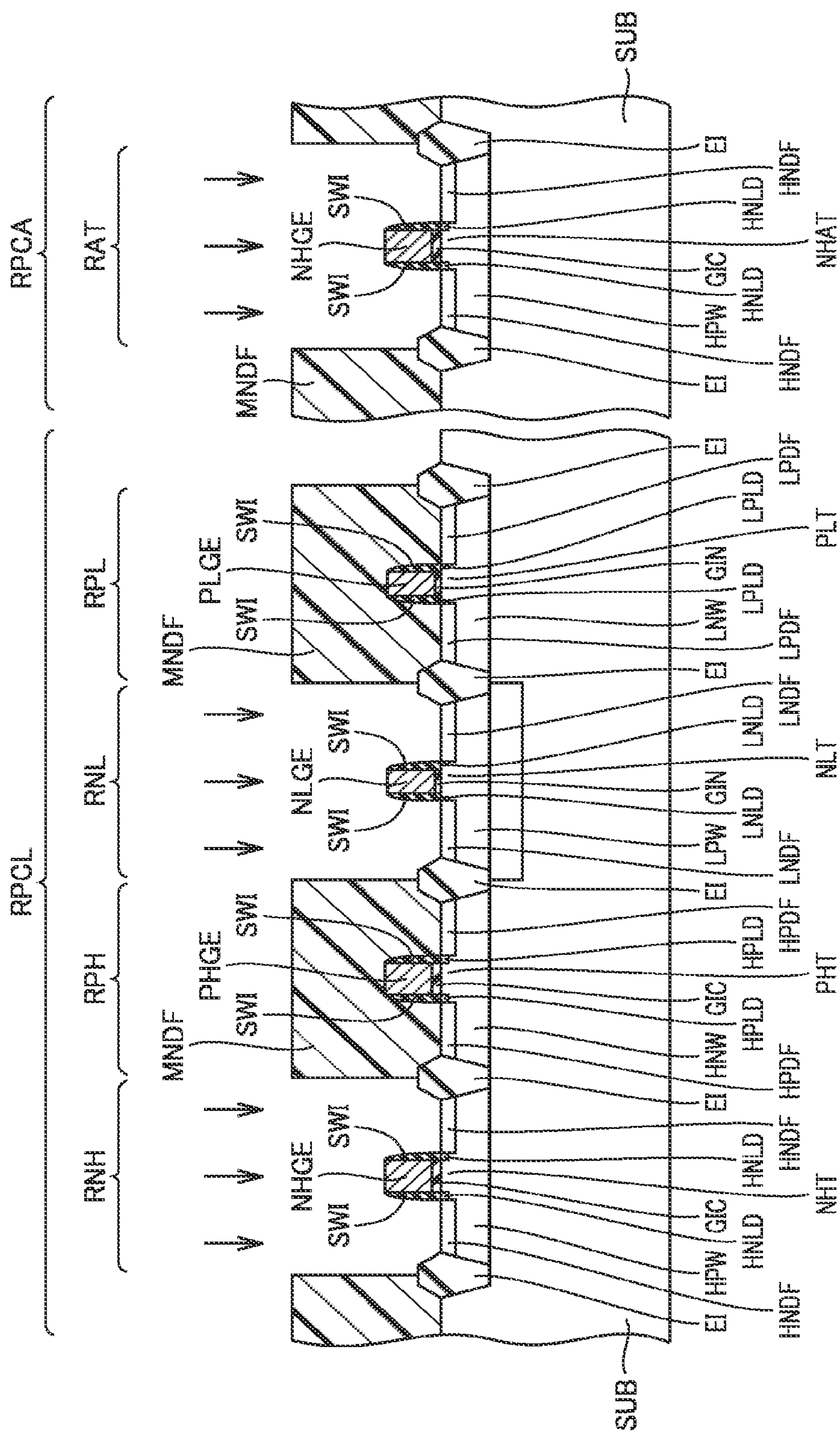
FIG. 19B is a cross sectional view of the peripheral region to show a step performed in the embodiment after the steps shown in FIG. 18A and FIG. 18B.

Next, a source-drain region is formed in each of regions RPT, RNH, RNL, RAT in each of which an n channel type field effect transistor is formed. As shown in FIG. 19A and FIG. 19B, a predetermined photolithographic process is performed, thereby forming a resist pattern MNDF to expose regions RPT, RNH, RNL, RAT and cover the other regions. Next, an n type impurity is implanted using resist pattern MNDF, sidewall insulating films SWI and gate electrodes TGE, PEGE, NHGE, NLGE as an implantation mask, thereby forming a source-drain region HNDF in each of regions RPT, RNH, RAT and forming a source-drain region LNDF in region RNL. Moreover, on this occasion, in pixel region RPE, floating diffusion region FDR is formed. Then, resist pattern MNDF is removed.

By the steps thus far, transfer transistor TT is formed in pixel region RPE. In pixel transistor region RPT, n channel type field effect transistor NHT is formed. In region RNH of first peripheral region RPCL, n channel type field effect transistor NHT is formed. In region RPH, p channel type field effect transistor PHT is formed. In region RNL, n channel type field effect transistor NLT is formed. In region RPL, p channel type field effect transistor PLT is formed. In region RAT of second peripheral region RPCA, n channel type field effect transistor NHAT is formed.

Next, a silicide protection film is formed for field effect transistor NHAT, for which no metal silicide film is formed, of field effect transistors NHT, PHT, NLT, PLT, NHAT, in order to prevent silicidation. Moreover, this silicide protection film is used as an antireflection film in pixel region RPE, and the pixel region is divided into a pixel region having a silicide protection film formed therein and a pixel region having no silicide protection film formed therein.

Figure 20A:
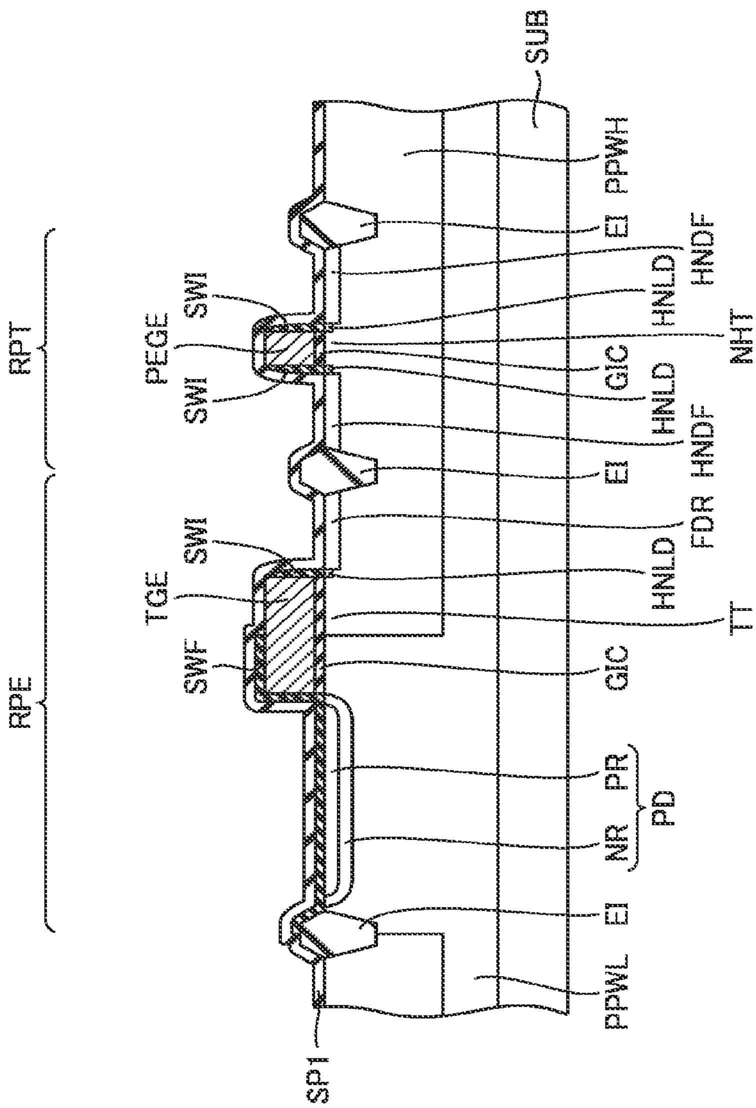
FIG. 20A is a cross sectional view of the pixel region and the like to show a step performed in the embodiment after the steps shown in FIG. 19A and FIG. 19B.
Figure 20B:
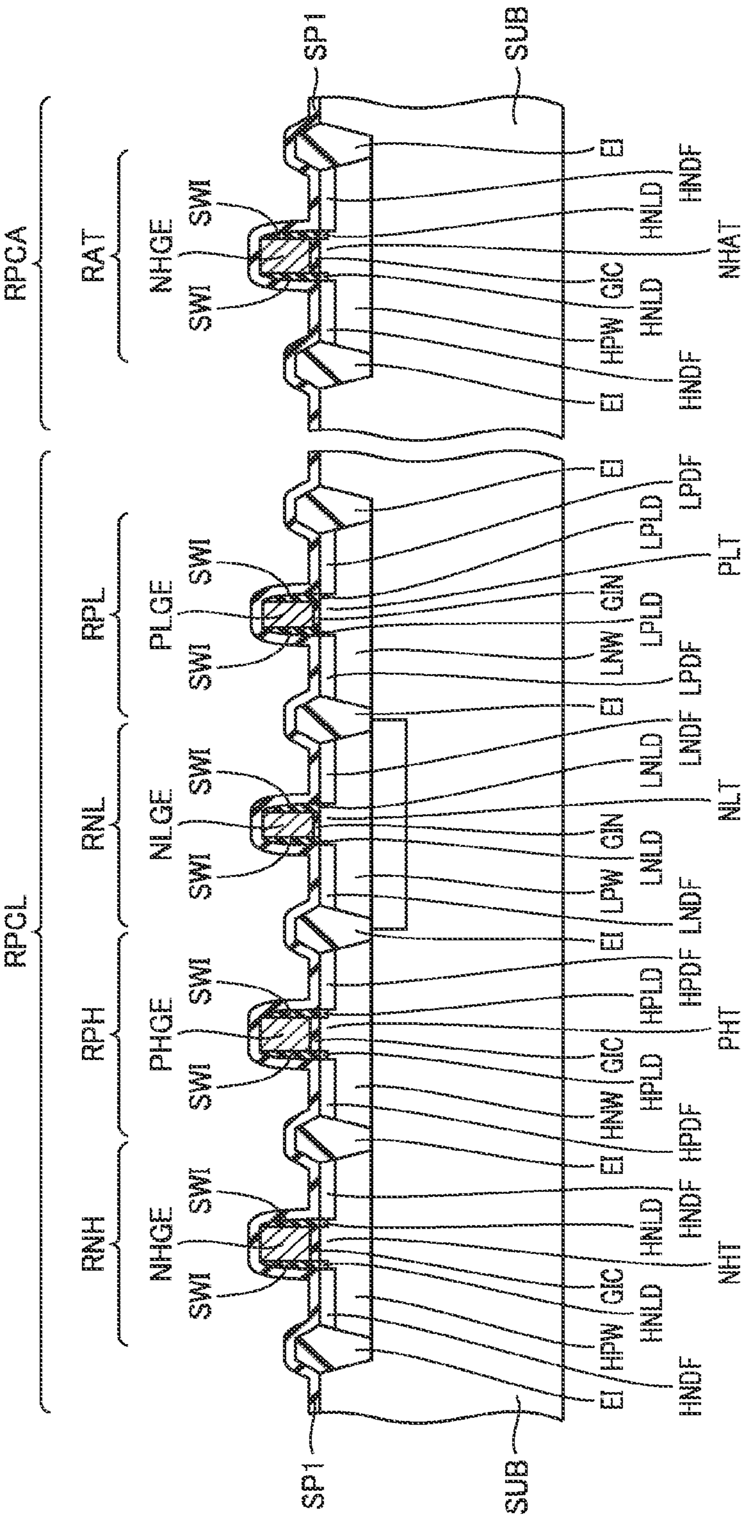
FIG. 20B is a cross sectional view of the peripheral region to show a step performed in the embodiment after the steps shown in FIG. 19A and FIG. 19B.
Figure 21A:
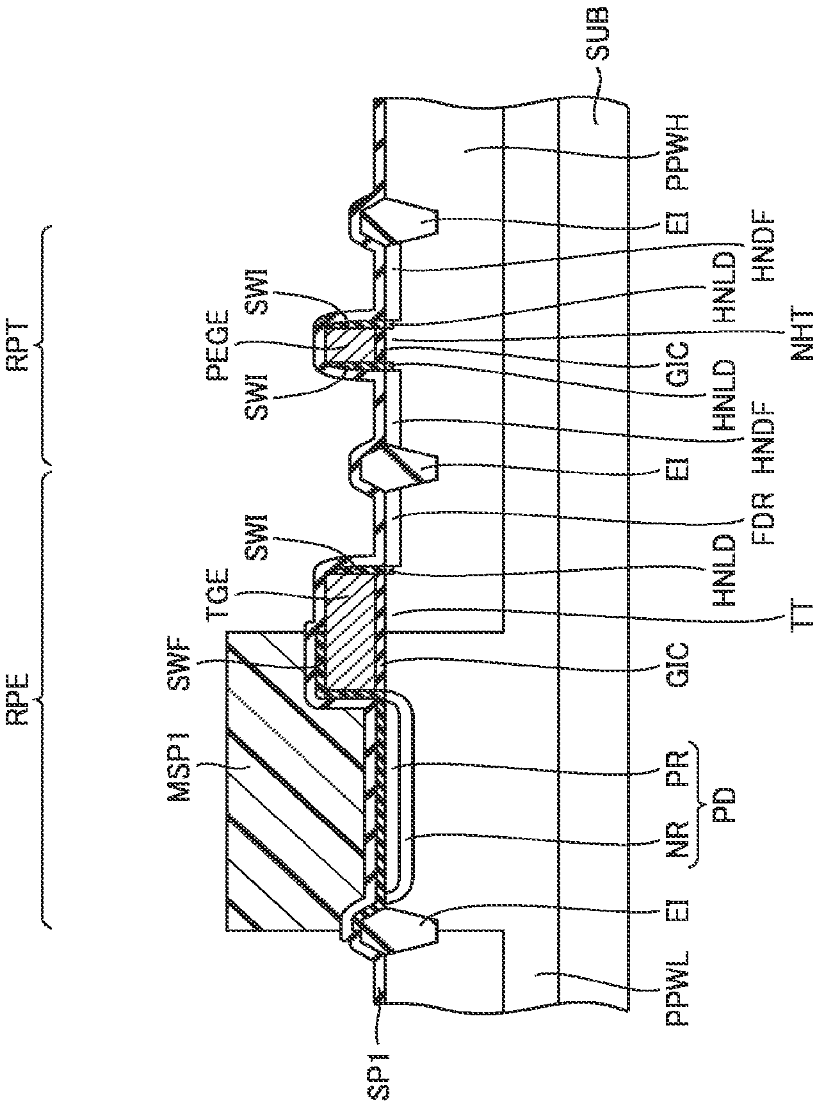
FIG. 21A is a cross sectional view of the pixel region and the like to show a step performed in the embodiment after the steps shown in FIG. 20A and FIG. 20B.
Figure 21B:
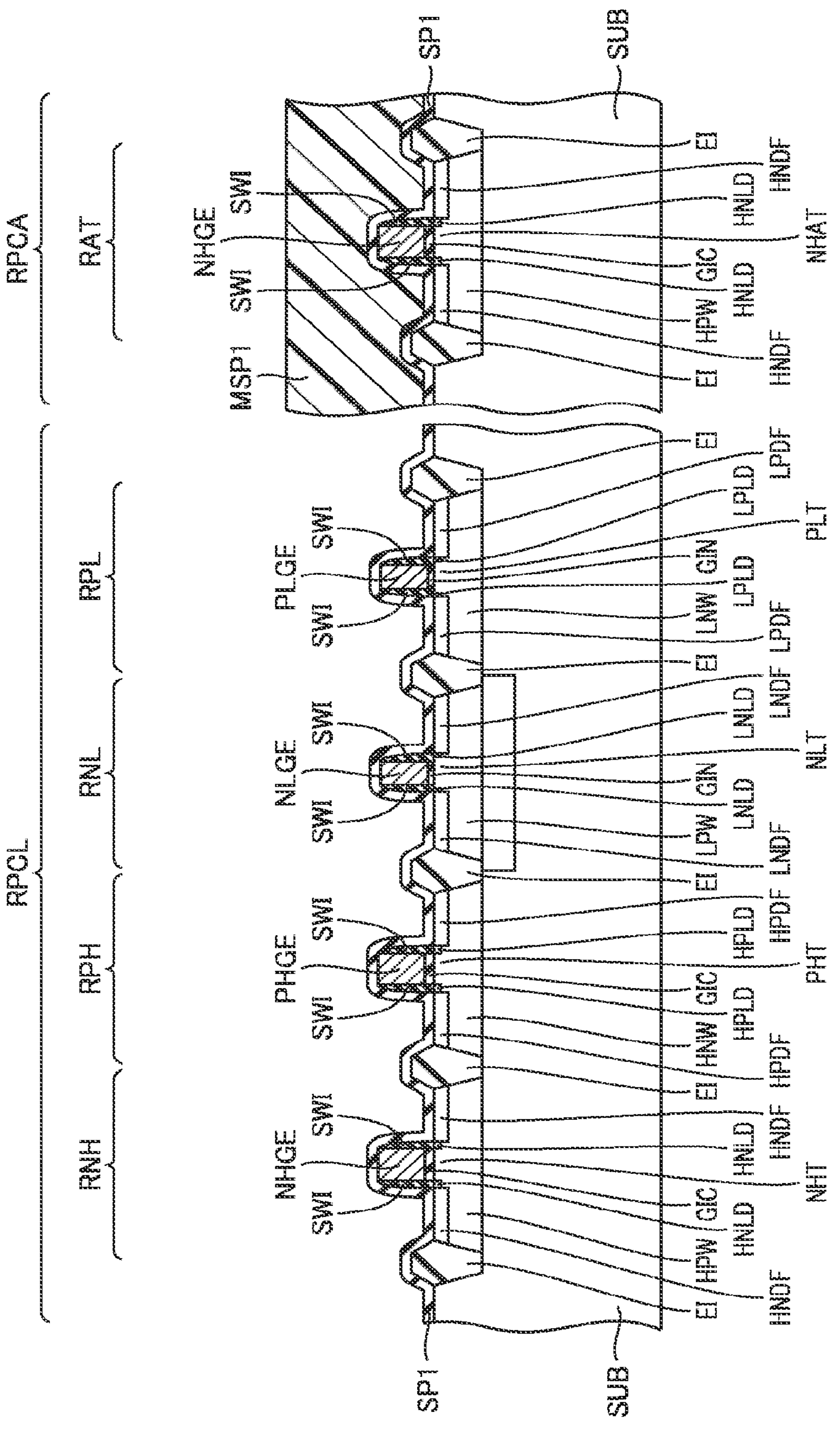
FIG. 21B is a cross sectional view of the peripheral region to show a step performed in the embodiment after the steps shown in FIG. 20A and FIG. 20B.

As shown in FIG. 20A and FIG. 20B, a silicide protection film SP1 for preventing silicidation is formed to cover gate electrodes TGE, PEGE, NHGE, PHGE, NLGE, PLGE, and the like. As silicide protection film SP1, a silicon oxide film or the like is formed, for example. Next, as shown in FIG. 21A and FIG. 21B, a resist pattern MSP1 is formed to cover region RAT and predetermined pixel region RPE and expose the other regions. In pixel region RPE, a plurality of pixel regions respectively corresponding to red, green and blue are formed.

Figure 21C:
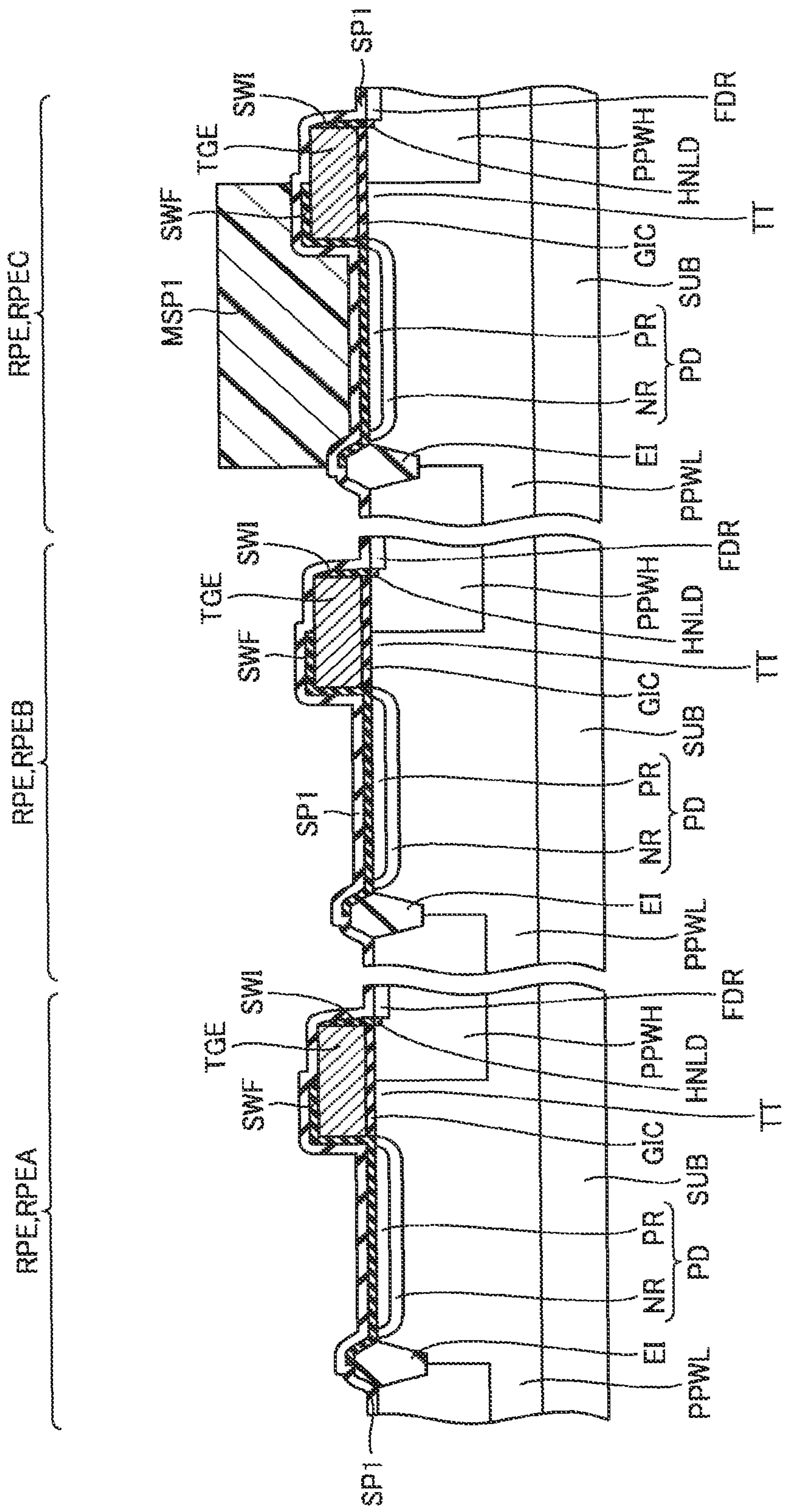
FIG. 21C is a cross sectional view of each pixel region to show a step performed in the embodiment after the steps shown in FIG. 20A and FIG. 20B.

Here, as shown in FIG. 21C, in pixel region RPE, in order to form the silicide protection film for a pixel region RPEC corresponding to a predetermined one of the three colors, resist pattern MSP1 is formed to cover pixel region RPEC and expose pixel regions RPEA, RPEB corresponding to the rest two of the colors.

Figure 22:
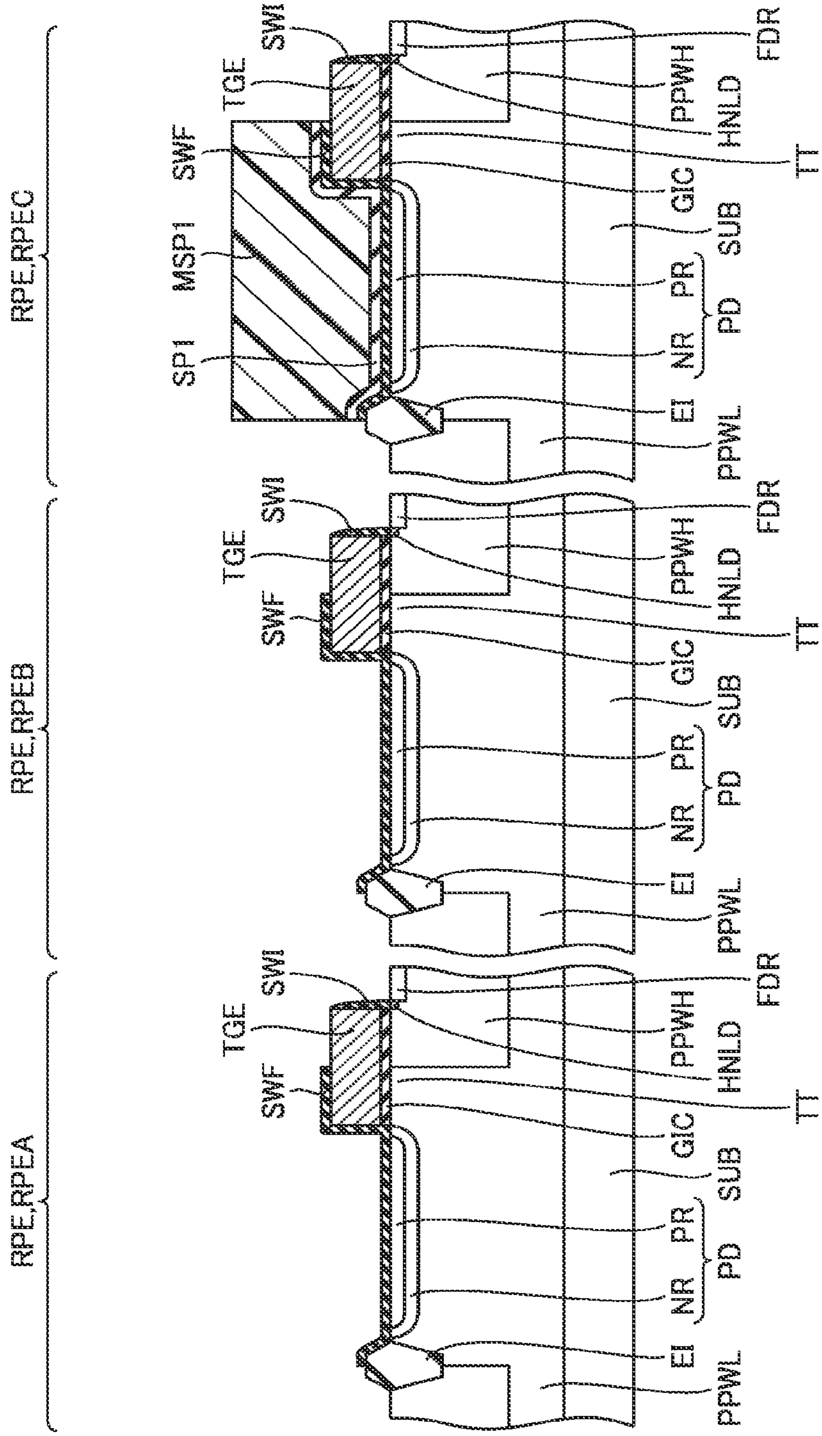
FIG. 22 is a cross sectional view of each pixel region to show a step performed in the embodiment after the steps shown in FIG. 21A to FIG. 21C.
Figure 23A:
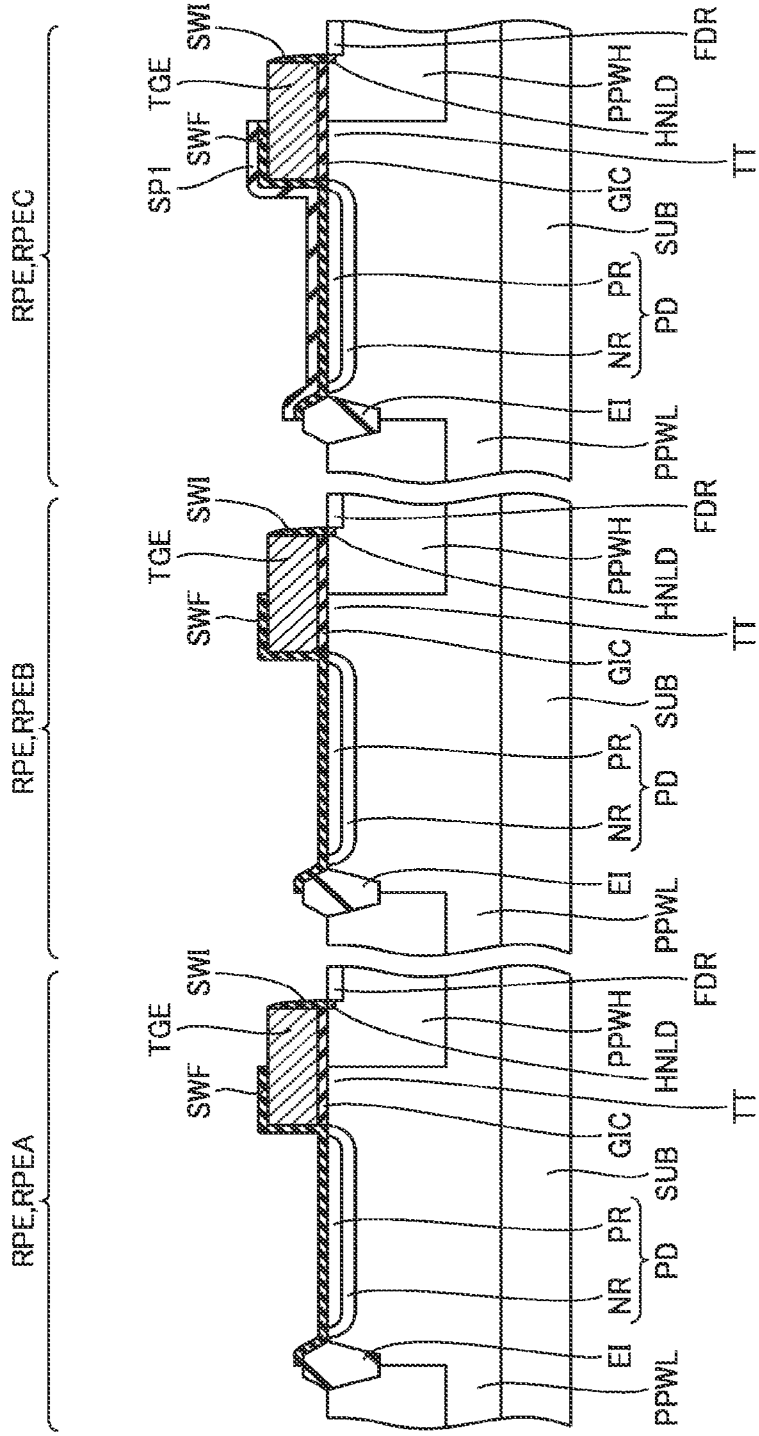
FIG. 23A is a cross sectional view of each pixel region to show a step performed in the embodiment after the step shown in FIG. 22.
Figure 23B:
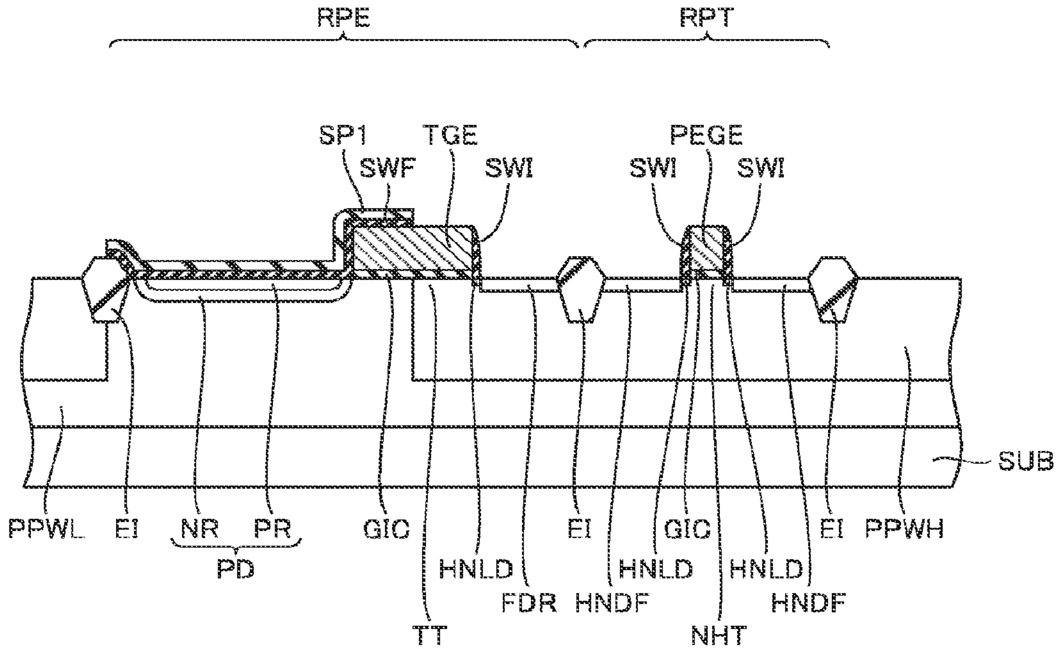
FIG. 23B is a cross sectional view of the pixel region and the like to show a step performed in the embodiment after the step shown in FIG. 22.
Figure 23C:
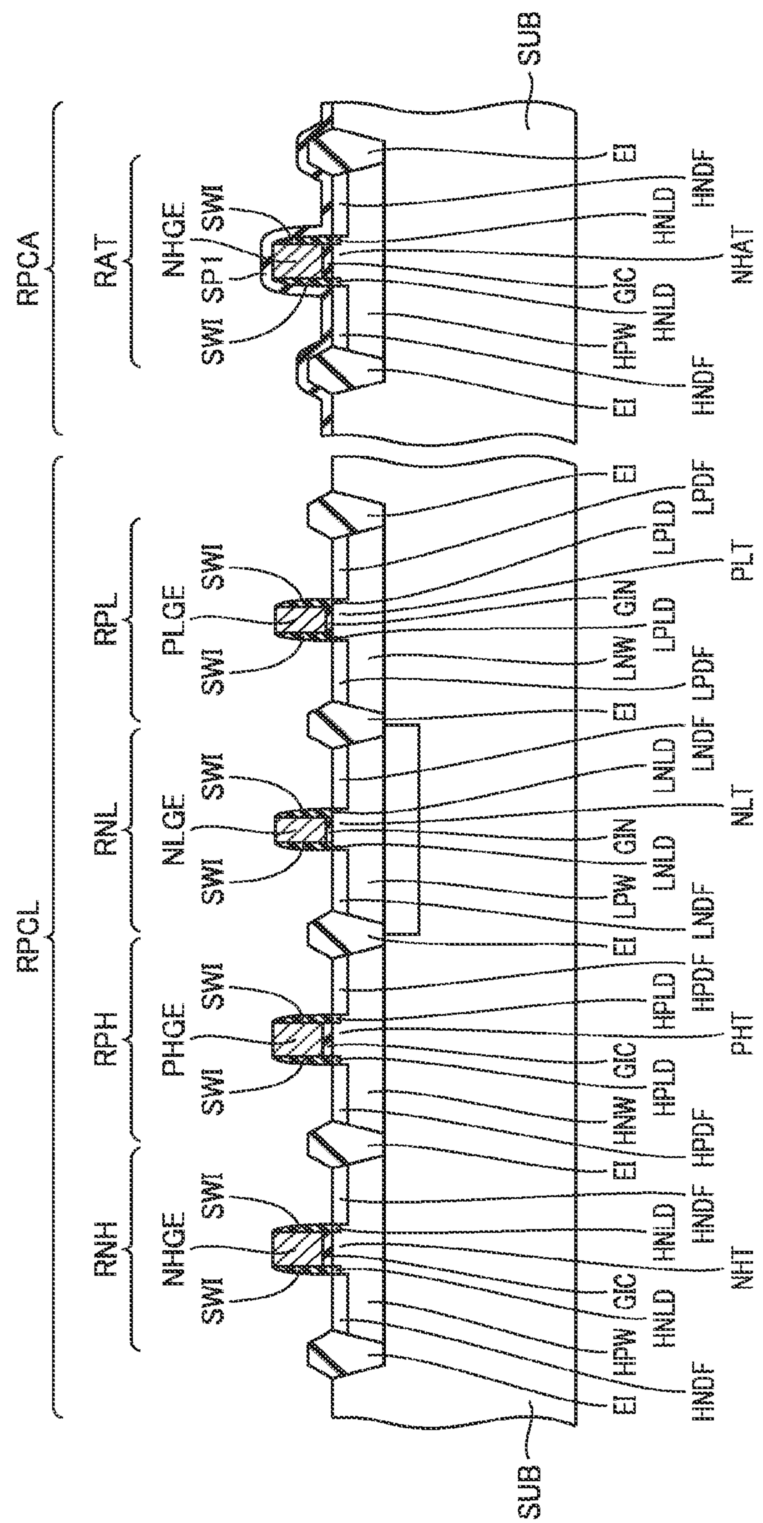
FIG. 23C is a cross sectional view of the peripheral region to show a step performed in the embodiment after the step shown in FIG. 22.

Next, as shown in FIG. 22, wet etching process is performed using resist pattern MSP1 as an etching mask, thereby removing exposed silicide protection film SP1. Next, resist pattern MSP1 is removed, thereby exposing silicide protection film SP1 remaining in pixel region RPEC as shown in FIG. 23A. On this occasion, as shown in FIG. 23B and FIG. 23C, in region RAT of second peripheral region RPCA, remaining silicide protection film SP1 is exposed. On the other hand, in pixel transistor region RPT and first peripheral region RPCL, silicide protection film SP1 is removed.

Figure 24A:
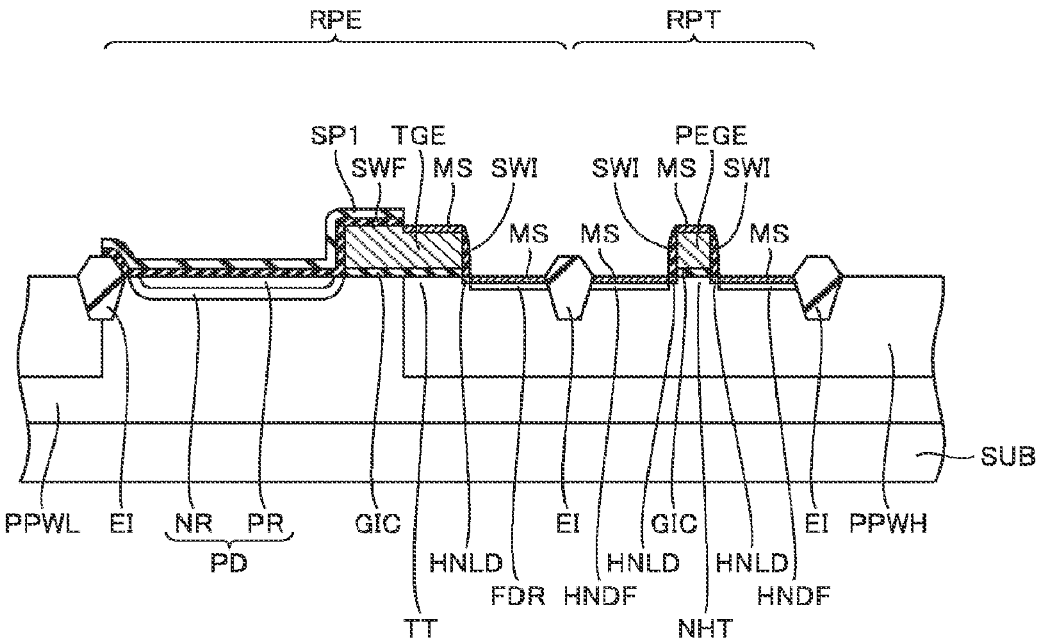
FIG. 24A is a cross sectional view of the pixel region and the like to show a step performed in the embodiment after the steps shown in FIG. 23A to FIG. 23C.
Figure 24B:
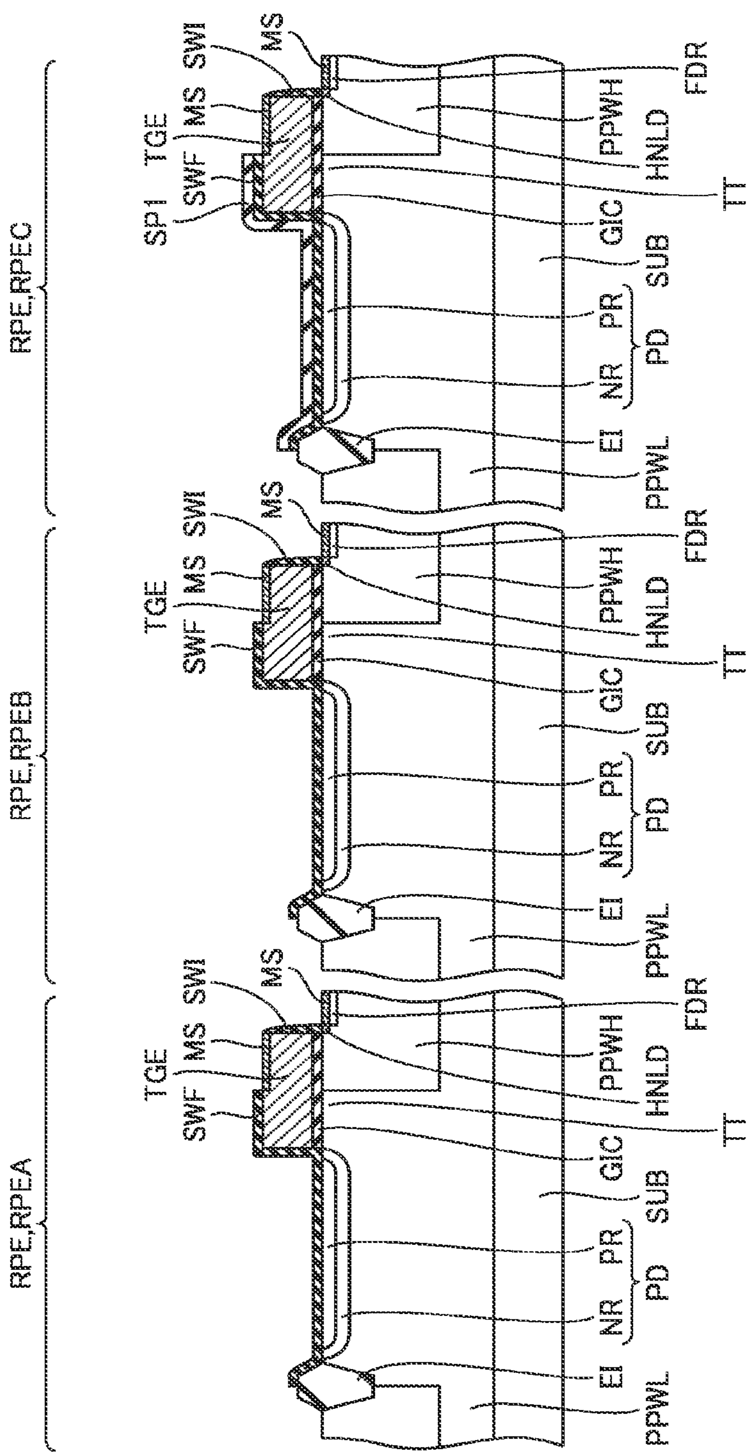
FIG. 24B is a cross sectional view of each pixel region to show a step performed in the embodiment after the steps shown in FIG. 23A to FIG. 23C.

Next, a metal silicide film is formed by a SALICIDE (Self ALIgned siliCIDE) method. First, a predetermined metal film (not shown), such as cobalt, is formed to cover gate electrodes TGE, PEGE, NHGE, PHGE, NLGE, PLGE. Next, a predetermined heat process is performed to react the metal with silicon, thereby forming metal silicide films MS (see FIG. 24A to FIG. 24C). Then, unreacted metal is removed. Accordingly, as shown in FIG. 24A and FIG. 24B, in pixel region RPE, metal silicide films MS are formed on portions of the upper surfaces of gate electrodes TGE of transfer transistors TT of pixel regions RPEA, RPEB, RPEC and the surfaces of floating diffusion regions FDR. In pixel transistor RTP, metal silicide films MS are formed on the upper surface of gate electrode PEGE of the field effect transistor and the surface of source-drain region HNDF.

Figure 24C:
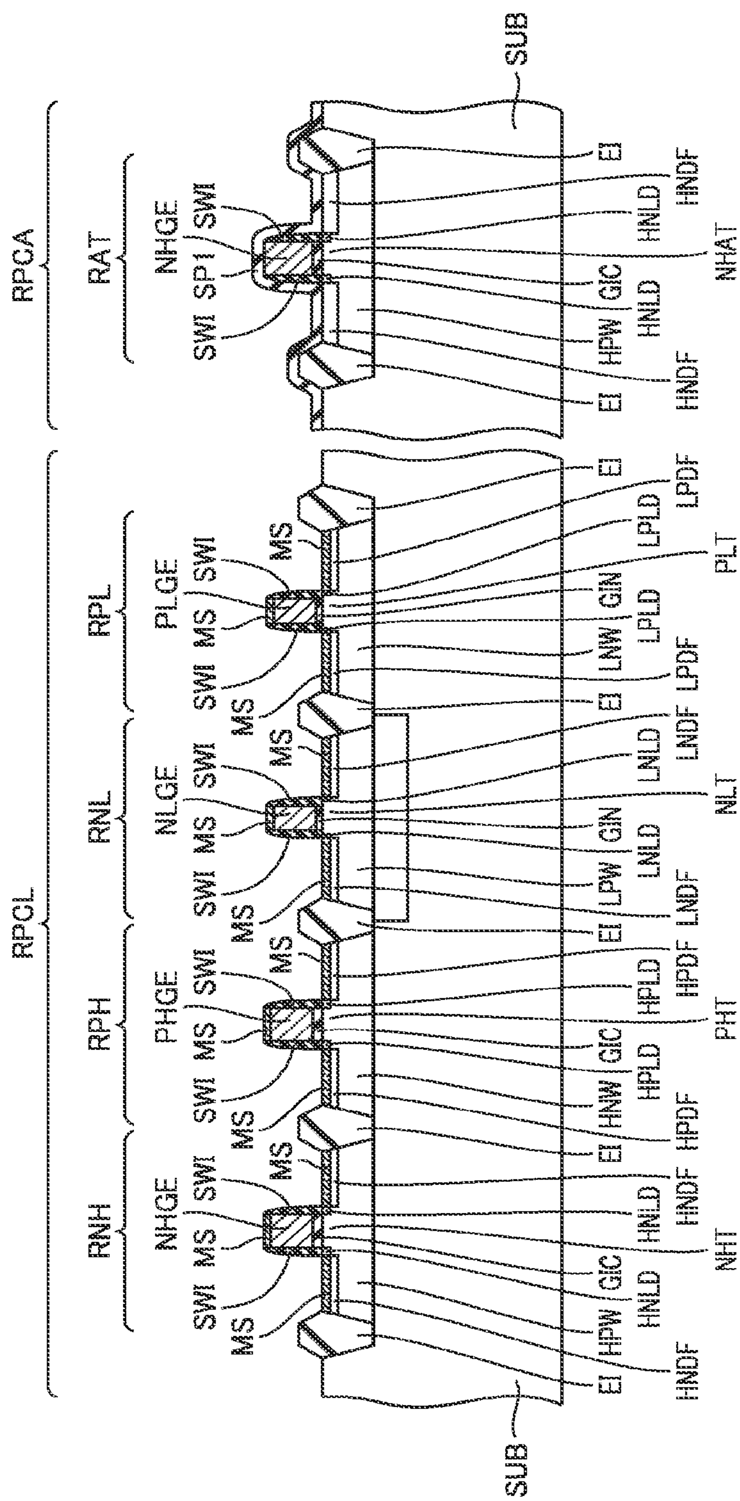
FIG. 24C is a cross sectional view of the peripheral region to show a step performed in the embodiment after the steps shown in FIG. 23A to FIG. 23C.

As shown in FIG. 24C, in first peripheral region RPCL, metal silicide films MS are formed on the upper surface of gate electrode NHGE of field effect transistor NHT and the surface of source-drain region HNDF. Metal silicide films MS are formed on the upper surface of gate electrode PHGE of field effect transistor PHT and the surface of source-drain region HPDF. Metal silicide films MS are formed on the upper surface of gate electrode NLGE of field effect transistor NLT and the surface of source-drain region LNDF. Metal silicide films MS are formed on the upper surface of gate electrode PLGE of field effect transistor PLT and the surface of source-drain region LPDF. On the other hand, in second peripheral region RPCA, silicide protection film SP1 is formed, so that no metal silicide film is formed.

Figure 25A:
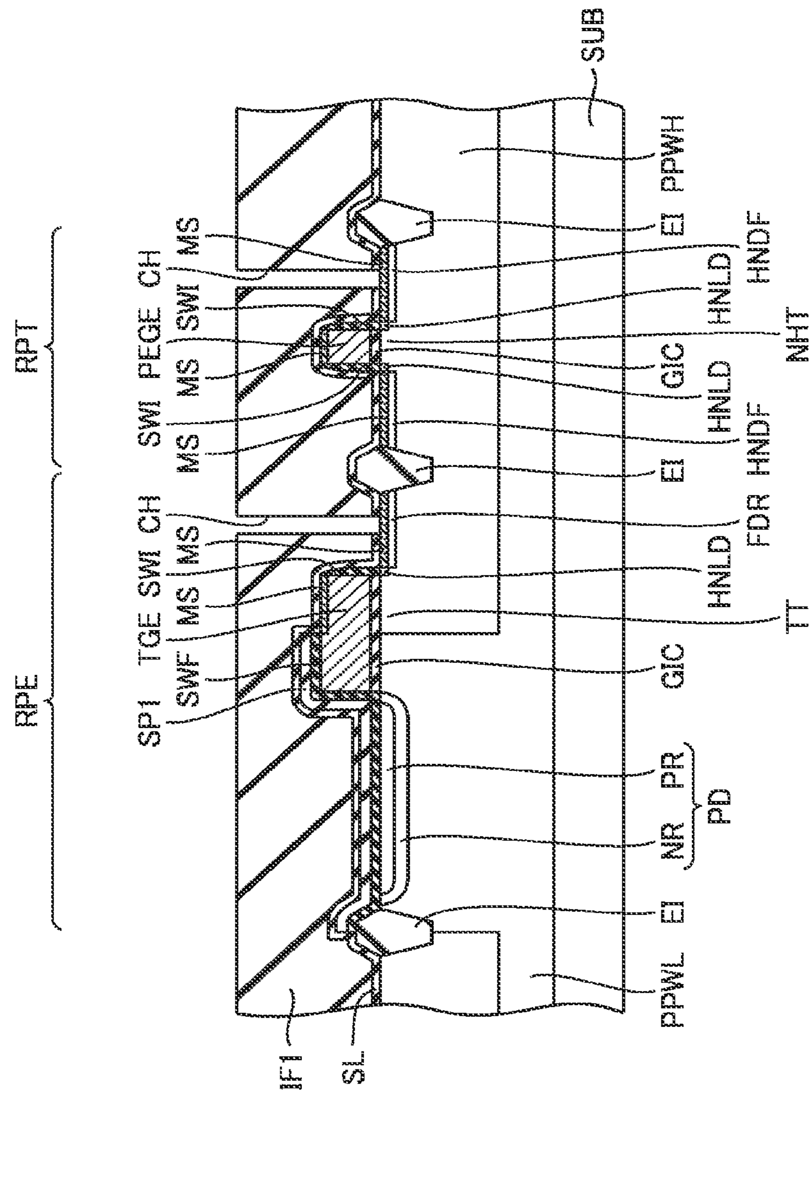
FIG. 25A is a cross sectional view of the pixel region and the like to show a step performed in the embodiment after the steps shown in FIG. 24A to FIG. 24C.
Figure 25B:
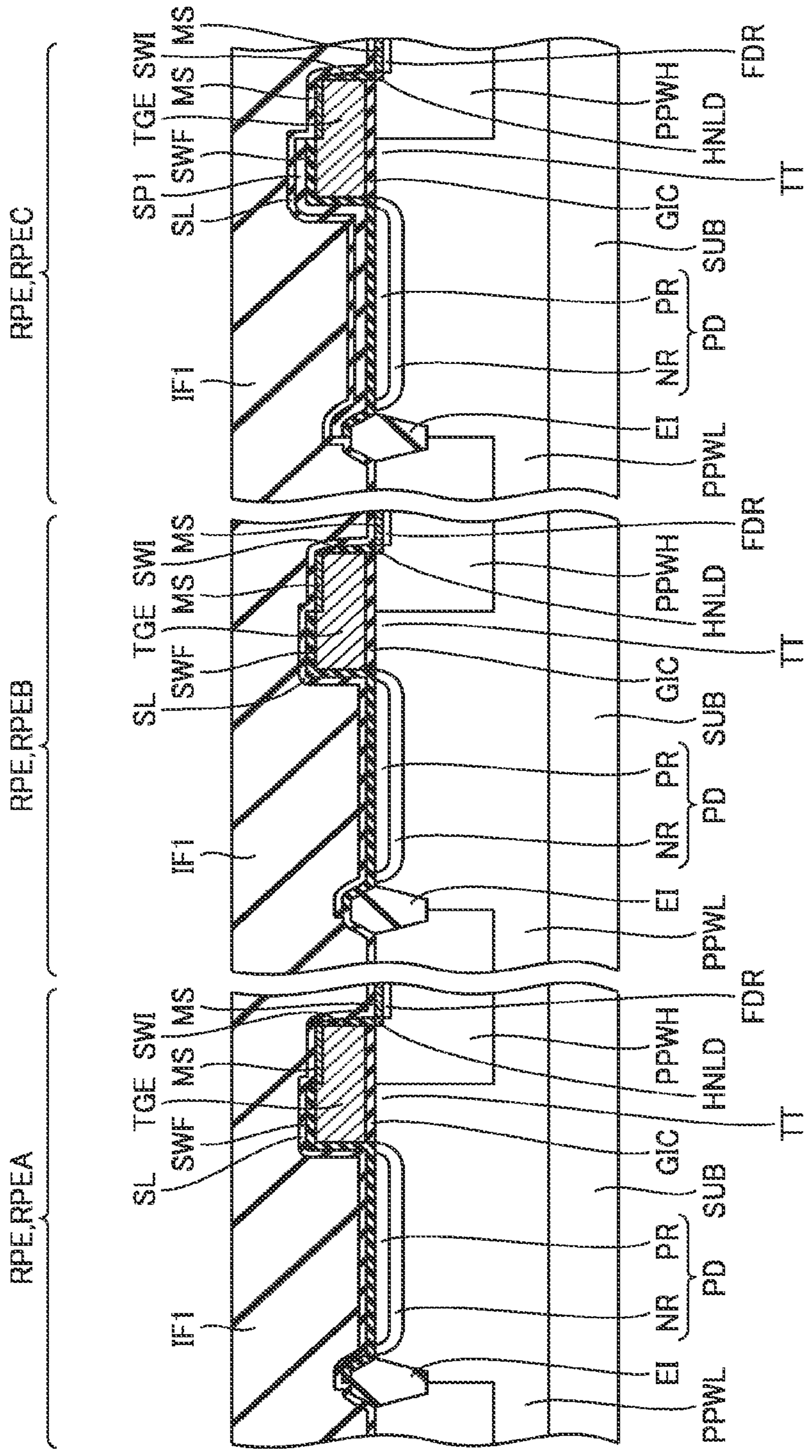
FIG. 25B is a cross sectional view of each pixel region to show a step performed in the embodiment after the steps shown in FIG. 24A to FIG. 24C.
Figure 25C:
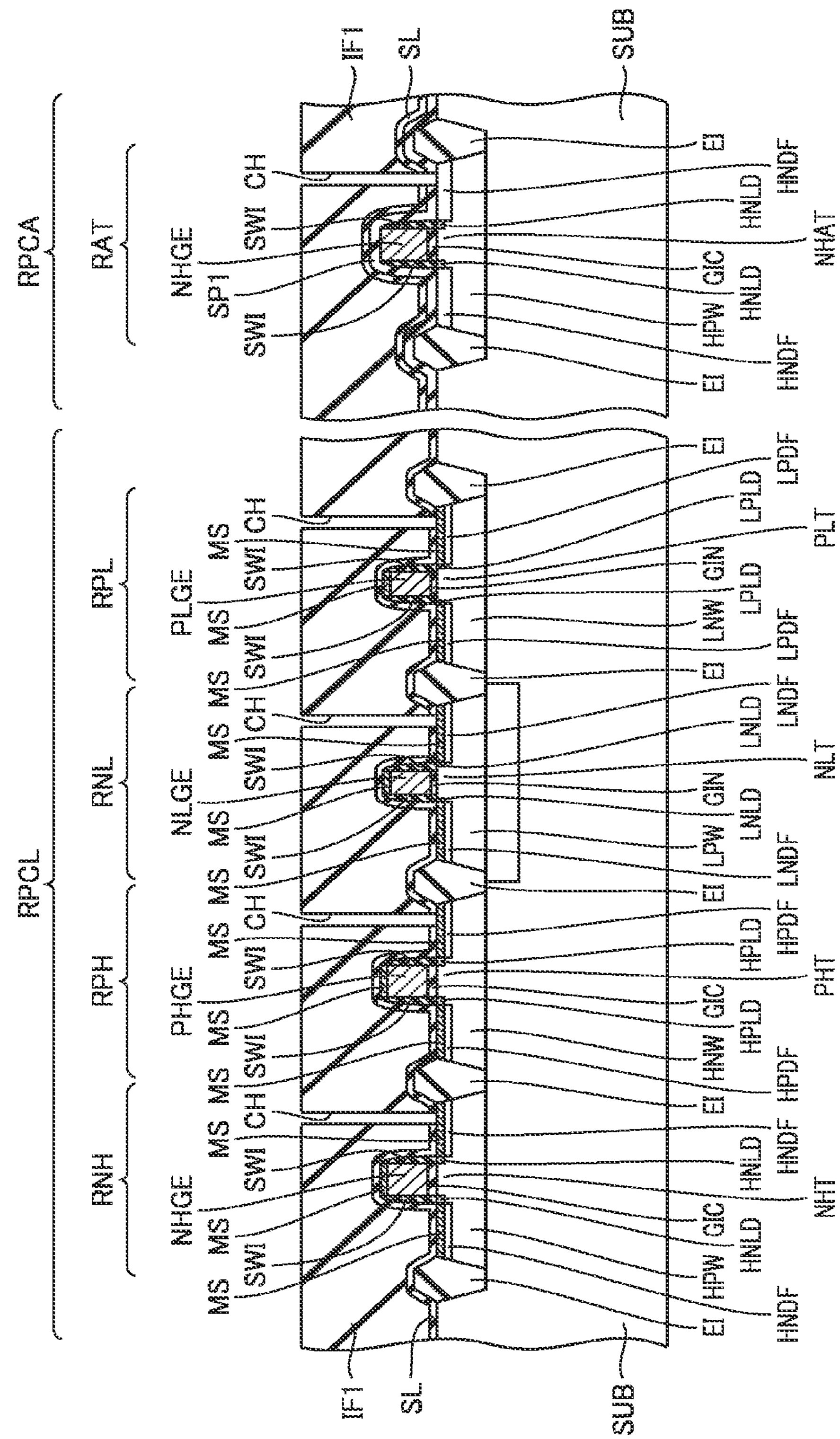
FIG. 25C is a cross sectional view of the peripheral region to show a step performed in the embodiment after the steps shown in FIG. 24A to FIG. 24C.

Next, as shown in FIG. 25A, FIG. 25B, and FIG. 25C, a stress liner film SL is formed to cover transfer transistor TT and field effect transistors NHT, PHT, NLT, PLT, NHAT, and the like. As stress liner film SL, for example, there is formed a laminate film in which a silicon nitride film is formed on a silicon oxide film. Next, a first interlayer insulating film IF1 is formed as a contact interlayer film to cover stress liner film SL. Next, a predetermined photolithographic process is performed, thereby forming a resist pattern (not shown) for forming a contact hole.

Next, anisotropic etching process is performed to first interlayer insulating film IF1 and the like using the resist pattern as an etching mask, thereby forming a contact hole CH in pixel region RPE to expose the surface of metal silicide film MS formed in floating diffusion region FDR. In pixel transistor region RPT, a contact hole CH is formed to expose the surface of metal silicide film MS formed in source-drain region HNDF.

In first peripheral region RPCL, a contact hole CH is formed to expose the surface of metal silicide film MS formed in each of source-drain regions HNDF, HPDF, LNDF, LPDF. In second peripheral region RPCA, a contact hole CH is formed to expose the surface of source-drain region HNDF. Then, the resist pattern is removed.

Figure 26A:
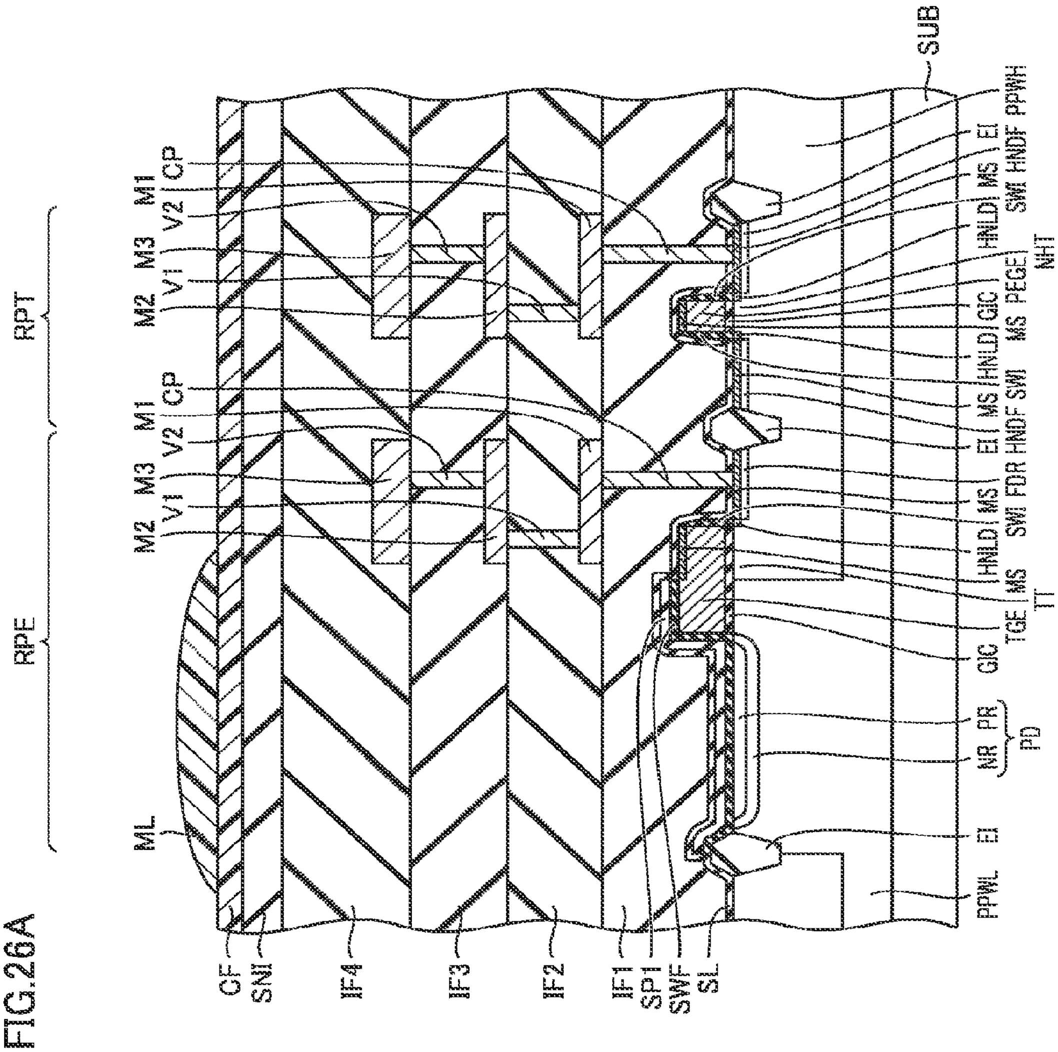
FIG. 26A is a cross sectional view of the pixel region and the like to show a step performed in the embodiment after the steps shown in FIG. 25A to FIG. 25C.
Figure 26B:
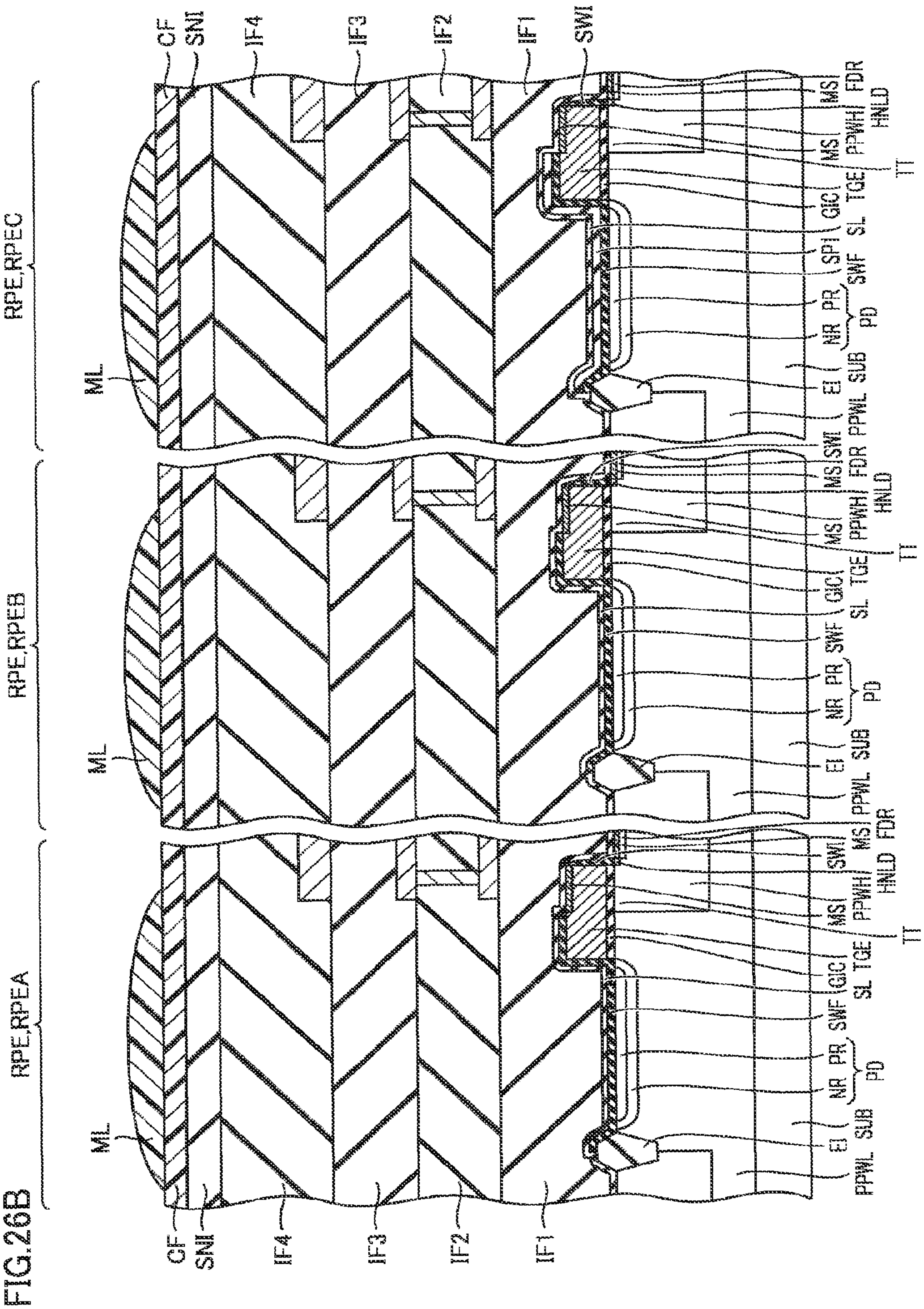
FIG. 26B is a cross sectional view of each pixel region to show a step performed in the embodiment after the steps shown in FIG. 25A to FIG. 25C.
Figure 26C:
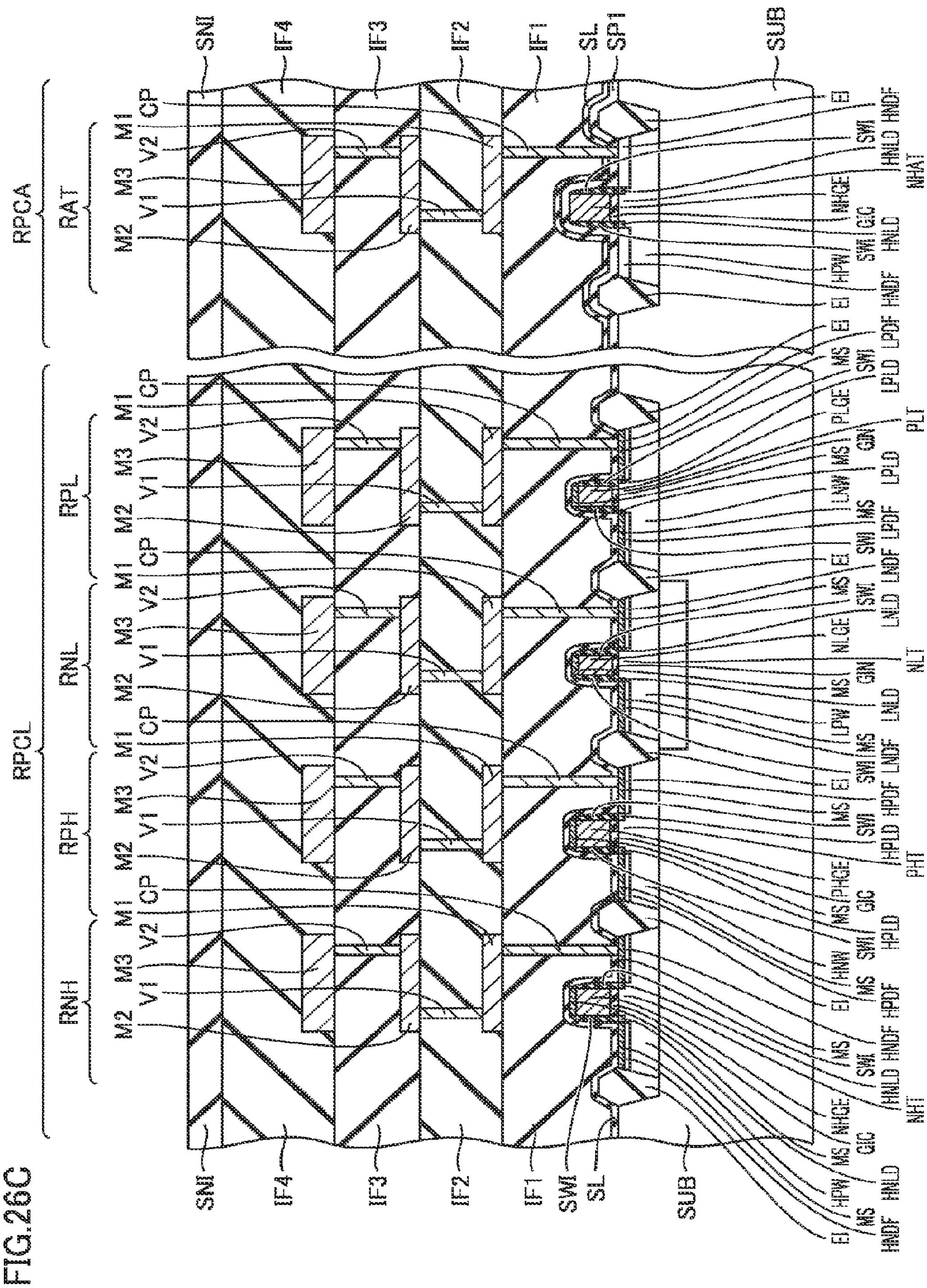
FIG. 26C is a cross sectional view of the peripheral region to show a step performed in the embodiment after the steps shown in FIG. 25A to FIG. 25C.

Next, as shown in FIG. 26A, FIG. 26B, and FIG. 26C, contact plugs CP are formed in contact holes CH. Next, first interconnections M1 are formed in contact with the surface of first interlayer insulating film IF1. Second interlayer insulating film IF2 is formed to cover first interconnections M1. Next, first vias V1 electrically connected to corresponding first interconnections M1 are formed to extend through second interlayer insulating film IF. Next, second interconnections M2 are formed in contact with the surface of second interlayer insulating film IF2. Second interconnections M2 are respectively electrically connected to corresponding first vias V1.

Next, a third interlayer insulating film IF3 is formed to cover second interconnections M2. Next, second vias V2 electrically connected to corresponding second interconnections M2 are formed to extend through third interlayer insulating film IF3. Next, third interconnections M3 are formed in contact with the surface of third interlayer insulating film IF3. Third interconnections M3 are electrically connected to corresponding second vias V2 respectively. Next, a fourth interlayer insulating film IF4 is formed to cover third interconnections M3. Next, an insulating film SNI, such as a silicon nitride film, is formed in contact with the surface of fourth interlayer insulating film IF4, for example. Next, in pixel region RPE, a predetermined color filter CF corresponding to one of red, green and blue is formed. Then, in pixel region RPE, micro lens ML is disposed to collect light. In this way, the main part of the image capturing device is completed.

In the above-described image capturing device, wet etching process is provided to remove the offset spacer film, thereby reducing etching damage in the photo diode as compared with a case where the offset spacer film is removed by performing dry etching process. This will be explained in relation to a method for manufacturing an image capturing device according to a comparative example. It should be noted that in the image capturing device according to the comparative example, the same members as those in the image capturing device according to the embodiment will be given reference characters obtained by providing a sign “C” before the reference characters of the corresponding members of the image capturing device according to the embodiment, and will not be described repeatedly unless required.

Figure 27A:
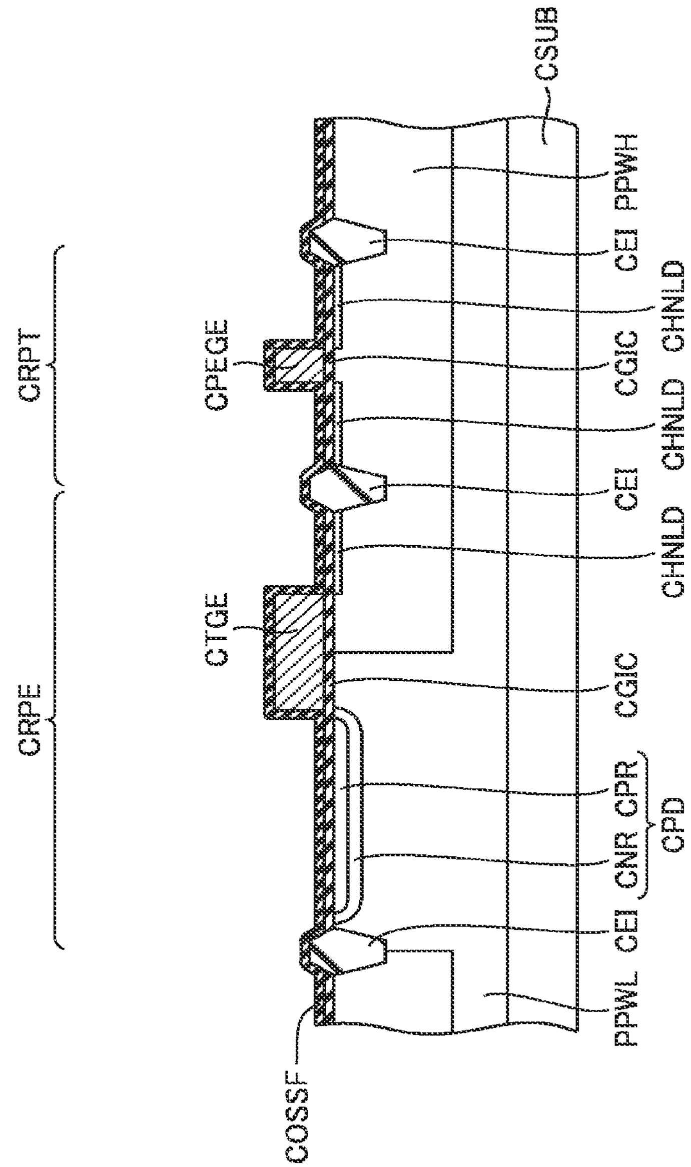
FIG. 27A is a cross sectional view of a pixel region and the like to show one step of a method for manufacturing an image capturing device according to a comparative example.
Figure 27B:
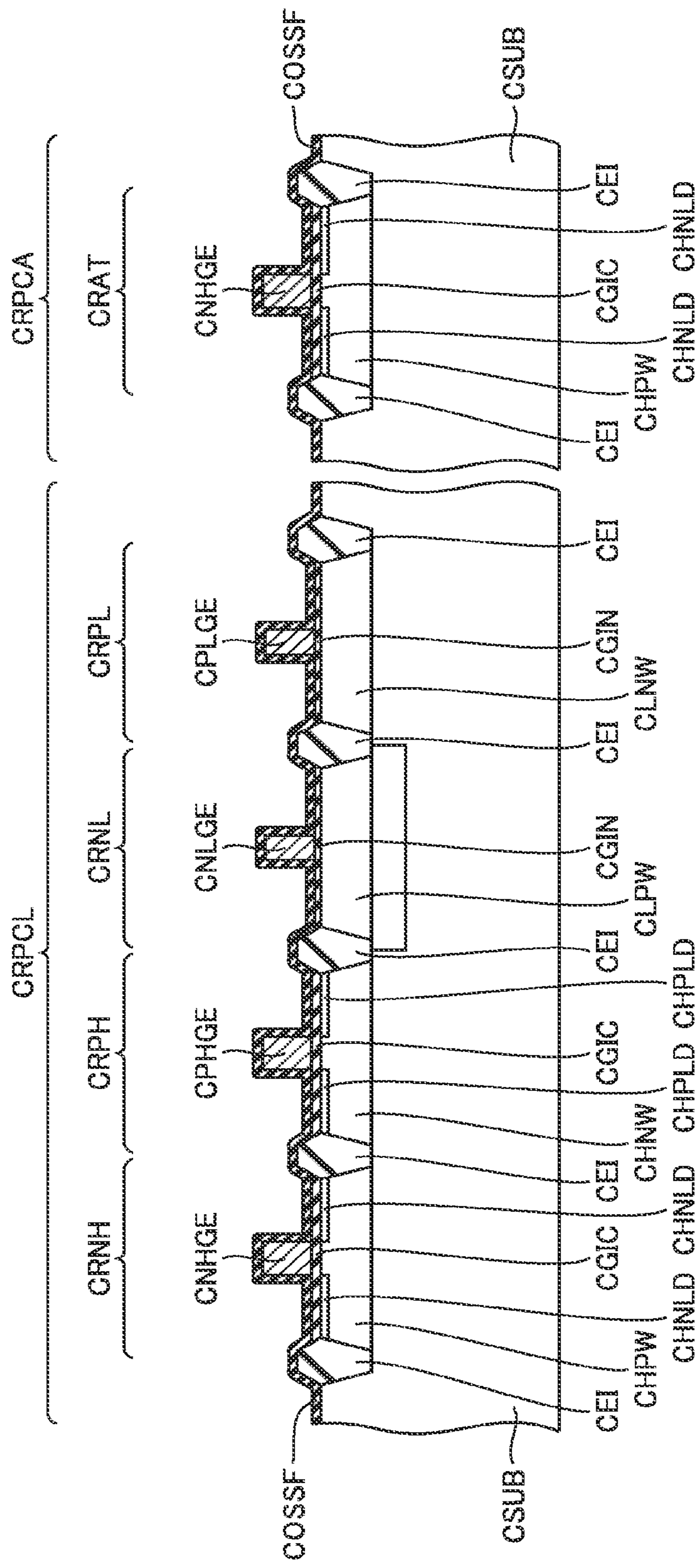
FIG. 27B is a cross sectional view of a peripheral region to show one step of the method for manufacturing the image capturing device according to the comparative example.
Figure 28A:
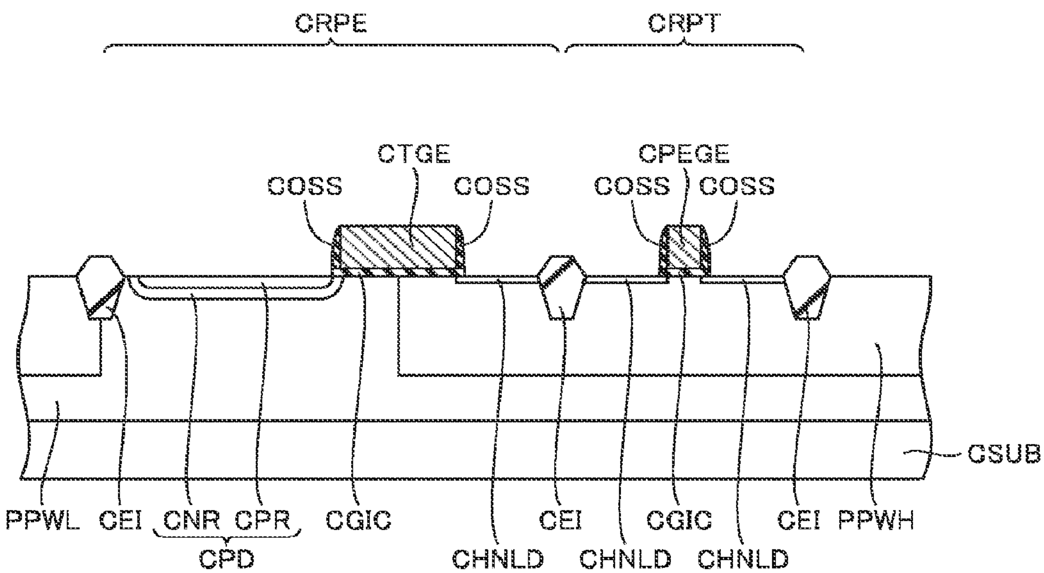
FIG. 28A is a cross sectional view of the pixel region and the like to show a step performed after the steps shown in FIG. 27A and FIG. 27B.
Figure 28B:
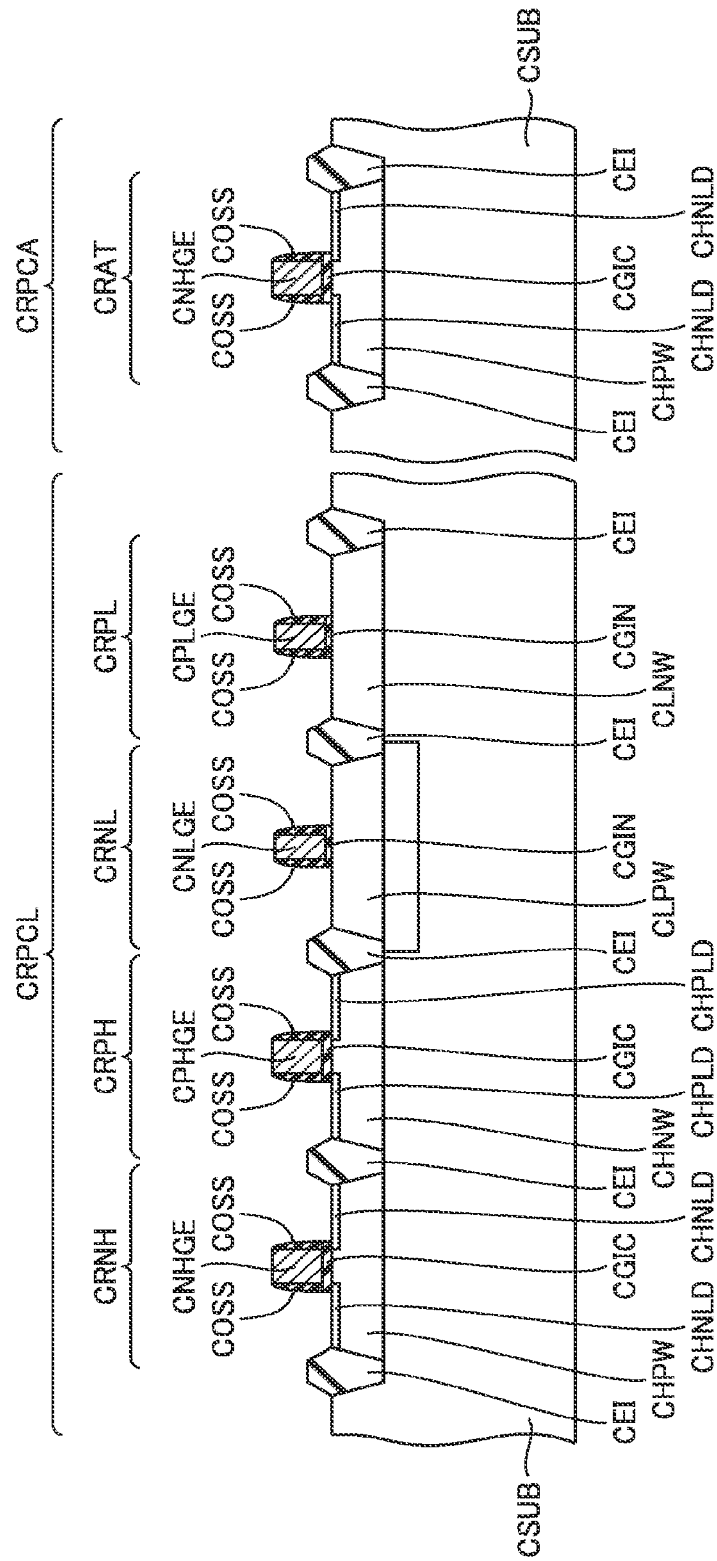
FIG. 28B is a cross sectional view of the peripheral region to show a step performed after the steps shown in FIG. 27A and FIG. 27B.

First, through the same steps as those shown in FIG. 7A and FIG. 7B to FIG. 10A and FIG. 10B, an insulating film COSSF to serve as the offset spacer film is formed to cover gate electrodes CTGE, CPEGE, CNHGE, CPHGE, CNLGE, CPLGE as shown in FIG. 27A and FIG. 27B. Next, as shown in FIG. 28A and FIG. 28B, anisotropic etching process is performed onto the entire surface of insulating film COSSF, thereby forming offset spacer films COSS on the side wall surfaces of gate electrodes CTGE, CPEGE, CNHGE, CPHGE, CNLGE, CPLGE. On this occasion, damage (plasma damage) is caused in photo diode CPD.

Figure 29A:
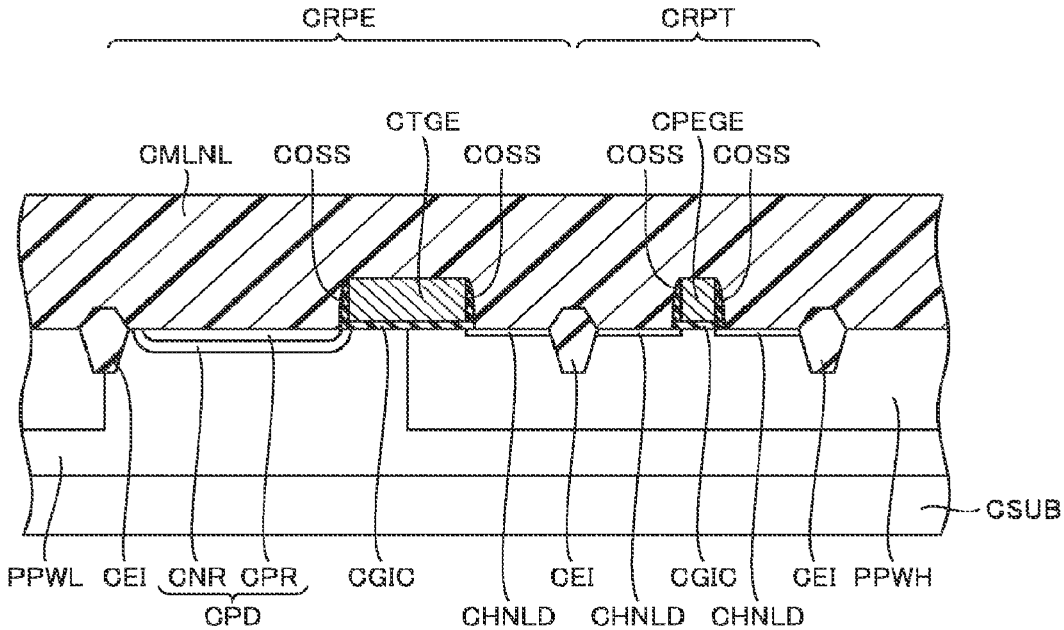
FIG. 29A is a cross sectional view of the pixel region and the like to show a step performed after the steps shown in FIG. 28A and FIG. 28B.
Figure 29B:
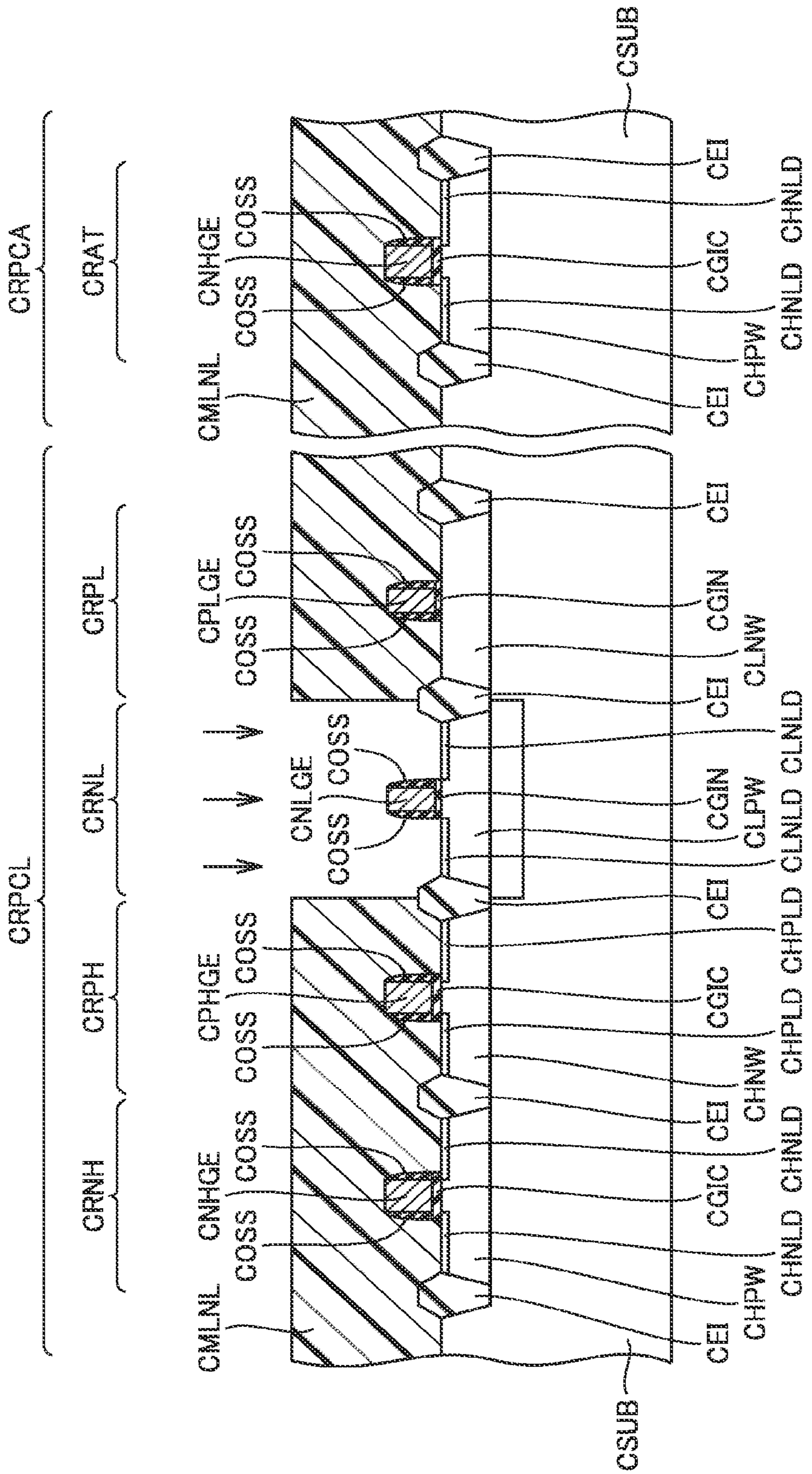
FIG. 29B is a cross sectional view of the peripheral region to show a step performed after the steps shown in FIG. 28A and FIG. 28B.
Figure 30A:
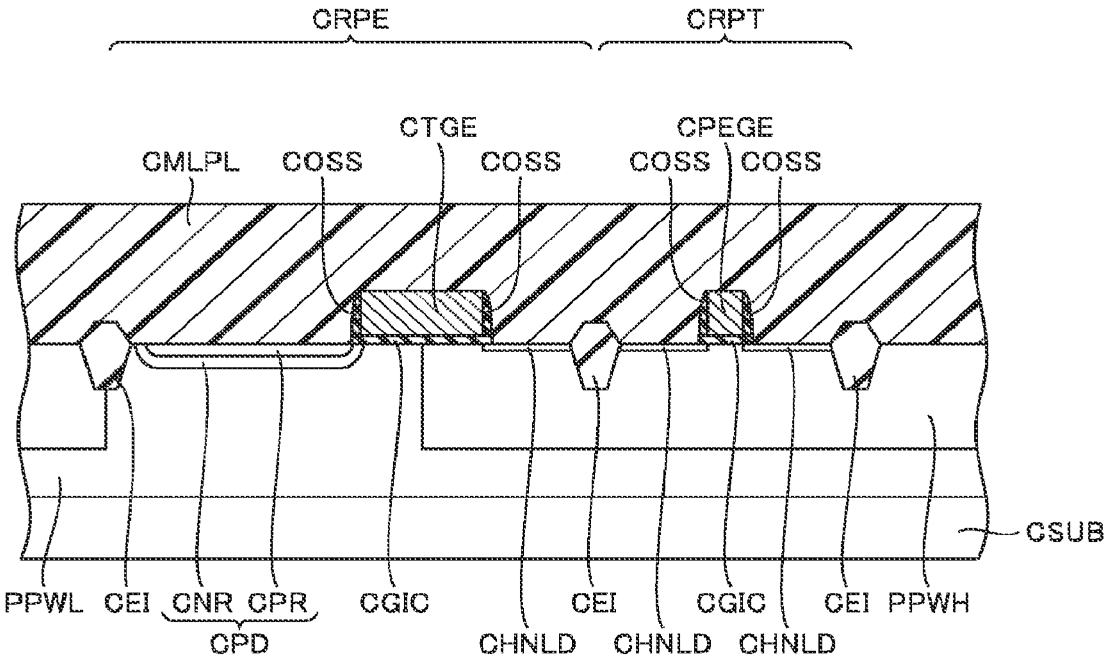
FIG. 30A is a cross sectional view of the pixel region and the like to show a step performed after the steps shown in FIG. 29A and FIG. 29B.
Figure 30B:
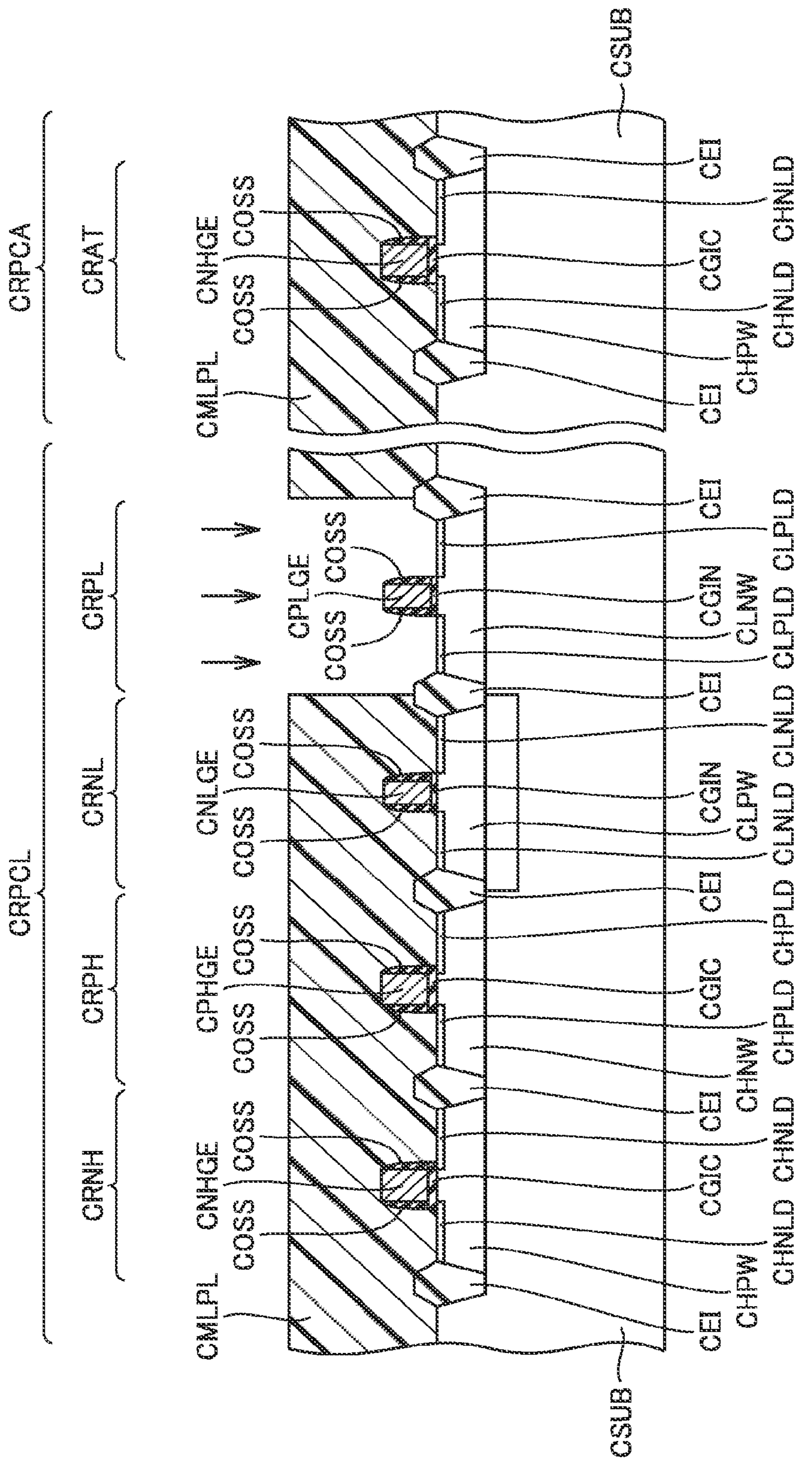
FIG. 30B is a cross sectional view of the peripheral region to show a step performed after the steps shown in FIG. 29A and FIG. 29B.

Next, as shown in FIG. 29A and FIG. 29B, an n type impurity is implanted using a resist pattern CMLNL, offset spacer films COSS, and gate electrode CNLGE as an implantation mask, thereby forming an extension region CLNLD in exposed region CRNL. Then, resist pattern CMLNL is removed. Next, as shown in FIG. 30A and FIG. 30B, a p type impurity is implanted using resist pattern CMLPL, offset spacer film COSS, and gate electrode CPLGE as an implantation mask, thereby forming extension region CLPLD in exposed region CRPL. Then, resist pattern CMLPL is removed.

Figure 31A:
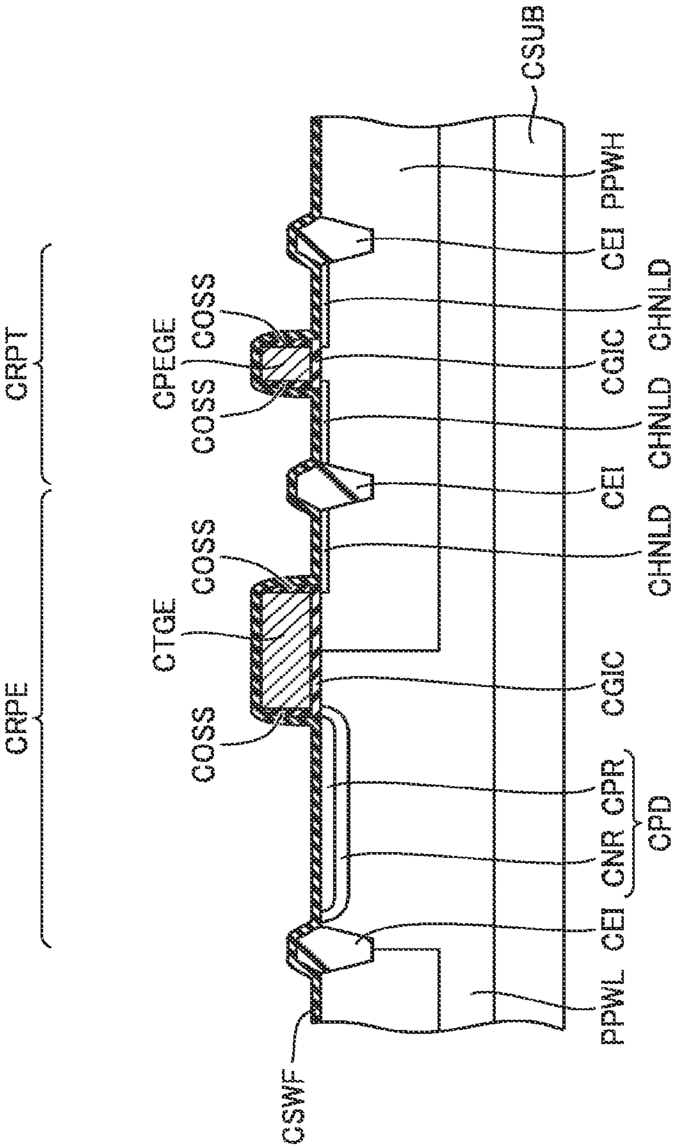
FIG. 31A is a cross sectional view of the pixel region and the like to show a step performed after the steps shown in FIG. 30A and FIG. 30B.
Figure 31B:
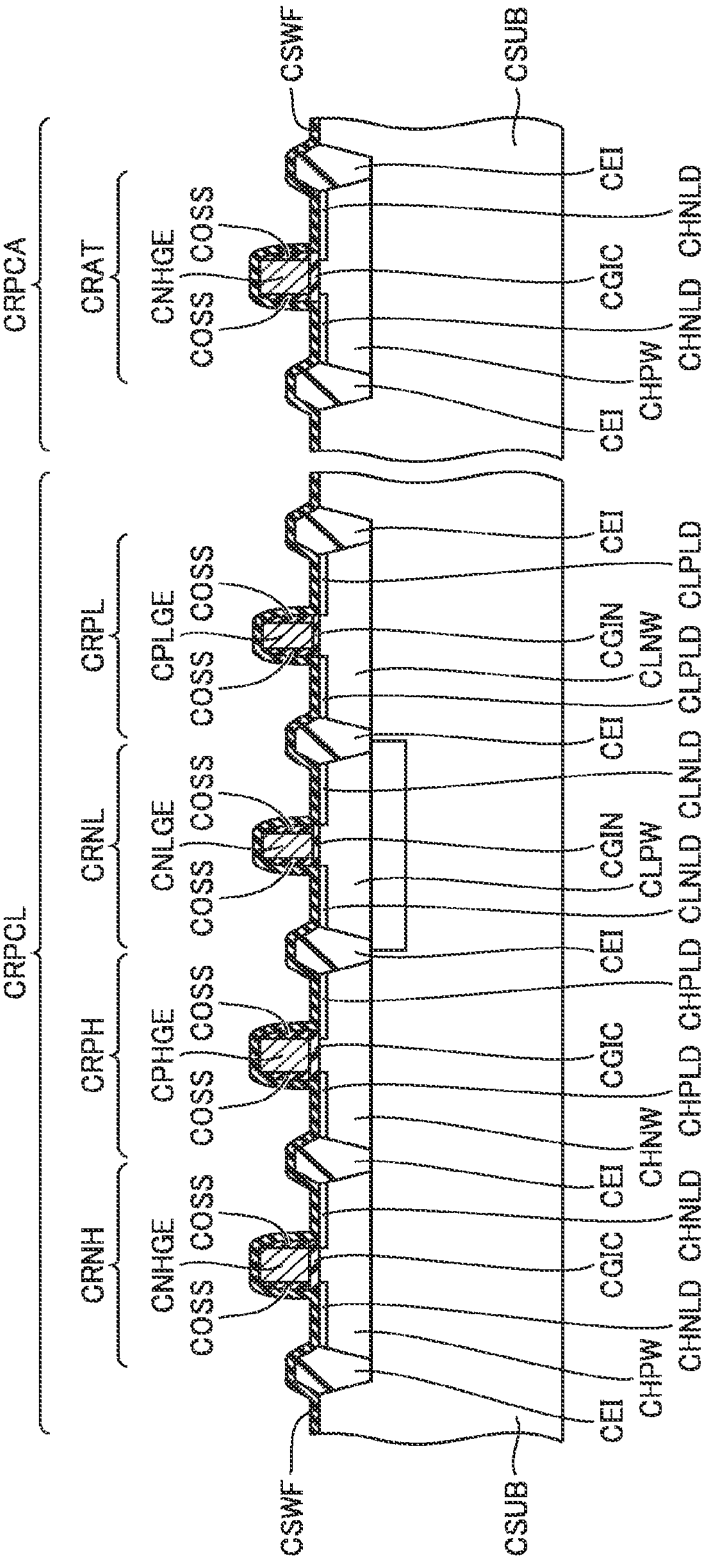
FIG. 31B is a cross sectional view of the peripheral region to show a step performed after the steps shown in FIG. 30A and FIG. 30B.
Figure 32A:
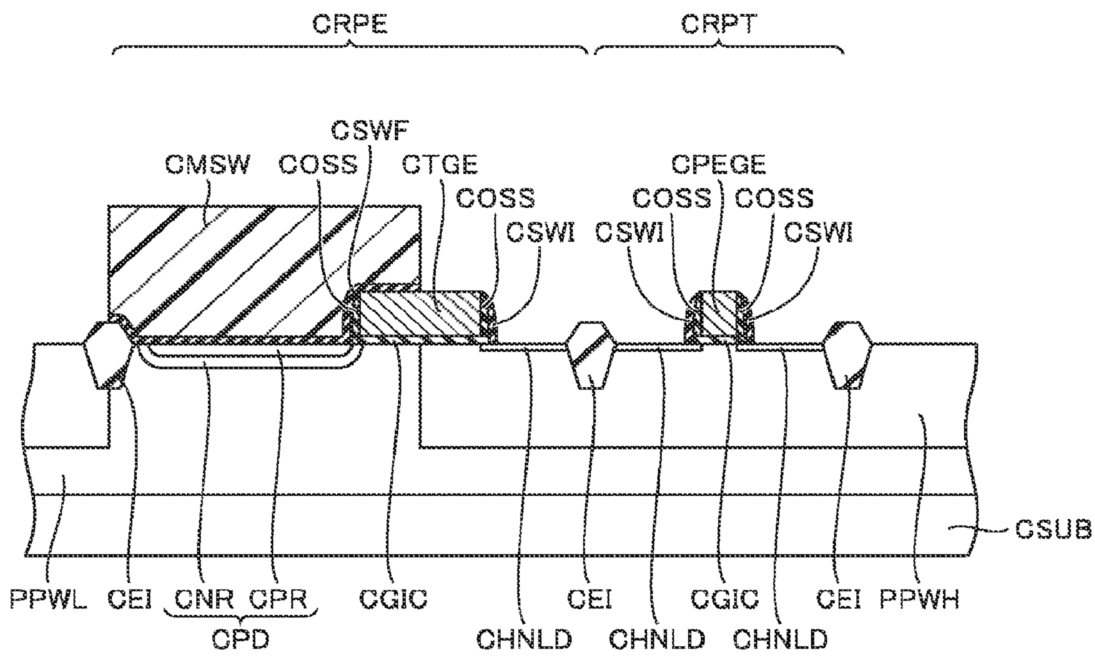
FIG. 32A is a cross sectional view of the pixel region and the like to show a step performed after the steps shown in FIG. 31A and FIG. 31B.
Figure 32B:
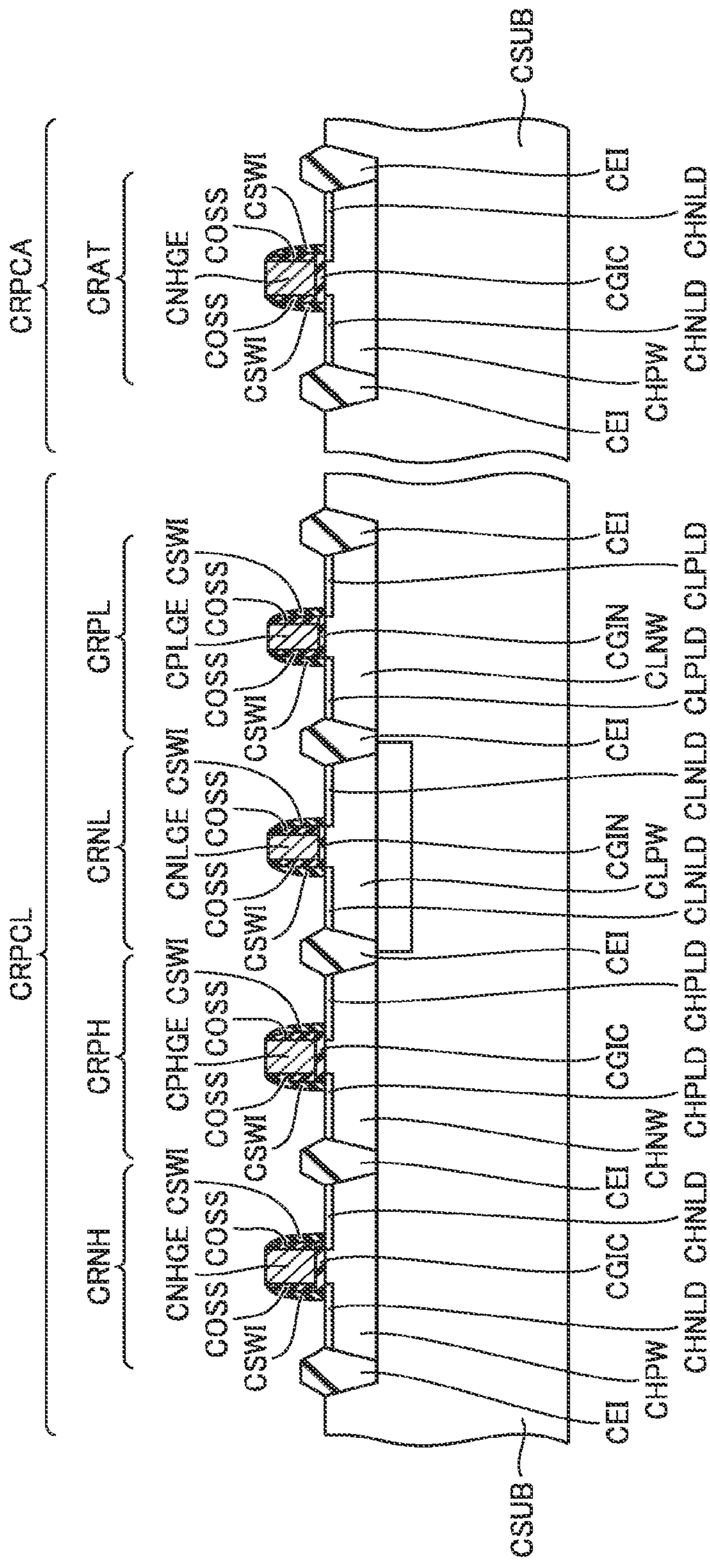
FIG. 32B is a cross sectional view of the peripheral region to show a step performed after the steps shown in FIG. 31A and FIG. 31B.

Next, as shown in FIG. 31A and FIG. 31B, an insulating film CSWF to serve as the sidewall insulating film is formed to cover gate electrodes CTGE, CPEGE, CNHGE, CPHGE, CNLGE, CPLGE. Next, as shown in FIG. 32A and FIG. 32B, anisotropic etching process is performed onto exposed insulating film CSWF using a resist pattern CMSW covering photo diode CPD as an etching mask, thereby forming a sidewall insulating films CSWI on the side wall surfaces of gate electrodes CTGE, CPEGE, CNHGE, CPHGE, CNLGE, CPLGE. Sidewall insulating films CSWI are formed to cover offset spacer films COSS disposed on the side wall surfaces of gate electrodes CTGE, CPEGE, CNHGE, CPHGE, CNLGE, CPLGE. Then, resist pattern CMSW is removed.

Figure 33A:
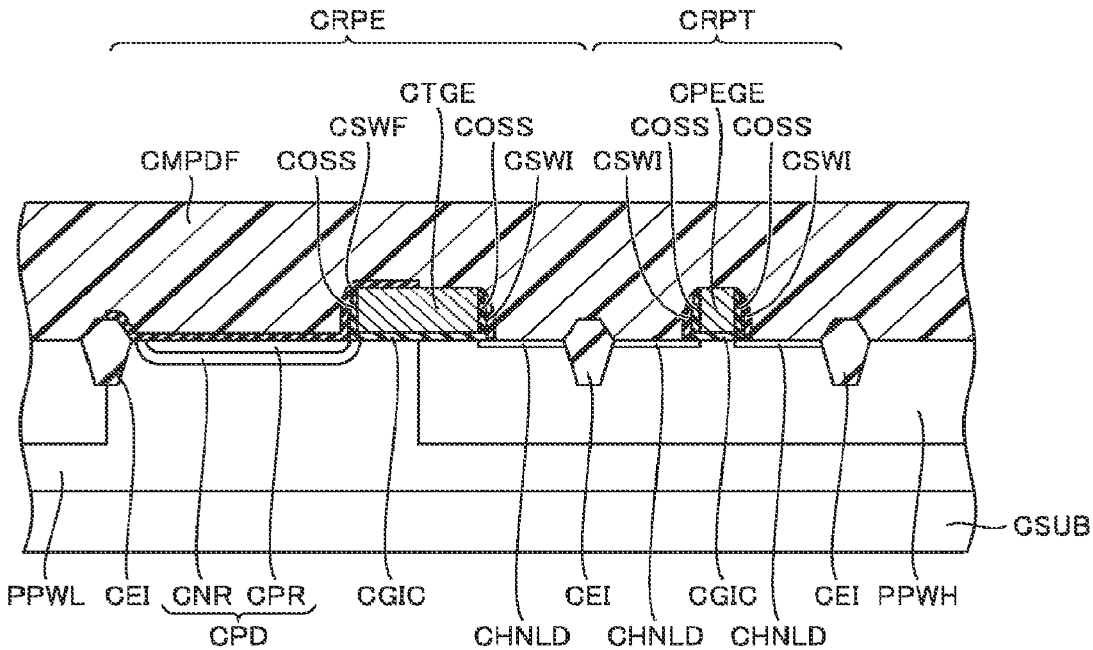
FIG. 33A is a cross sectional view of the pixel region and the like to show a step performed after the steps shown in FIG. 32A and FIG. 32B.
Figure 33B:
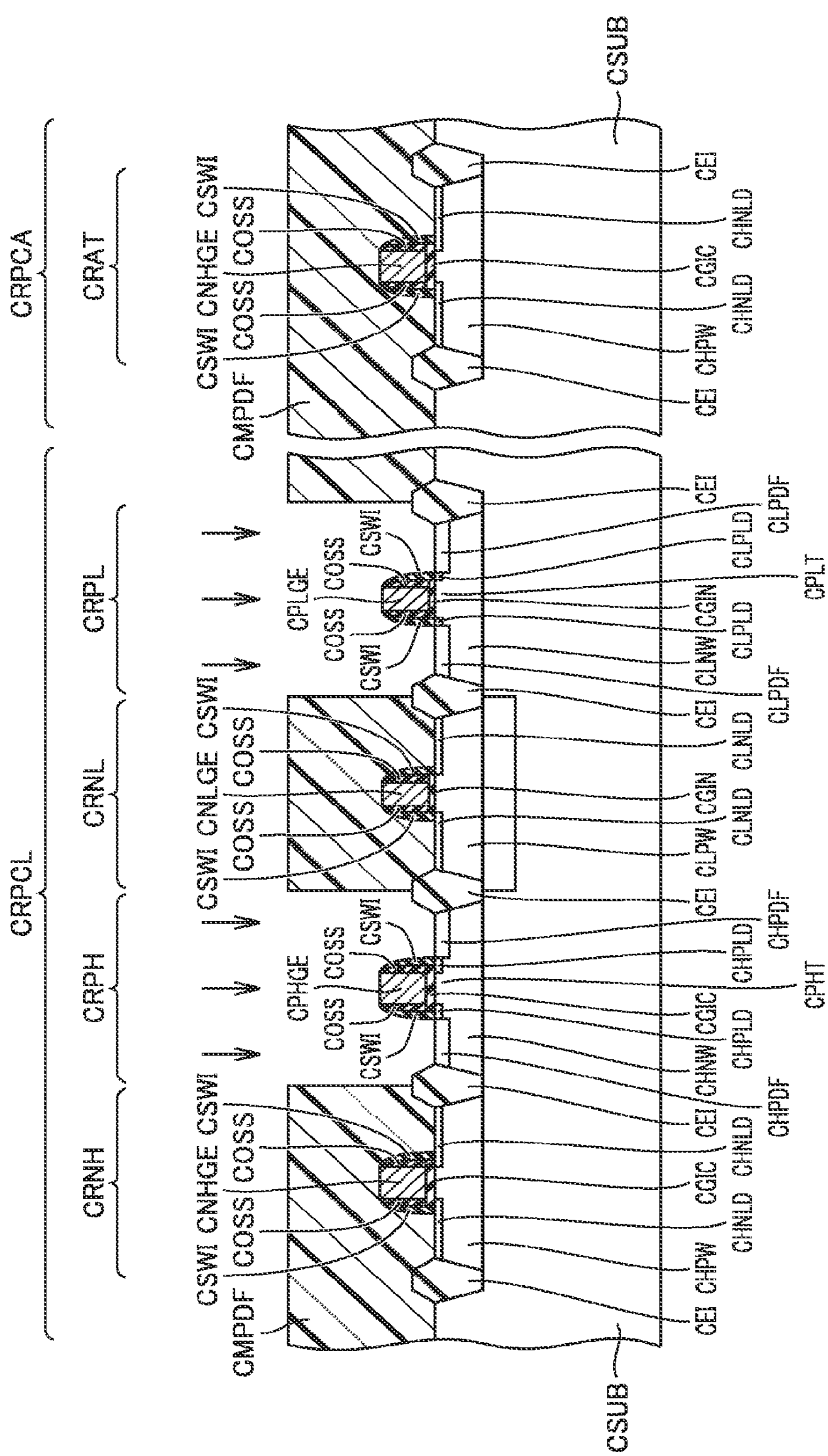
FIG. 33B is a cross sectional view of the peripheral region to show a step performed after the steps shown in FIG. 32A and FIG. 32B.

Next, as shown in FIG. 33A and FIG. 33B, a p type impurity is implanted using a resist pattern CMPDF, sidewall insulating films CSWI, offset spacer films COSS and gate electrodes CPHGE, CPLGE as an implantation mask, thereby forming a source-drain region CHPDF in region CRPH and forming a source-drain region CLPDF in region CRPL. Then, resist pattern CMPDF is removed.

Figure 34A:
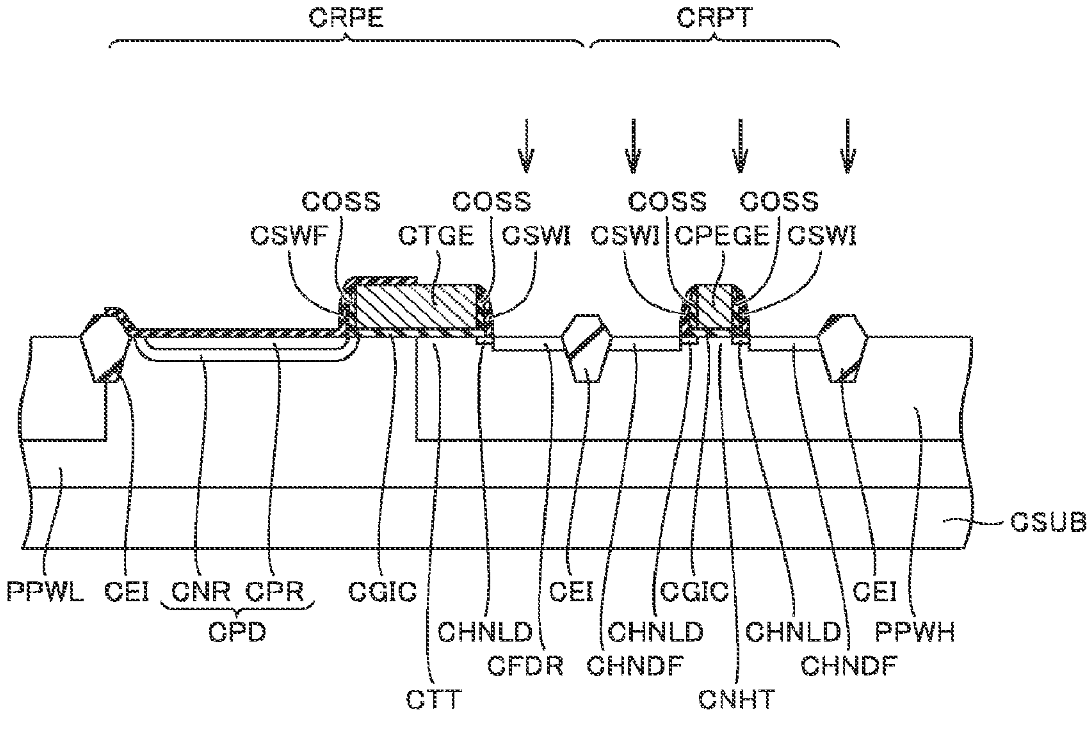
FIG. 34A is a cross sectional view of the pixel region and the like to show a step performed after the steps shown in FIG. 33A and FIG. 33B.
Figure 34B:
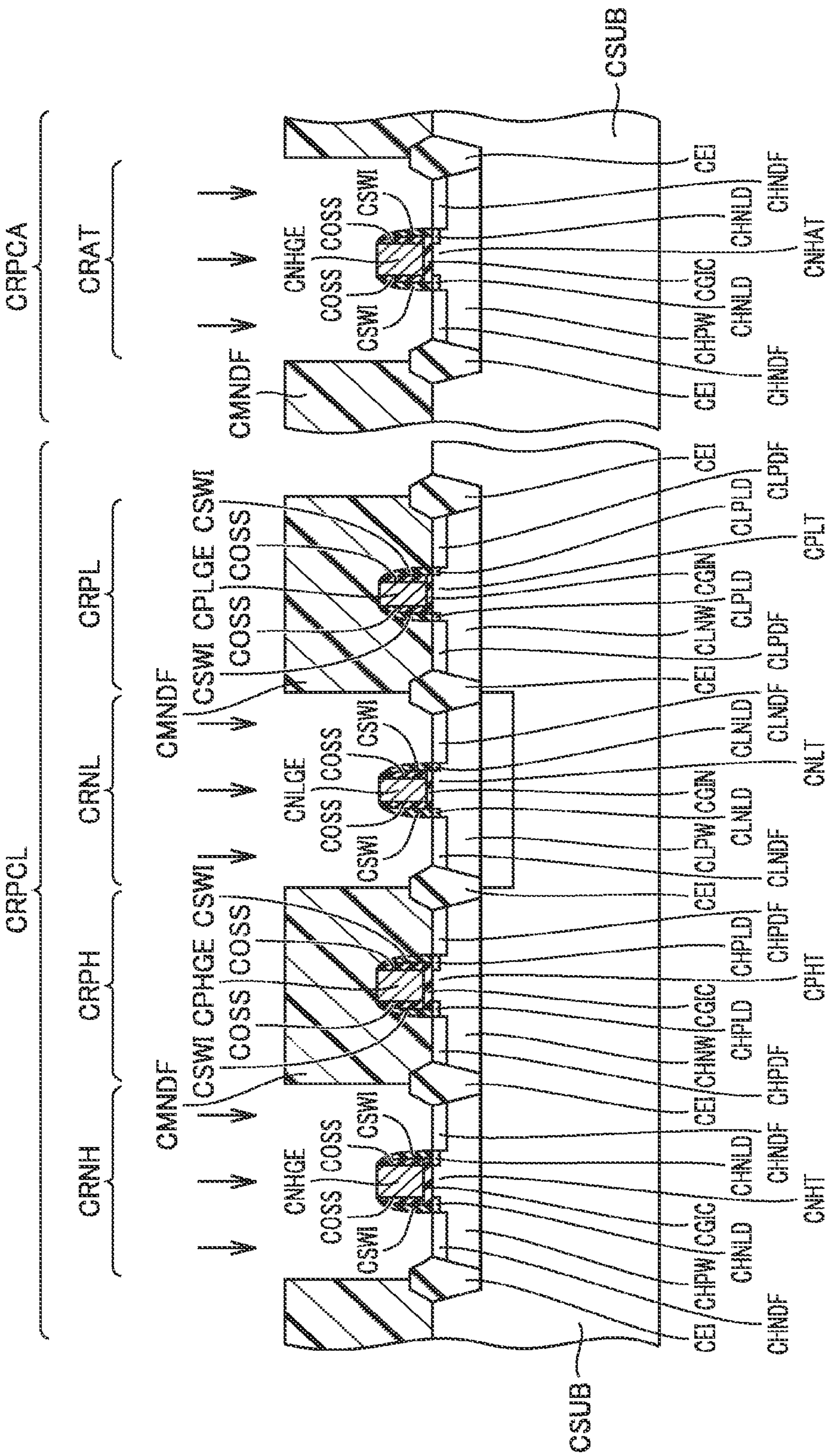
FIG. 34B is a cross sectional view of the peripheral region to show a step performed after the steps shown in FIG. 33A and FIG. 33B.

Next, as shown in FIG. 34A and FIG. 34B, an n type impurity is implanted using a resist pattern CMNDF, sidewall insulating films CSWI, offset spacer films COSS and gate electrodes CTGE, CPEGE, CNHGE, CNLGE as an implantation mask, thereby forming a source-drain region CHNDF in each of regions CRPT, CRNH, CRAT and forming a source-drain region CLNDF in region CRNL. Moreover, on this occasion, in pixel region CRPE, a floating diffusion region CFDR is formed. Then, resist pattern CMNDF is removed.

Figure 35A:
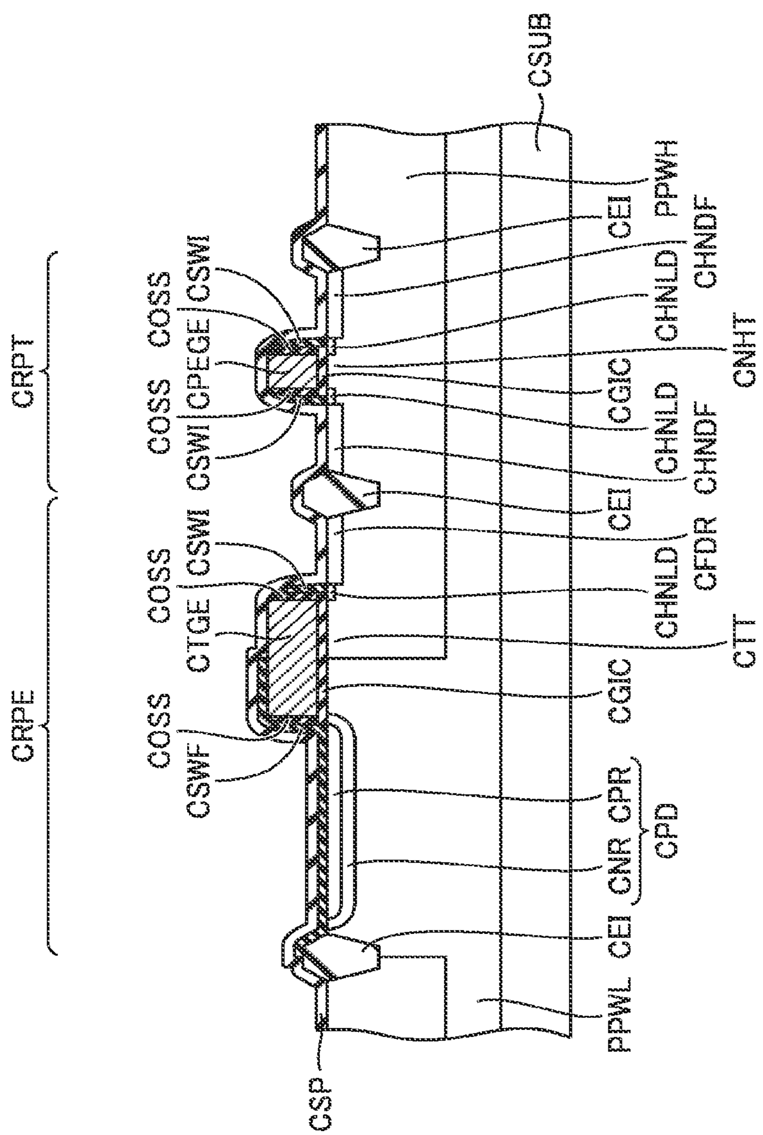
FIG. 35A is a cross sectional view of the pixel region and the like to show a step performed after the steps shown in FIG. 34A and FIG. 34B.
Figure 35B:
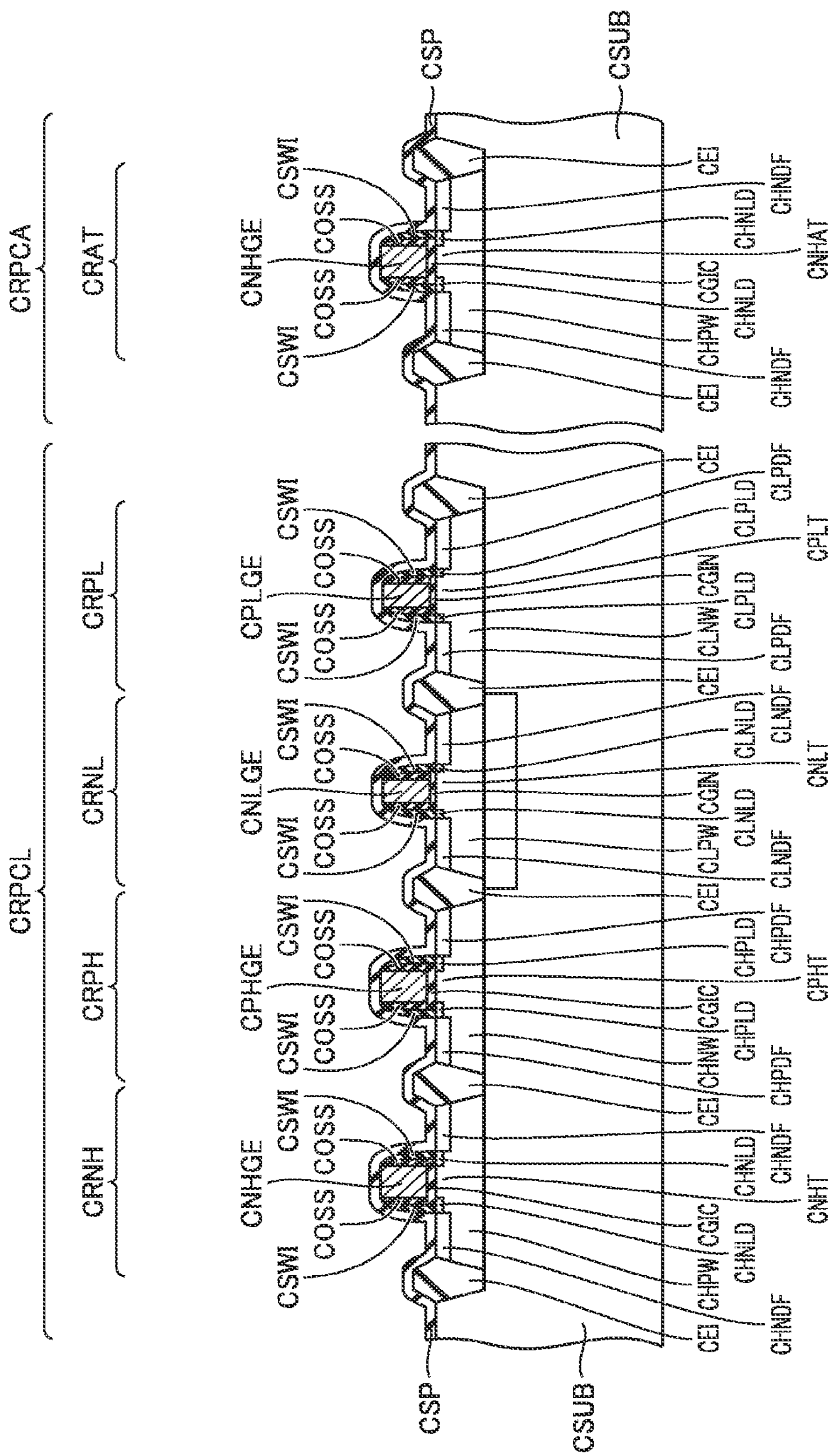
FIG. 35B is a cross sectional view of the peripheral region to show a step performed after the steps shown in FIG. 34A and FIG. 34B.
Figure 36A:
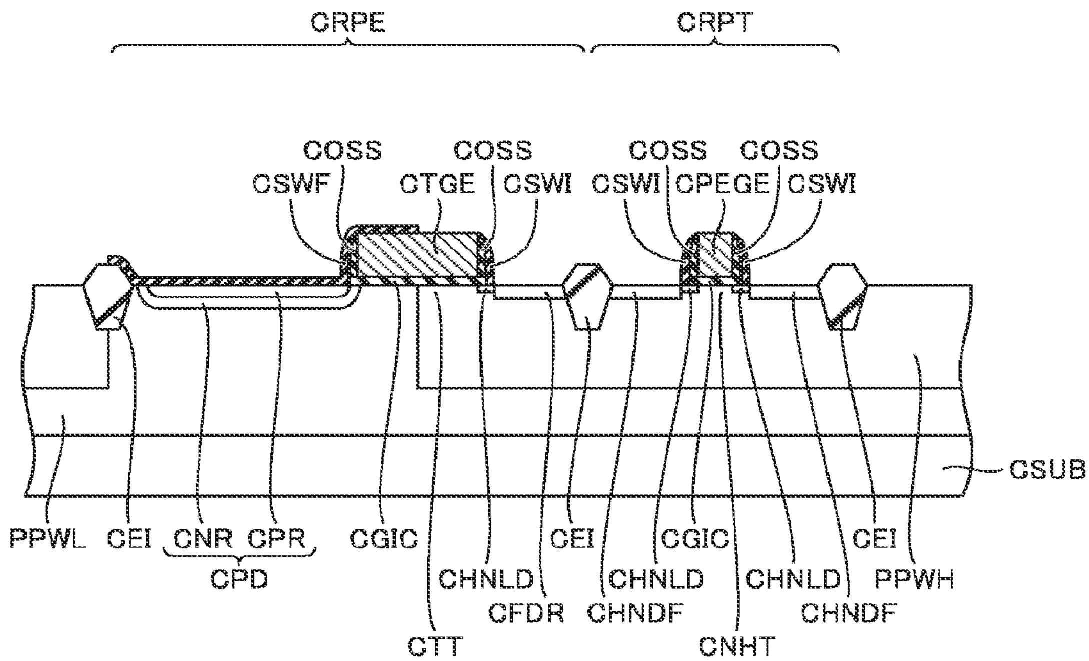
FIG. 36A is a cross sectional view of the pixel region and the like to show a step performed after the steps shown in FIG. 35A and FIG. 35B.
Figure 36B:
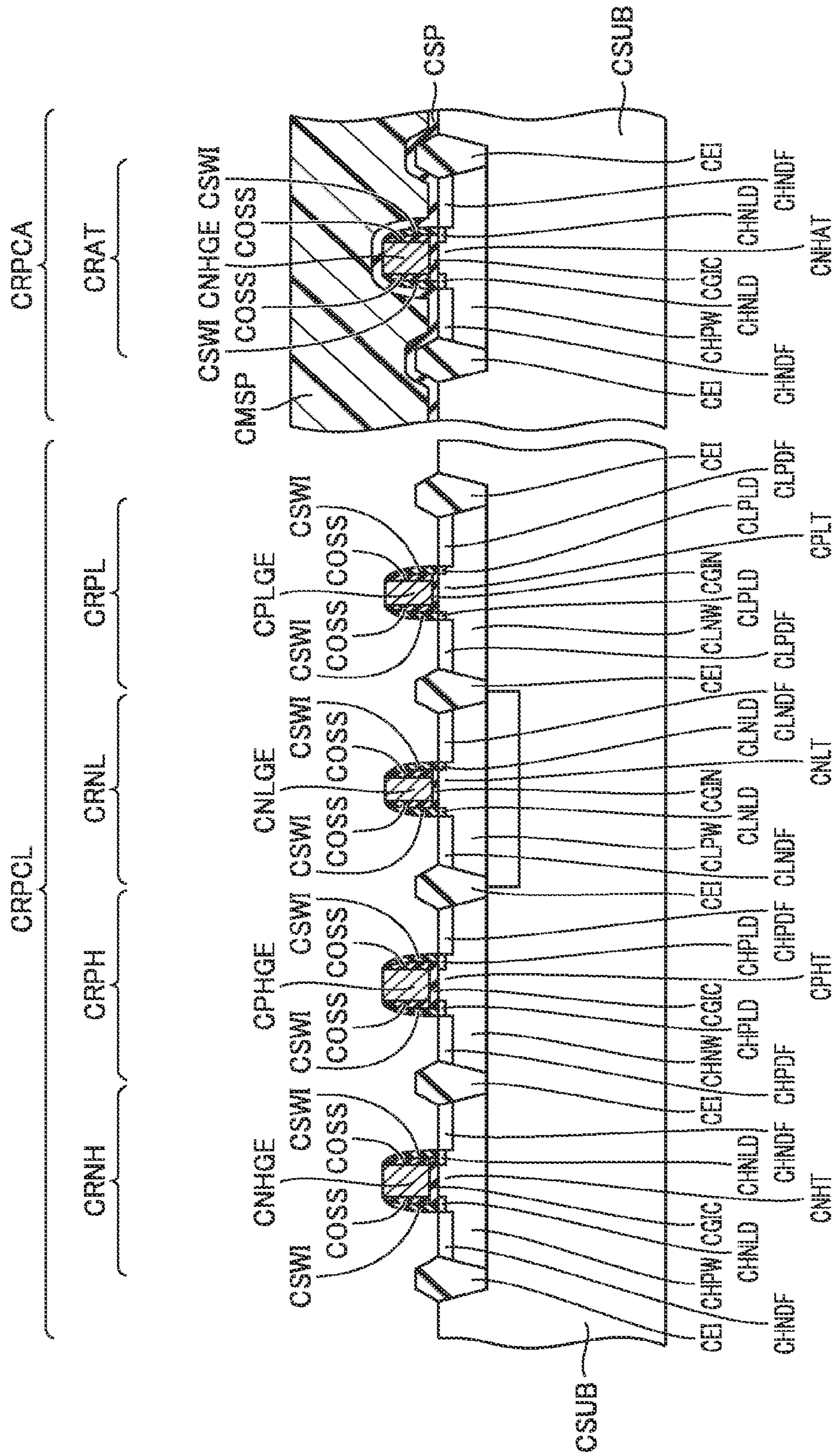
FIG. 36B is a cross sectional view of the peripheral region to show a step performed after the steps shown in FIG. 35A and FIG. 35B.

Next, as shown in FIG. 35A and FIG. 35B, a silicide protection film CSP is formed to cover gate electrodes CTGE, CPEGE, CNHGE, CPHGE, CNLGE, CPLGE and the like. Next, a resist pattern CMSP (see FIG. 36B) is formed to cover region CRAT and expose the other regions. Next, as shown in FIG. 36A and FIG. 36B, wet etching process is performed using resist pattern CMSP as an etching mask, thereby removing exposed silicide protection film CSP. Then, resist pattern CMSP is removed.

Figure 37A:
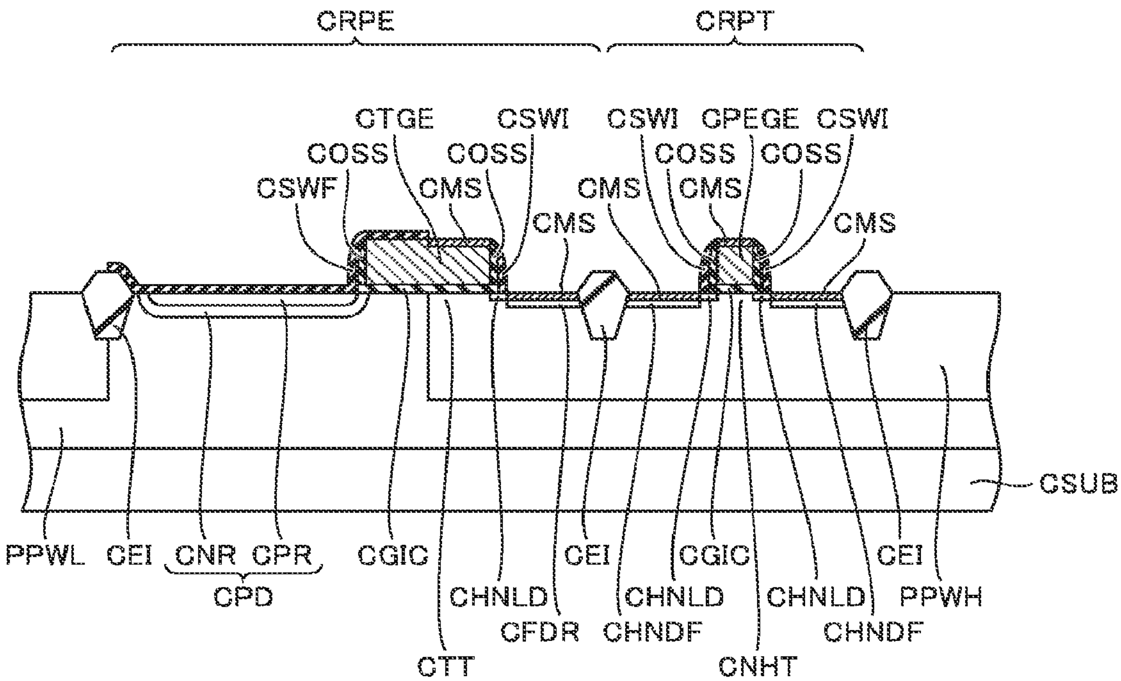
FIG. 37A is a cross sectional view of the pixel region and the like to show a step performed after the steps shown in FIG. 36A and FIG. 36B.
Figure 37B:
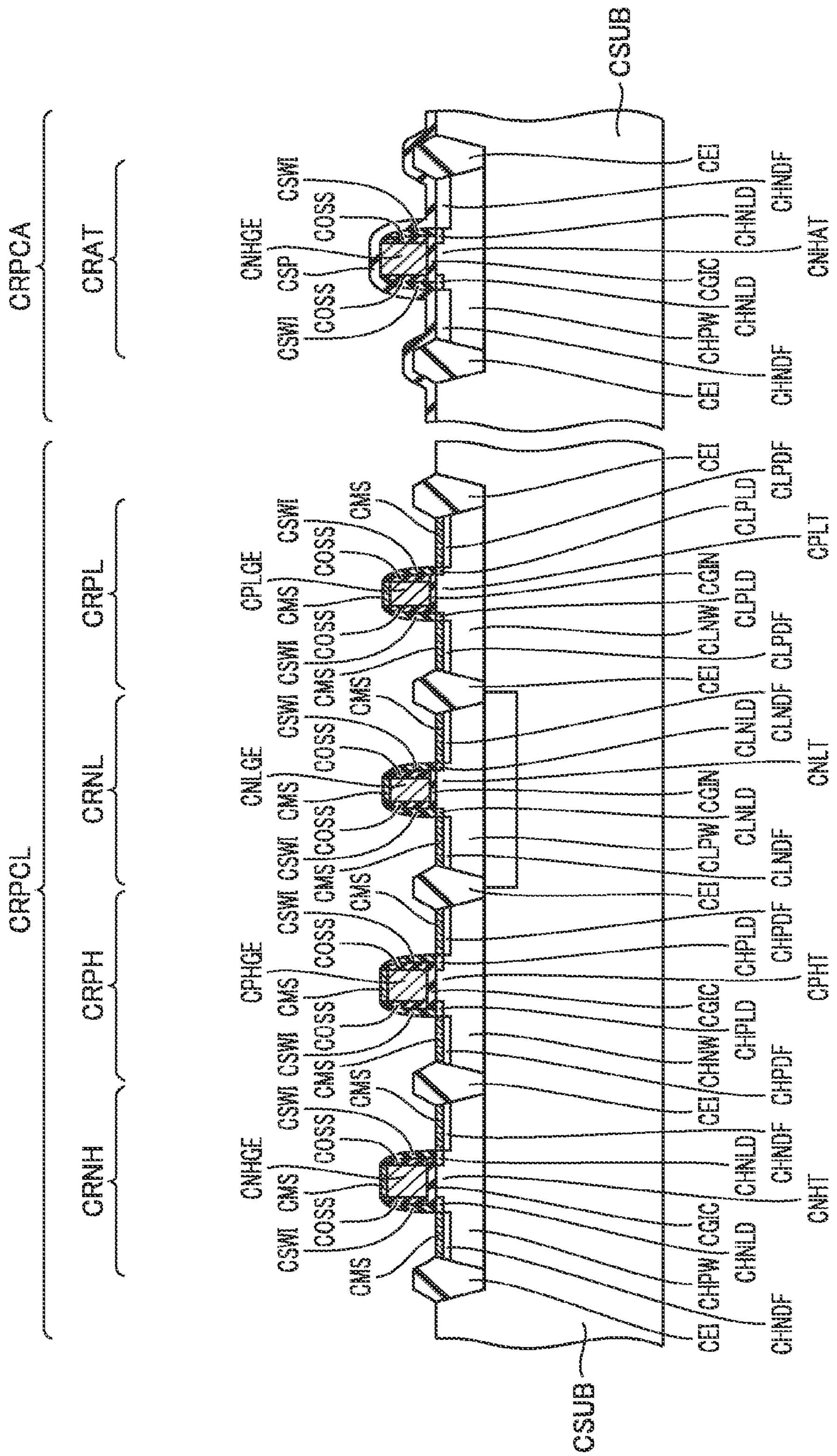
FIG. 37B is a cross sectional view of the peripheral region to show a step performed after the steps shown in FIG. 36A and FIG. 36B.
Figure 38A:
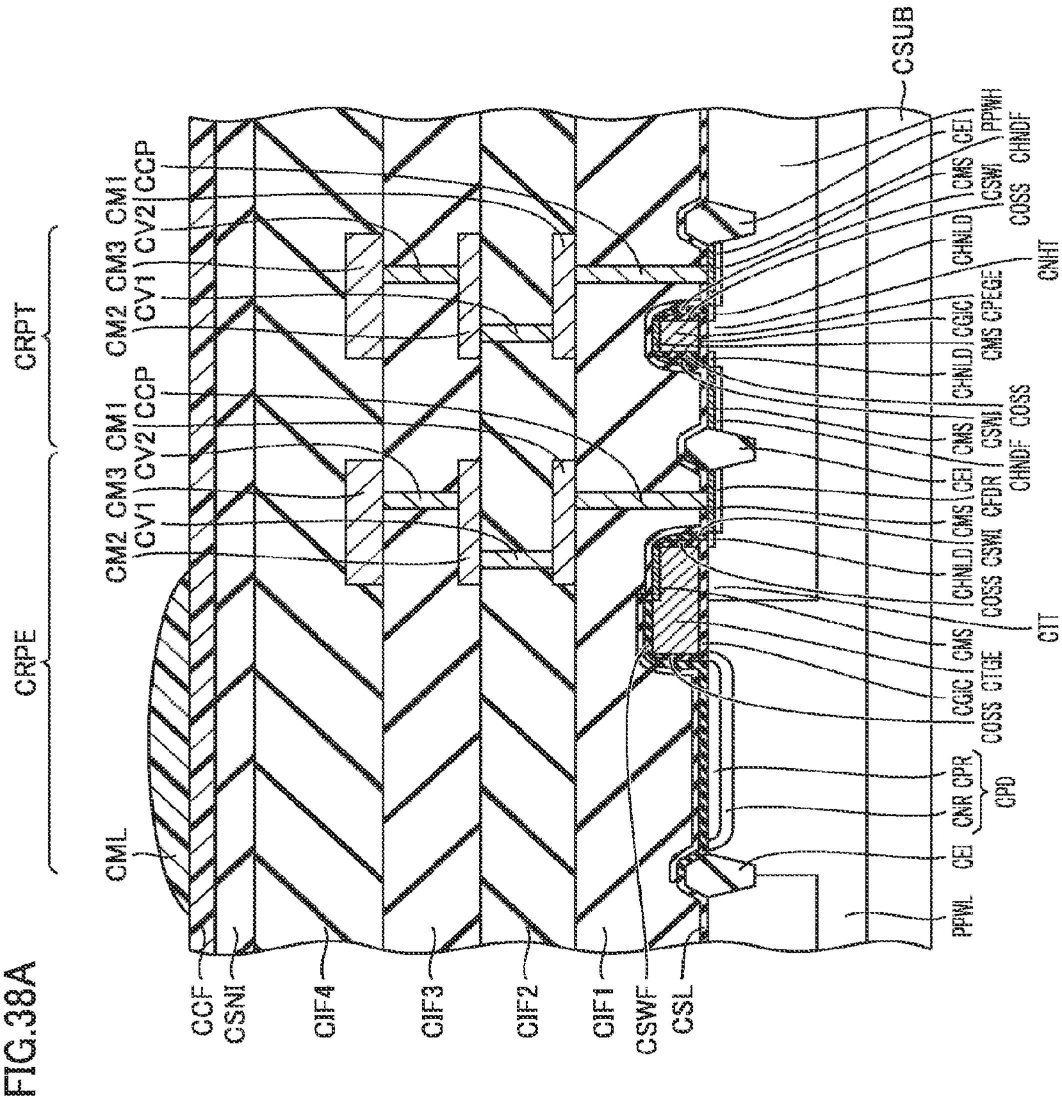
FIG. 38A is a cross sectional view of the pixel region and the like to show a step performed after the steps shown in FIG. 37A and FIG. 37B.
Figure 38B:
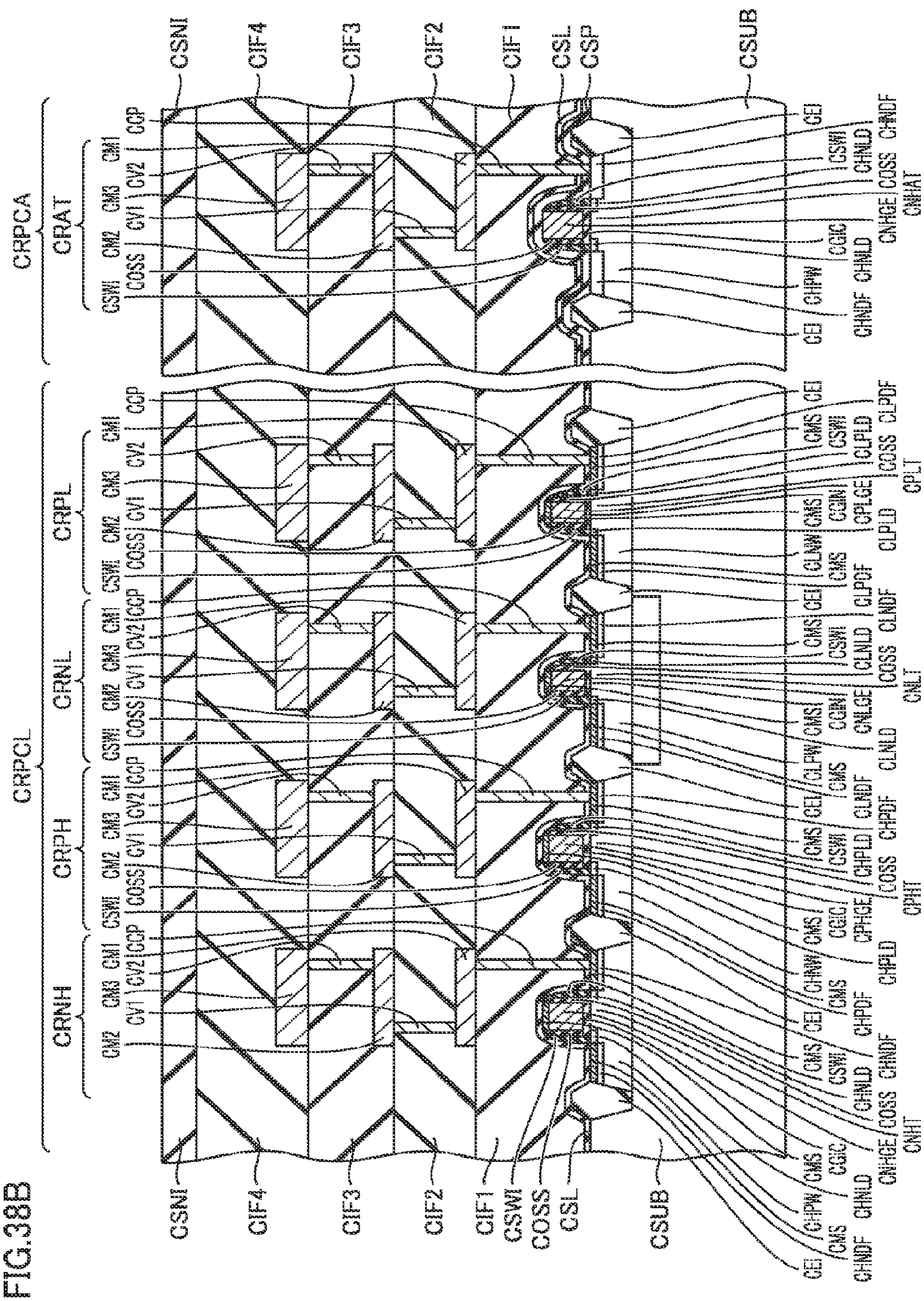
FIG. 38B is a cross sectional view of the peripheral region to show a step performed after the steps shown in FIG. 37A and FIG. 37B.

Next, as shown in FIG. 37A and FIG. 37B, by the SALICIDE method, metal silicide films CMS are formed except region CRAT. Then, the same steps as those shown in FIG. 25A and FIG. 25C and the same steps as those shown in FIG. 26A and FIG. 26C are performed, thereby completing the main part of the image capturing device according to the comparative example as shown in FIG. 38A and FIG. 38B.

In the image capturing device according to the comparative example, as shown in FIG. 28A and FIG. 28B, offset spacer film COSS is formed by providing anisotropic etching process onto the entire surface of insulating film COSSF. Accordingly, in pixel region CRPE, the anisotropic etching process causes damage (plasma damage) in photo diode CPD. The damage in photo diode CPD causes increased dark current, with the result that a current flows even when light does not come into photo diode CPD.

In contrast to the comparative example, in the method for manufacturing the image capturing device according to the first embodiment, anisotropic etching process is performed onto insulating film OSSF, so that photo diode PD is covered with resist pattern MOSE when forming offset spacer film OSS (see FIG. 12A and FIG. 12B). Accordingly, no damage (plasma damage) resulting from anisotropic etching process is caused in photo diode PD.

Moreover, extension regions LNLD, LPLD are formed using the offset spacer film and the like as an implantation mask, and thereafter insulating film OSSF covering photo diode PD is removed together with offset spacer film OSS by performing wet etching process (see FIG. 15A and FIG. 15B). Through this wet etching process, no damage is caused in photo diode PD. As a result, dark current resulting from the damage can be reduced in the image capturing device.

Further, in pixel region RPE, insulating film OSSF covering photo diode PD is removed before forming sidewall insulating film SWI functioning as an antireflection film (see FIG. 15A, FIG. 15B, FIG. 16A, and FIG. 16B). Accordingly, an amount of light coming into photo diode PD can be suppressed from being decreased, thereby preventing deterioration of sensitivity of the image capturing device.

Moreover, as shown in FIG. 26B, pixel region RPE includes: pixel region RPEC having the silicide protection film formed therein to function as an antireflection film; and pixel regions RPEA, RPEB each having no silicide protection film formed therein. Accordingly, the strength (light collection ratio) of light passing through the film covering photo diode PD and coming into the photo diode can be adjusted in accordance with a color (wavelength) of light, whereby the sensitivity of the pixel can be set to a desired sensitivity. This will be specifically illustrated in a second embodiment.

Second Embodiment

In the first embodiment, it has been illustrated that the pixel region of the image capturing device is divided into a pixel region having a silicide protection film formed therein and a pixel region having no silicide protection film formed therein. Explained here is a case where the offset spacer films are removed by wet etching process on the entire surface to provide different thicknesses of silicide protection films. It should be noted that the same members as those in the image capturing device illustrated in the first embodiment are given the same reference characters and are not described repeatedly unless required.

First, the same steps as those shown in FIG. 7A and FIG. 7B to FIG. 14A and FIG. 14B are performed, and then the same steps as those shown in FIG. 15A and FIG. 15B are performed, thereby removing insulating film OSSF covering pixel region RPE by wet etching process together with offset spacer film OSS. Then, the same steps as those shown in FIG. 16A and FIG. 16B to FIG. 19A and FIG. 19B are performed, and thereafter, different film thicknesses of silicide protection films are provided for the pixel regions.

Figure 39A:
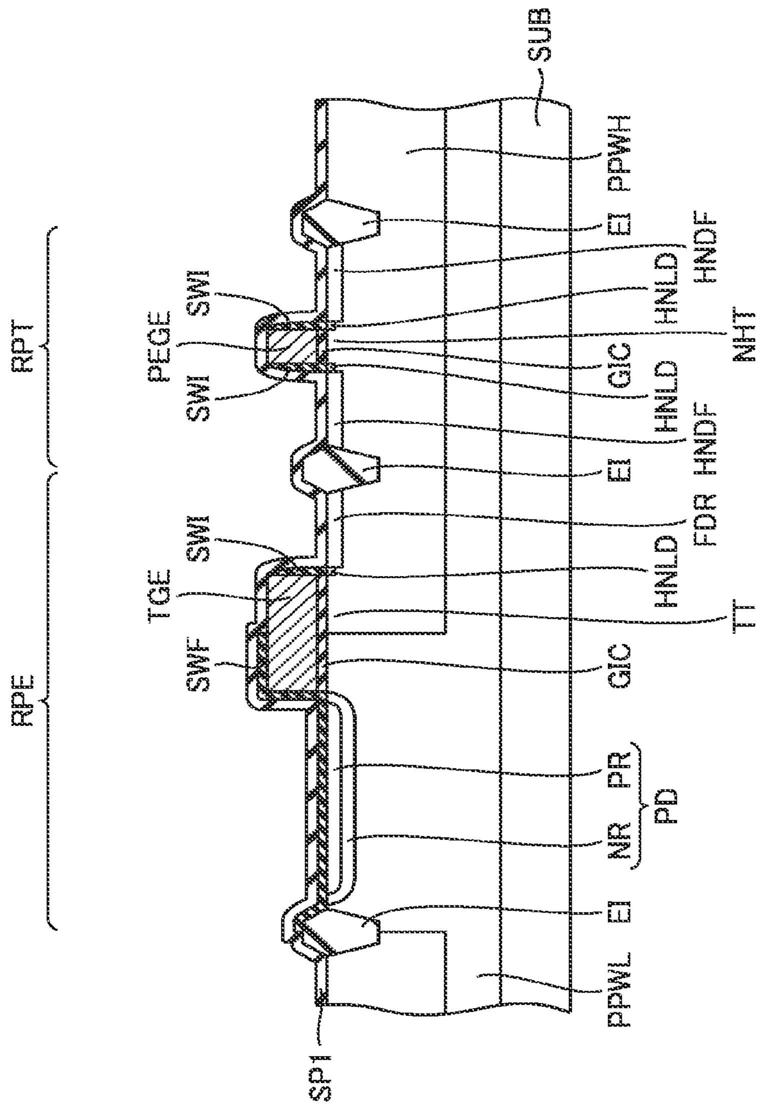
FIG. 39A is a cross sectional view of the pixel region and the like to show one step of the method for manufacturing an image capturing device according to a second embodiment.
Figure 39B:
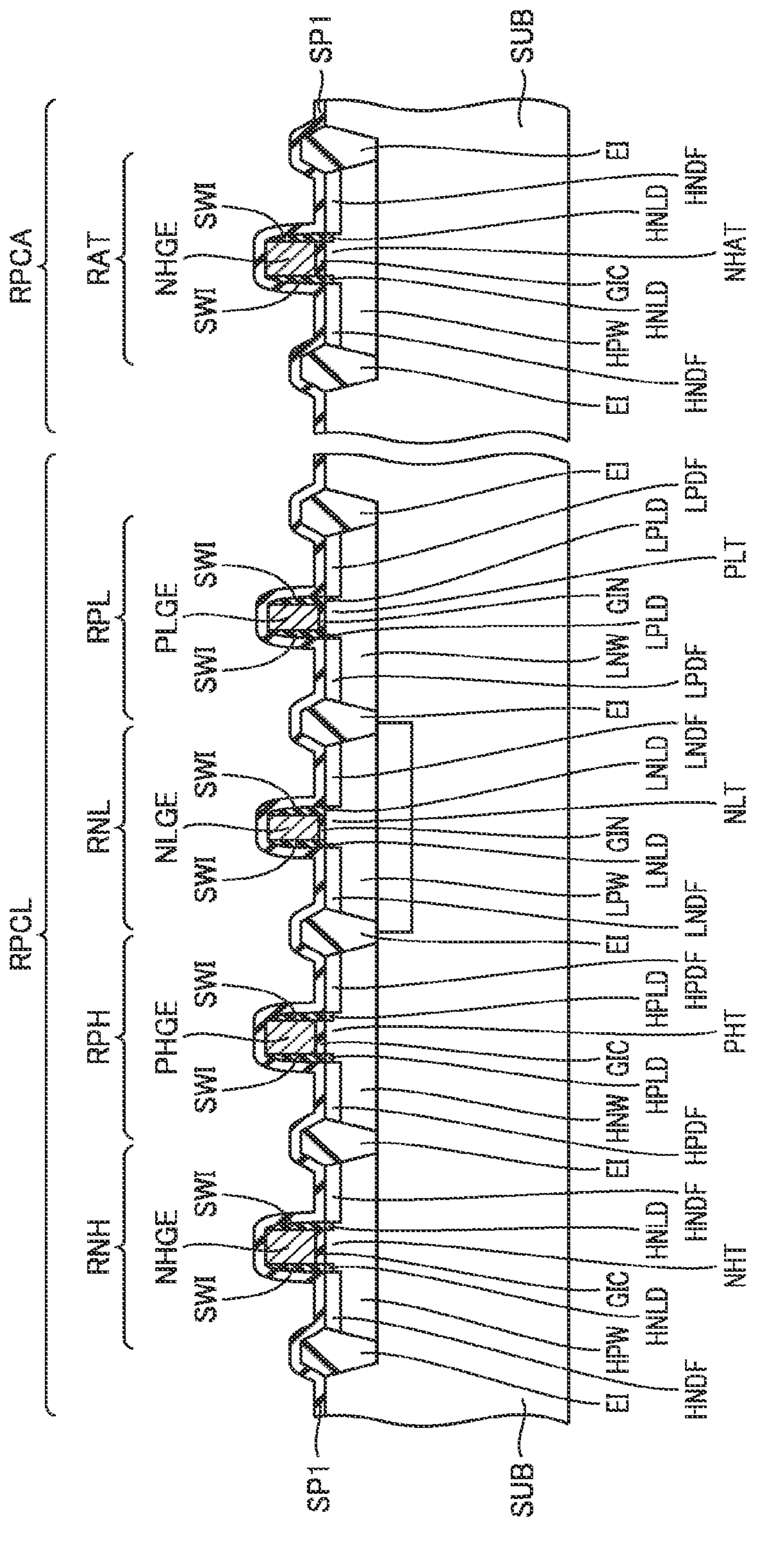
FIG. 39B is a cross sectional view of the peripheral region to show one step of the method for manufacturing the image capturing device according to the second embodiment.
Figure 40A:
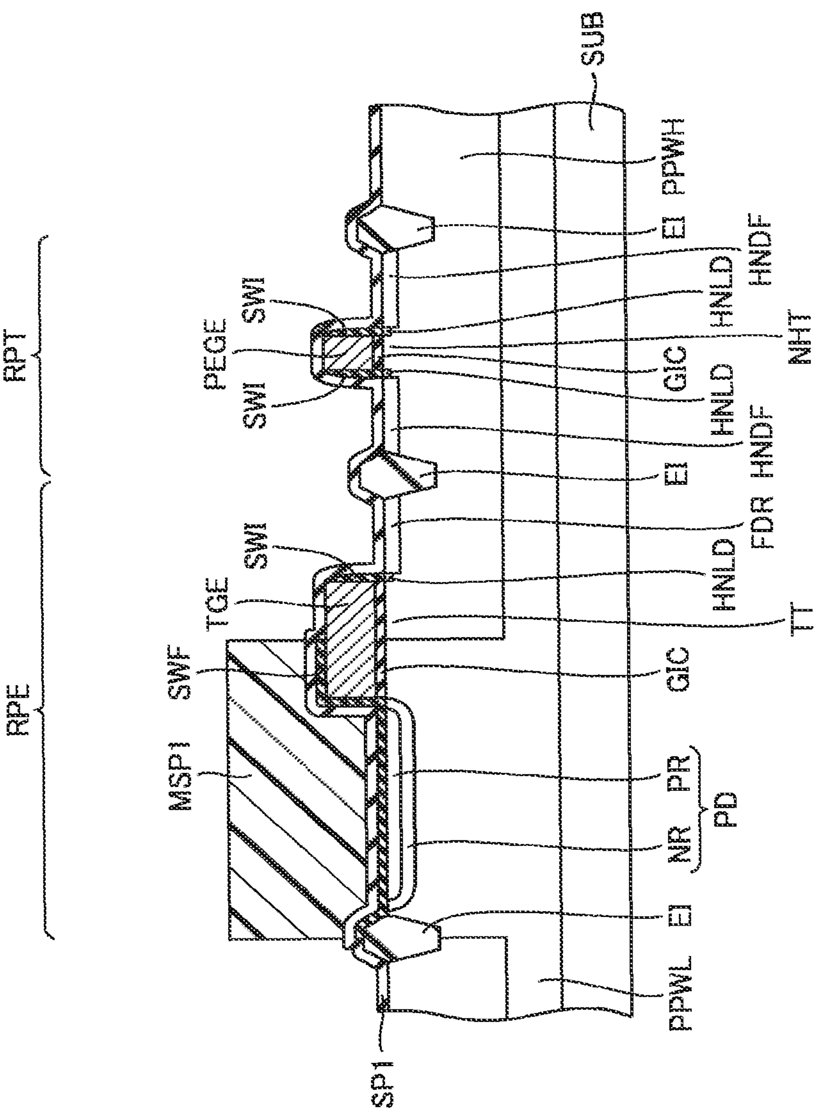
FIG. 40A is a cross sectional view of the pixel region and the like to show a step performed in the embodiment after the steps shown in FIG. 39A and FIG. 39B.
Figure 40B:
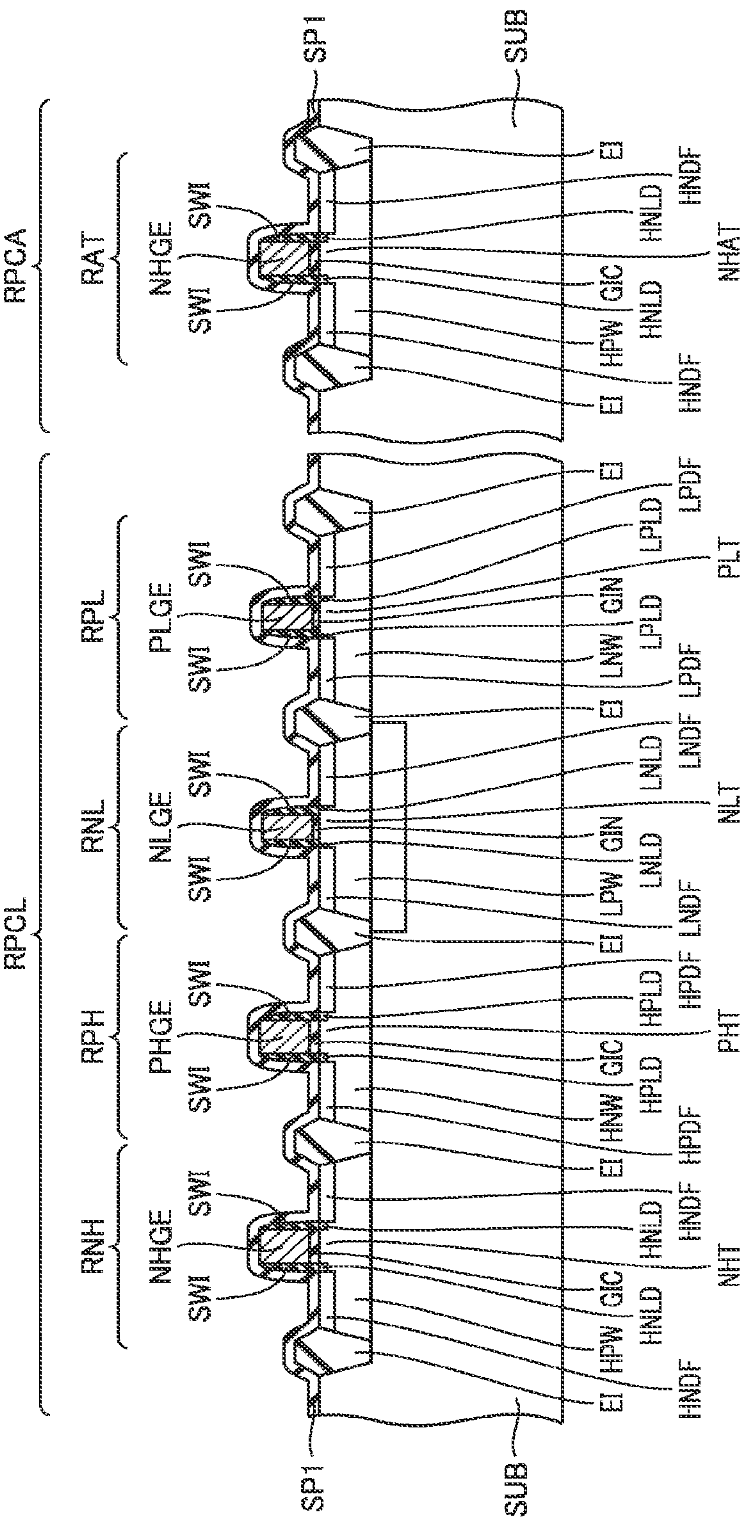
FIG. 40B is a cross sectional view of the peripheral region to show a step performed in the embodiment after the steps shown in FIG. 39A and FIG. 39B.
Figure 40C:
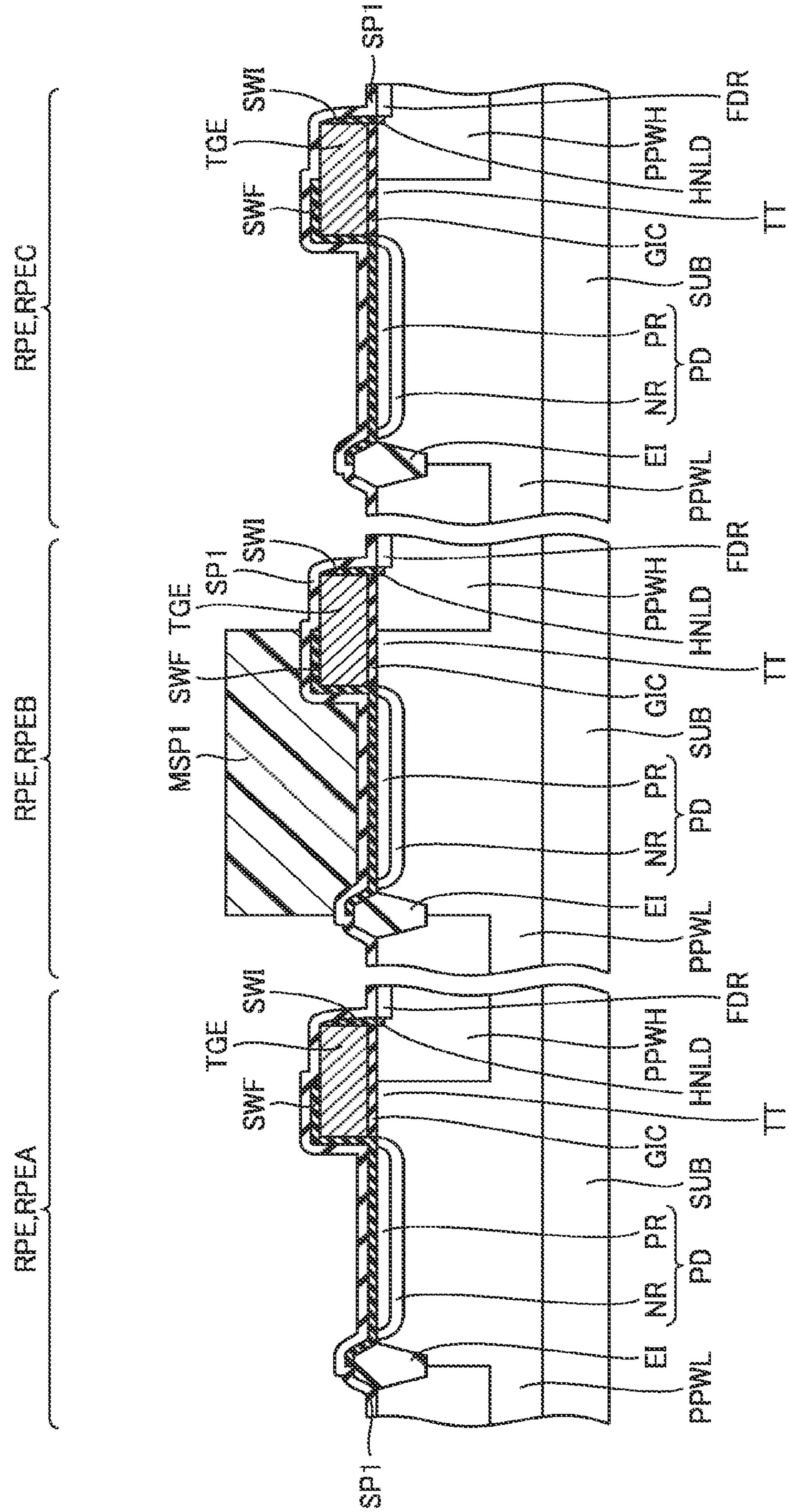
FIG. 40C is a cross sectional view of each pixel region to show a step performed in the embodiment after the steps shown in FIG. 39A and FIG. 39B.

First, as shown in FIG. 39A and FIG. 39B, a first silicide protection film SP1 is formed to cover gate electrodes TGE, PEGE, NHGE, PHGE, NLGE, PLGE and the like. Next, as shown in FIG. 40A and FIG. 40B, a resist pattern MSP1 is formed to cover predetermined pixel region RPE and expose the other regions. As described above, in pixel region RPE, a plurality of pixel regions respectively corresponding to red, green and blue are formed. Here, as shown in FIG. 40C, in pixel region RPE, in order to form the first silicide protection film for a pixel region RPEB corresponding to a predetermined one of the three colors, resist pattern MSP1 is formed to cover pixel region RPEB and expose pixel regions RPEA, RPEC corresponding to the rest two of the colors.

Figure 41:
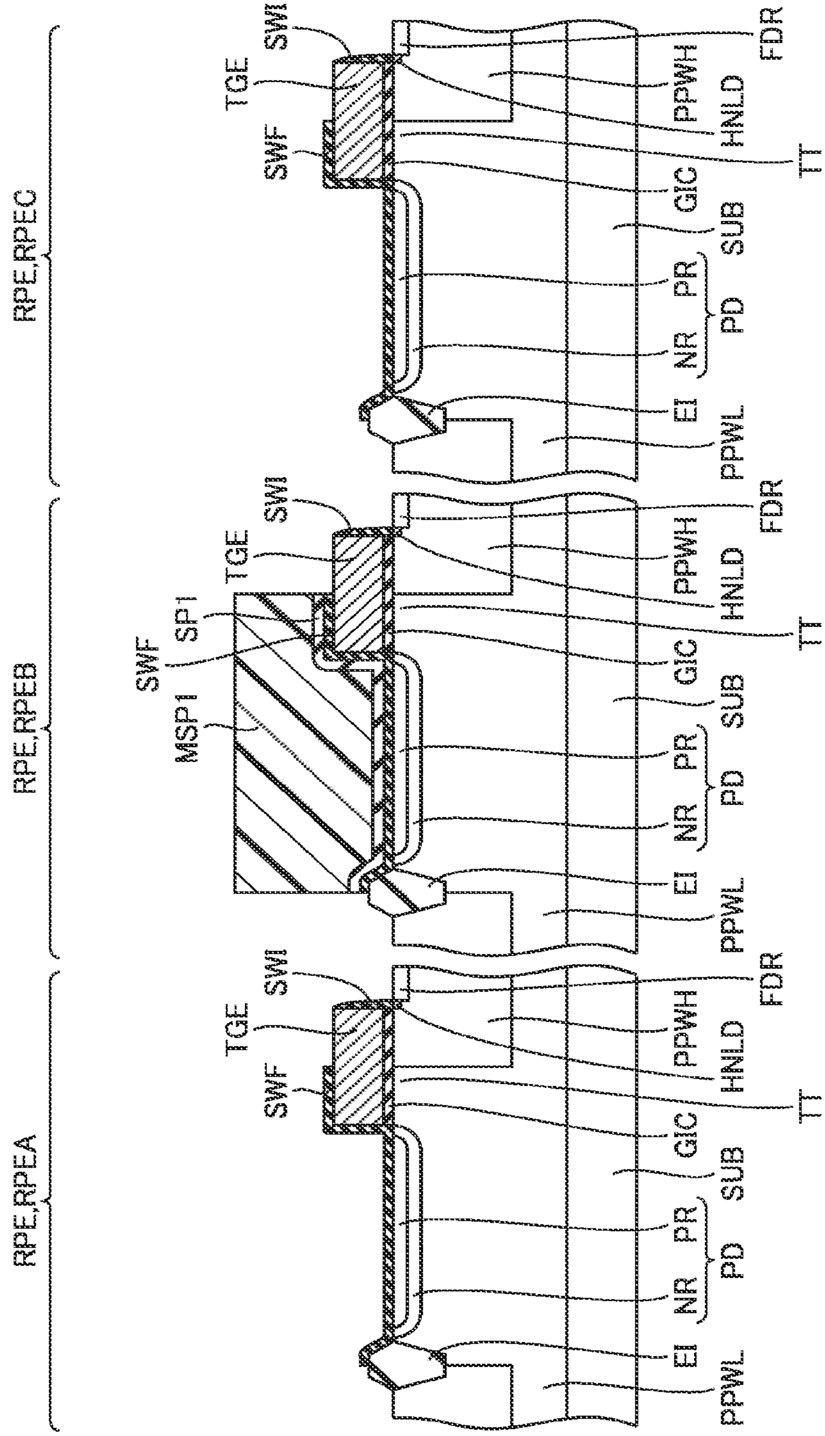
FIG. 41 is a cross sectional view of each pixel region to show a step performed in the embodiment after the steps shown in FIG. 40A to FIG. 40C.
Figure 42A:
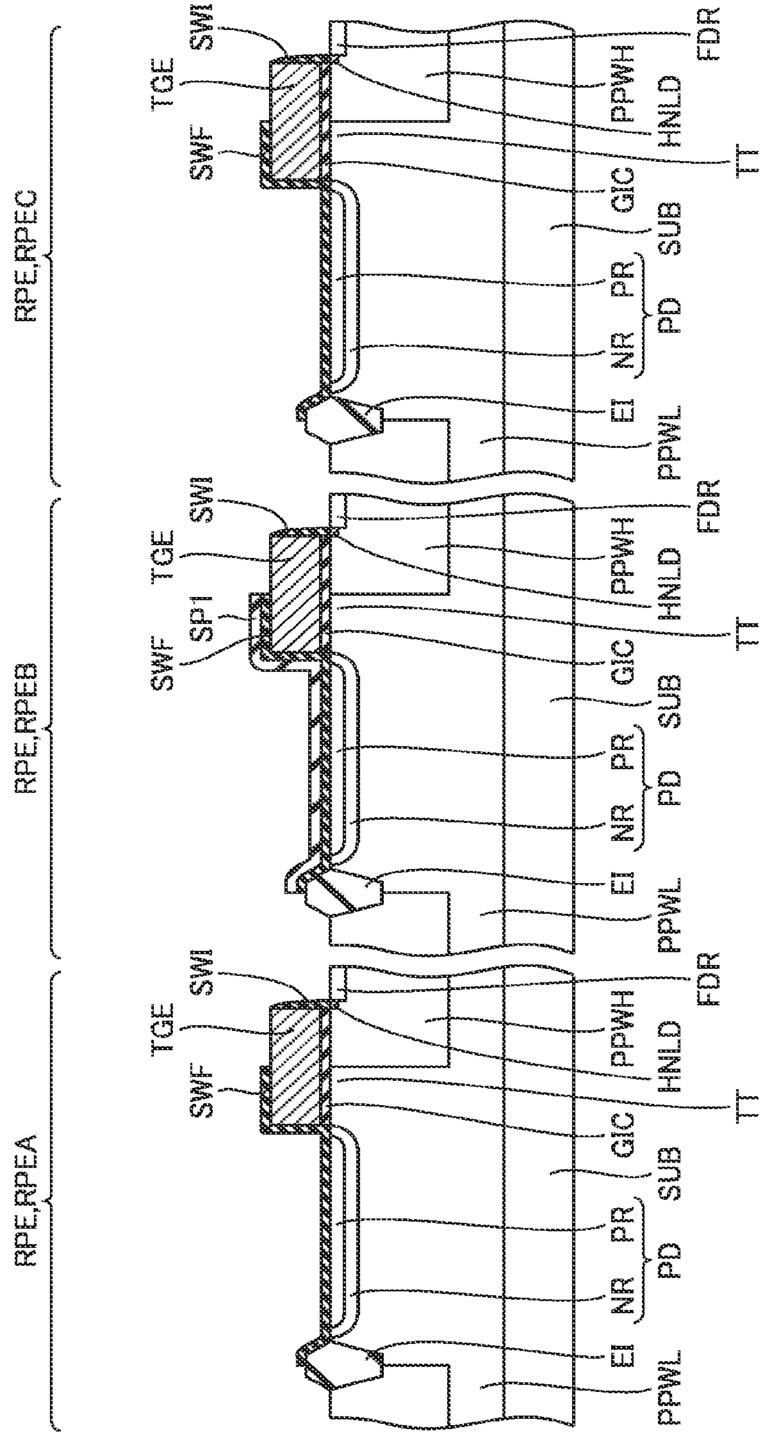
FIG. 42A is a cross sectional view of each pixel region to show a step performed in the embodiment after the step shown in FIG. 41.
Figure 42B:
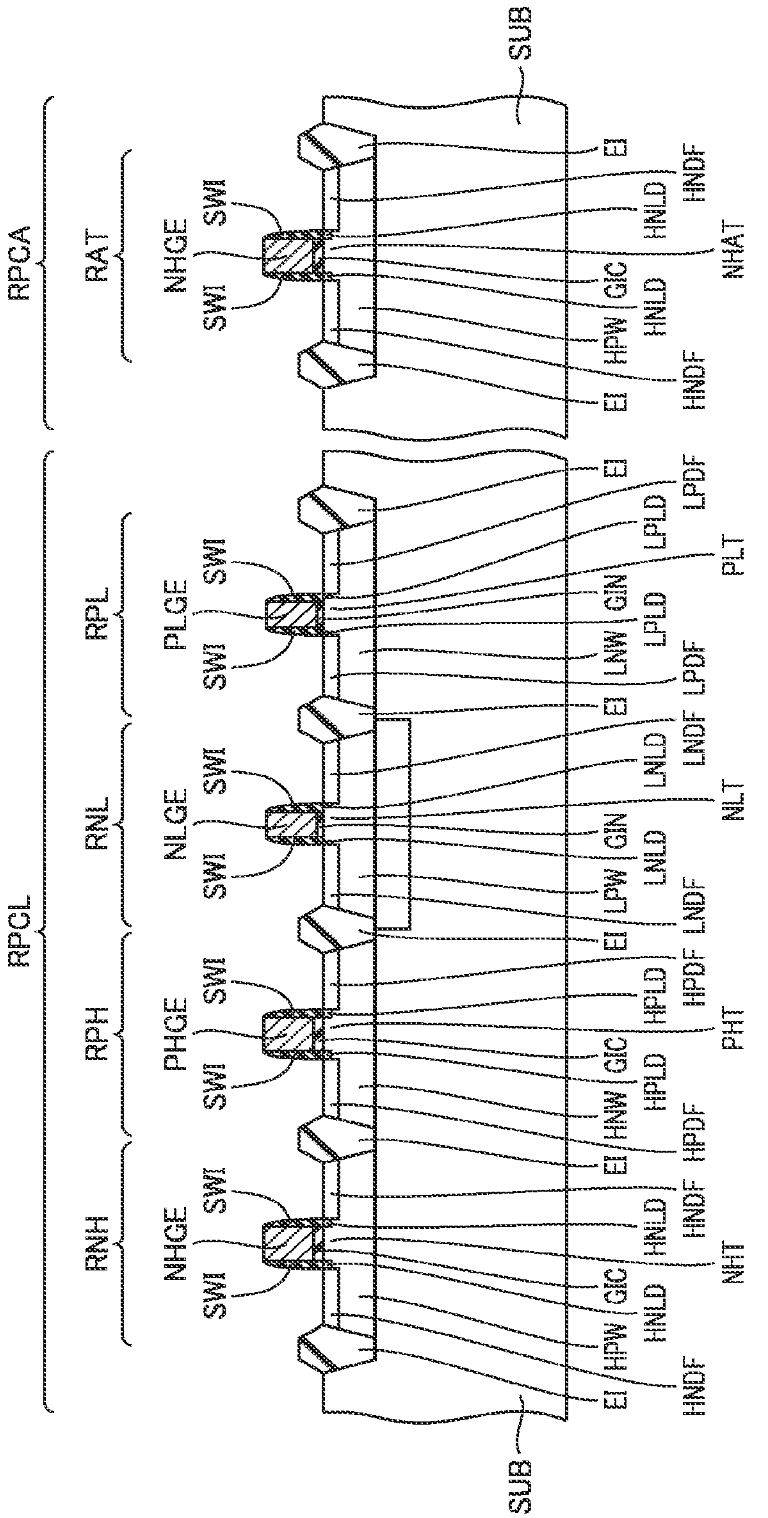
FIG. 42B is a cross sectional view of the pixel region and the like to show a step performed in the embodiment after the step shown in FIG. 41.

Next, as shown in FIG. 41, wet etching process is performed using resist pattern MSP1 as an etching mask, thereby removing exposed silicide protection film SP1. Then, resist pattern MSP1 is removed, thereby exposing silicide protection film SP1 remaining in pixel region RPEB as shown in FIG. 42A. On this occasion, as shown in FIG. 42B, silicide protection film SP1 covering first peripheral region RPCL is removed and silicide protection film SP1 covering region RAT of second peripheral region RPCA is also removed.

Figure 43A:
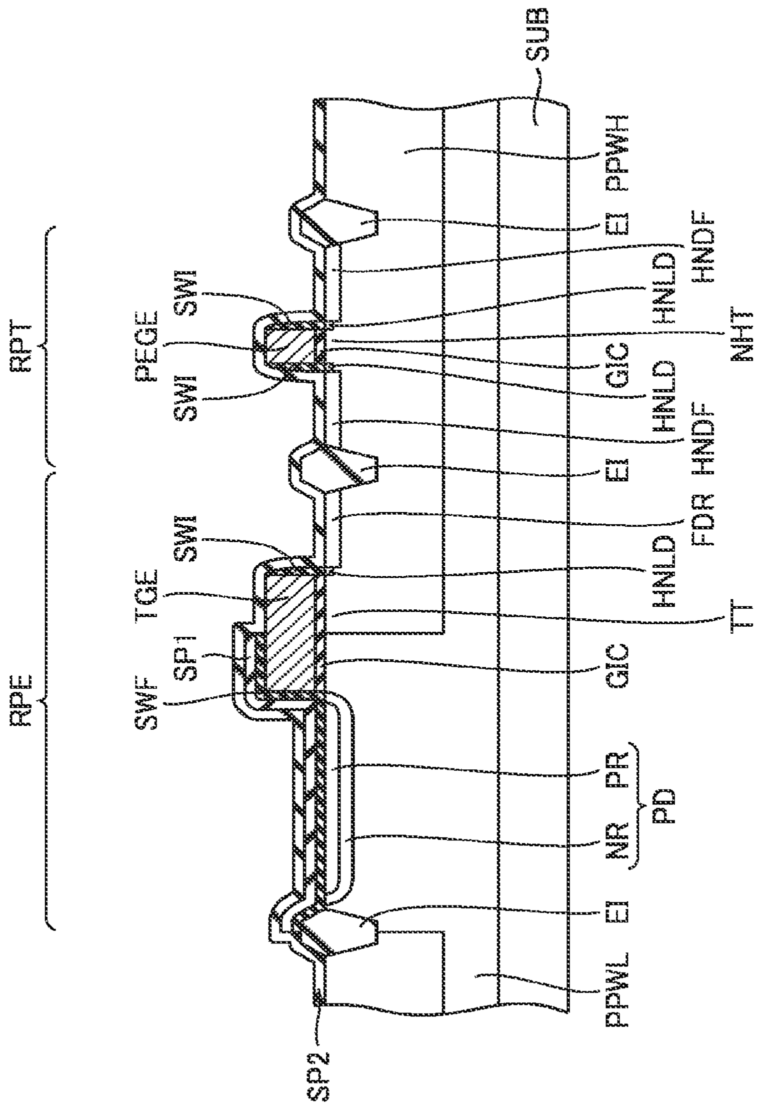
FIG. 43A is a cross sectional view of the pixel region and the like to show a step performed in the embodiment after the steps shown in FIG. 42A and FIG. 42B.
Figure 43B:
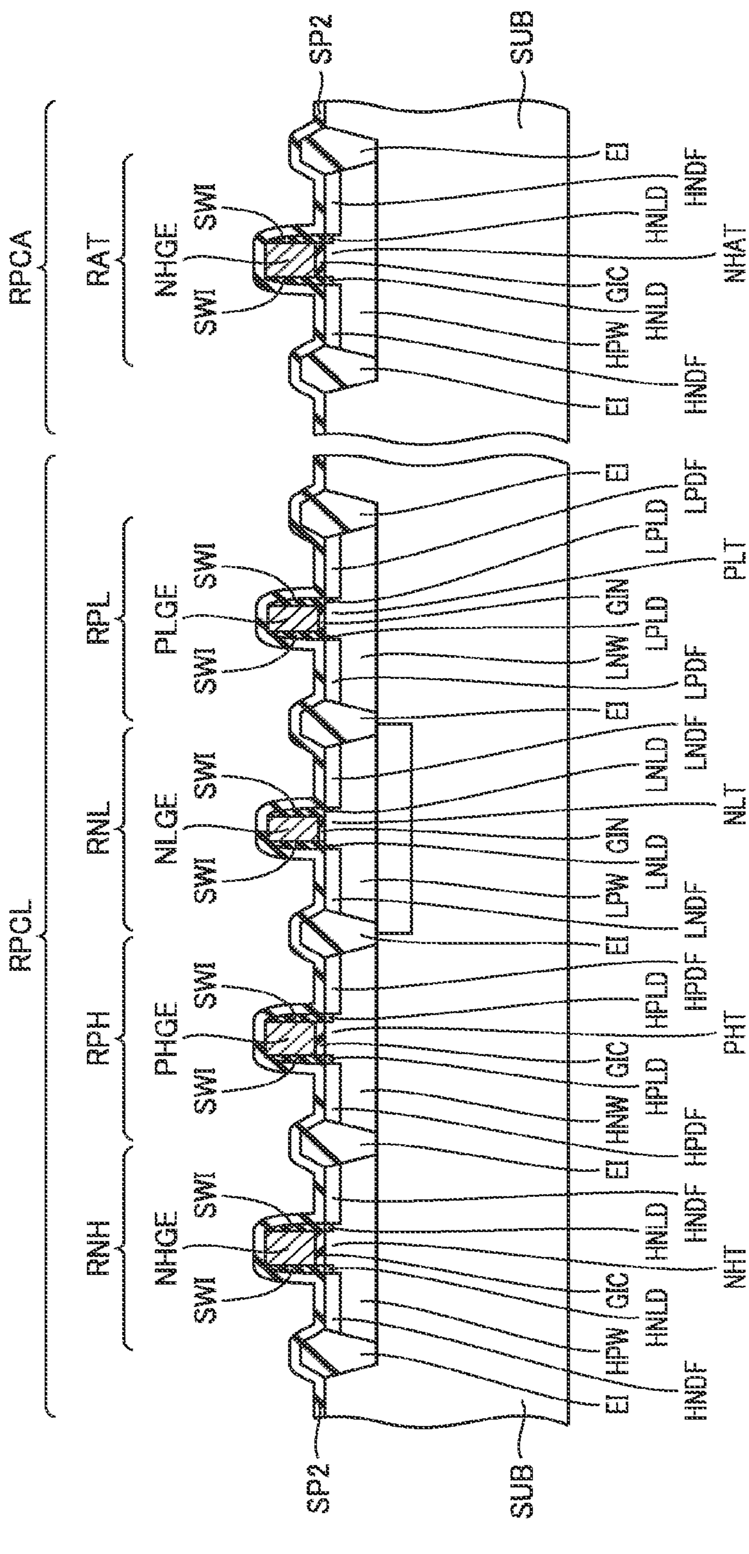
FIG. 43B is a cross sectional view of the peripheral region to show a step performed in the embodiment after the steps shown in FIG. 42A and FIG. 42B.
Figure 43C:
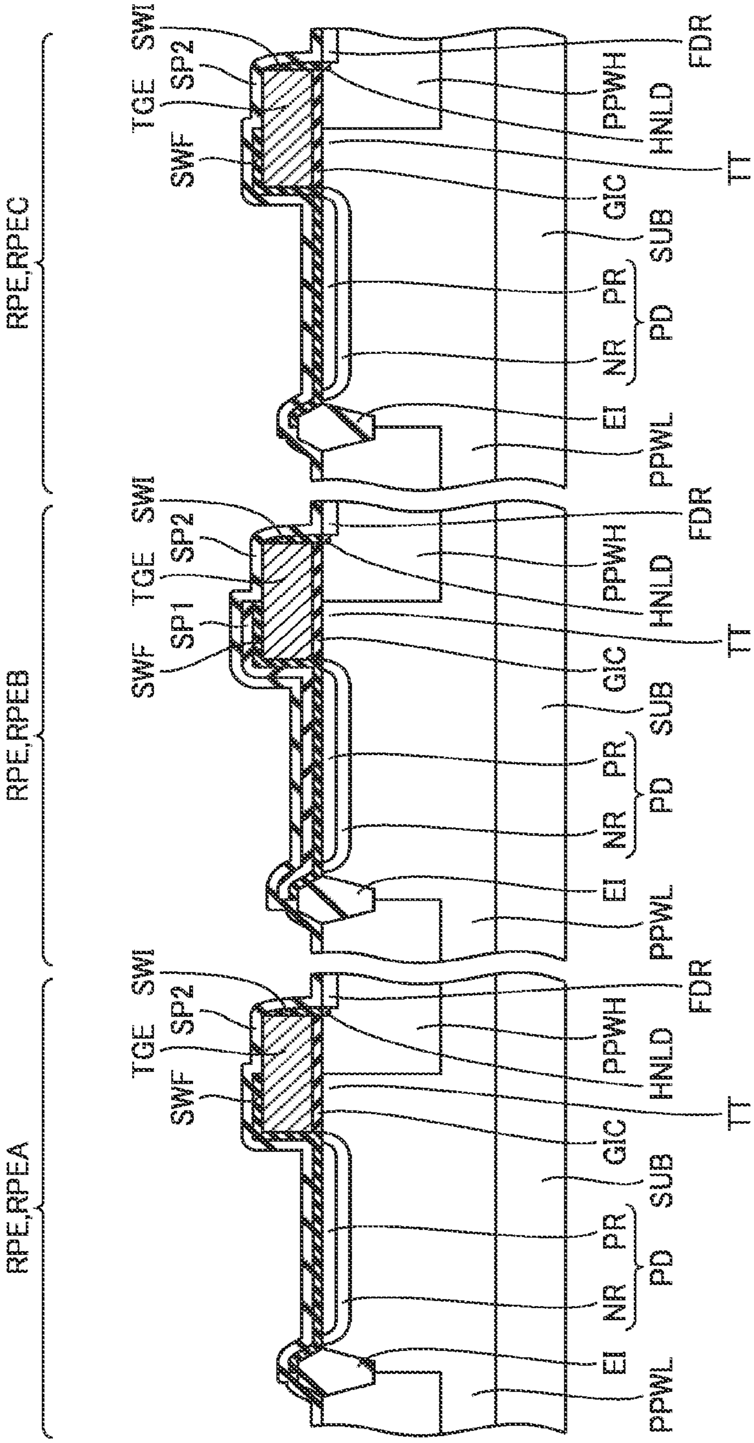
FIG. 43C is a cross sectional view of each pixel region to show a step performed in the embodiment after the steps shown in FIG. 42A and FIG. 42B.

Next, as shown in FIG. 43A and FIG. 43B, a second silicide protection film SP2 is formed to cover gate electrodes TGE, PEGE, NHGE, PHGE, NLGE, PLGE and the like. On this occasion, as shown in FIG. 43C, in pixel region RPE at pixel region RPEB having first silicide protection film SP1 formed therein, silicide protection film SP2 is formed to cover silicide protection film SP1, gate electrode TGE, and the like. In pixel regions RPEA and RPEC having no silicide protection film SP1 formed therein, silicide protection film SP2 is formed to cover insulating film SWF and gate electrode TGE.

Figure 44A:
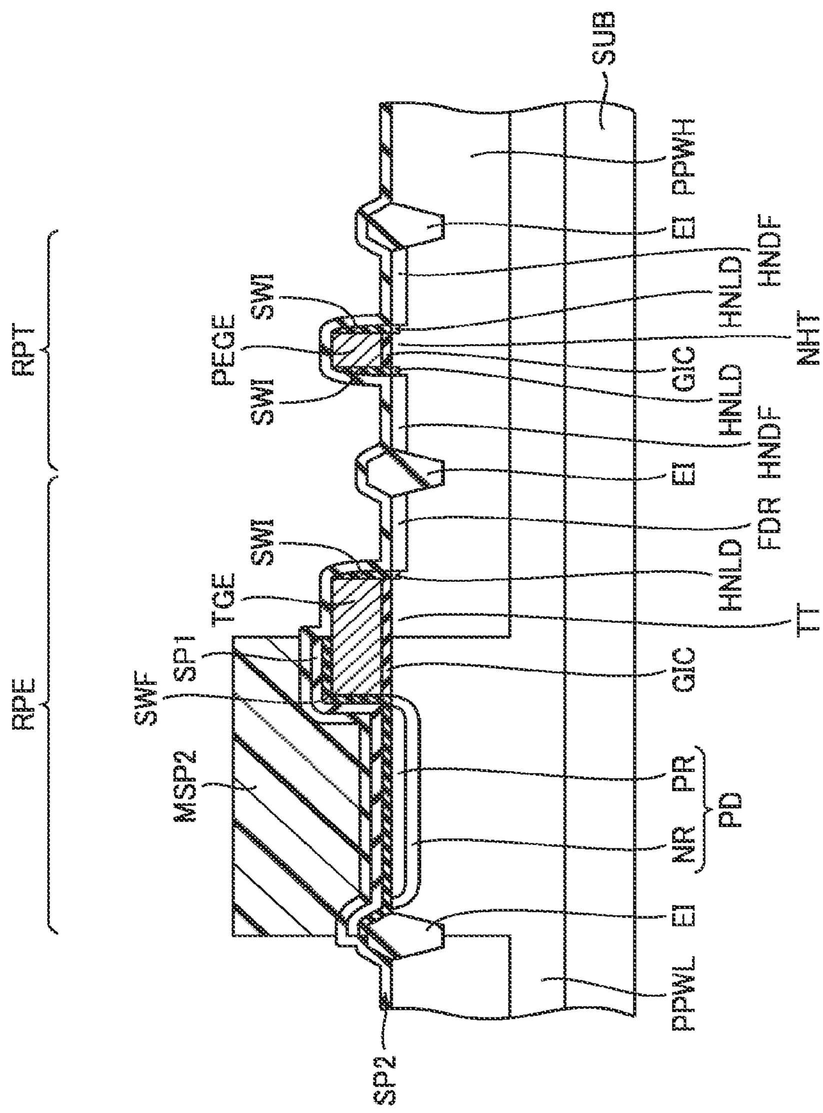
FIG. 44A is a cross sectional view of the pixel region and the like to show a step performed in the embodiment after the steps shown in FIG. 43A to FIG. 43C.
Figure 44B:
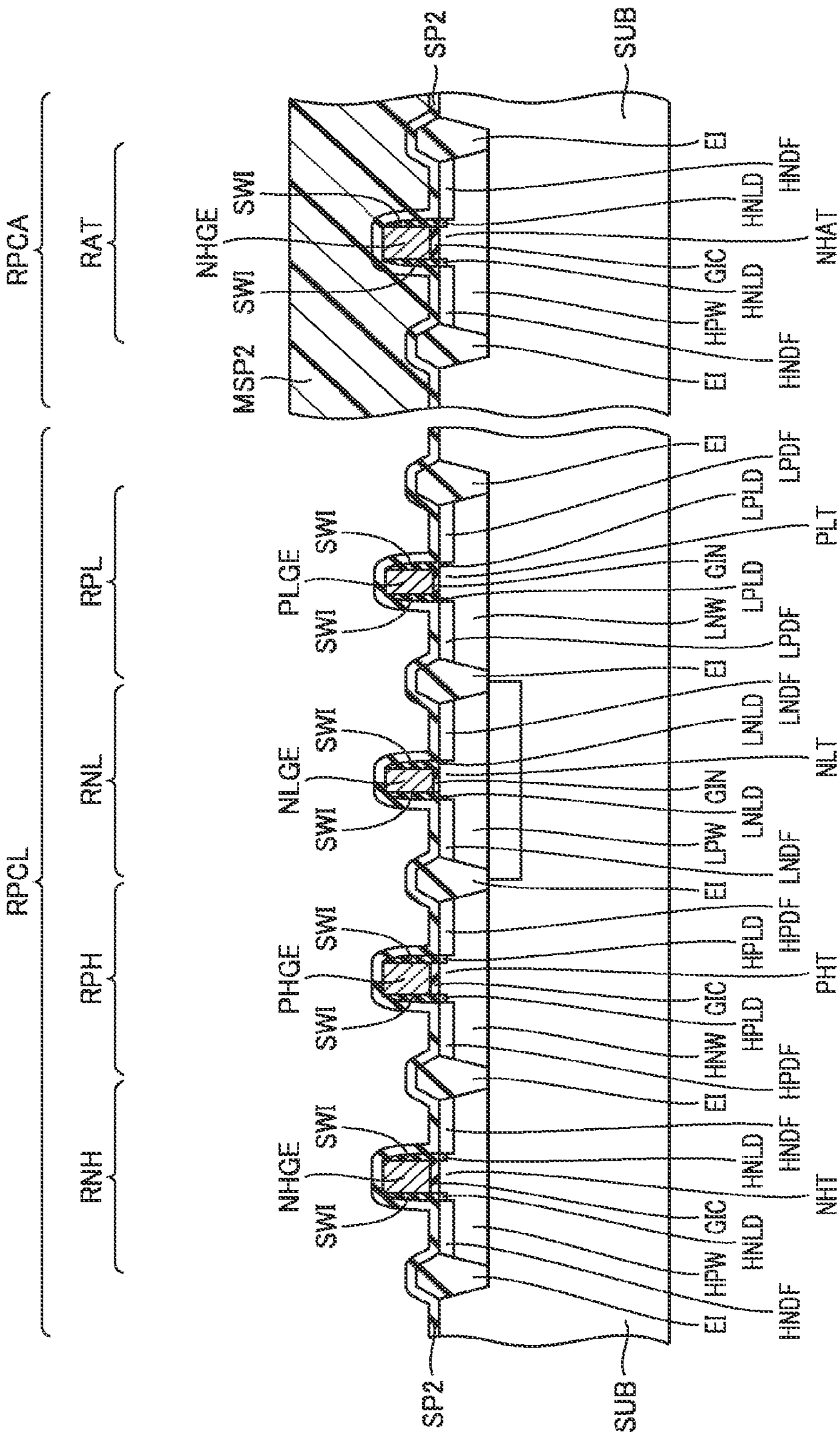
FIG. 44B is a cross sectional view of the peripheral region to show a step performed in the embodiment after the steps shown in FIG. 43A to FIG. 43C.
Figure 44C:
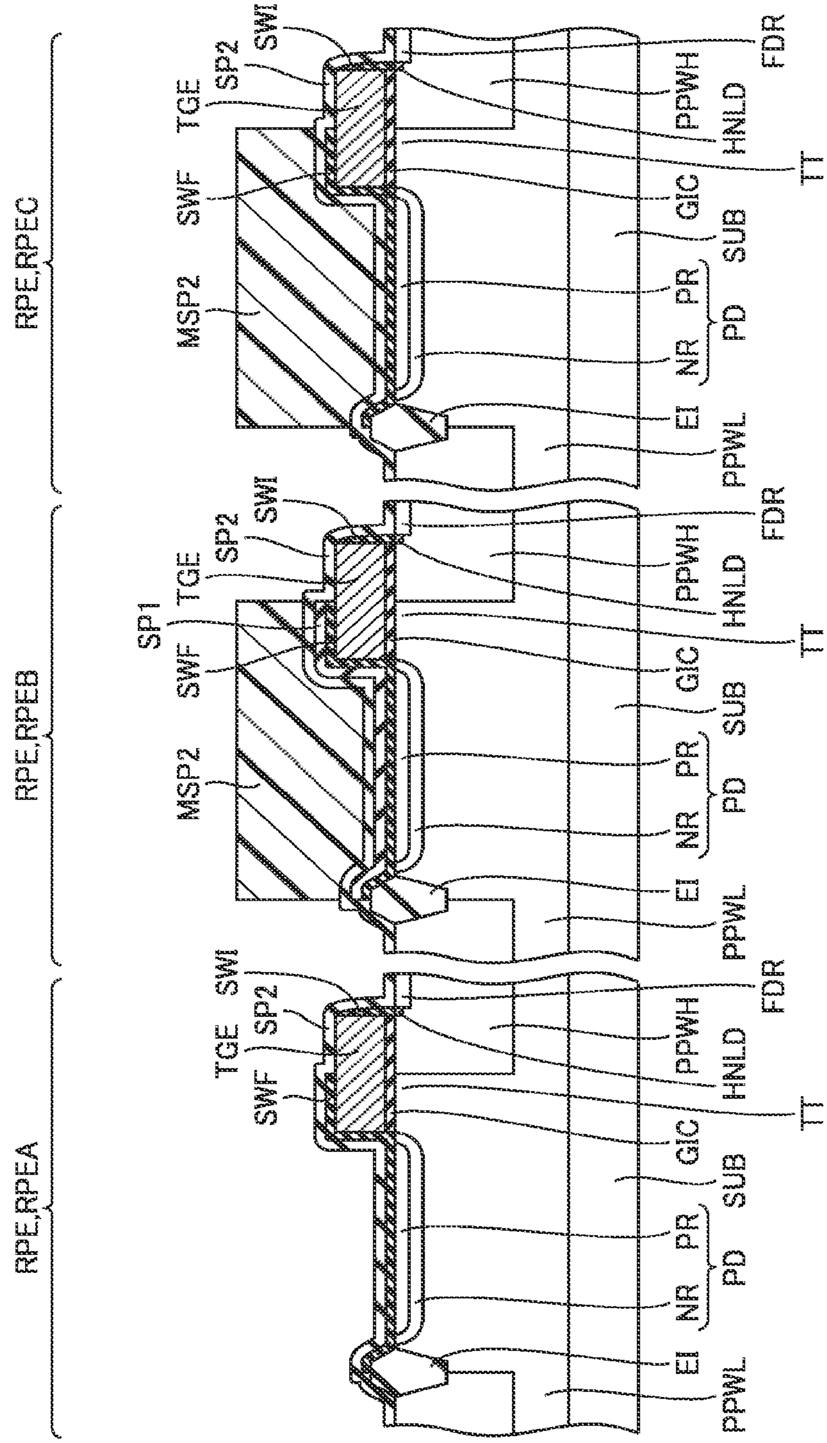
FIG. 44C is a cross sectional view of each pixel region to show a step performed in the embodiment after the steps shown in FIG. 43A to FIG. 43C.

Next, as shown in FIG. 44A and FIG. 44B, resist pattern MSP2 is formed to cover predetermined pixel region RPE and region RAT of second peripheral region RPCA and expose the other regions. Here, as shown in FIG. 44C, in pixel region RPE, in order to form a second silicide protection film for pixel region RPEB corresponding to one predetermined color and form a first silicide protection film for pixel region RPEC corresponding to another predetermined color, resist pattern MSP2 is formed to cover pixel regions RPEB, RPEC and expose pixel region RPEA.

Figure 45:
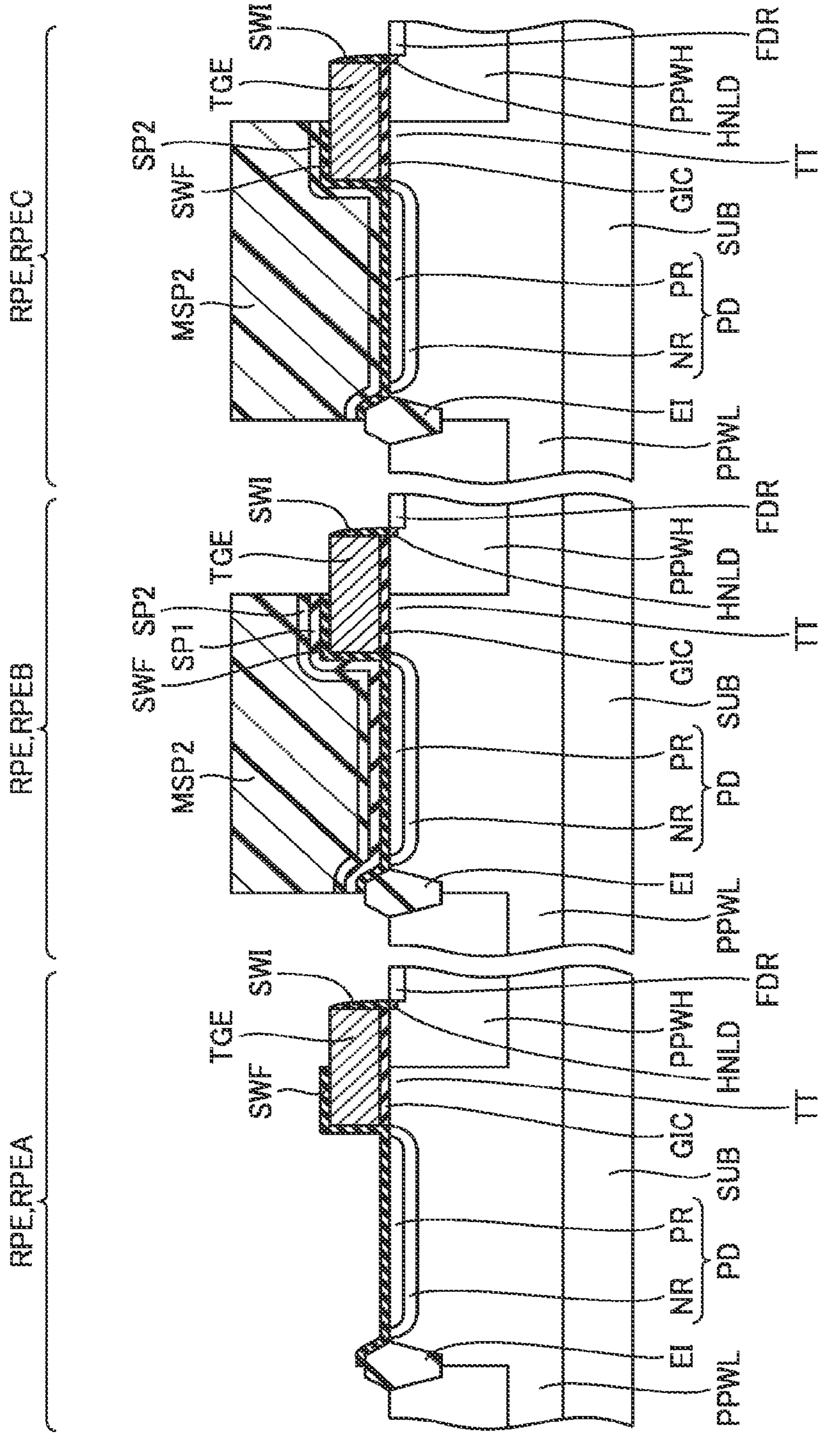
FIG. 45 is a cross sectional view of each pixel region to show a step performed in the embodiment after the steps shown in FIG. 44A to FIG. 44C.
Figure 46A:
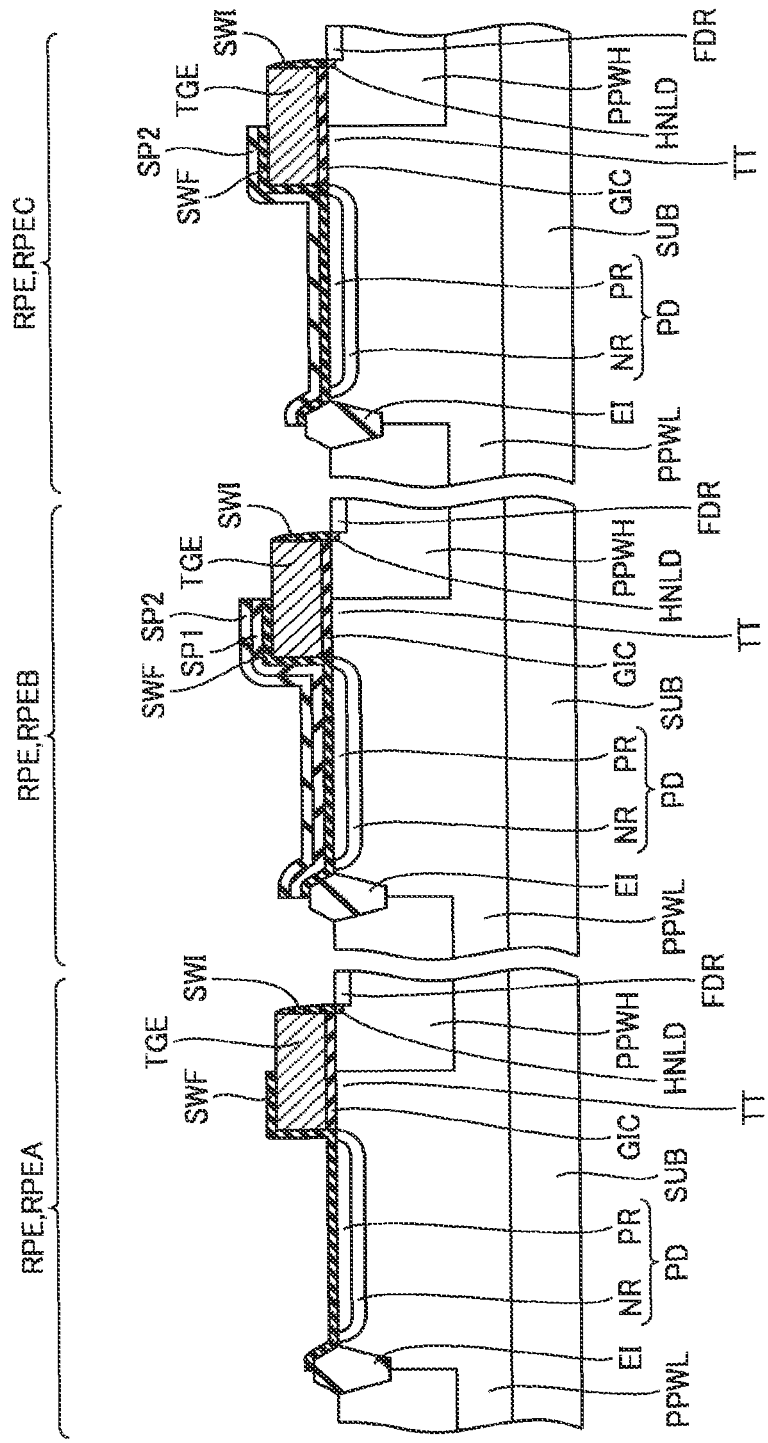
FIG. 46A is a cross sectional view of each pixel region to show a step performed in the embodiment after the steps shown in FIG. 45.

Next, as shown in FIG. 45, wet etching process is performed using resist pattern MSP2 as an etching mask, thereby removing exposed silicide protection film SP2. Then, resist pattern MSP2 is removed, thereby exposing silicide protection film SP2 remaining in each of pixel regions RPEB, RPEC as shown in FIG. 46A. Accordingly, two silicide protection films SP1, SP2 are formed in pixel region RPEB, and one silicide protection film SP2 is formed in pixel region RPEC. Moreover, no silicide protection film is formed in pixel region RPEA. In this way, the different film thicknesses of the silicide protection films can be provided for pixel region RPE.

Figure 46B:
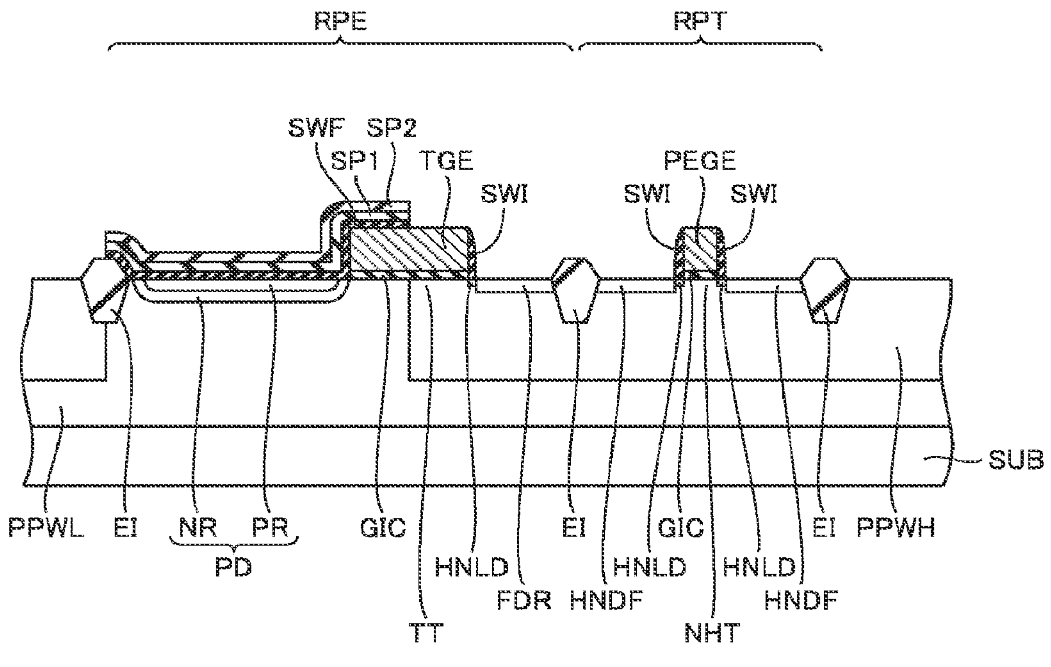
FIG. 46B is a cross sectional view of the pixel region and the like to show a step performed in the embodiment after the steps shown in FIG. 45.
Figure 46C:
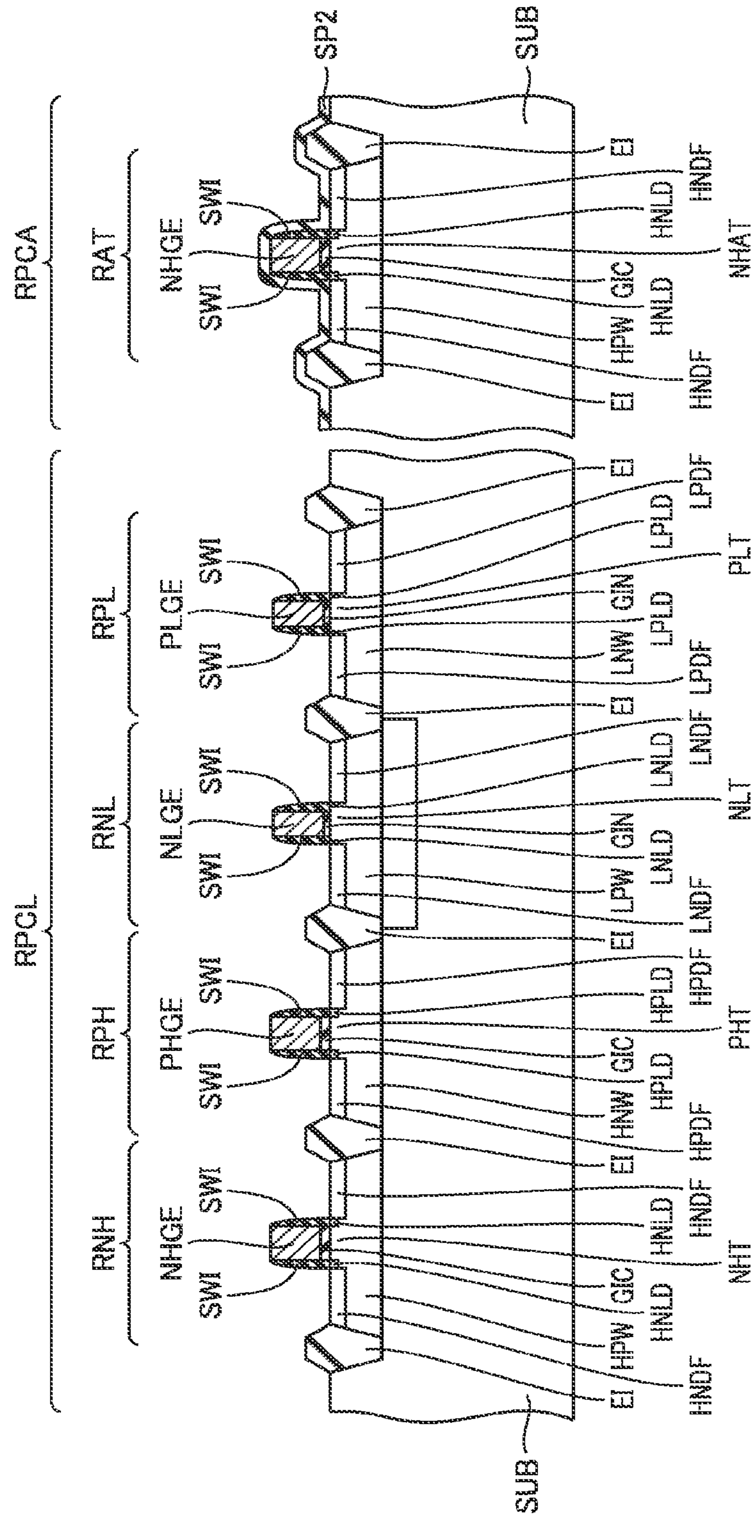
FIG. 46C is a cross sectional view of the peripheral region to show a step performed in the embodiment after the steps shown in FIG. 45.

On the other hand, as shown in FIG. 46B and FIG. 46C, in pixel transistor region RPT and first peripheral region RPCL, silicide protection film SP2 is removed. In region RAT of second peripheral region RPCA, remaining silicide protection film SP2 is exposed.

Figure 47A:
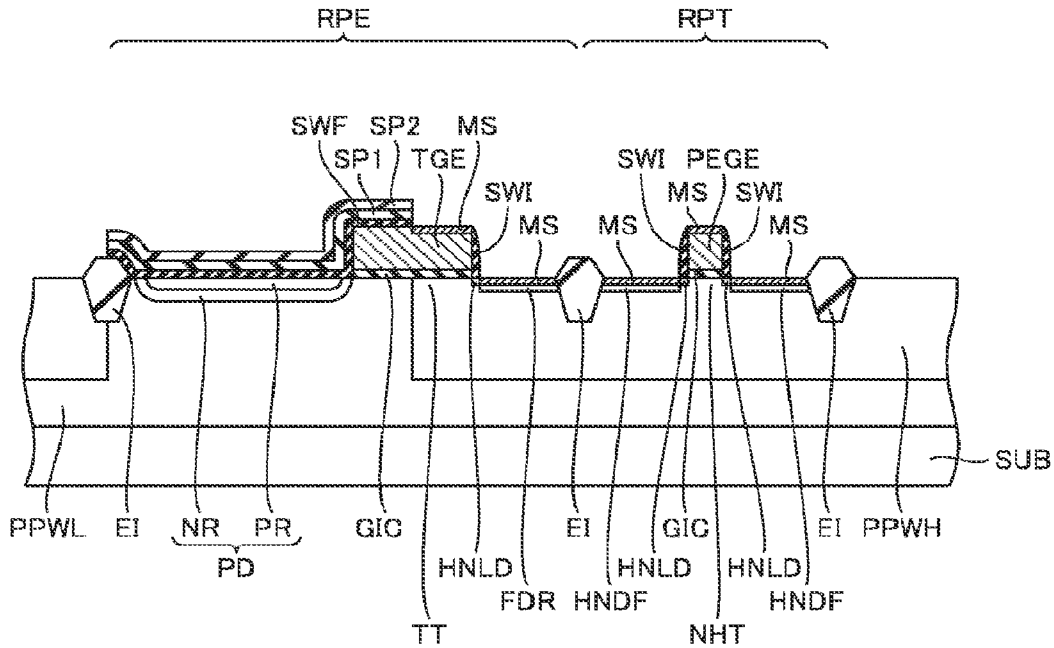
FIG. 47A is a cross sectional view of the pixel region and the like to show a step performed in the embodiment after the steps shown in FIG. 46A to FIG. 46C.
Figure 47B:
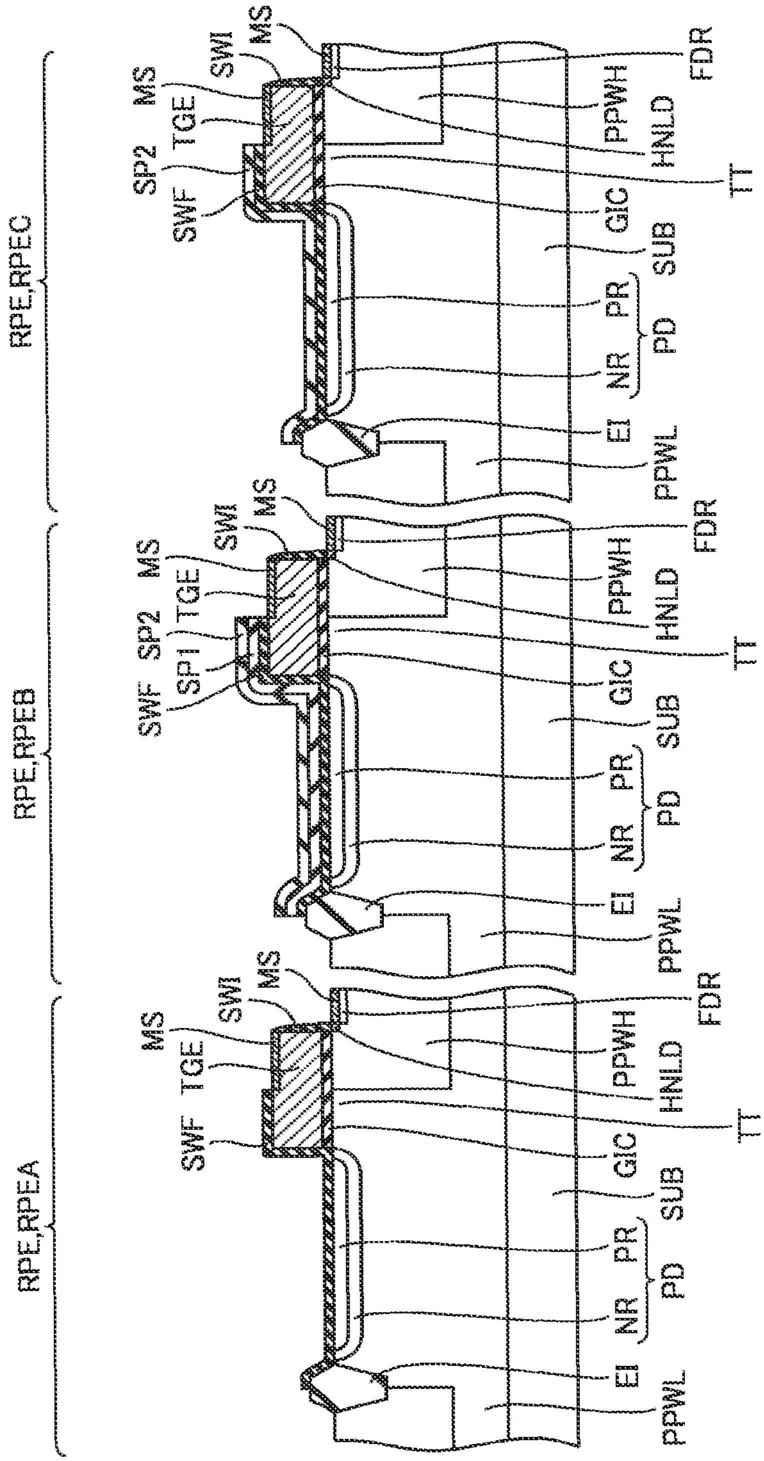
FIG. 47B is a cross sectional view of each pixel region to show a step performed in the embodiment after the steps shown in FIG. 46A to FIG. 46C.
Figure 47C:
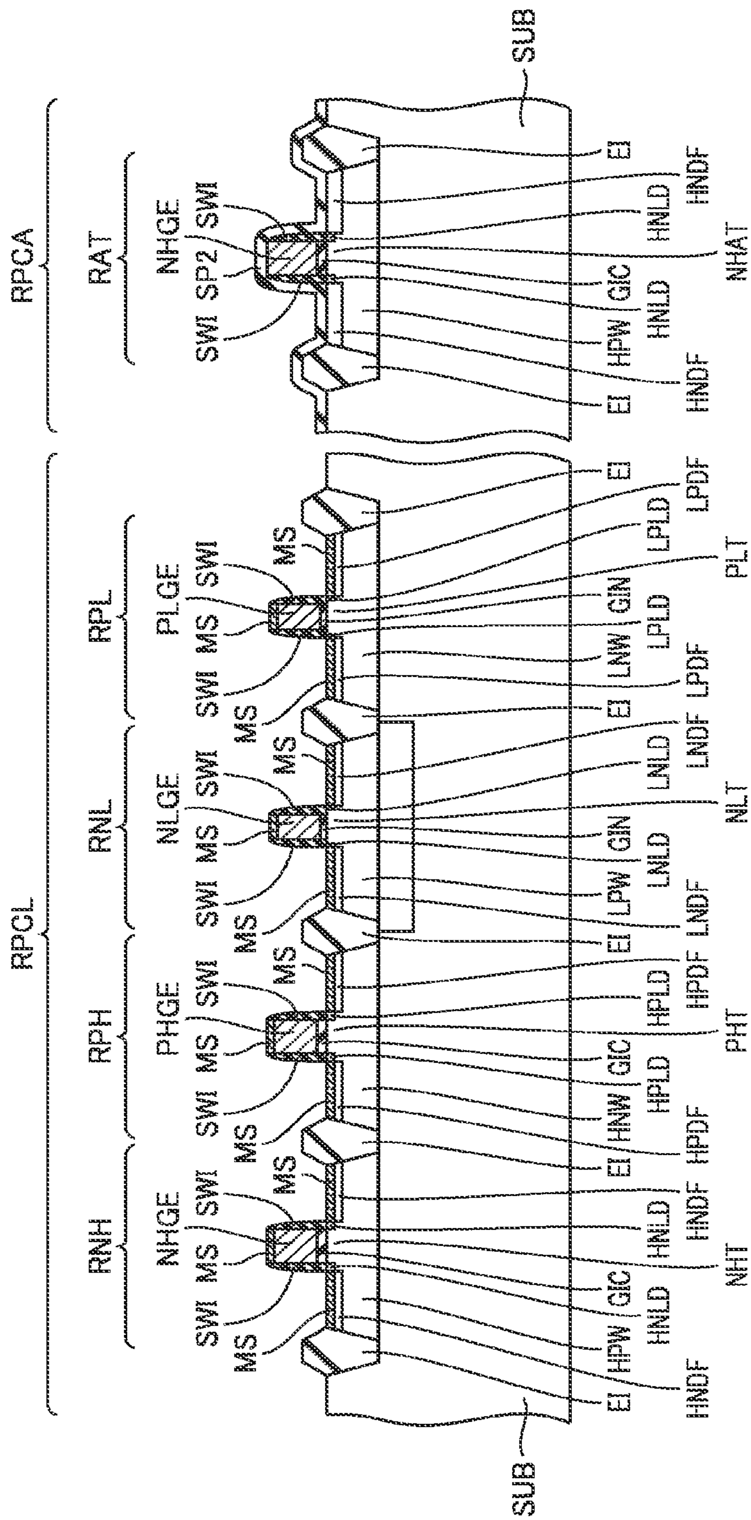
FIG. 47C is a cross sectional view of the peripheral region to show a step performed in the embodiment after the steps shown in FIG. 46A to FIG. 46C.

Next, a metal silicide film is formed by the SALICIDE method. As shown in FIG. 47A and FIG. 47B, in pixel region RPE, metal silicide films MS are formed on a portion of the upper surface of gate electrode TGE of transfer transistor TT, and the surface of floating diffusion region FDR. In pixel transistor RTP, metal silicide films MS are formed on the upper surface of gate electrode PEGE of the field effect transistor and the surface of source-drain region HNDF. As shown in FIG. 47C, in first peripheral region RPCL, metal silicide films MS are formed on the upper surfaces of gate electrodes NHGE, PHGE, NLGE, PLGE and the surfaces of source-drain regions HNDF, HPDF, LNDF, LPDF. On the other hand, in second peripheral region RPCA, silicide protection film SP2 is formed, so that no metal silicide film is formed.

Figure 48A:
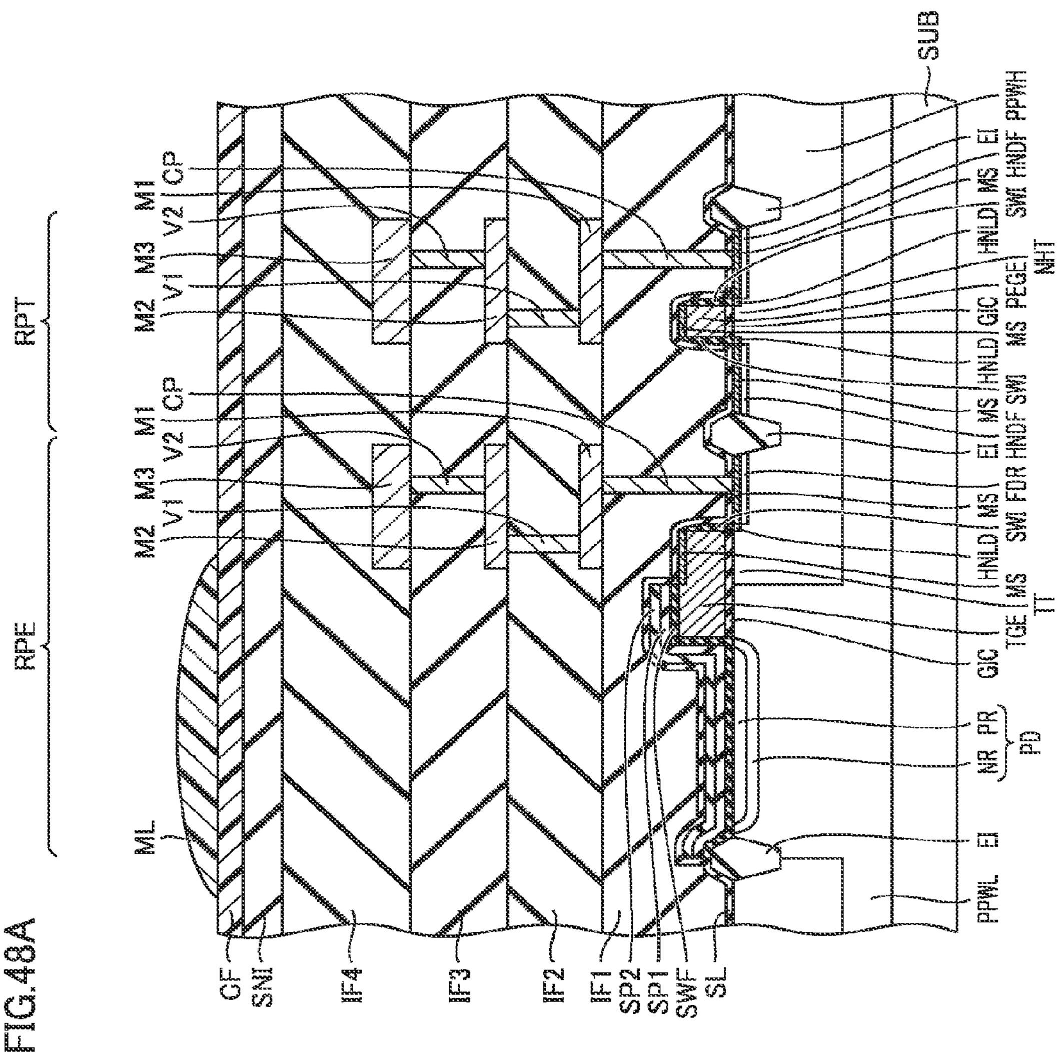
FIG. 48A is a cross sectional view of the pixel region and the like to show a step performed in the embodiment after the steps shown in FIG. 47A to FIG. 47C.
Figure 48B:
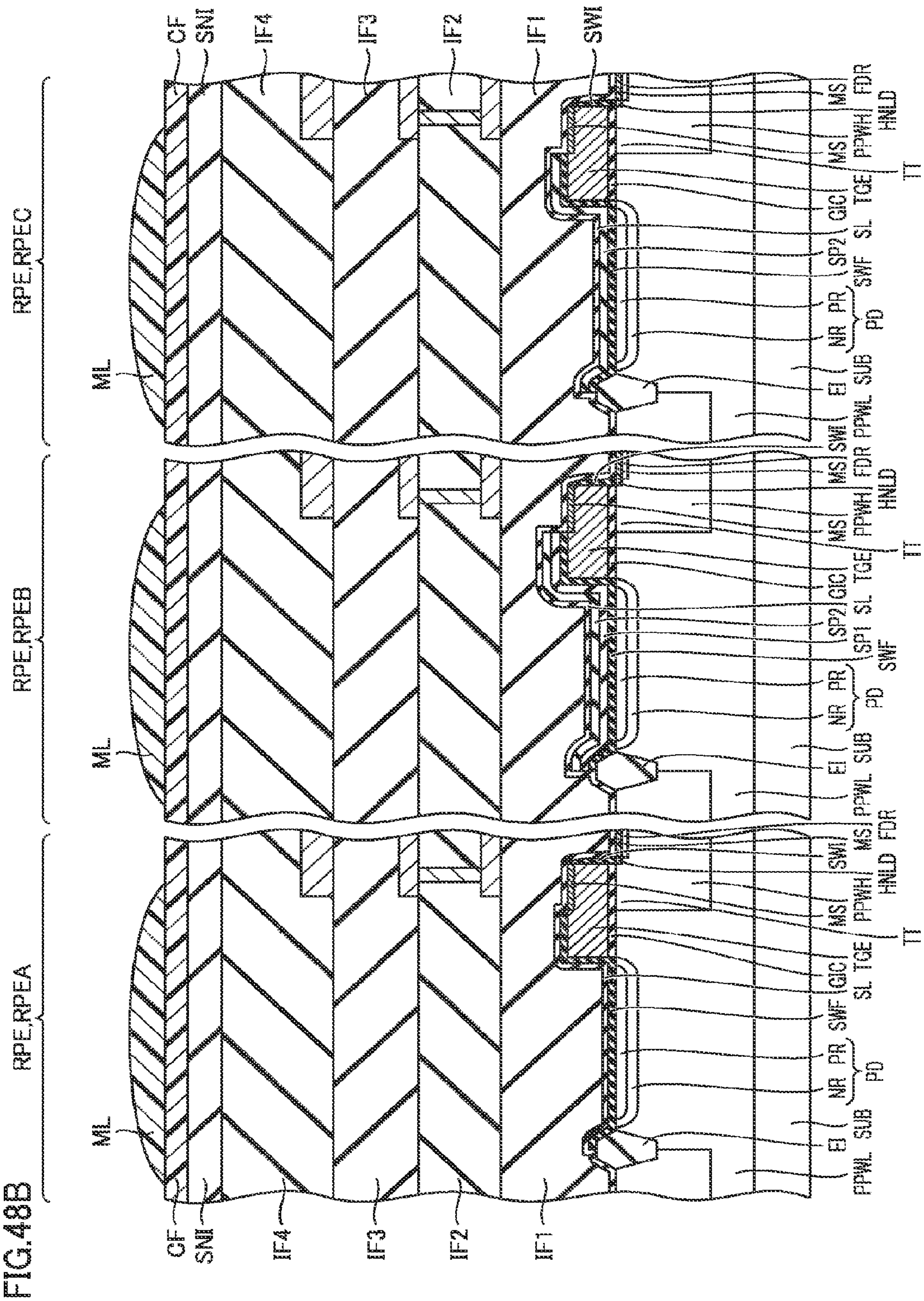
FIG. 48B is a cross sectional view of each pixel region to show a step performed in the embodiment after the steps shown in FIG. 47A to FIG. 47C.
Figure 48C:
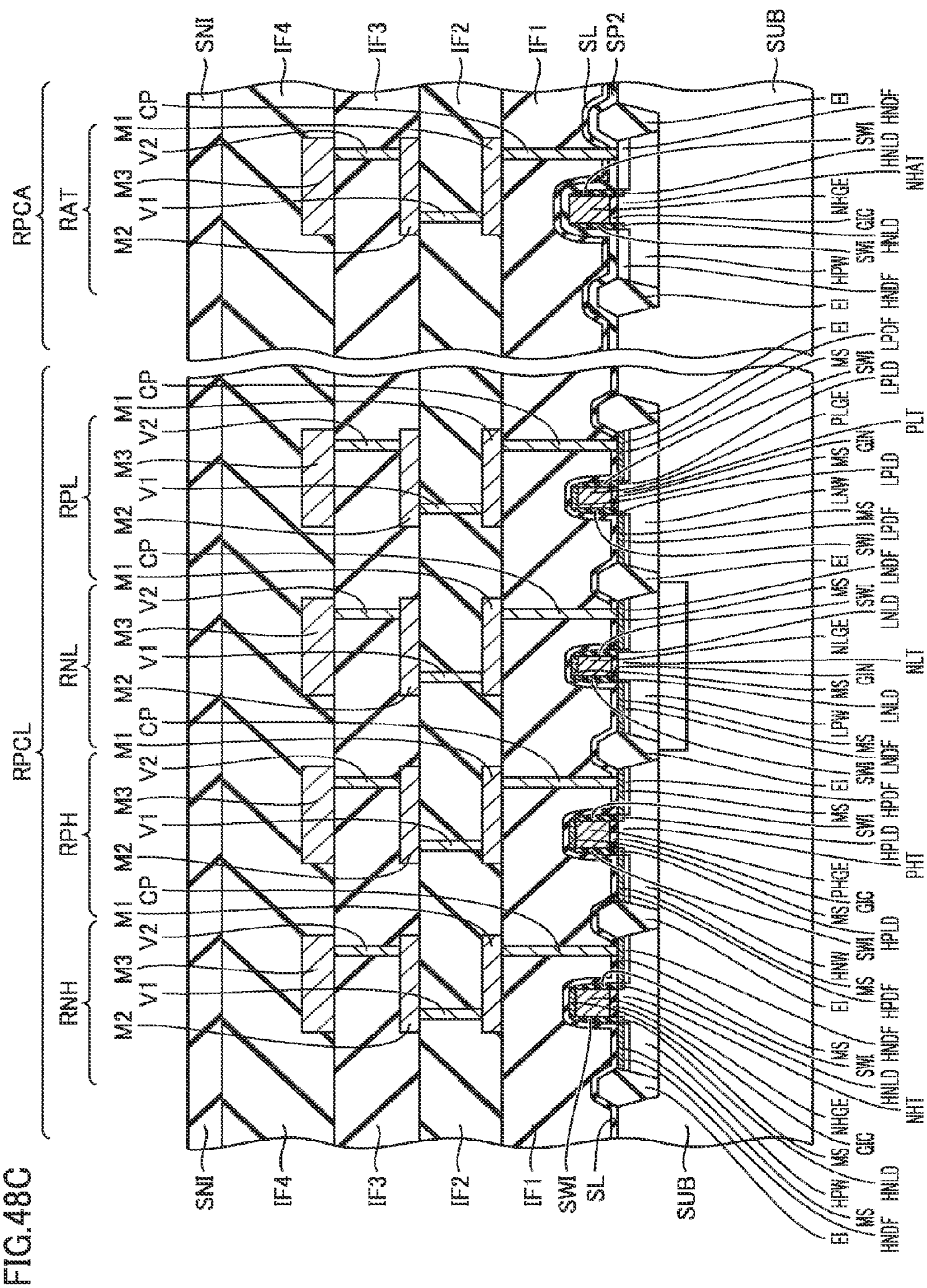
FIG. 48C is a cross sectional view of the peripheral region to show a step performed in the embodiment after the steps shown in FIG. 47A to FIG. 47C.

Then, the same steps as those shown in FIG. 25A, FIG. 25B and FIG. 25C are performed, and thereafter the same steps as those shown in FIG. 26A, FIG. 26B and FIG. 26C are performed, thereby completing the main part of the image capturing device as shown in FIG. 48A, FIG. 48B and FIG. 48C.

In the method for manufacturing the image capturing device according to the second embodiment, as with the method for manufacturing the image capturing device according to the first embodiment, during the formation of offset spacer film OSS, photo diode PD is covered with resist pattern MOSE. After forming extension regions LNLD, LPLD, insulating film OSSF covering photo diode PD is removed together with offset spacer film OSS by performing wet etching process. Accordingly, as described in the first embodiment, no damage is caused in photo diode PD, with the result that a dark current resulting from the damage can be reduced in the image capturing device.

Moreover, in pixel region RPE of the image capturing device according to the second embodiment, the insulating film to serve as the offset spacer film is removed and the different film thicknesses of the silicide protection films serving as antireflection films are provided. Specifically, pixel region RPE is provided with: pixel region RPEB having silicide protection films SP1, SP2 having a relatively thick film thickness; pixel region RPEC having silicide protection film SP2 having a relatively thin film thickness; and pixel region RPEA having no silicide protection film (see FIG. 51B).

On the other hand, in pixel region PRE of the image capturing device according to the first embodiment, the insulating film to serve as the offset spacer film is removed and there are provided pixel region RPEC having silicide protection film SP1 formed therein and pixel regions RPEA, RPEB having no silicide protection film formed therein (see FIG. 26B).

Accordingly, depending on a color (wavelength) of light, the strength (light collection ratio) of the light, which passes through the film (laminate film) covering photo diode PD and comes into the photo diode, can be increased. Regarding this, assuming light of one of red, green and blue by way of example, the following describes a relation between the transmittance of the laminate film covering the photo diode and the film thickness of the silicide protection film and the like.

Figure 49:
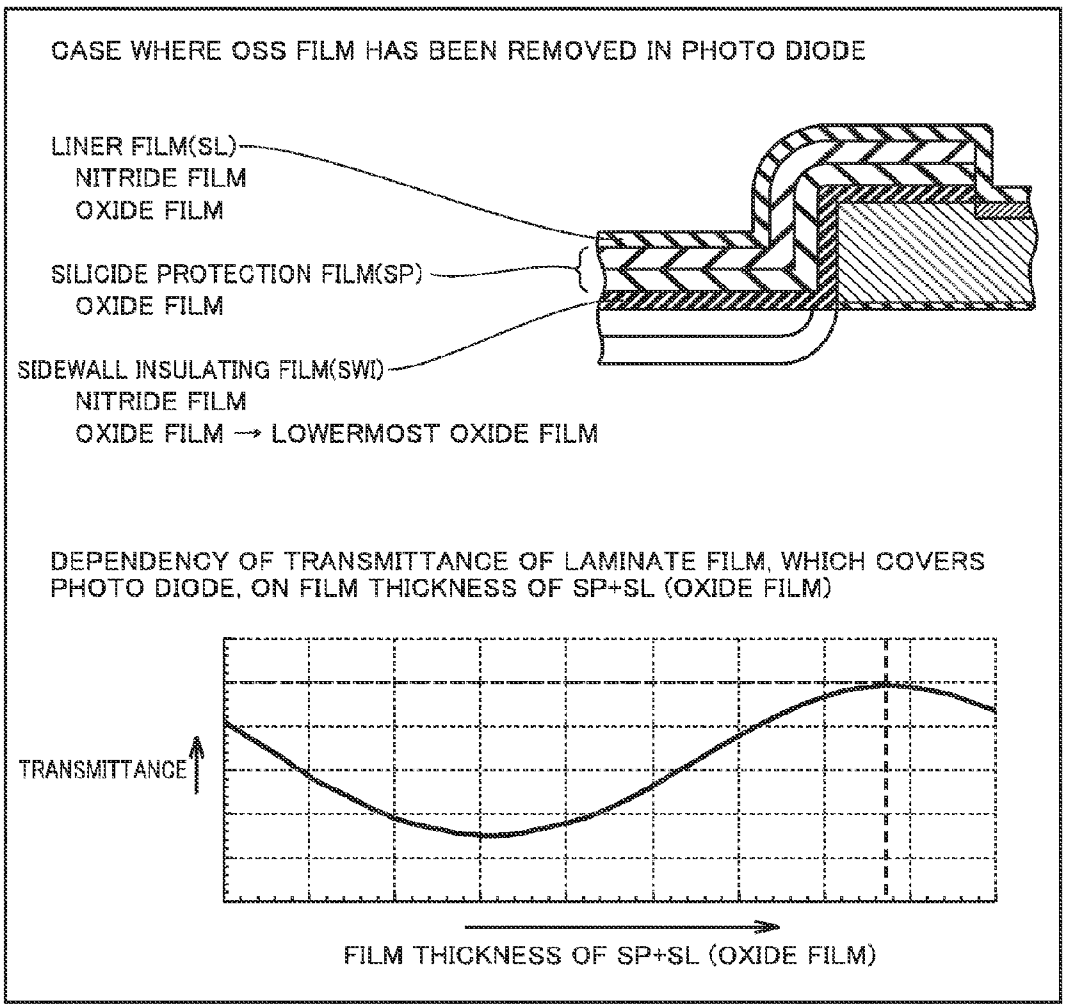
FIG. 49 illustrates functions and effects of a silicide protection film and the like in the pixel region of the image capturing device in the first or second embodiment.

As shown in FIG. 49, first, sidewall insulating film SWI covering the photo diode is constituted of two layers, i.e., an oxide film and a nitride film. Silicide protection film SP is constituted of an oxide film. Stress liner film SL is constituted of two layers, i.e., an oxide film and a nitride film.

In this case, a graph therein shows a relation between the transmittance of the laminate film covering the photo diode and the total film thickness of the silicide protection film (oxide film) and the oxide film of the stress liner film as evaluated by the inventors. As shown in the graph, it is seen that the transmittance is changed depending on the film thickness of the silicide protection film and the like.

This result is obtained from the graph for the one exemplary light of red, green or blue in spectrum, but the inventors have confirmed that light other than the exemplary one is also varied in transmittance depending on the film thickness of the silicide protection film and the like. Thus, by providing a pixel region having a silicide protection film therein and a pixel region having no silicide protection film formed therein and by providing different thicknesses of silicide protection films in pixel regions having silicide protection films formed therein, there can be manufactured an image capturing device including pixel regions optimal for, for example, specifications required for a digital camera or the like. Specifically, by adjusting the film thickness of the silicide protection film, the sensitivity of the pixel can be increased or the sensitivity of the pixel can be suppressed from being increased too much, whereby the sensitivity of the pixel can be precisely set to a desired sensitivity.

Third Embodiment

Explained here is a case where the offset spacer film remains and the pixel region is divided into a pixel region having a silicide protection film formed therein and a pixel region having no silicide protection film formed therein. It should be noted that the same members as those in the image capturing device illustrated in the first embodiment are given the same reference characters and are not described repeatedly unless required.

Figure 50A:
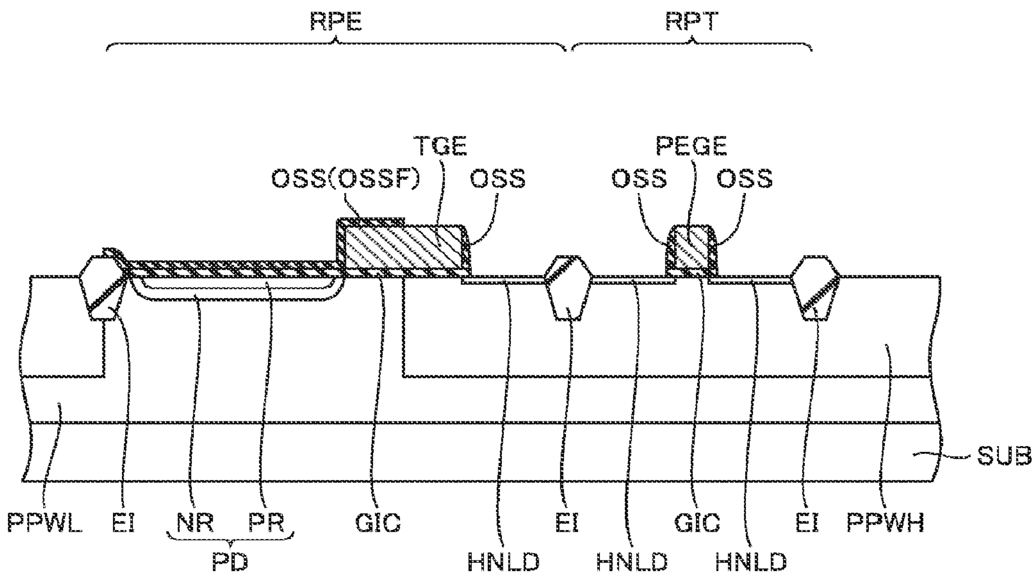
FIG. 50A is a cross sectional view of the pixel region and the like to show one step of a method for manufacturing an image capturing device according to a third embodiment.
Figure 50B:
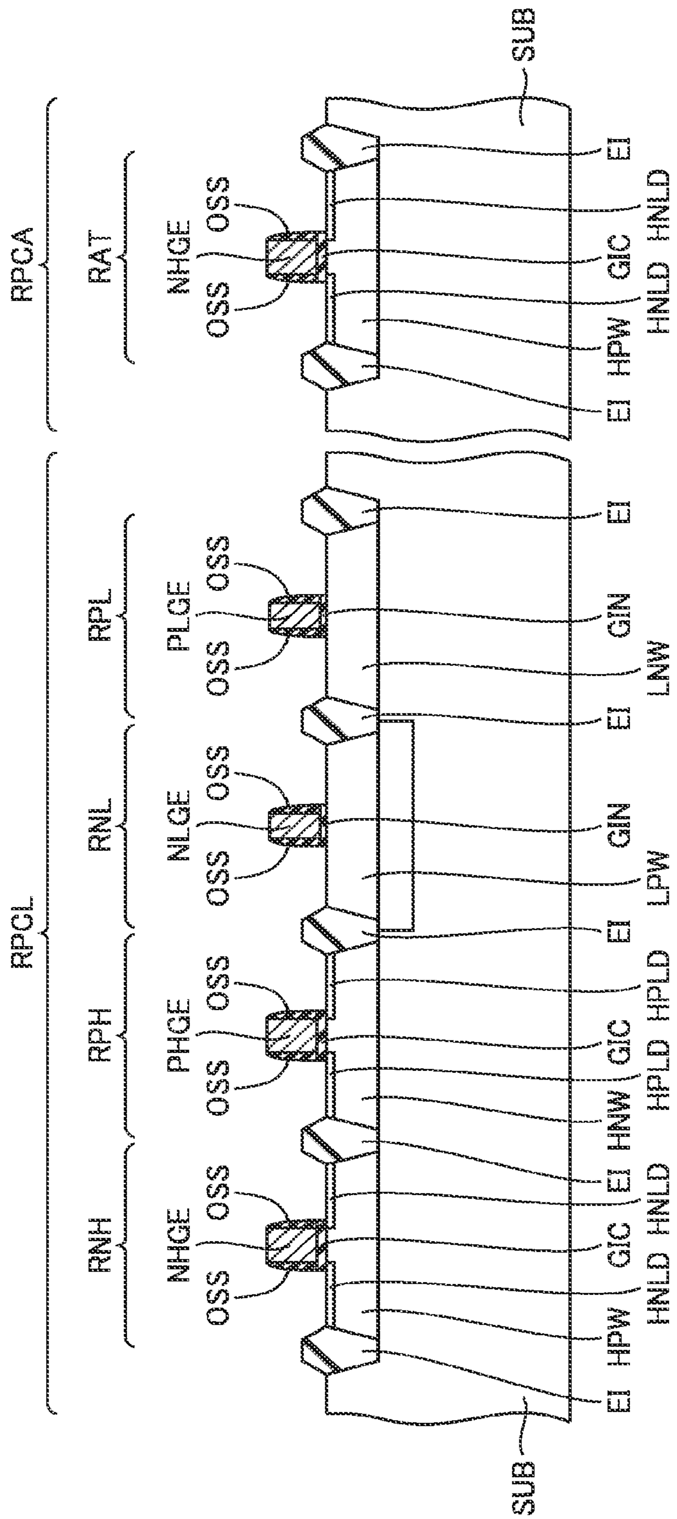
FIG. 50B is a cross sectional view of the peripheral region to show one step of the method for manufacturing the image capturing device according to the third embodiment.

First, after performing the same steps as those shown in FIG. 7A and FIG. 7B to FIG. 12A and FIG. 12B, resist pattern MLPL is removed, thereby exposing offset spacer film OSS formed on each of insulating films OSSF covering photo diode PD and the side wall surfaces of gate electrodes TGE, PEGE, NHGE, PHGE, NLGE, PLGE as shown in FIG. 50A and FIG. 50B.

Figure 51A:
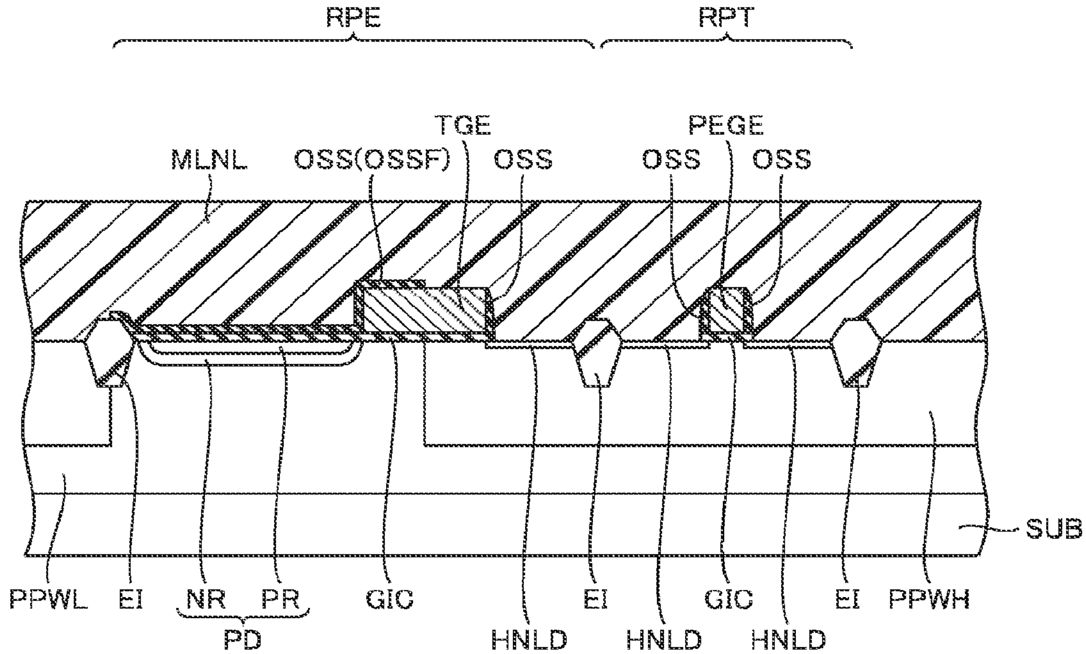
FIG. 51A is a cross sectional view of the pixel region and the like to show a step performed in the embodiment after the steps shown in FIG. 50A and FIG. 50B.
Figure 51B:
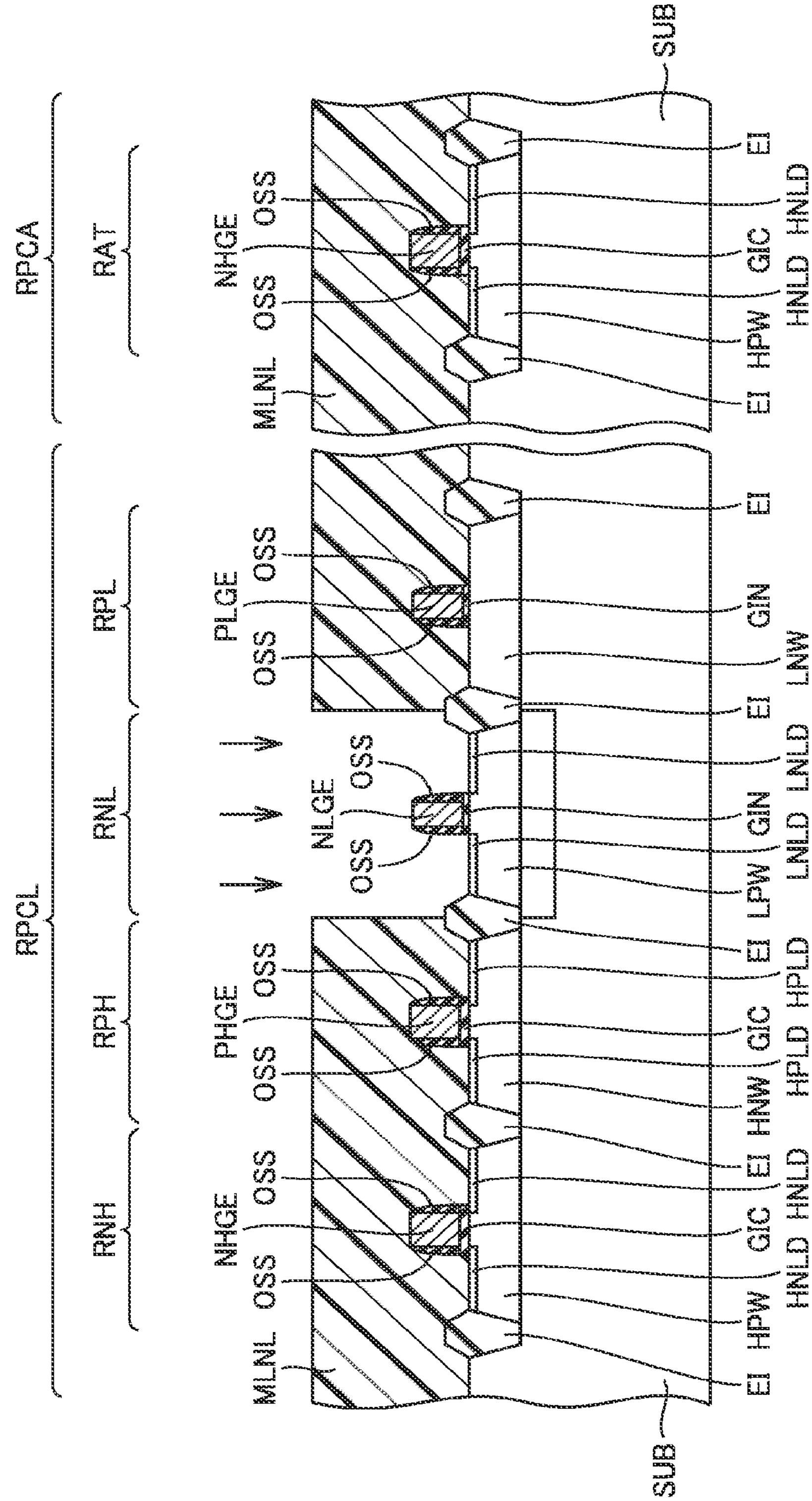
FIG. 51B is a cross sectional view of the peripheral region to show a step performed in the embodiment after the steps shown in FIG. 50A and FIG. 50B.

Next, as shown in FIG. 51A and FIG. 51B, a predetermined photolithographic process is performed, thereby forming resist pattern MLNL to expose region RNL and cover the other regions. Next, an n type impurity is implanted using resist pattern MLNL, offset spacer film OSS, and gate electrode NLGE as an implantation mask, thereby forming an extension region LNLD in exposed region RNL. Then, resist pattern MLNL is removed.

Figure 52A:
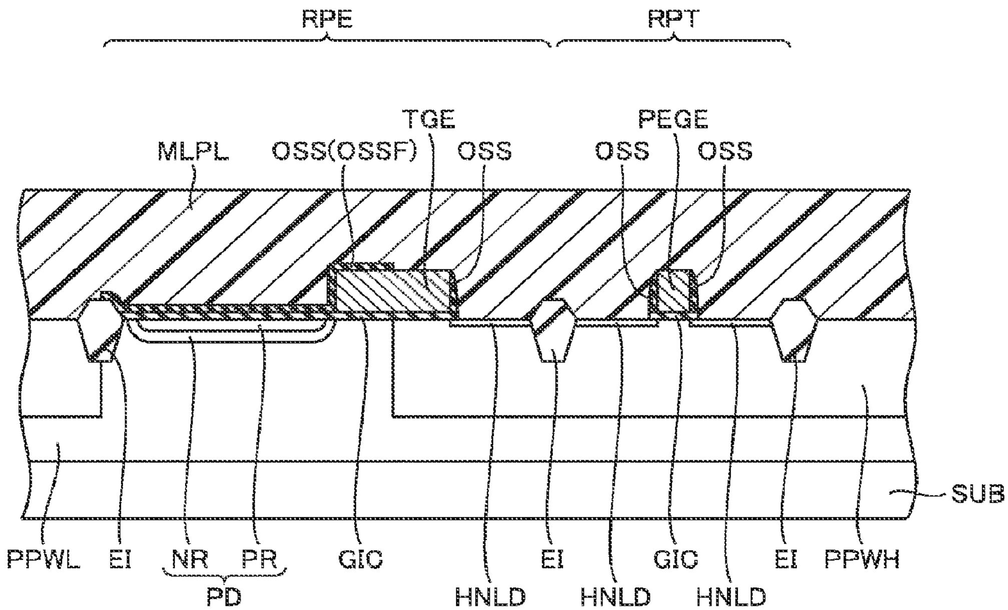
FIG. 52A is a cross sectional view of the pixel region and the like to show a step performed in the embodiment after the steps shown in FIG. 51A and FIG. 51B.
Figure 52B:
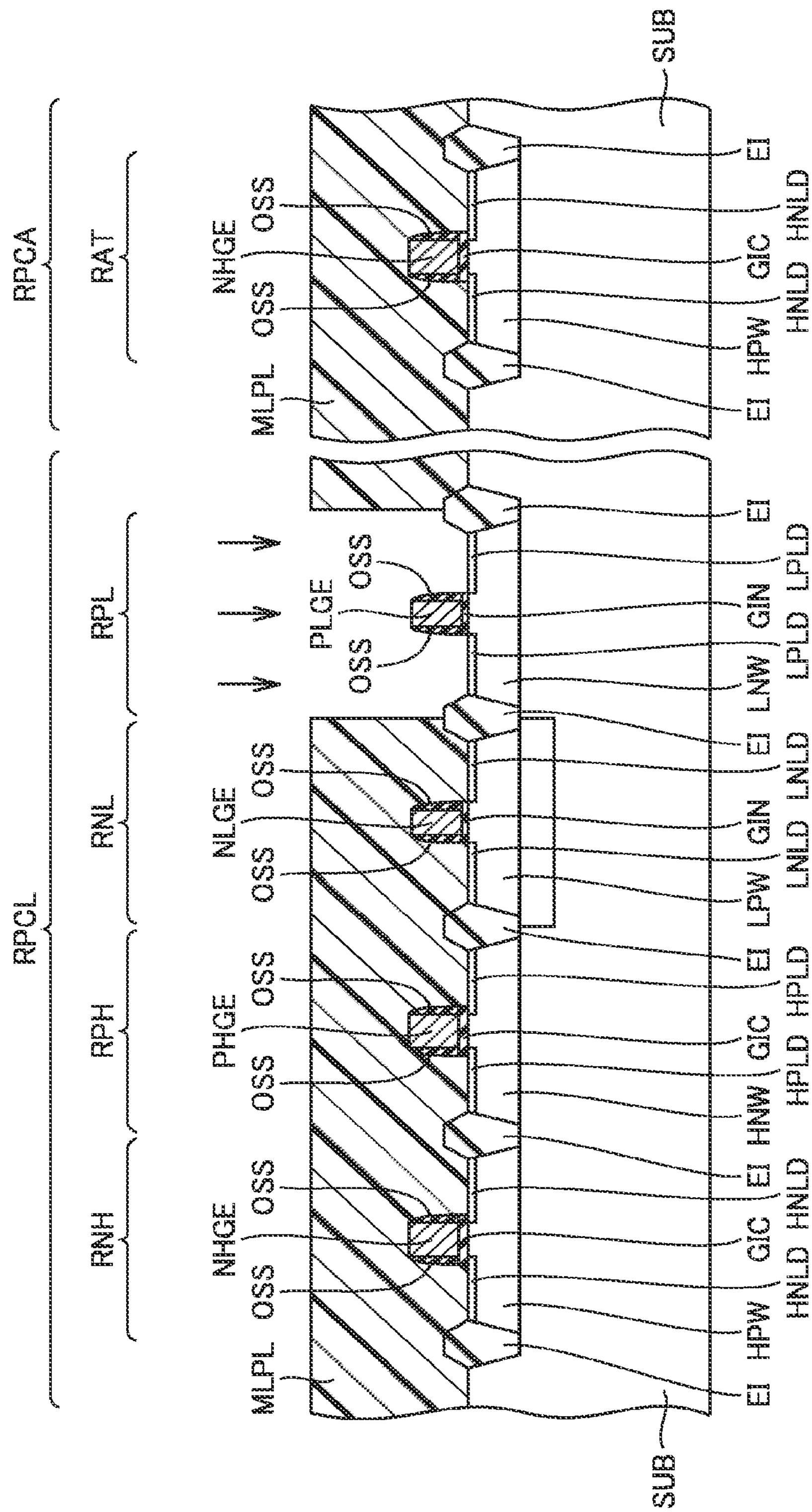
FIG. 52B is a cross sectional view of the peripheral region to show a step performed in the embodiment after the steps shown in FIG. 51A and FIG. 51B.

Next, as shown in FIG. 52A and FIG. 52B, a predetermined photolithographic process is provided, thereby forming a resist pattern MLPL to expose region RPL and cover the other regions. Next, a p type impurity is implanted using resist pattern MLPL, offset spacer film OSS, and gate electrode PLGE as an implantation mask, thereby forming an extension region LPLD in exposed region RPL. Then, resist pattern MLPL is removed.

Figure 53A:
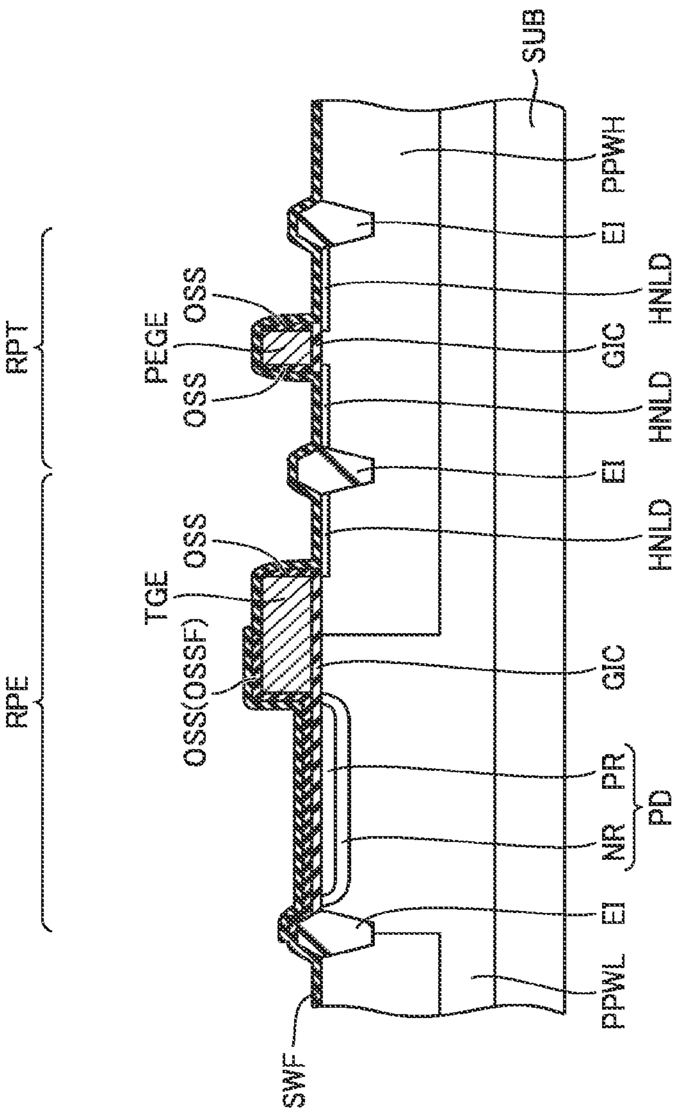
FIG. 53A is a cross sectional view of the pixel region and the like to show a step performed in the embodiment after the steps shown in FIG. 52A and FIG. 52B.
Figure 53B:
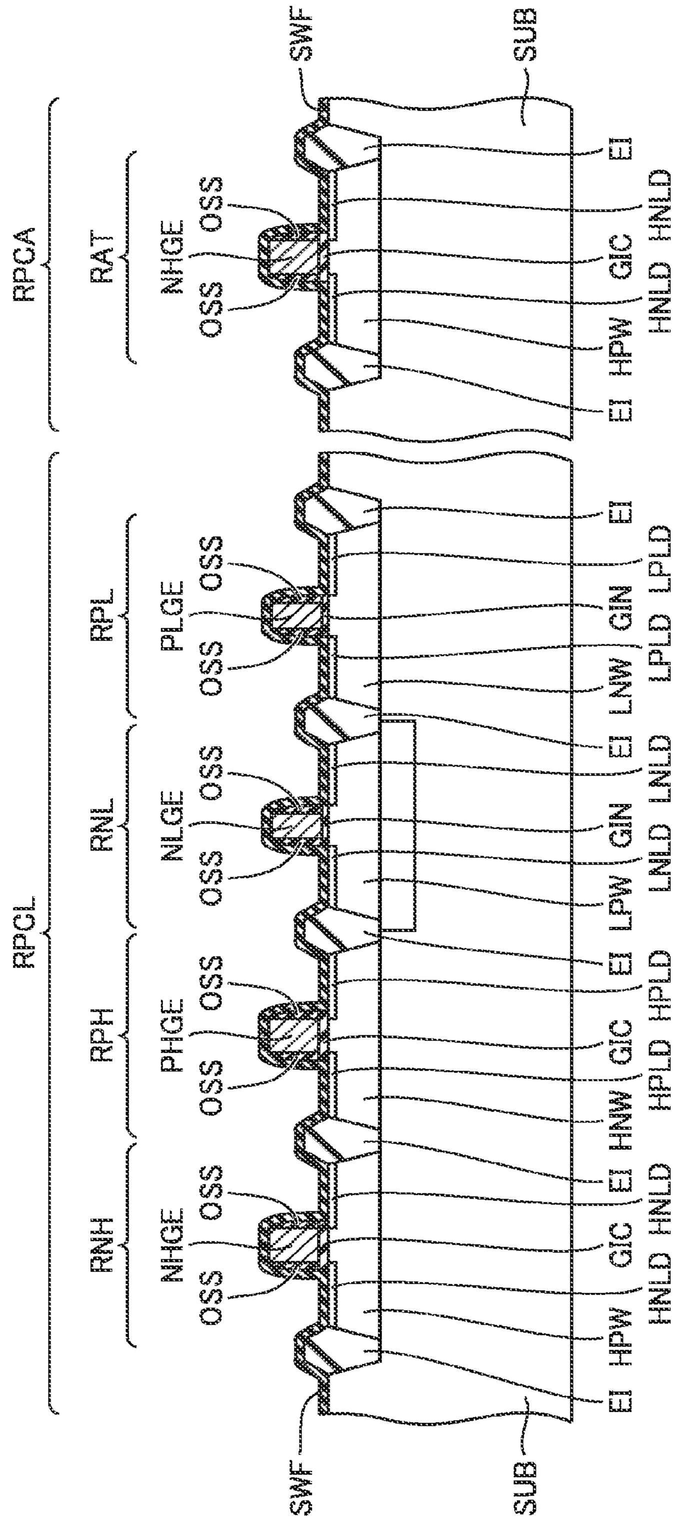
FIG. 53B is a cross sectional view of the peripheral region to show a step performed in the embodiment after the steps shown in FIG. 52A and FIG. 52B.
Figure 54A:
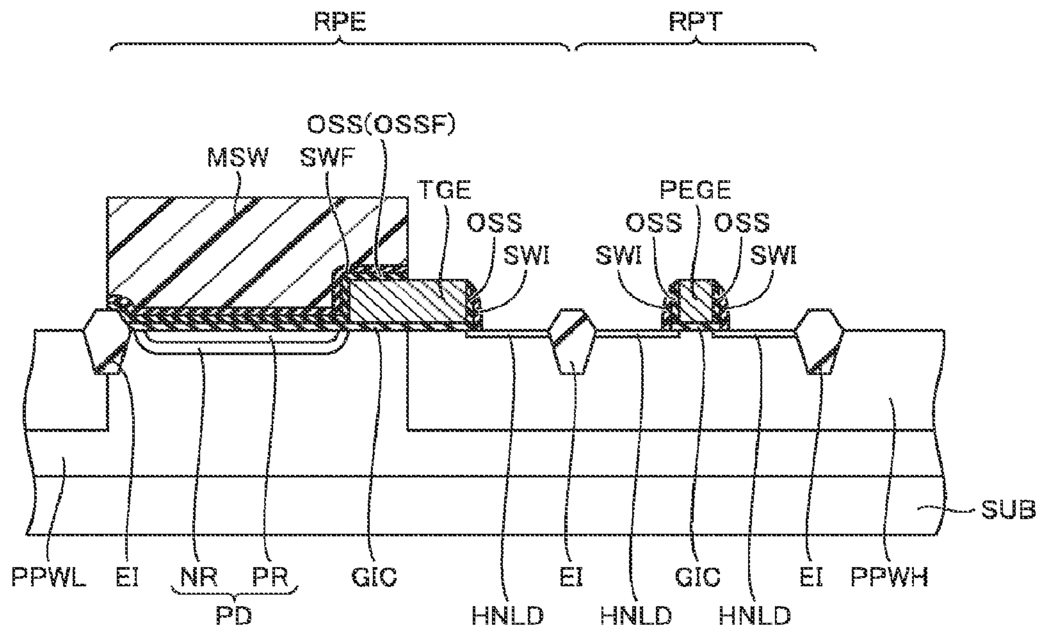
FIG. 54A is a cross sectional view of the pixel region and the like to show a step performed in the embodiment after the steps shown in FIG. 53A and FIG. 53B.
Figure 54B:
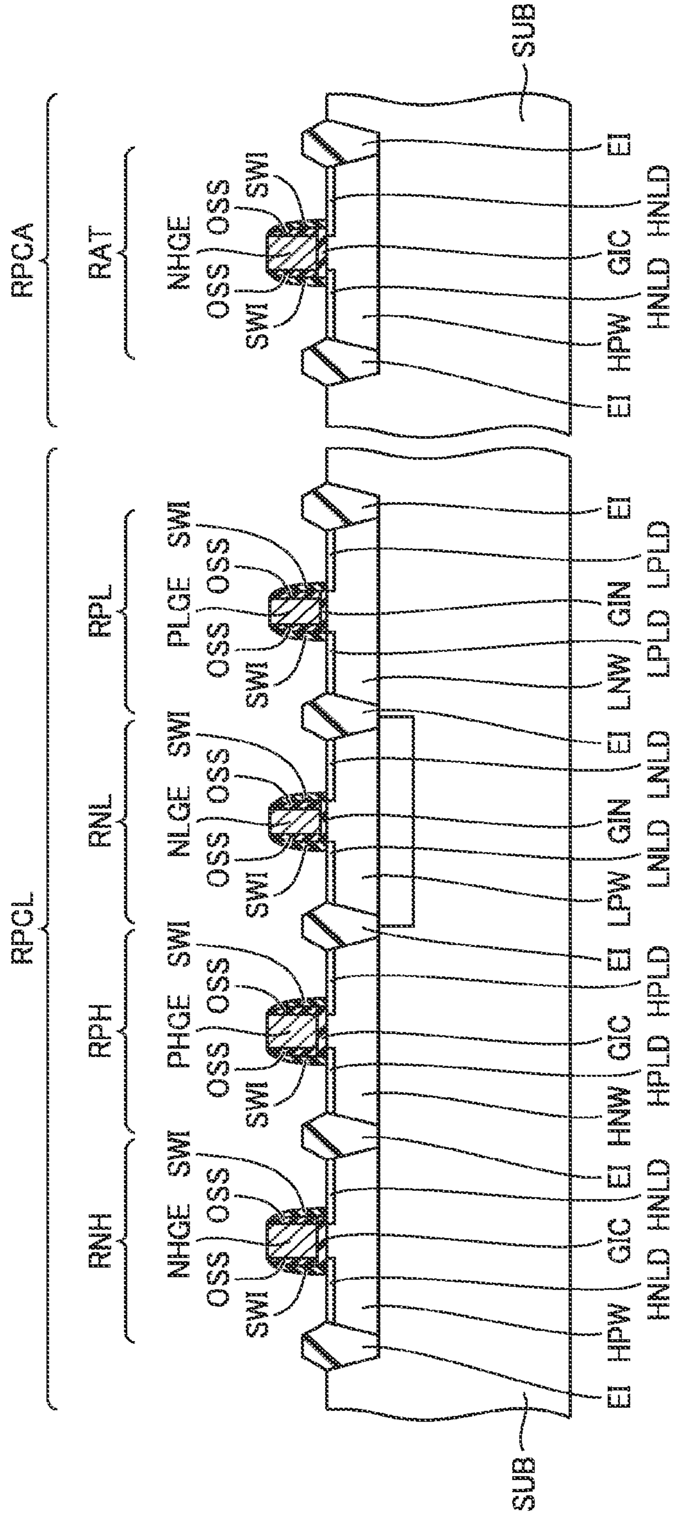
FIG. 54B is a cross sectional view of the peripheral region to show a step performed in the embodiment after the steps shown in FIG. 53A and FIG. 53B.

Next, as shown in FIG. 53A and FIG. 53B, an insulating film SWF to serve as the sidewall insulating film is formed to cover each of gate electrodes TGE, PEGE, NHGE, PHGE, NLGE, PLGE and offset spacer film OSS. Next, a predetermined photolithographic process is performed, thereby forming a resist pattern MSW (see FIG. 54A) to cover the region in which photo diode PD is disposed and expose the other regions. Next, as shown in FIG. 54A and FIG. 54B, anisotropic etching process is performed onto exposed insulating film SWF using resist pattern MSW as an etching mask.

Accordingly, portions of insulating film SWF are removed from the upper surfaces of gate electrodes TGE, PEGE, NHGE, PHGE, NLGE, PLGE, thereby forming sidewall insulating films SWI constituted of the remaining portions of insulating film SWF on the side wall surfaces of gate electrodes TGE, PEGE, NHGE, PHGE, NLGE, PLGE. Sidewall insulating films SWI are formed to cover offset spacer film OSS. Then, resist pattern MSW is removed.

Figure 55A:
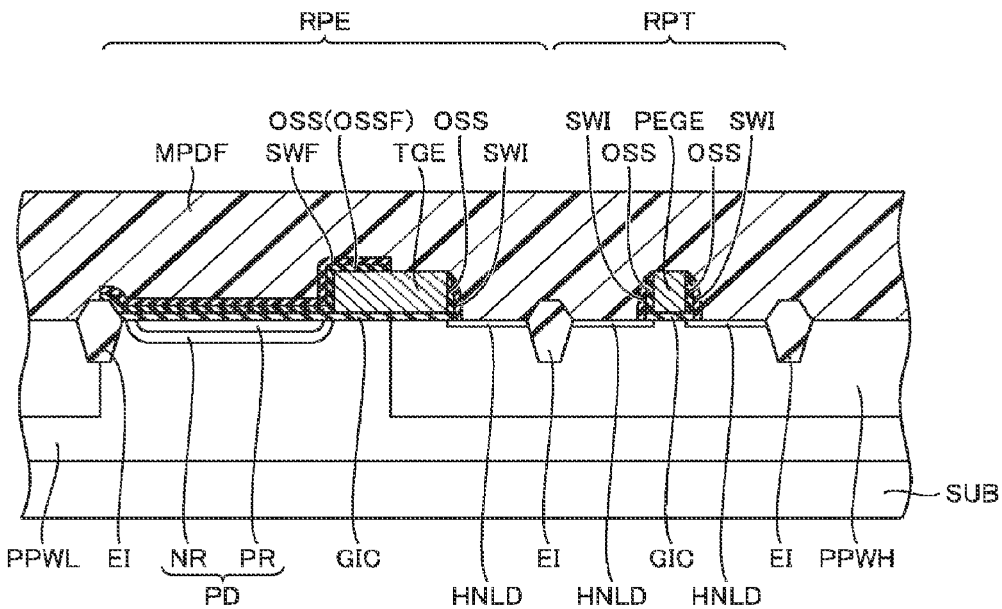
FIG. 55A is a cross sectional view of the pixel region and the like to show a step performed in the embodiment after the steps shown in FIG. 54A and FIG. 54B.
Figure 55B:
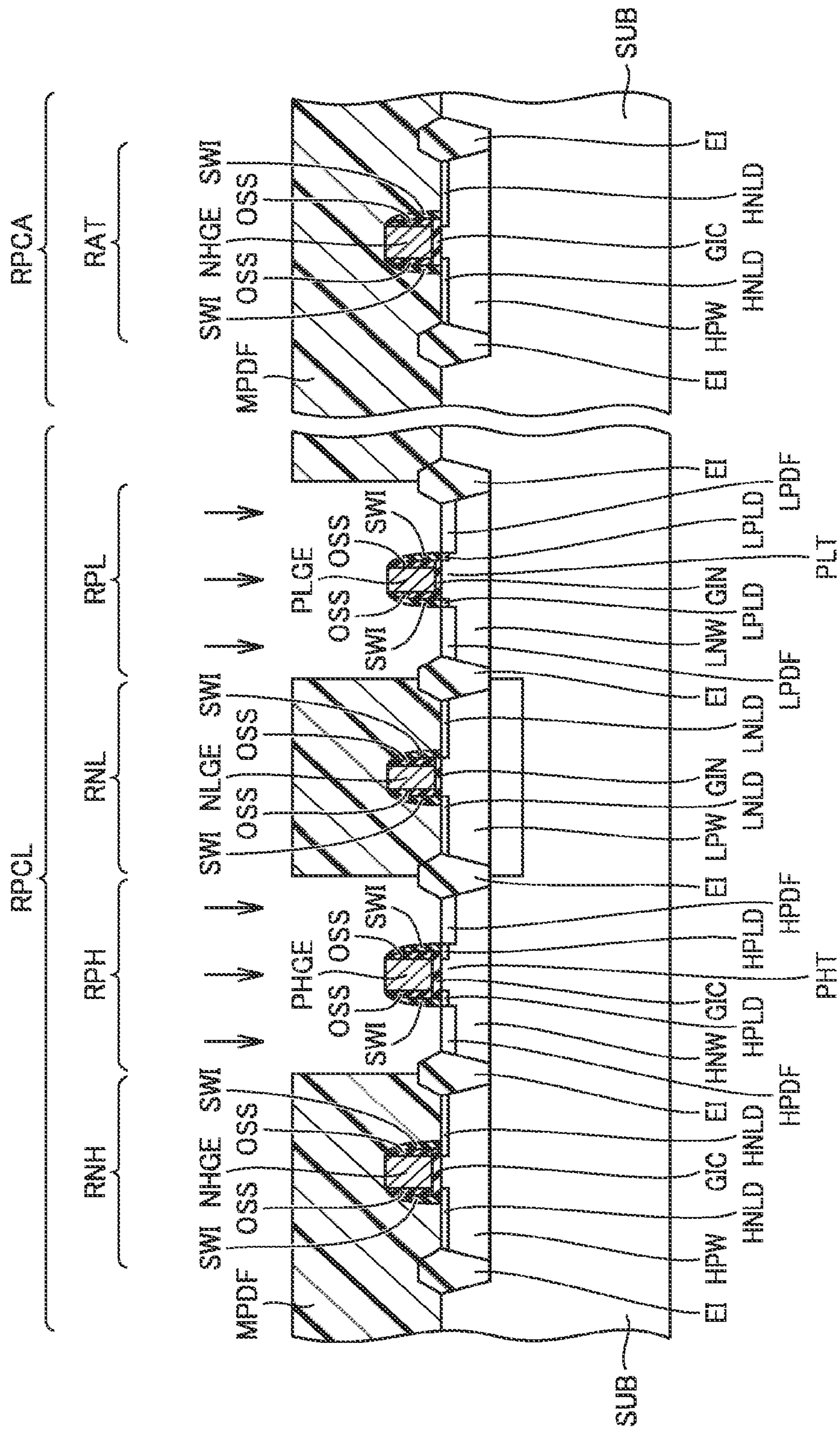
FIG. 55B is a cross sectional view of the peripheral region to show a step performed in the embodiment after the steps shown in FIG. 54A and FIG. 54B.

Next, as shown in FIG. 55A and FIG. 55B, a predetermined photolithographic process is performed, thereby forming a resist pattern MPDF to expose regions RPH, RPL and cover the other regions. Next, a p type impurity is implanted using resist pattern MPDF, sidewall insulating films SWI, offset spacer films OSS and gate electrodes PHGE, PLGE as an implantation mask, thereby forming a source-drain region HPDF in region RPH and forming a source-drain region LPDF in region RPL. Then, resist pattern MPDF is removed.

Figure 56A:
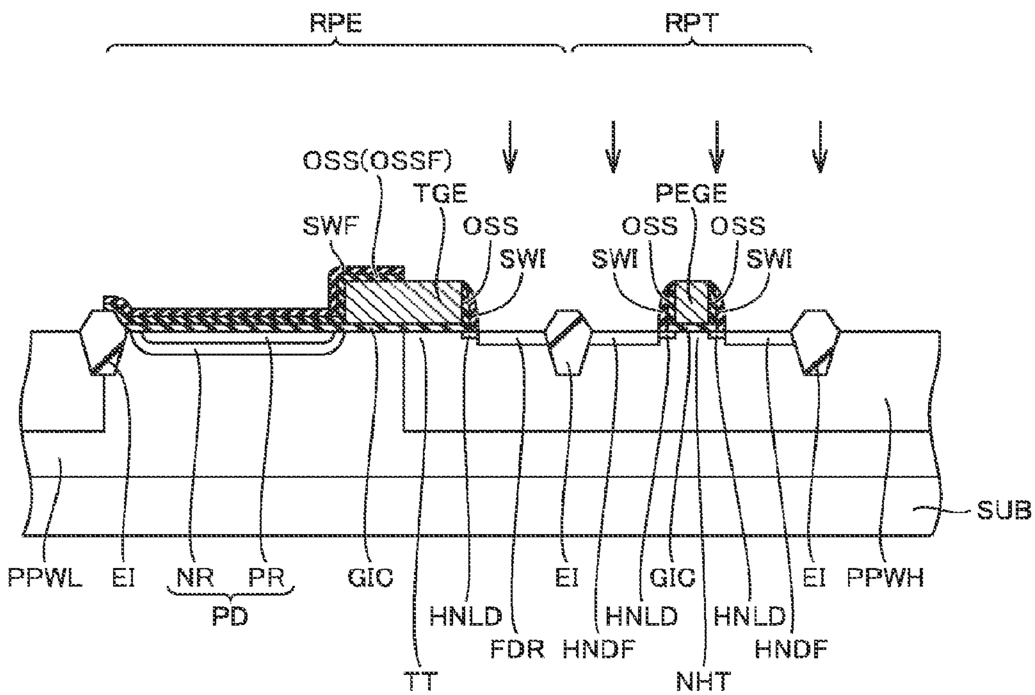
FIG. 56A is a cross sectional view of the pixel region and the like to show a step performed in the embodiment after the steps shown in FIG. 55A and FIG. 55B.
Figure 56B:
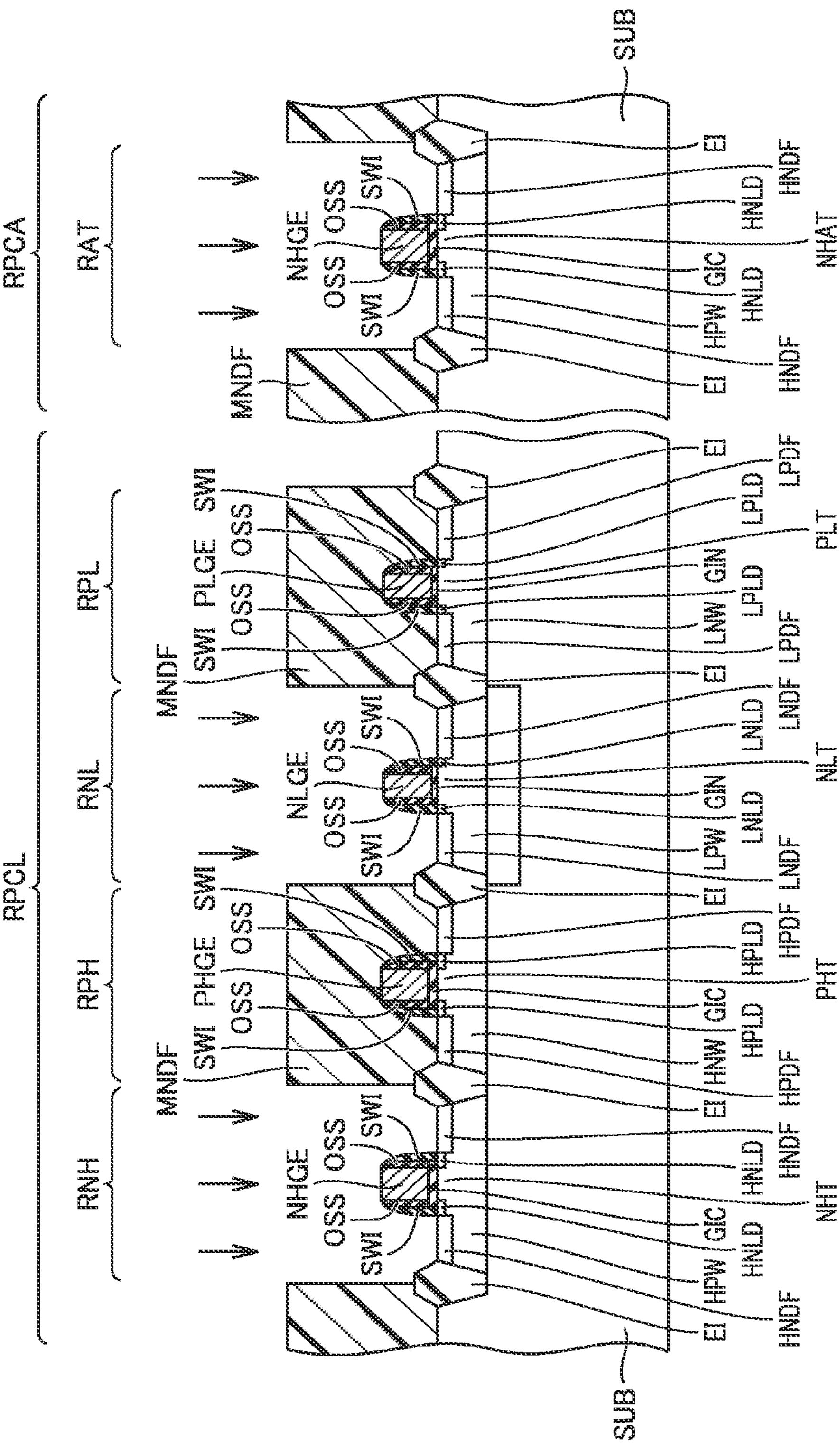
FIG. 56B is a cross sectional view of the peripheral region to show a step performed in the embodiment after the steps shown in FIG. 55A and FIG. 55B.

Next, as shown in FIG. 56A and FIG. 56B, a predetermined photolithographic process is performed, thereby forming a resist pattern MNDF to expose regions RPT, RNH, RNL, RAT and cover the other regions. Next, an n type impurity is implanted using resist pattern MNDF, sidewall insulating film SWI, offset spacer film OSS and gate electrodes TGE, PEGE, NHGE, NLGE as an implantation mask, thereby forming a source-drain region HNDF in each of regions RPT, RNH, RAT and forming a source-drain region LNDF in region RNL. Moreover, on this occasion, in pixel region RPE, floating diffusion region FDR is formed. Then, resist pattern MNDF is removed.

Figure 57A:
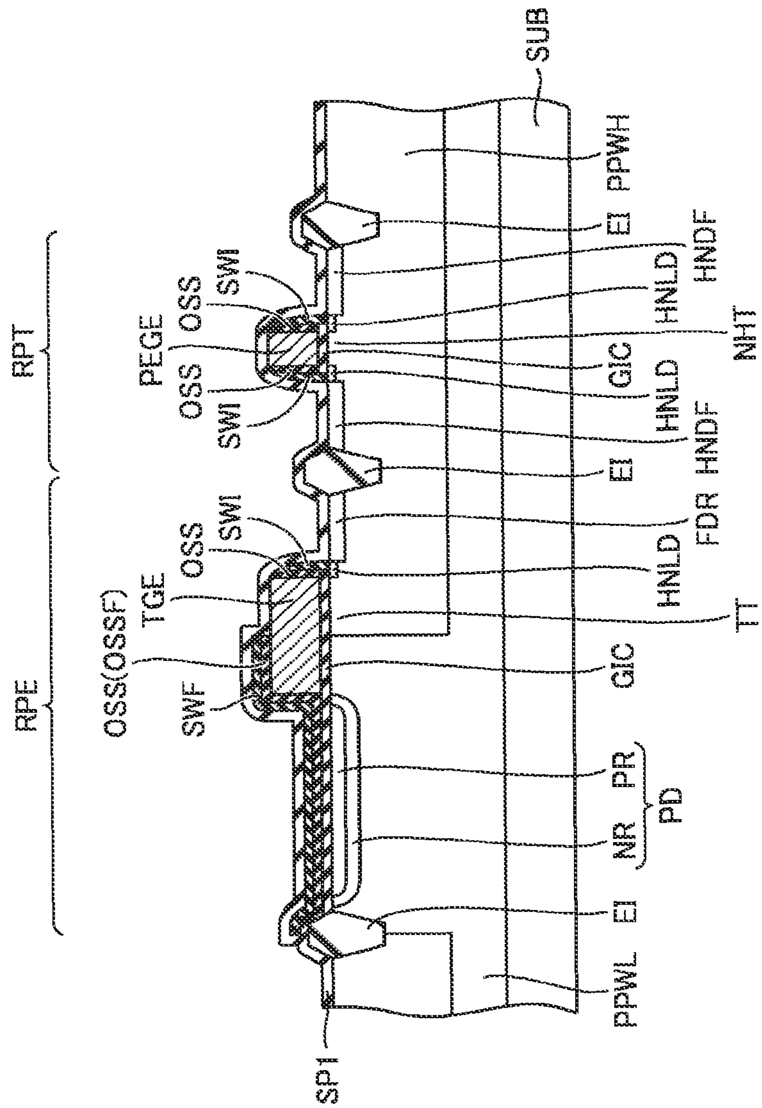
FIG. 57A is a cross sectional view of the pixel region and the like to show a step performed in the embodiment after the steps shown in FIG. 56A and FIG. 56B.
Figure 57B:
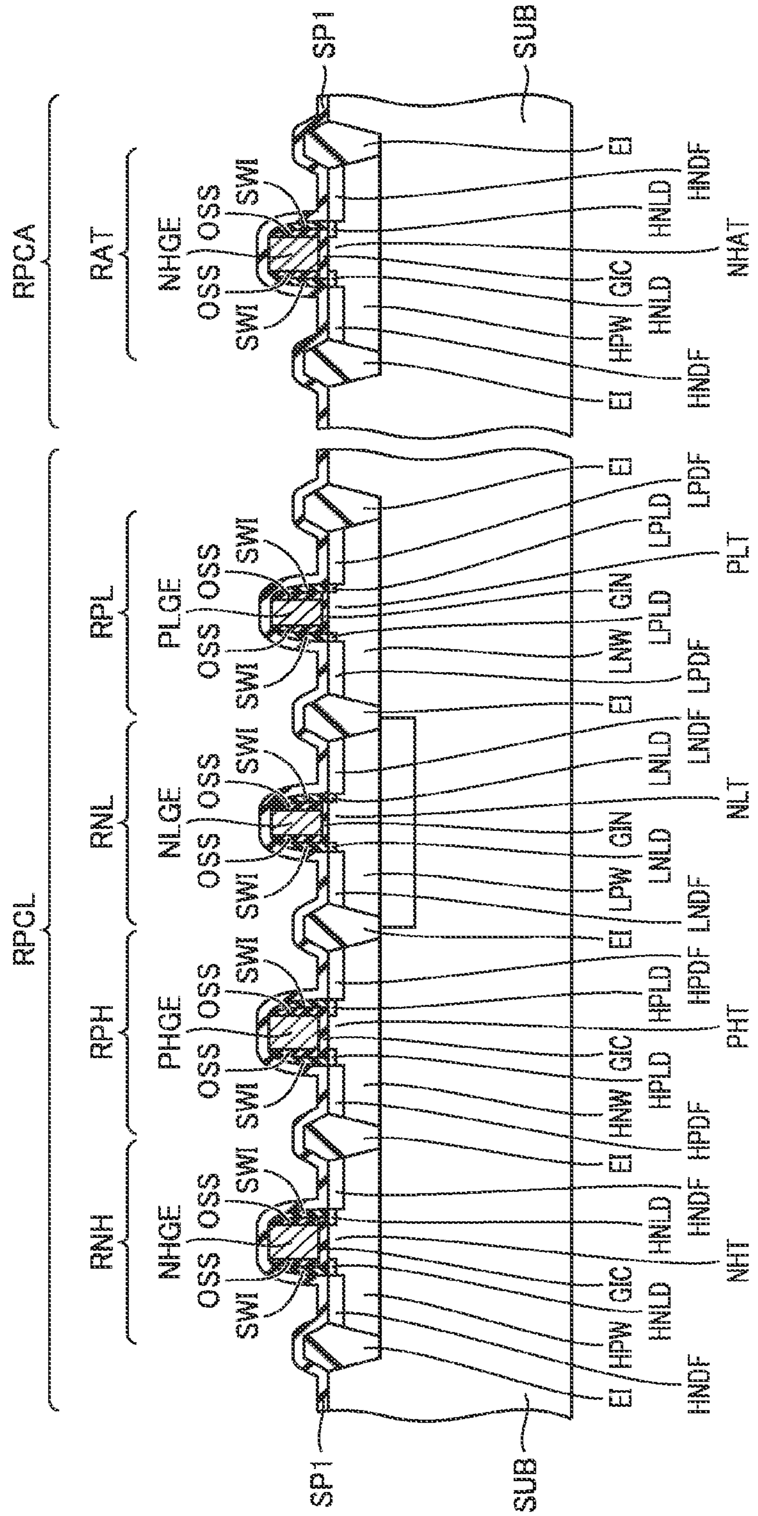
FIG. 57B is a cross sectional view of the peripheral region to show a step performed in the embodiment after the steps shown in FIG. 56A and FIG. 56B.
Figure 58A:
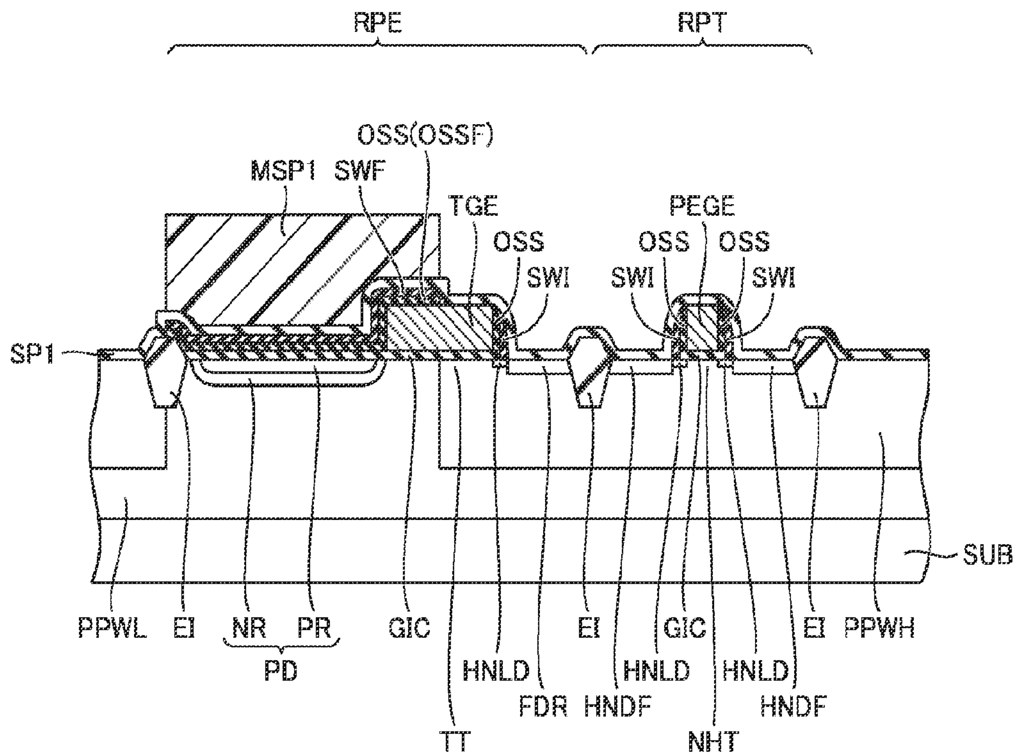
FIG. 58A is a cross sectional view of the pixel region and the like to show a step performed in the embodiment after the steps shown in FIG. 57A and FIG. 57B.
Figure 58B:
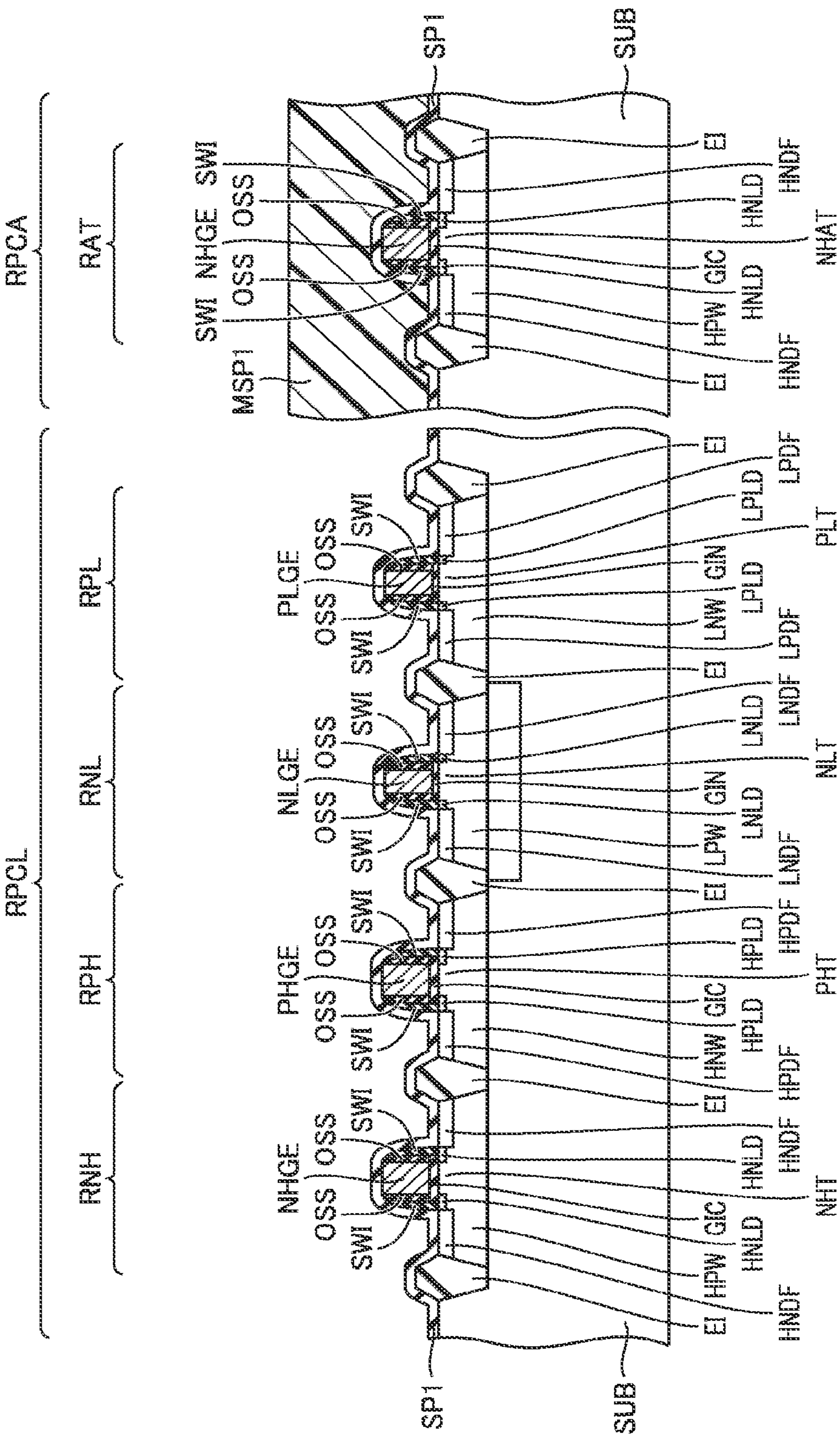
FIG. 58B is a cross sectional view of the peripheral region to show a step performed in the embodiment after the steps shown in FIG. 57A and FIG. 57B.
Figure 59A:
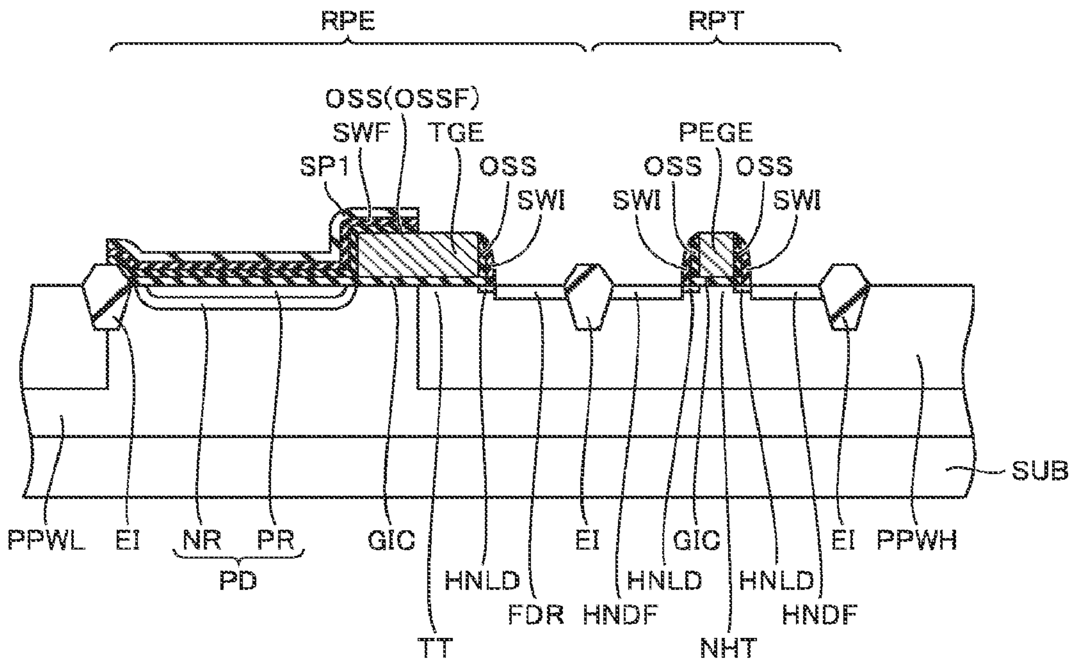
FIG. 59A is a cross sectional view of the pixel region and the like to show a step performed in the embodiment after the steps shown in FIG. 58A and FIG. 58B.
Figure 59B:
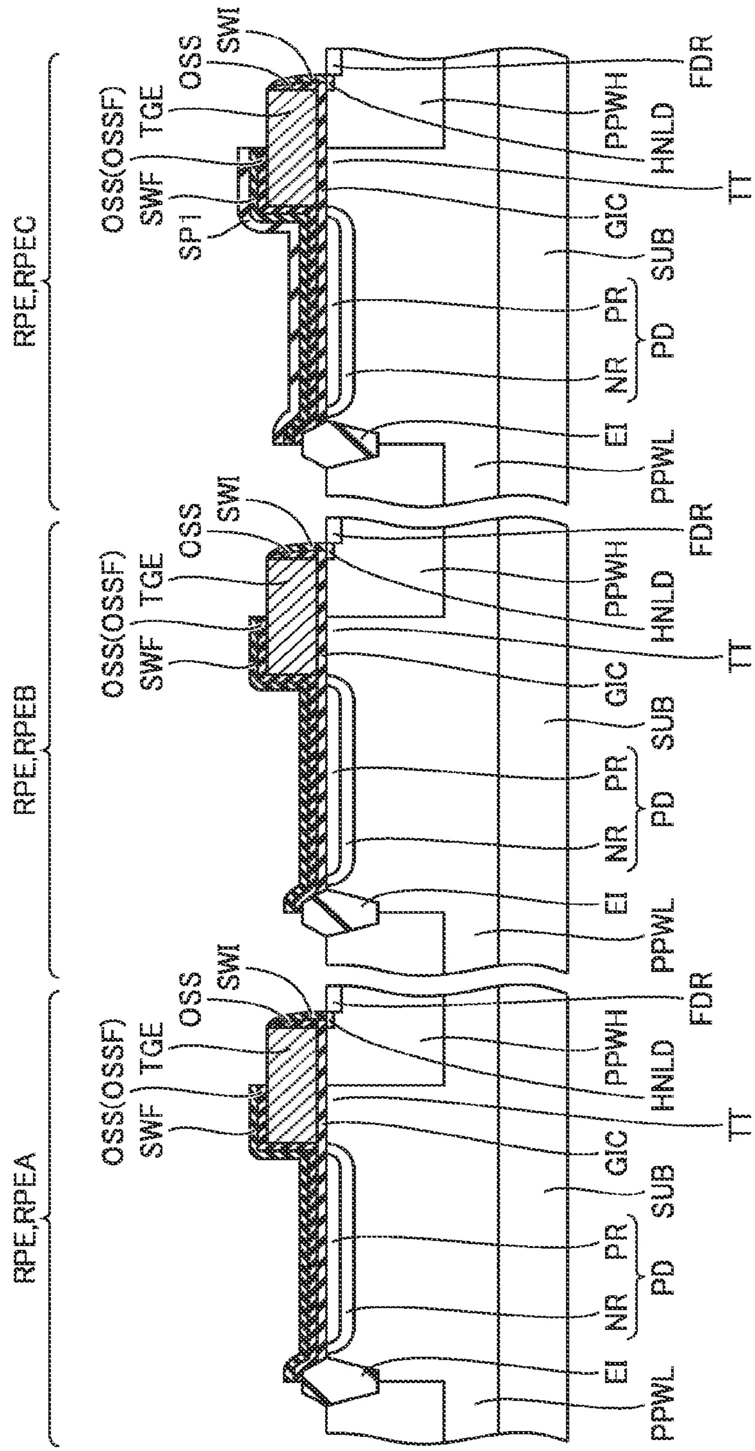
FIG. 59B is a cross sectional view of each pixel region to show a step performed in the embodiment after the steps shown in FIG. 58A and FIG. 58B.
Figure 59C:
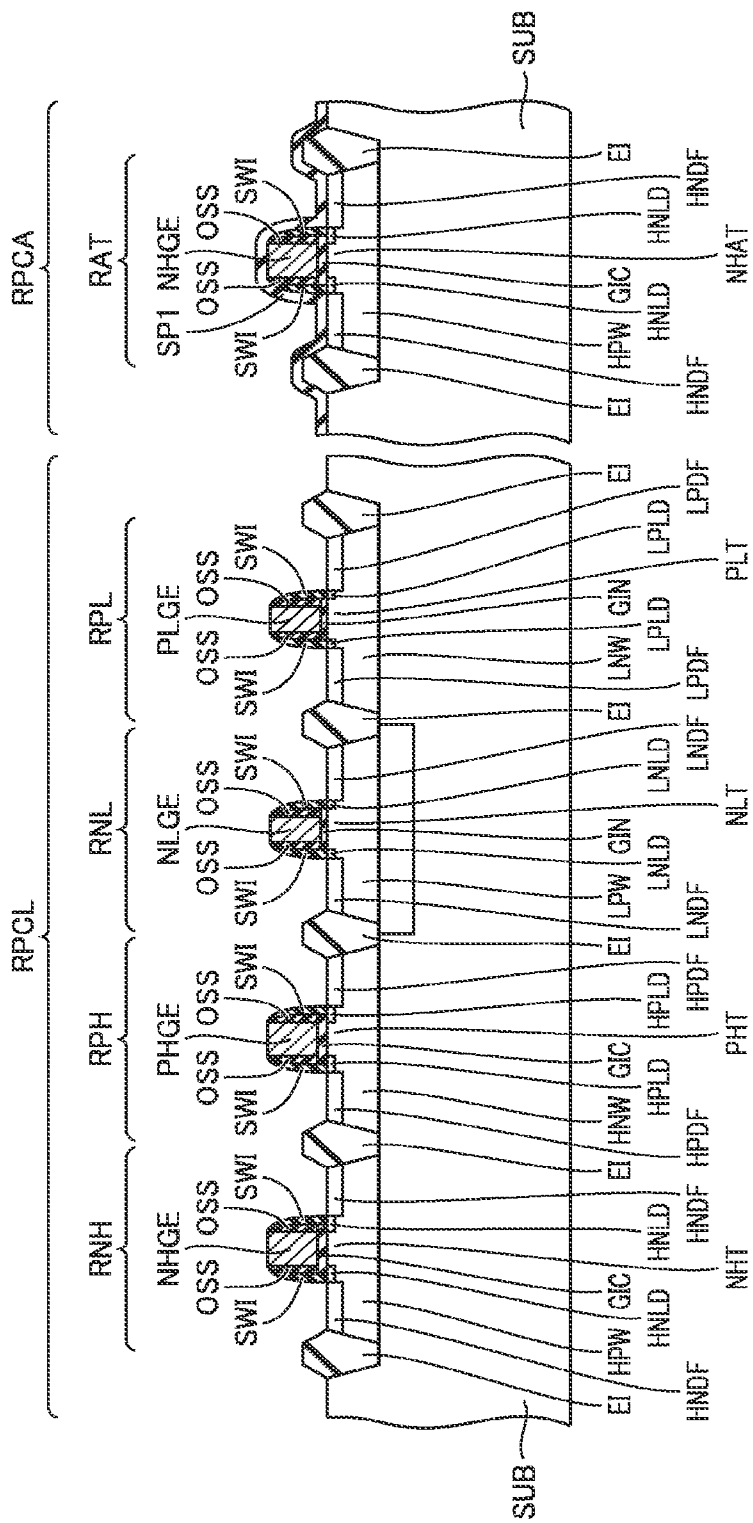

Next, as shown in FIG. 57A and FIG. 57B, a silicide protection film SP1 for preventing silicidation is formed to cover gate electrodes TGE, PEGE, NHGE, PHGE, NLGE, PLGE, and the like. Next, in the same manner as the steps shown in FIG. 21A to FIG. 21C, as shown in FIG. 58A and FIG. 58B, resist pattern MSP1 is formed to cover region RAT and pixel region RPE (RPEC) corresponding to one predetermined color and expose the other regions. Next, wet etching process is performed using resist pattern MSP1 as an etching mask, thereby removing exposed silicide protection film SP1. Then, resist pattern MSP1 is removed, thereby exposing silicide protection film SP1 remaining in pixel region RPEC of pixel region RPE as shown in FIG. 59A, FIG. 59B and FIG. 59C. Further, silicide protection film SP1 remaining in region RAT of second peripheral region RPCA is exposed.

Figure 60A:
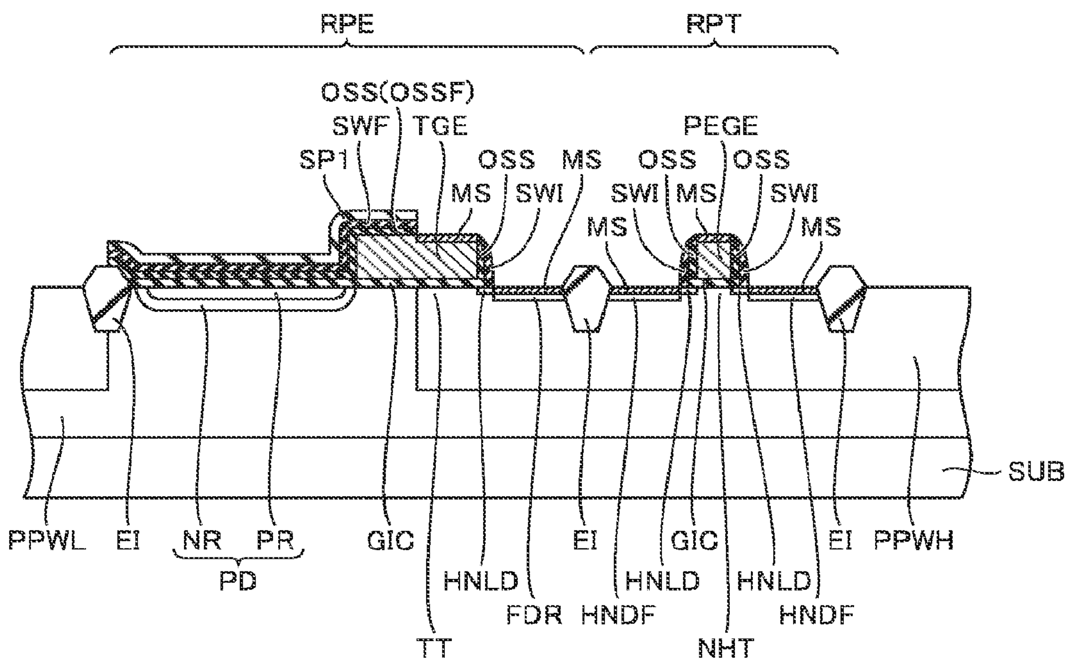
Figure 60B:
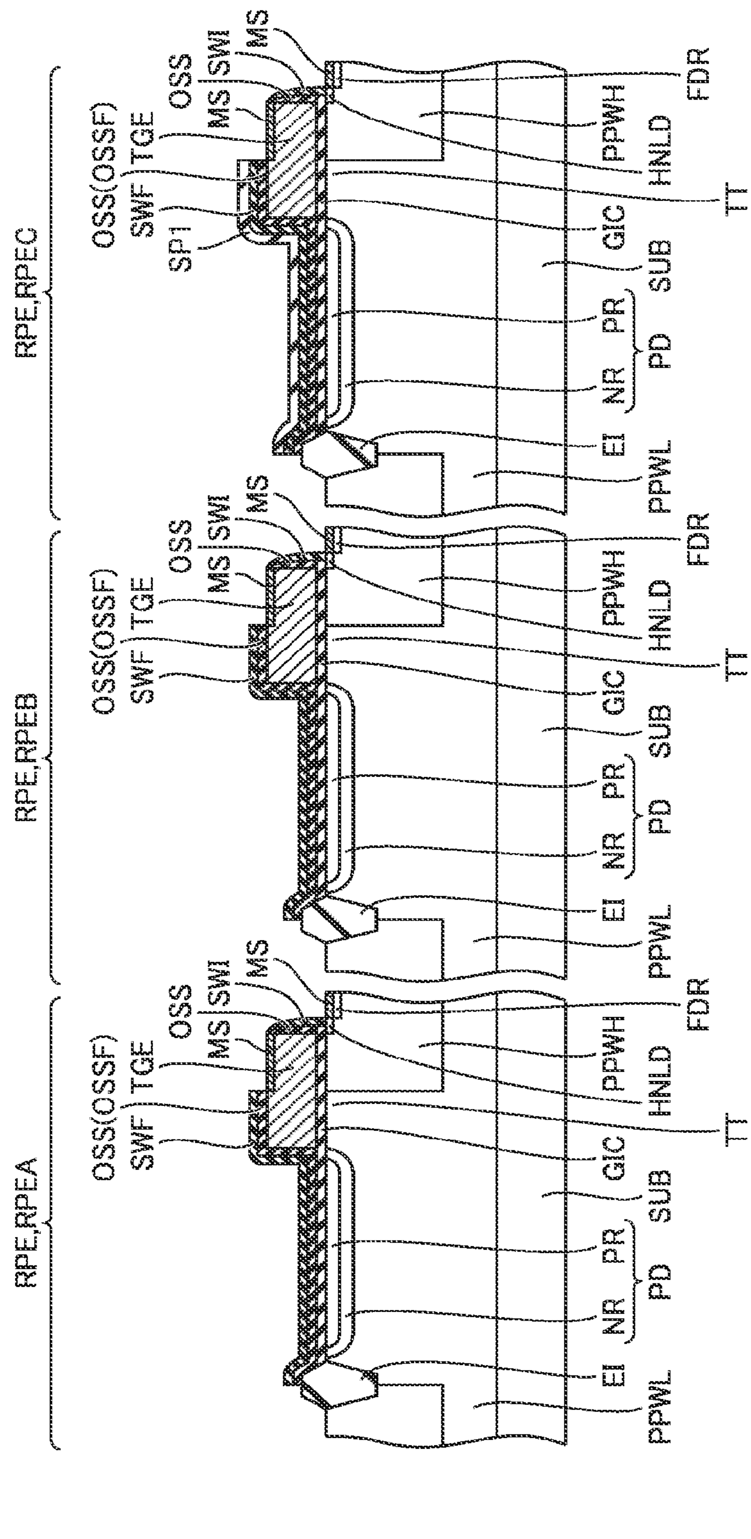
Figure 60C:
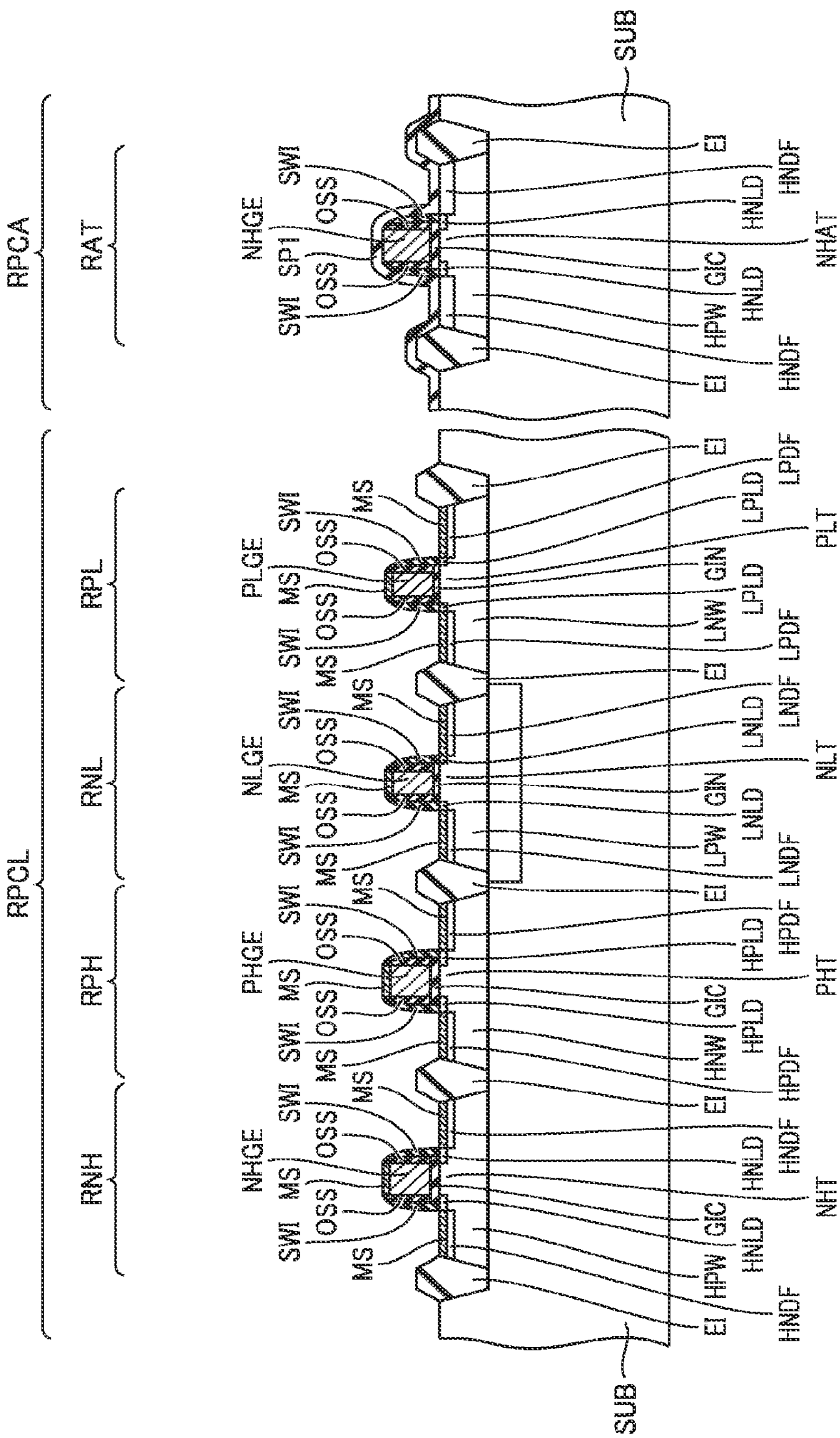

Next, a metal silicide film is formed by the SALICIDE method. As shown in FIG. 60A and FIG. 60B, in pixel region RPE, metal silicide films MS are formed on a portion of the upper surface of gate electrode TGE of transfer transistor TT, and the surface of floating diffusion region FDR. In pixel transistor RTP, metal silicide films MS are formed on the upper surface of gate electrode PEGE of field effect transistor NHT and the surface of source-drain region HNDF. As shown in FIG. 60C, in first peripheral region RPCL, metal silicide films MS are formed on the upper surfaces of gate electrodes NHGE, PHGE, NLGE, PLGE and the surfaces of source-drain regions HNDF, HPDF, LNDF, LPDF. On the other hand, in second peripheral region RPCA, silicide protection film SP1 is formed, so that no metal silicide film is formed.

Figure 61A:
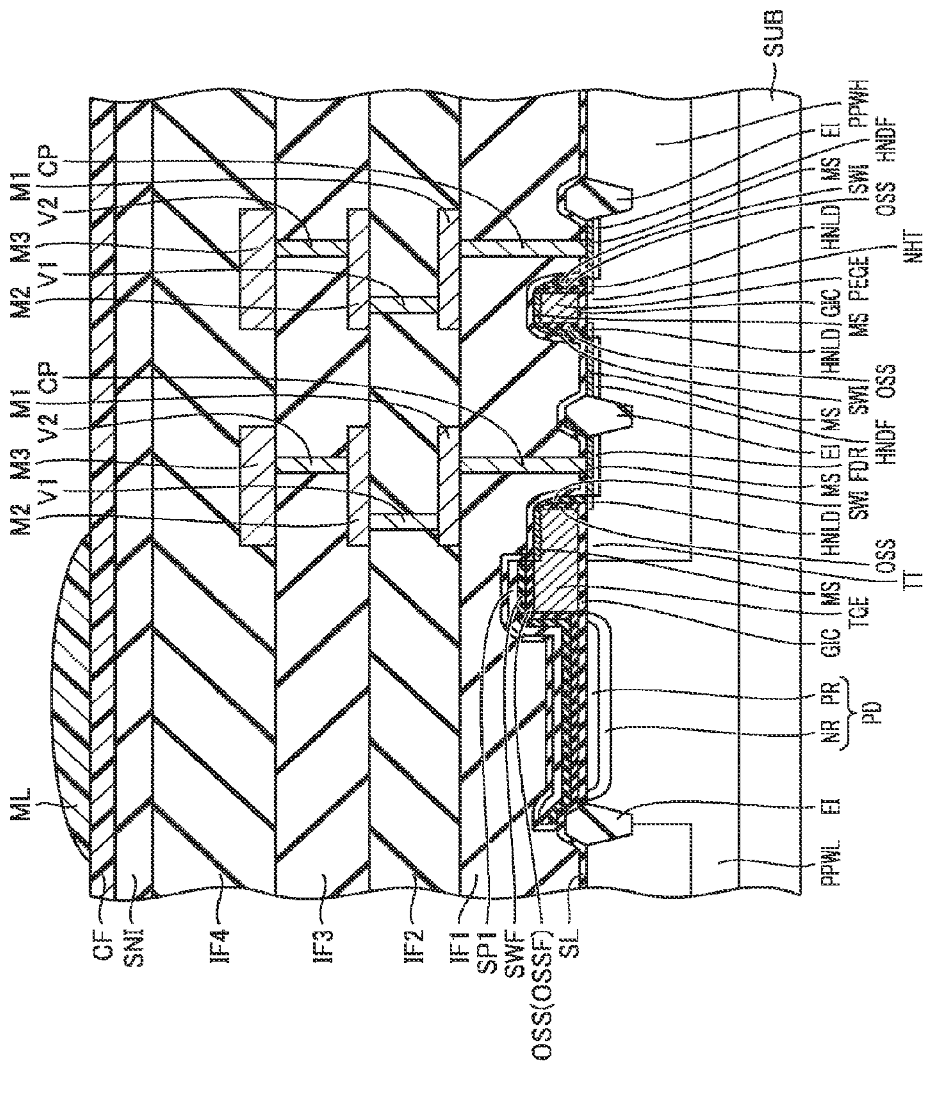
Figure 61B:
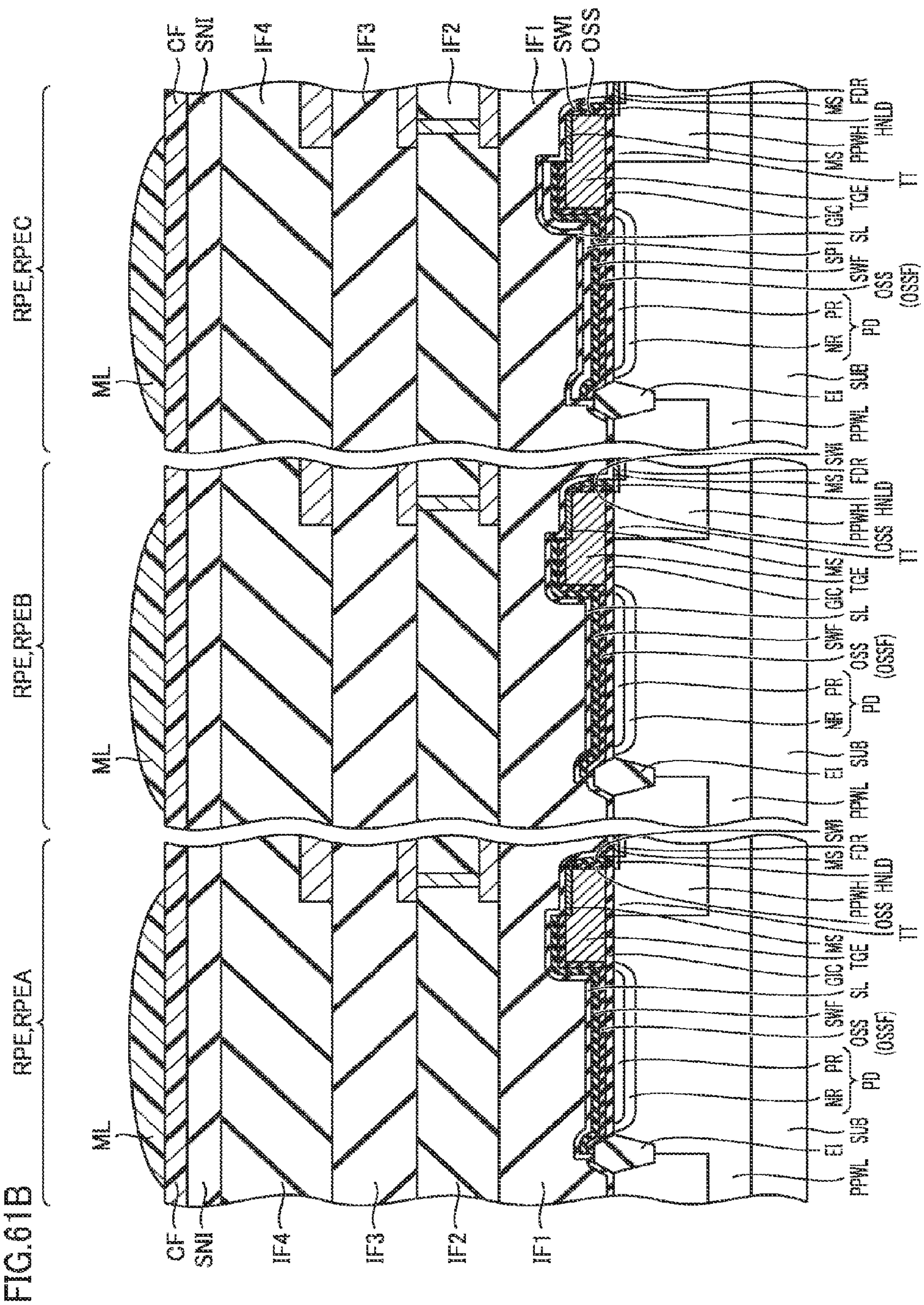
Figure 61C:
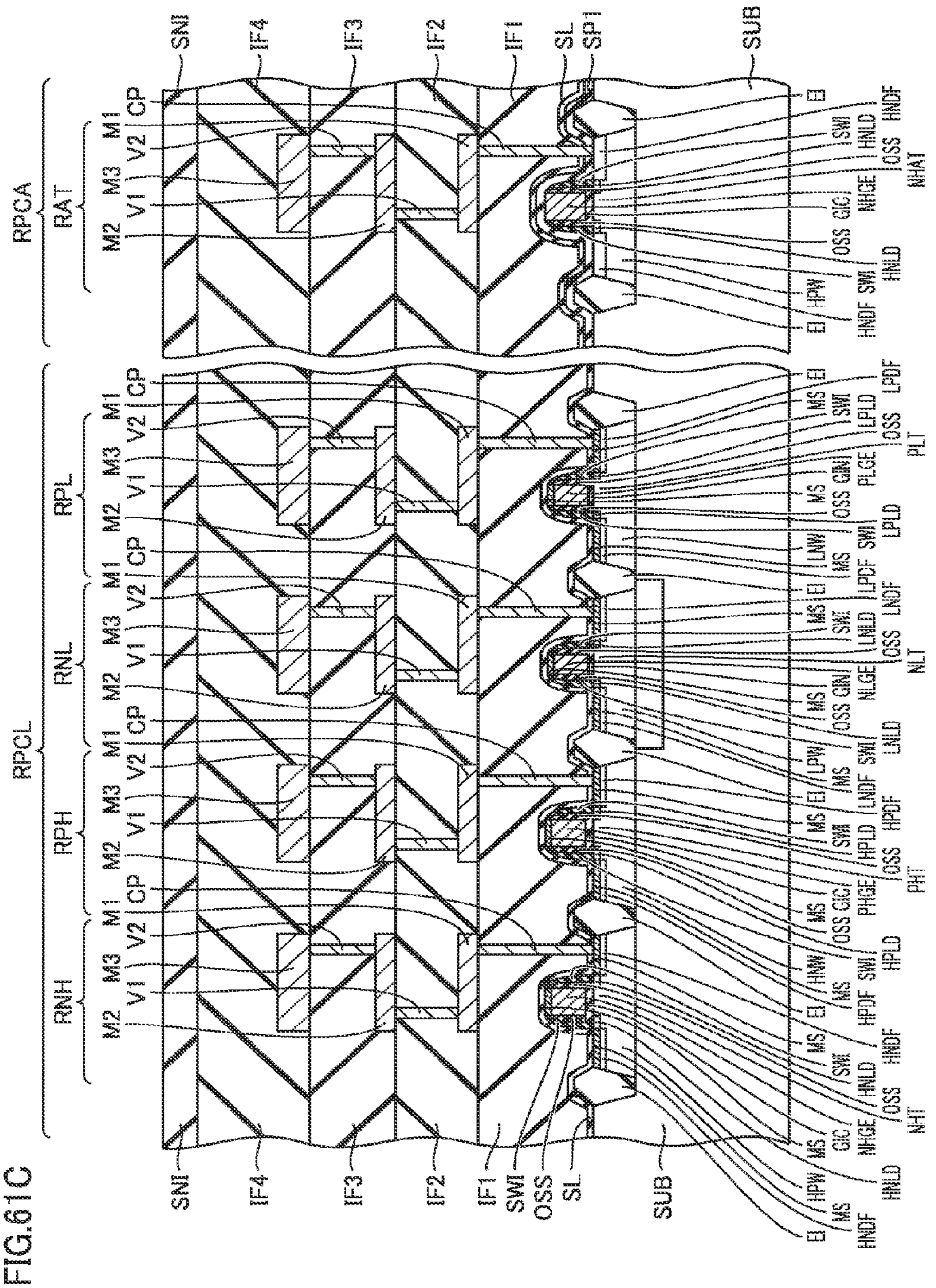

Then, the same steps as those shown in FIG. 25A, FIG. 25B, and FIG. 25C are performed, and thereafter the same steps as those shown in FIG. 26A, FIG. 26B, and FIG. 26C are performed, thereby completing the main part of the image capturing device as shown in FIG. 61A, FIG. 61B, and FIG. 61C.

In the method for manufacturing the image capturing device according to the third embodiment, during the formation of offset spacer film OSS, photo diode PD is covered with resist pattern MOSE. Insulating film OSSF covering photo diode PD is not removed and remains. Accordingly, no damage is caused in photo diode PD as compared with the image capturing device according to the comparative example in which the offset spacer film is removed by performing dry etching process, with the result that dark current resulting from the damage can be reduced in the image capturing device.

Moreover, as shown in FIG. 61B, offset spacer film OSS (OSSF) remains in pixel region RPE, and pixel region RPE includes: pixel region RPEC having the silicide protection film formed therein to function as an antireflection film; and pixel regions RPEA, RPEB each having no silicide protection film formed therein. Accordingly, the strength (light collection ratio) of light passing through the film covering photo diode PD and coming into the photo diode can be adjusted in accordance with a color (wavelength) of light, whereby the sensitivity of the pixel can be set to a desired sensitivity. This will be specifically illustrated in a fourth embodiment.

Furthermore, in the image capturing device according to the third embodiment, source-drain regions HNDF, HPDF, LNDF, LPDF of field effect transistors NHT, PHT, NLT, PLT, NHAT are formed using, as an implantation mask, gate electrodes PEGE, NHGE, PHGE, NLGE, PLGE, and offset spacer films OSS and sidewall insulating films SWI formed on the side wall surfaces of the gate electrodes (see FIG. 55B and FIG. 56B).

In field effect transistors NHT, PHT, NLT, PLT, NHAT, the lengths of gate electrodes NLGE, PLGE of field effect transistors NLT, PLT, which are driven with a low voltage, in the gate length direction are set to be shorter than the lengths of gate electrodes NHGE, PHGE of field effect transistors NHT, PHT, NHAT, which are driven with a high voltage, in the gate length direction. Accordingly, in source-drain regions LNDF, LPDF of field effect transistors NLT, PLT, a distance in the gate length direction is secured as compared with a case where no offset spacer film is formed on each of the side wall surfaces of the gate electrodes, thereby suppressing fluctuation in characteristic as a field effect transistor.

Fourth Embodiment

It has been illustrated that the pixel region of the image capturing device according to the third embodiment is divided into a pixel region having a silicide protection film formed therein and a pixel region having no silicide protection film formed therein. Explained here is a case where the offset spacer films remain and different film thicknesses of silicide protection films are provided. It should be noted that the same members as those in the image capturing device illustrated in the first embodiment are given the some reference characters and are not described repeatedly unless required.

Figure 62A:
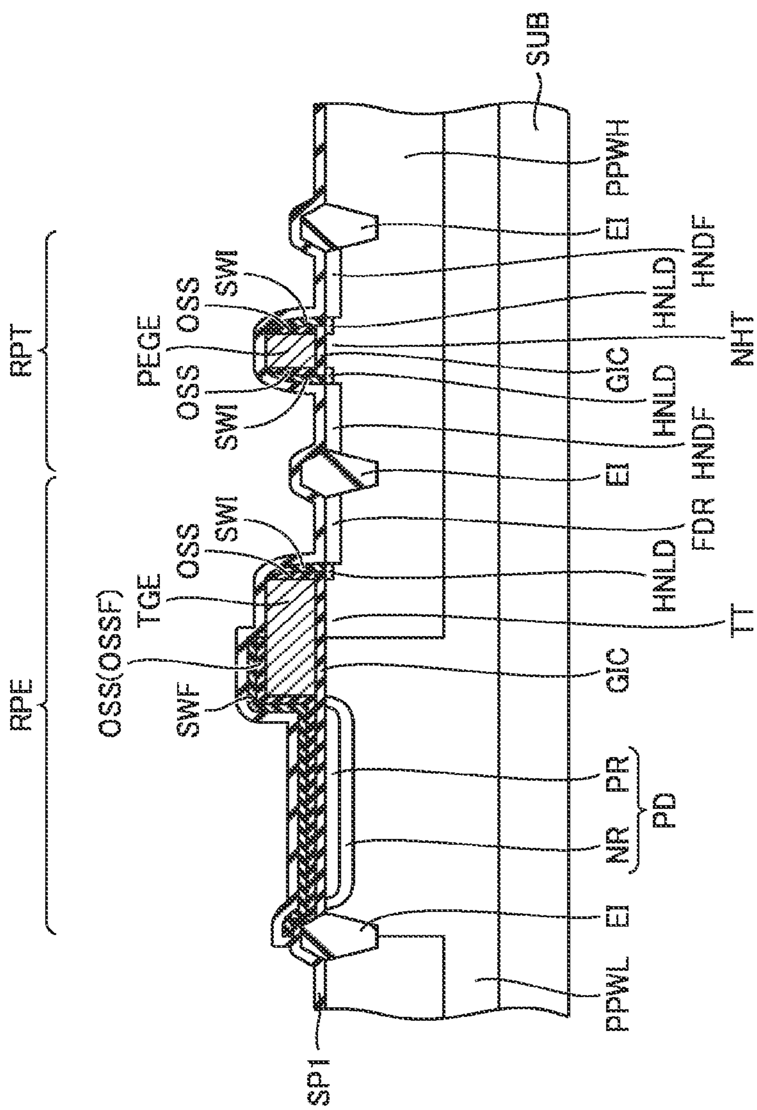
Figure 62B:
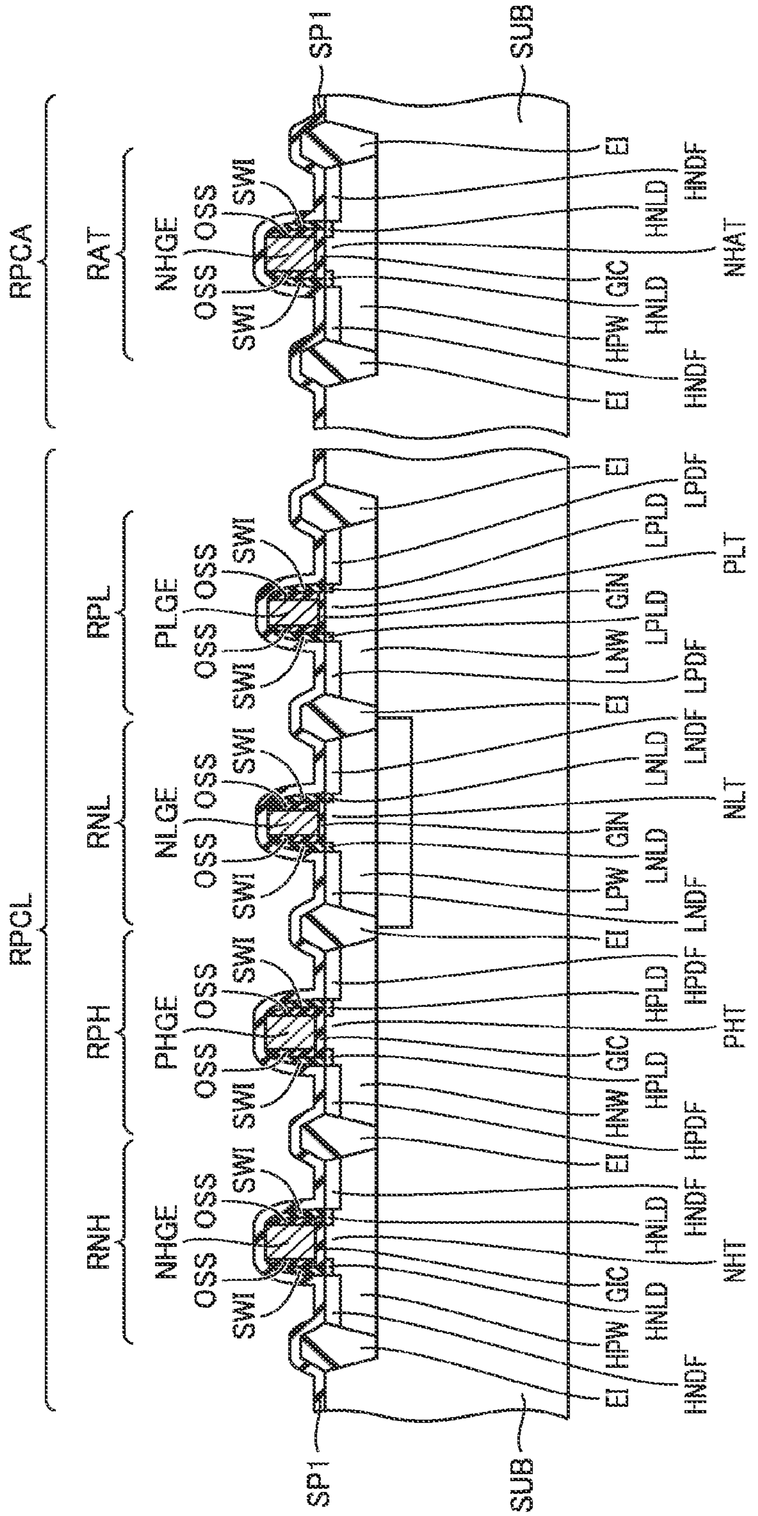
Figure 63A:
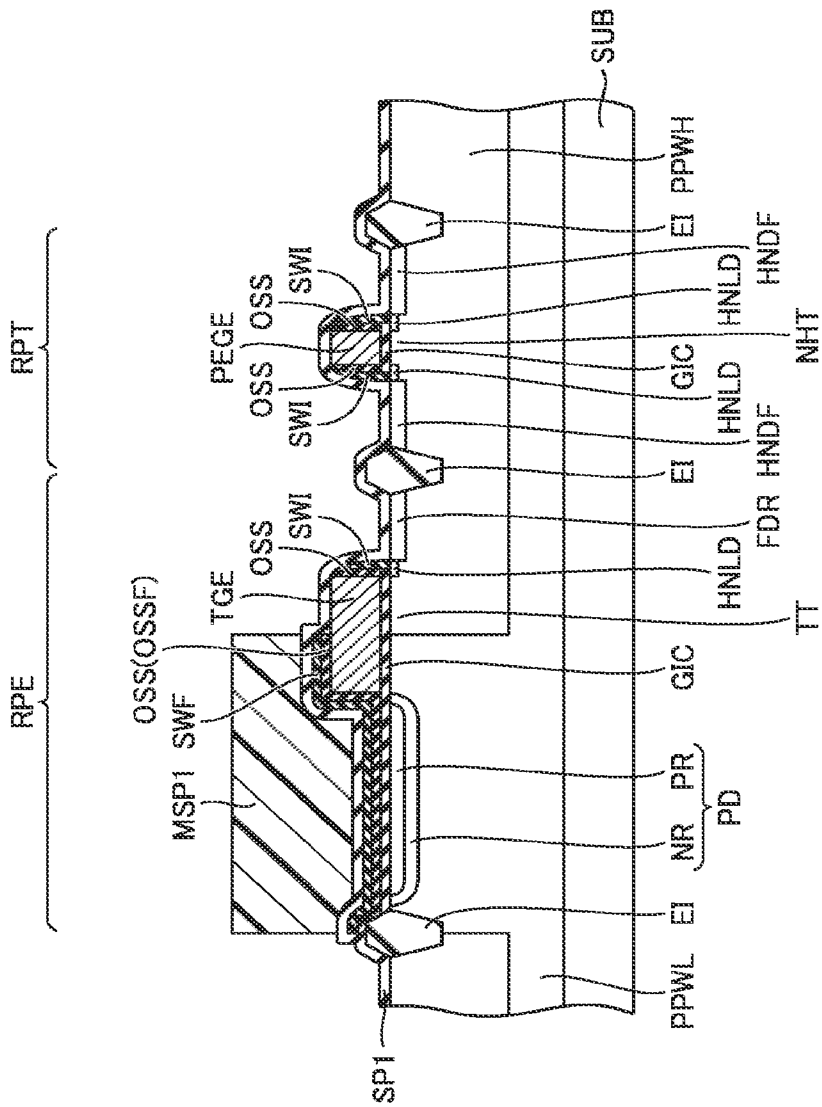
Figure 63B:
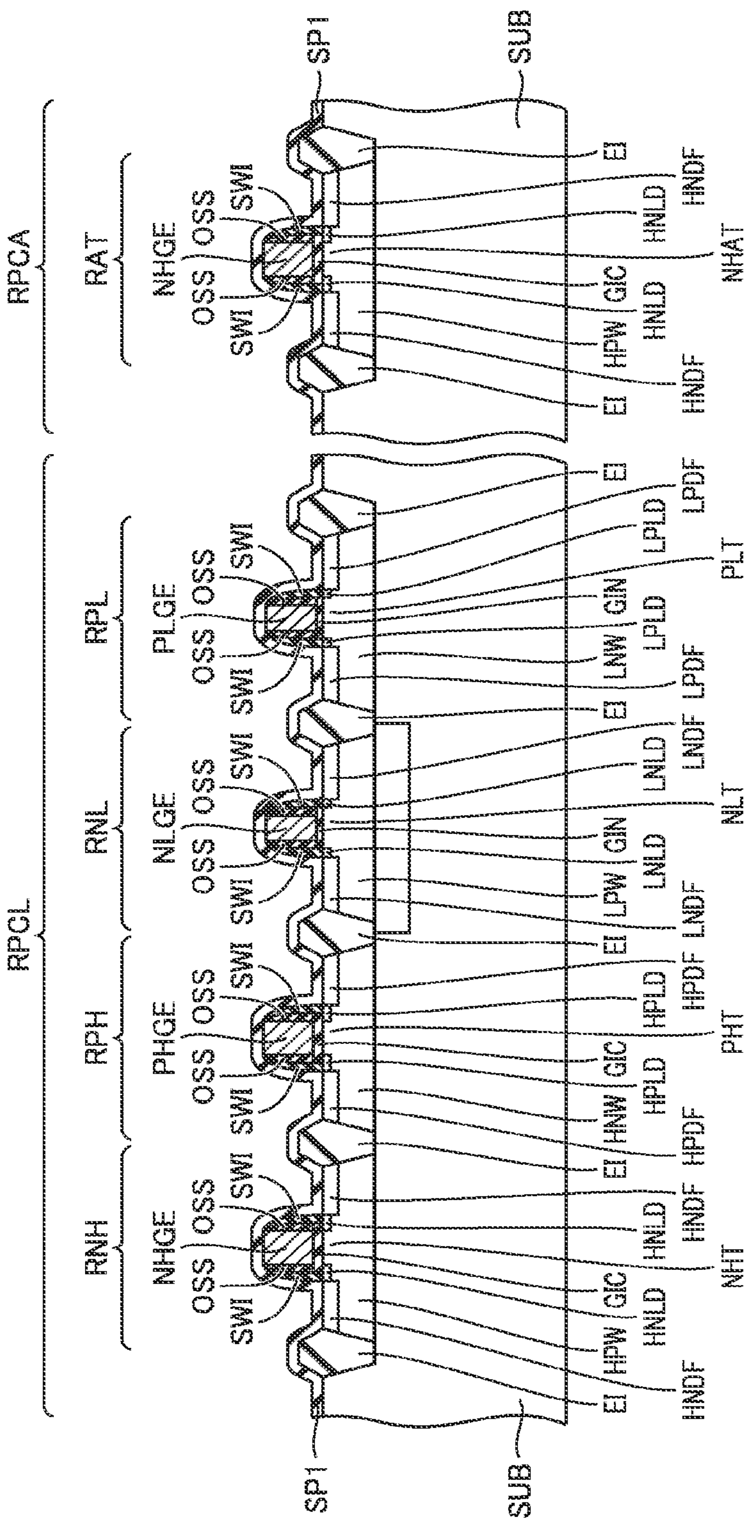

The same steps as those shown in FIG. 50A and FIG. 50B to FIG. 56A and FIG. 56B are performed, and thereafter, the different film thicknesses of the silicide protection films are provided for the pixel regions. As shown in FIG. 62A and FIG. 62B, a first silicide protection film SP1 is formed to cover gate electrodes TGE, PEGE, NHGE, PHGE, NLGE, PLGE, and the like. Next, by performing a predetermined photolithographic process, a resist pattern MSP1 is formed to cover predetermined pixel region RPE and expose the other regions as shown in FIG. 63A and FIG. 63B.

Here, as with the second embodiment, in pixel region RPE, in order to form the first silicide protection film for a pixel region RPEB (see FIG. 64) corresponding to a predetermined one of the three colors, resist pattern MSP1 is formed to cover pixel region RPEB and expose pixel regions RPEA, RPEC corresponding to the rest two of the colors.

Next, as shown in FIG. 64, wet etching process is performed using resist pattern MSP1 as an etching mask, thereby removing exposed silicide protection film SP1. On this occasion, silicide protection film SP1 covering region RAT of second peripheral region RPCA is also removed. Then, resist pattern MSP1 is removed. Next, as shown in FIG. 65A and FIG. 65B, in order to cover gate electrodes TGE, PEGE, NHGE, PHGE, NLGE, PLGE and the like, a second silicide protection film SP2 is formed.

On this occasion, as shown in FIG. 65C, in pixel region RPE at pixel region RPEB having first silicide protection film SP1 formed therein, silicide protection film SP2 is formed to cover silicide protection film SP1, gate electrode TGE, and the like. In pixel regions RPEA and RPEC having no silicide protection film SP1, silicide protection film SP2 is formed to cover insulating film SWF and gate electrode TGE.

Next, by performing a predetermined photolithographic process, as shown in FIG. 66A and FIG. 66B, resist pattern MSP2 is formed to cover predetermined pixel region RPE and region RAT of second peripheral region RPCA and expose the other regions. Here, as shown in FIG. 66C, in pixel region RPE, in order to form a second silicide protection film in pixel region RPEB corresponding to one predetermined color and form a first silicide protection film in pixel region RPEC corresponding to another predetermined color, resist pattern MSP2 is formed to cover pixel regions RPEB, RPEC and expose pixel region RPEA.

Next, as shown in FIG. 67A, FIG. 67B, and FIG. 67C, wet etching process is performed using resist pattern MSP2 as an etching mask, thereby removing exposed silicide protection film SP2. Then, by removing resist pattern MSP2, as shown in FIG. 68A and FIG. 68B, silicide protection film SP2 remaining in each of pixel region RPE and region RAT is exposed. Accordingly, two silicide protection films SP1, SP2 are formed in pixel region RPEB, and one silicide protection film SP2 is formed in pixel region RPEC as shown in FIG. 68C. Moreover, no silicide protection film is formed in pixel region RPEA. In this way, the different film thicknesses of the silicide protection films can be provided for pixel region RPE.

Next, a metal silicide film is formed by the SALICIDE method. As shown in FIG. 69A and FIG. 69B, in pixel region RPE, metal silicide films MS are formed on a portion of the upper surface of gate electrode TGE of transfer transistor TT and the surface of floating diffusion region FDR. In pixel transistor RTP, metal silicide films MS are formed on the upper surface of gate electrode PEGE of the field effect transistor and the surface of source-drain region HNDF. As shown in FIG. 69C, in first peripheral region RPCL, metal silicide films MS are formed on the upper surfaces of gate electrodes NHGE, PHGE, NLGE, PLGE and the surfaces of source-drain regions HNDF, HPDF, LNDF, LPDF. On the other hand, in second peripheral region RPCA, silicide protection film SP2 is formed, so that no metal silicide film is formed.

Then, the same steps as those shown in FIG. 25A, FIG. 25B, and FIG. 25C are performed, and thereafter the same steps as those shown in FIG. 26A, FIG. 26B, and FIG. 26C are performed, thereby completing the main part of the image capturing device as shown in FIG. 70A, FIG. 70B, and FIG. 70C.

In the method for manufacturing the image capturing device according to the fourth embodiment, as with the method for manufacturing the image capturing device according to the third embodiment, during the formation of offset spacer film OSS, photo diode PD is covered with resist pattern MOSE. Insulating film OSSF covering photo diode PD is not removed and remains. Accordingly, no damage is caused in photo diode PD as compared with the image capturing device according to the comparative example in which the offset spacer film is removed by performing dry etching process, with the result that dark current resulting from the damage can be reduced in the image capturing device.

Moreover, in pixel region RPE of the image capturing device according to the fourth embodiment, the insulating film serving as the offset spacer film is not removed and remains and the different film thicknesses of the silicide protection films serving as antireflection films are provided to cover the remaining insulating film. Specifically, pixel region RPE is provided with: pixel region RPEB having silicide protection films SP1, SP2 having a relatively thick film thickness; pixel region RPEC having silicide protection film SP2 having a relatively thin film thickness; and pixel region RPEA having no silicide protection film (see FIG. 70B).

On the other hand, in pixel region PRE of the image capturing device according to the third embodiment, the insulating film to serve as the offset spacer film is not removed and remains, and there are provided pixel region RPEC having silicide protection film SP1 formed therein and pixel regions RPEA, RPEB having no silicide protection film formed therein (see FIG. 61B).

Accordingly, depending on a color (wavelength) of light, the strength (light collection ratio) of the light, which passes through the film covering photo diode PD and comes into the photo diode, can be increased. Regarding this, assuming light of one of red, green and blue by way of example, the following describes a relation between the transmittance of the laminate film covering the photo diode and the film thickness of the silicide protection film or the like.

As shown in FIG. 71, first, offset spacer film OSS is constituted of an oxide film. Sidewall insulating film SWI covering the photo diode is constituted of two layers, i.e., an oxide film and a nitride film. Silicide protection film SP is constituted of an oxide film. Stress liner film SL is constituted of two layers, i.e., an oxide film and a nitride film.

In this case, a graph therein shows a relation between the transmittance of the laminate film covering the photo diode and the total film thickness of the silicide protection film (oxide film) and the oxide film of the stress liner film as evaluated by the inventors. As shown in the graph, it is seen that the transmittance is changed depending on the film thickness of the silicide protection film and the like.

This result is obtained from the graph for the one exemplary light of red, green or blue in spectrum, but the inventors have confirmed that light other than the exemplary one is also varied in transmittance depending on the film thickness of the silicide protection film and the like. Thus, by providing a pixel region having a silicide protection film formed therein and a pixel region having no silicide protection film formed therein and by providing different thicknesses of silicide protection films in pixel regions having silicide protection films formed therein, there can be manufactured an image capturing device including pixel regions optimal for, for example, specifications required for a digital camera or the like. Specifically, by adjusting the film thickness of the silicide protection film, the sensitivity of the pixel can be increased or the sensitivity of the pixel can be suppressed from being increased too much, whereby the sensitivity of the pixel can be precisely set to a desired sensitivity.

Furthermore, in the image capturing device according to the fourth embodiment, as with the third embodiment, source-drain regions LNDF, LPDF of field effect transistors NLT, PLT having gate electrodes NLGE, PLGE having a relatively short length in the gate length direction are formed using, as an implantation mask, gate electrodes NLGE, PLGE and offset spacer films OSS and sidewall insulating films SWI formed on the side wall surfaces of the gate electrodes. Accordingly, in source-drain regions LNDF, LPDF of field effect transistors NLT, PLT, a distance in the gate length direction is secured as compared with a case where no offset spacer film is formed on each of the side wall surfaces of the gate electrodes, thereby suppressing fluctuation in characteristic as a field effect transistor.

Fifth Embodiment

Explained here is a case where the offset spacer film is removed using an etching mask and the pixel region is divided into a pixel region having a silicide protection film formed therein and a pixel region having no silicide protection film formed therein. It should be noted that the same members as those in the image capturing device illustrated in the first embodiment are given the same reference characters and are not described repeatedly unless required.

First, the same steps as those shown in FIG. 7A and FIG. 7B to FIG. 14A and FIG. 14B are performed, and then, a predetermined photolithographic process is performed as shown in FIG. 72A and FIG. 72B, thereby forming a resist pattern MOSS to expose insulating film OSSF, which is to serve as offset spacer film OSS, covering photo diode PD, and to cover the other regions. Next, as shown in FIG. 73, wet etching process is performed using resist pattern MOSS as an etching mask, thereby removing insulating film OSSF, which is to serve as offset spacer film OSS, covering photo diode PD. Then, resist pattern MOSS is removed.

Next, as shown in FIG. 74A and FIG. 74B, insulating film SWF to serve as the sidewall insulating film is formed to cover gate electrodes TGE, PEGE, NHGE, PHGE, NLGE, PLGE and offset spacer film OSS. Next, a resist pattern MSW (see FIG. 75A) is formed to cover the region in which photo diode PD is disposed and expose the other regions. Next, as shown in FIG. 75A and FIG. 75B, anisotropic etching process is performed onto exposed insulating film SWF using resist pattern MSW as an etching mask.

Accordingly, portions of insulating film SWF are removed from the upper surfaces of gate electrodes TGE, PEGE, NHGE, PHGE, NLGE, PLGE, thereby forming sidewall insulating films SWI constituted of the remaining portions of insulating film SWF on the side wall surfaces of gate electrodes TGE, PEGE, NHGE, PHGE, NLGE, PLGE. Sidewall insulating films SWI are formed to cover the offset spacer films. Then, resist pattern MSW is removed.

Next, by performing the same steps as those shown in FIG. 18A and FIG. 18B (FIG. 55A and FIG. 55B), source-drain regions HPDF, LPDF (see FIG. 76B) are formed. Next, the same steps as those shown in FIG. 19A and FIG. 19B (FIG. 56A and FIG. 56B) are performed, thereby forming source-drain regions HNDF, LNDF (see FIG. 76A and FIG. 76B). Next, as shown in FIG. 76A and FIG. 76B, a silicide protection film SP1, such as a silicon oxide film, for preventing silicidation is formed to cover gate electrodes TGE, PEGE, NHGE, PHGE, NLGE, PLGE, and the like.

Next, the same steps as those shown in FIG. 21A, FIG. 21B, and FIG. 21C to FIG. 23A, FIG. 23B, and FIG. 23C are performed, thereby forming silicide protection film SP1 in pixel region RPE at pixel region RPEC as shown in FIG. 77A, FIG. 77B, and FIG. 77C. Moreover, silicide protection film SP1 is formed in region RAT of second peripheral region RPCA. Next, the same steps as those shown in FIG. 24A, FIG. 24B, and FIG. 24C are performed, thereby forming metal silicide films MS (see FIG. 78A and the like). On this occasion, in second peripheral region RPCA, silicide protection film SP1 is formed, so that no metal silicide film is formed.

Then, the same steps as those shown in FIG. 25A, FIG. 25B, and FIG. 25C are performed, and thereafter the same steps as those shown in FIG. 26A, FIG. 26B, and FIG. 26C are performed, thereby completing the main part of the image capturing device as shown in FIG. 78A, FIG. 78B, and FIG. 78C.

In the method for manufacturing the image capturing device according to the fifth embodiment, insulating film OSSF, which is to serve as the offset spacer film, covering photo diode PD is removed by performing wet etching process using resist pattern MOSS as an etching mask. Accordingly, as described in the first embodiment, no damage is caused in photo diode PD, with the result that a dark current resulting from the damage can be reduced in the image capturing device.

Moreover, the insulating film to serve as the offset spacer film is removed in pixel region RPE of the image capturing device according to the fifth embodiment, and pixel region RPE includes: pixel region RPEC having the silicide protection film formed therein to function as an antireflection film; and pixel regions RPEA, RPEB having no silicide protection film formed therein. Accordingly, as illustrated mainly in the second embodiment, by dividing into a pixel region having a silicide protection film formed therein and a pixel region having no silicide protection film formed therein, the sensitivity of the pixel can be increased or the sensitivity of the pixel can be suppressed from being increased too much, thereby precisely adjusting the sensitivity of the pixel to desired sensitivity.

Furthermore, in the image capturing device according to the fifth embodiment, as with the third embodiment, source-drain regions LNDF, LPDF of field effect transistors NLT, PLT having gate electrodes NLGE, PLGE having a relatively short length in the gate length direction are formed using, as an implantation mask, gate electrodes NLGE, PLGE and offset spacer films OSS and sidewall insulating films SWI formed on the side wall surfaces of the gate electrodes. Accordingly, in source-drain regions LNDF, LPDF of field effect transistors NLT, PLT, a distance in the gate length direction is secured as compared with a case where no offset spacer film is formed on each of the side wall surfaces of the gate electrodes, thereby suppressing fluctuation in characteristic as a field effect transistor.

Sixth Embodiment

It has been illustrated that the pixel region of the image capturing device according to the fifth embodiment is divided into a pixel region having a silicide protection film formed therein and a pixel region having no silicide protection film formed therein. Explained here is a case where the offset spacer films are removed using an etching mask and different film thicknesses of silicide protection films are provided for the pixel regions. It should be noted that the same members as those in the image capturing device illustrated in the first embodiment are given the same reference characters and are not described repeatedly unless required.

The same steps as those shown in FIG. 72A and FIG. 72B to FIG. 75A and FIG. 75B are performed, and thereafter, the different film thicknesses of the silicide protection films are provided for the pixel regions. As shown in FIG. 79A and FIG. 79B, in order to cover gate electrodes TGE, PEGE, NHGE, PHGE, NLGE, PLGE and the like, first silicide protection film SP1 is formed.

Next, the same steps as those shown in FIG. 40A and FIG. 40B to FIG. 46B and FIG. 46C are performed, thereby forming two silicide protection films SP1, SP2 in pixel region RPEB and forming one silicide protection film SP2 in pixel region RPEC as shown in FIG. 80A, FIG. 80B, and FIG. 80C. Moreover, no silicide protection film is formed in pixel region RPEA. Moreover, silicide protection film SP2 is formed in second peripheral region RPCA. In this way, the different film thicknesses of the silicide protection films can be provided for pixel region RPE.

Next, the same steps as those shown in FIG. 24A, FIG. 24B, and FIG. 24C are performed, thereby forming metal silicide films MS (see FIG. 81A and the like). On this occasion, in second peripheral region RPCA, silicide protection film SP2 is formed, so that no metal silicide film is formed.

Then, the same steps as those shown in FIG. 25A, FIG. 25B, and FIG. 25C are performed and thereafter the same steps as those shown in FIG. 26A, FIG. 26B, and FIG. 26C are performed, thereby completing the main part of the image capturing device as shown in FIG. 81A, FIG. 81B, and FIG. 81C.

In the method for manufacturing the image capturing device according to the sixth embodiment, as with the fifth embodiment, insulating film OSSF to serve as the offset spacer film covering photo diode PD is removed by performing wet etching process using resist pattern MOSS as an etching mask. Accordingly, as described in the first embodiment, no damage is caused in photo diode PD, with the result that a dark current resulting from the damage can be reduced in the image capturing device.

Moreover, in pixel region RPE of the image capturing device according to the sixth embodiment, the insulating film to serve as the offset spacer film is removed and the different film thicknesses of the silicide protection films serving as antireflection films are provided. Accordingly, as illustrated mainly in the second embodiment, in the pixel regions having the silicide protection films formed therein, by providing different film thicknesses thereof, the sensitivity of the pixel can be increased or the sensitivity of the pixel can be suppressed from being increased too much, thereby precisely adjusting the sensitivity of the pixel to desired sensitivity.

Furthermore, in the image capturing device according to the sixth embodiment, as with the third embodiment, source-drain regions LNDF, LPDF of field effect transistors NLT, PLT having gate electrodes NLGE, PLGE having a relatively short length in the gate length direction are formed using, as an implantation mask, gate electrodes NLGE, PLGE and offset spacer films OSS and sidewall insulating films SWI formed on the side wall surfaces of the gate electrodes. Accordingly, in source-drain regions LNDF, LPDF of field effect transistors NLT, PLT, a distance in the gate length direction is secured as compared with a case where no offset spacer film is formed on each of the side wall surfaces of the gate electrodes, thereby suppressing fluctuation in characteristic as a field effect transistor.

Seventh Embodiment

Explained here is a case where the offset spacer films remain in the pixel region and the like, the remaining offset spacer films are removed by wet etching process to the entire surface, and the pixel region is divided into a pixel region having a silicide protection film formed therein and a pixel region having no silicide protection film formed therein. It should be noted that the same members as those in the image capturing device illustrated in the first embodiment are given the same reference characters and are not described repeatedly unless required.

The same steps as those shown in FIG. 7A and FIG. 7B to FIG. 11A and FIG. 11B are performed, thereby forming insulating film OSSF to serve as the offset spacer film to cover gate electrodes TGE, PEGE, NHGE, PHGE, NLGE, PLGE as shown in FIG. 82A and FIG. 82B.

Next, by performing a predetermined photolithographic process, resist pattern MOSE (see FIG. 83A) is formed to cover pixel region RPE and pixel transistor region RPT and expose the other regions. Next, as shown in FIG. 83A and FIG. 83B, anisotropic etching process is provided to exposed insulating film OSSF using resist pattern MOSE as an etching mask. Accordingly, the portions of insulating film OSSF on the upper surfaces of gate electrodes NHGE, PHGE, NLGE, PLGE are removed, thereby forming offset spacer films OSS constituted of the remaining portions of insulating film OSSF on the side wall surfaces of gate electrodes NHGE, PHGE, NLGE, PLGE. Then, resist pattern MOSE is removed.

Next, as shown in FIG. 84A and FIG. 84B, a predetermined photolithographic process is performed, thereby forming resist pattern MLNL to expose region RNL and cover the other regions. Next, an n type impurity is implanted using resist pattern MLNL, offset spacer films OSS, and gate electrode NLGE as an implantation mask, thereby forming an extension region LNLD in exposed region RNL. Then, resist pattern MLNL is removed.

Next, as shown in FIG. 85A and FIG. 85B, a predetermined photolithographic process is provided, thereby forming a resist pattern MLPL to expose region RPL and cover the other regions. Next, a p type impurity is implanted using resist pattern MLPL, offset spacer films OSS, and gate electrode PLGE as an implantation mask, thereby forming an extension region LPLD in exposed region RPL. Then, resist pattern MLPL is removed.

Next, as shown in FIG. 86A and FIG. 86B, wet etching process is performed onto the entire surface of semiconductor substrate SUB, thereby removing offset spacer film OSS (insulating film OSSF) covering each of pixel region RPE and pixel transistor region RPT and offset spacer film OSS formed on the side wall surface of each of gate electrodes TGE, PEGE, NHGE, PHGE, NLGE, PLGE.

Next, the same steps as those shown in FIG. 16A and FIG. 16B to FIG. 19A and FIG. 19B are performed, and thereafter, silicide protection film SP1 is formed to cover gate electrodes TGE, PEGE, NHGE, PHGE, NLGE, PLGE, and the like as shown in FIG. 87A and FIG. 87B.

Next, the same steps as those shown in FIG. 21A, FIG. 21B, and FIG. 21C to FIG. 23A, FIG. 23B, and FIG. 23C are performed, thereby forming silicide protection film SP1 in pixel region RPE at pixel region RPEC as shown in FIG. 88A, FIG. 88B, and FIG. 88C. Moreover, silicide protection film SP1 is formed in region RAT of second peripheral region RPCA. Next, the same steps as those shown in FIG. 24A, FIG. 24B, and FIG. 24C are performed, thereby forming metal silicide films MS (see FIG. 89A and the like). On this occasion, in second peripheral region RPCA, silicide protection film SP1 is formed, so that no metal silicide film is formed.

Then, the same steps as those shown in FIG. 25A, FIG. 25B, and FIG. 25C are performed, and thereafter the same steps as those shown in FIG. 26A, FIG. 26B, and FIG. 26C are performed, thereby completing the main part of the image capturing device as shown in FIG. 89A, FIG. 89B, and FIG. 89C.

In the method for manufacturing the image capturing device according to the seventh embodiment, insulating film OSSF, which is to serve as the offset spacer film, covering pixel region RPE and pixel transistor region RPT are removed together with offset spacer film OSS by performing wet etching process to the entire surface (see FIG. 87A and FIG. 87B). Accordingly, as described in the first embodiment, no damage is caused in photo diode PD, with the result that a dark current resulting from the damage can be reduced in the image capturing device.

In pixel region RPE of the image capturing device according to the seventh embodiment, the insulating film to serve as the offset spacer film is removed and pixel region RPE includes: pixel region RPEC having the silicide protection film formed therein to function as an antireflection film; and pixel regions RPEA, RPEB having no silicide protection film formed therein. Accordingly, as illustrated mainly in the second embodiment, by dividing the pixel region into a pixel region having a silicide protection film formed therein and a pixel region having no silicide protection film formed therein, the sensitivity of the pixel can be increased or the sensitivity of the pixel can be suppressed from being increased too much, thereby precisely adjusting the sensitivity of the pixel to desired sensitivity.

Eighth Embodiment

It has been illustrated that the pixel region of the image capturing device according to the seventh embodiment is divided into a pixel region having a silicide protection film formed therein and a pixel region having no silicide protection film formed therein. Explained here is a case where the offset spacer films remain in the pixel region and the like, the remaining offset spacer films are removed by wet etching process to the entire surface, and different film thicknesses of silicide protection films are provided in the pixel regions. It should be noted that the same members as those in the image capturing device illustrated in the first embodiment are given the same reference characters and are not described repeatedly unless required.

The same steps as those shown in FIG. 82A and FIG. 82B to FIG. 86A and FIG. 86B are performed, and thereafter, the different film thicknesses of the silicide protection films are provided for the pixel region. As shown in FIG. 90A and FIG. 90B, in order to cover gate electrodes TGE, PEGE, NHGE, PHGE, NLGE, PLGE and the like, first silicide protection film SP1 is formed.

Next, the same steps as those shown in FIG. 40A and FIG. 40B to FIG. 46B and FIG. 46C are performed, thereby forming two silicide protection films SP1, SP2 in pixel region RPEB and forming one silicide protection film SP2 in pixel region RPEC as shown in FIG. 91A, FIG. 91B, and FIG. 91C. Moreover, no silicide protection film is formed in pixel region RPEA. Moreover, silicide protection film SP2 is formed in second peripheral region RPCA. In this way, the different film thicknesses of the silicide protection films can be provided for pixel region RPE.

Next, the same steps as those shown in FIG. 24A, FIG. 24B, and FIG. 24C are performed, thereby forming metal silicide films MS (see FIG. 92A and the like). On this occasion, in second peripheral region RPCA, silicide protection film SP2 is formed, so that no metal silicide film is formed.

Then, the same steps as those shown in FIG. 25A, FIG. 25B, and FIG. 25C are performed, and thereafter the same steps as those shown in FIG. 26A, FIG. 26B, and FIG. 26C are performed, thereby completing the main part of the image capturing device as shown in FIG. 92A, FIG. 92B, and FIG. 92C.

In the method for manufacturing the image capturing device according to the eighth embodiment, as with the seventh embodiment, insulating film OSSF, which is to serve as the offset spacer film, covering pixel region RPE and pixel transistor region RPT are removed together with offset spacer film OSS by performing wet etching process to the entire surface (see FIG. 86A and FIG. 86B). Accordingly, as described in the first embodiment, no damage is caused in photo diode PD, with the result that a dark current resulting from the damage can be reduced in the image capturing device.

Moreover, in pixel region RPE of the image capturing device according to the eighth embodiment, the insulating film to serve as the offset spacer film is removed and the different film thicknesses of the silicide protection films serving as antireflection films are provided. Accordingly, as illustrated mainly in the second embodiment, in the pixel regions having the silicide protection films formed therein, by providing the different film thicknesses thereof, the sensitivity of the pixel can be increased or the sensitivity of the pixel can be suppressed from being increased too much, thereby precisely adjusting the sensitivity of the pixel to desired sensitivity.

Ninth Embodiment

In each of the embodiments, as the sidewall insulating film, the sidewall insulating film constituted of two layers has been exemplified and illustrated. Explained here is a case where a sidewall insulating film constituted of three layers is formed as the sidewall insulating film in the method for manufacturing the image capturing device according to the first embodiment. It should be noted that the same members as those in the image capturing device illustrated in the first embodiment are given the same reference characters and are not described repeatedly unless required.

The same steps as those shown in FIG. 7A and FIG. 7B to FIG. 11A and FIG. 11B are performed, thereby forming insulating film OSSF to serve as the offset spacer film so as to cover gate electrodes TGE, PEGE, NHGE, PHGE, NLGE, PLGE as shown in FIG. 93A and FIG. 93B. Next, a predetermined photolithographic process is performed, thereby forming a resist pattern MOSE (sec FIG. 94A) to cover the region in which photo diode PD is disposed and expose the other regions. Next, as shown in FIG. 94A and FIG. 94B, anisotropic etching process is provided to exposed insulating film OSSF using resist pattern MOSE as an etching mask, thereby forming offset spacer film OSS. Then, resist pattern MOSE is removed.

Next, as shown in FIG. 95A and FIG. 95B, a predetermined photolithographic process is performed, thereby forming resist pattern MLNL to expose region RNL and cover the other regions. Next, an n type impurity is implanted using resist pattern MLNL, offset spacer film OSS, and gate electrode NLGE as an implantation mask, thereby forming an extension region LNLD in exposed region RNL. Then, resist pattern MLNL is removed.

Next, as shown in FIG. 96A and FIG. 96B, a predetermined photolithographic process is provided, thereby forming a resist pattern MLPL to expose region RPL and cover the other regions. Next, a p type impurity is implanted using resist pattern MLPL, offset spacer films OSS, and gate electrode PLGE as an implantation mask, thereby forming an extension region LPLD in exposed region RPL. Then, resist pattern MLPL is removed.

Next, as shown in FIG. 97A and FIG. 97B, wet etching process is performed onto the entire surface of semiconductor substrate SUB, thereby removing offset spacer film OSS (insulating film OSSF) covering photo diode PD and removing offset spacer film OSS formed on the side wall surface of each of gate electrodes TGE, PEGE, NHGE, PHGE, NLGE, PLGE.

Next, as shown in FIG. 98A and FIG. 98B, an insulating film SWF to serve as the sidewall insulating film is formed to cover each of gate electrodes TGE, PEGE, NHGE, PHGE, NLGE, PLGE. As the insulating film, an insulating film is formed which is constituted of three layers by sequentially providing oxide film SWF1, nitride film SWF2 and oxide film SWF3. Next, a resist pattern MSW (see FIG. 99A) is formed to cover the region in which photo diode PD is disposed and expose the other regions.

Next, as shown in FIG. 99A and FIG. 99B, sidewall insulating films SWI1, SWI2, SWI3 are formed on the side wall surfaces of gate electrodes TGE, PEGE, NHGE, PHGE, NLGE, PLGE by providing anisotropic etching process to exposed insulating films SWF3, SWF2, SWF1 using resist pattern MSW as an etching mask. Then, resist pattern MSW is removed.

Next, as shown in FIG. 100A and FIG. 100B, a predetermined photolithographic process is performed, thereby forming a resist pattern MPDF to expose regions RPH, RPL and cover the other regions. Next, a p type impurity is implanted using resist pattern MPDF, sidewall insulating films SWI1 to SWI3 and gate electrodes PHGE, PLGE as an implantation mask, thereby forming a source-drain region HPDF in region RPH and forming a source-drain region LPDF in region RPL. Then, resist pattern MPDF is removed.

Next, as shown in FIG. 101A and FIG. 101B, a predetermined photolithographic process is performed, thereby forming a resist pattern MNDF to expose regions RPT, RNH, RNL, RAT and cover the other regions. Next, an n type impurity is implanted using resist pattern MNDF, sidewall insulating film SWI1 to SWI3 and gate electrodes TGE, PEGE, NHGE, NLGE as an implantation mask, thereby forming a source-drain region HNDF in each of regions RPT, RNH, RAT and forming a source-drain region LNDF in region RNL. Moreover, on this occasion, in pixel region RPE, floating diffusion region FDR is formed. Then, resist pattern MNDF is removed.

Next, wet etching process is performed onto the entire surface of semiconductor substrate SUB. Accordingly, the uppermost sidewall insulating film SWI3 of three sidewall insulating films SWI1 to SWI3 is removed as shown in FIG. 102A and FIG. 102B. Here, by removing the uppermost sidewall insulating film SWI3, there can be obtained substantially the same structure as the structure obtained by forming the sidewall insulating film constituted of two layers.

Next, as shown in FIG. 103A and FIG. 103B, a silicide protection film SP1, such as a silicon oxide film, for preventing silicidation is formed to cover gate electrodes TGE, PEGE, NHGE, PHGE, NLGE, PLGE, and the like. Next, the same steps as those shown in FIG. 21A, FIG. 21B, and FIG. 21C to FIG. 26A, FIG. 26B, and FIG. 26C are performed, thereby completing the main part of the image capturing device as shown in FIG. 104A and FIG. 104B.

In the method for manufacturing the image capturing device according to the ninth embodiment, the following effect is obtained in addition to the effect of reducing the dark current resulting from the damage and the effect of manufacturing an image capturing device including an optimal pixel region as illustrated in the first embodiment.

First, as shown in the upper part of FIG. 105, in the image capturing device according to the comparative example, offset spacer film COSS remains, for example, on the side wall surface of gate electrode CTGE of transfer transistor CTT. Sidewall insulating film CSWI is formed on the side wall surface of gate electrode CTGE to cover offset spacer film COSS. Sidewall insulating film CSWI is constituted of two layers, i.e., sidewall insulating film CSWI1 and sidewall insulating film CSWI2.

Floating diffusion region CFDR of transfer transistor CTT is formed using gate electrode CTGE, offset spacer film COSS, and sidewall insulating film CSWI as an implantation mask. On this occasion, a distance (length) from a position just below the side wall surface of gate electrode CTGE to floating diffusion region CFDR is regarded as a distance DC.

Next, as shown in the middle part of FIG. 105, in the image capturing device according to the first embodiment, on the side wall surface of gate electrode TGE of transfer transistor TT, the offset spacer film does not remain and sidewall insulating film SWI formed. Sidewall insulating film SWI is constituted of two layers, i.e., sidewall insulating film SWI1 and sidewall insulating film SWI2. Floating diffusion region FDR of transfer transistor TT is formed using gate electrode TGE and sidewall insulating film SWI as an implantation mask. On this occasion, a distance (length) from a position just below the side wall surface of gate electrode TGE to floating diffusion region FDR is regarded as a distance D1.

Next, as shown in the lower part of FIG. 105, on the side wall surface of gate electrode TGE of transfer transistor TT in the image capturing device according to the ninth embodiment, the offset spacer film does not remain and sidewall insulating film SWI is formed. Sidewall insulating film SWI is constituted of three layers, i.e., sidewall insulating film SWI1, sidewall insulating film SWI2, and sidewall insulating film SWI3. Floating diffusion region FDR of transfer transistor TT is formed using gate electrode TGE and sidewall insulating film SWI as an implantation mask. On this occasion, a distance (length) from a position just below the side wall surface of gate electrode TGE to floating diffusion region FDR is regarded as a distance D2.

Thus, distance D1 is shorter than distance DC in the comparative example because the offset spacer film has been removed. On the other hand, even though the offset spacer film has been removed, distance D2 is longer than distance D1 because sidewall insulating film SWI is constituted of three layers. Accordingly, in the image capturing device according to the ninth embodiment, the distance (length) from the position just below the side wall surface of gate electrode TGE to floating diffusion region FDR is secured, thereby suppressing fluctuation in transistor characteristic of transfer transistor TT.

It should be noted that the transfer gate electrode has been exemplified and illustrated herein, but the fluctuation in transistor characteristic can be suppressed in a similar manner also in other field effect transistors in each of which the offset spacer film is removed. Moreover, the explanation has been made based on the manufacturing method of the first embodiment, but the present invention is not limited to this manufacturing method and is applicable to a method for manufacturing an image capturing device in which an offset spacer film is removed.

Thus far, the invention made by the present inventors has been illustrated specifically based on the embodiments but the present invention is not limited to the embodiments and can be modified in various ways as long as the modification does not deviate from the essential part of the invention.

REFERENCE SIGNS LIST

IS: image capturing device; PE: pixel; PEA: pixel A; PEB: pixel B; PEC: pixel C; VSC: vertical scanning circuit;

HSC: horizontal scanning circuit; PD: photo diode; NR: n type region; PR: p type region; VTC: voltage conversion circuit; RC: row circuit; TT: transfer transistor; TGE: gate electrode; FDR: floating diffusion region; RT: resetting transistor; RGE: gate electrode; AT: amplification transistor; AGE: gate electrode; ST: selection transistor; SGE: gate electrode; PEGE: gate electrode; SUB: semiconductor substrate; EI: element isolation insulating film; EF1, EF2, EF3, EF4: element formation region; RPE, RPEA, RPEB, RPEC: pixel region; RPT: pixel transistor region; RPCL: first peripheral region; RPCA: second peripheral region; RNH, RPH, RNL, RPL, RAT: region; NHT, PHT, NLT, PLT, NHAT: field effect transistor; PPWL, PPWH: P well; HPW: P well; HNW: N well; LPW: P well; LNW: N well; GIC, GIN: gate insulating film; NHGE, PHGE, NLGE, PLGE, PEGE: gate electrode; HNLD, HPLD: extension region; OSS: offset spacer film; LNLD, LPLD: extension region; SWF: insulating film; SWI: sidewall insulating film; SWF1, SWF2, SWF3: insulating film; SWI1, SWI2, SWI3: sidewall insulating film; HPDF, LPDF, HNDF, LNDF: source-drain region; SP1, SP2: silicide protection film; MS: metal silicide film; SL: stress liner film; IF1: first interlayer insulating film; CH: contact hole; CP: contact plug; M1: first interconnection; IF2: second interlayer insulating film; V1: first via; M2: second interconnection; IF3: third interlayer insulating film; V2: second via; M3: third interconnection; IF4: fourth interlayer insulating film; SNI: insulating film; CF: color filter; ML: micro lens; MHNL, MHPL, MOSE, MOSS, MLNL, MLPL, MSW, MPDF, MNDF, MSP1, MSP2: resist pattern.

The invention claimed is:

1. A method for manufacturing an image capturing device including a photoelectric conversion region, a transfer transistor and a floating diffusion region, the method comprising the steps of:

(a) defining a pixel region by forming an element isolation insulating film in a semiconductor substrate;

(b) forming a transfer gate electrode of said transfer transistor in said pixel region, said transfer gate electrode having a first side surface and a second side surface opposite to said first side surface;

(c) forming said photoelectric conversion region at a portion of said pixel region on said first side surface side of said transfer gate electrode;

(d) forming a first insulating film so as to cover said pixel region;

(e) removing a portion of said first insulating film on said photoelectric conversion region and said first side surface of said transfer gate electrode by performing a wet etching process;

(f) forming a second insulating film so as to cover said pixel region;

(g) removing a portion of said first insulating film and a portion of said second insulating film by anisotropic etching while protecting said photoelectric conversion region and said first side surface of said transfer gate electrode;

wherein in step (g), a first sidewall spacer is formed from said second insulating film so as to extend from said first side surface of said transfer gate electrode to said photoelectric conversion region, and a second side wall spacer is formed from said first insulating film and said second insulating film so as to cover said second side surface of said transfer gate electrode;

and (h) forming said floating diffusion region in said pixel region on said second side surface side of said transfer gate electrode by implanting an impurity of a predetermined conductivity type using said second sidewall spacer as an implantation mask.

2. The method for manufacturing the image capturing device according to claim 1, further comprising, after step (d) and before step (e), the steps of:

(i1) forming a resist pattern over said first insulating film on said photoelectric conversion region and said first side surface of said transfer gate electrode, (i2) performing anisotropic etching of said first insulating film to form an offset spacer on said second side surface of transfer gate electrode; and (i3) removing said resist pattern.

3. The method for manufacturing the image capturing device according to claim 2, further comprising, after step (i3), the step of:

forming an extension diffusion region in said pixel region on said second side surface side of said transfer gate electrode by implanting an impurity of a predetermined conductivity type using said offset spacer as an implantation mask.

4. The method for manufacturing the image capturing device according to claim 1, wherein said pixel region is one of a first pixel region, a second pixel region, and a third pixel region respectively corresponding to red, green and blue, said photoelectric conversion region, is one of a first photoelectric conversion region in said first pixel region, a second photoelectric conversion region in said second pixel region, and a third photoelectric conversion region in said third pixel region, and the method further comprises, after the step (h), the steps of:

(j) forming a silicidation blocking film to cover said pixel region including said first photoelectric conversion region, said second photoelectric conversion region, and said third photoelectric conversion region;

(k) removing a portion of said silicidation blocking film; and (l) forming a metal silicide film, wherein in step (k), said silicidation blocking film is processed such that a portion of said silicidation blocking film covers at least one of said first to third photoelectric conversion region.

5. The method for manufacturing the image capturing device according to claim 4, wherein in step (k), said silicidation blocking film is processed such that portions of said silicidation blocking film cover two of said first to third photoelectric conversion regions, and said silicidation blocking film remaining on one of said two photoelectric conversion regions has a film thickness different from a film thickness of said silicidation blocking film remaining on the other of said two photoelectric conversion regions.

6. The method for manufacturing the image capturing device according to claim 1, wherein said second sidewall spacer formed in said step (g) is constituted of at least two layers.

7. An image capturing device, comprising:

a pixel region defined by an element isolation insulating film formed in a semiconductor substrate, said pixel region including:

a first pixel region, a second pixel region, and a third pixel region, respectively corresponding to red, green and blue, and each including a photoelectric conversion unit, a transfer transistor, and a floating diffusion region, a transfer gate electrode of each transfer transistor having a first side surface and a second side surface opposite to said first side surface, each photoelectric conversion region being formed at a portion of the corresponding pixel region on said first side surface side of the corresponding transfer gate electrode, and each floating diffusion region being formed at a portion of the corresponding pixel region on said second side surface side of the corresponding transfer gate electrode, a respective offset spacer film being formed on said second side surface of each transfer gate electrode;

a respective sidewall insulating film being formed so as to extend from over said first side surface of each transfer gate electrode to over the corresponding photoelectric conversion region and formed over said second side surface of that transfer gate electrode to cover the corresponding offset spacer film; and a silicidation blocking film formed to cover said photoelectric conversion region of at least one of said first to third pixel regions.

8. The image capturing device according to claim 7, wherein said silicidation blocking film is formed to cover said photoelectric conversion region of two of said first to third pixel regions, and said silicidation blocking film remaining on said photoelectric conversion region of one of said two pixel regions has a film thickness different from a film thickness of said silicidation blocking film remaining on said photoelectric conversion region of the other of said two pixel regions.

9. The method for manufacturing the image capturing device according to claim 1, wherein in step (g), said anisotropic etching is performed while protecting said photoelectric conversion region and said first side surface of said transfer gate electrode with a photoresist film.

10. The method for manufacturing the image capturing device according to claim 1, wherein said first insulating film consists of an oxide film, and said second insulating film consists of an oxide film and a nitride film.

* * * * *

UNITED STATES PATENT AND TRADEMARK OFFICE

CERTIFICATE OF CORRECTION

PATENT NO. : 9,806,126 B2
APPLICATION NO. : 15/404320
DATED : October 31, 2017
INVENTOR(S) : Takeshi Kamino and Takahiro Tomimatsu It is certified that error appears in the above-identified patent and that said Letters Patent is hereby corrected as shown below:

Claim 7, Column 39, Lines 1-2, "a photoelectric conversion unit" should read --a photoelectric conversion region--

Signed and Sealed this
Twentieth Day of February, 2018

Andrei Iancu
*Director of the United States Patent and Trademark Office*